(12) United States Patent
Kato et al.

(10) Patent No.: US 12,354,671 B2
(45) Date of Patent: Jul. 8, 2025

(54) SEMICONDUCTOR MEMORY DEVICE

(71) Applicant: KIOXIA CORPORATION, Tokyo (JP)

(72) Inventors: Koji Kato, Yokohama (JP); Yuki Shimizu, Yokohama (JP); Shuhei Oketa, Yokohama (JP)

(73) Assignee: KIOXIA CORPORATION, Tokyo (JP)

( * ) Notice: Subject to any disclaimer, the term of this patent is extended or adjusted under 35 U.S.C. 154(b) by 154 days.

(21) Appl. No.: 18/184,893

(22) Filed: Mar. 16, 2023

(65) Prior Publication Data
US 2023/0352099 A1 Nov. 2, 2023

(30) Foreign Application Priority Data

Apr. 28, 2022 (JP) .................................. 2022-074383

(51) Int. Cl.
*G11C 11/00* (2006.01)
*G11C 5/06* (2006.01)
*G11C 16/04* (2006.01)
*G11C 16/08* (2006.01)
*G11C 16/10* (2006.01)
(Continued)

(52) U.S. Cl.
CPC ................ *G11C 16/26* (2013.01); *G11C 5/06* (2013.01); *G11C 16/0483* (2013.01); *G11C 16/08* (2013.01); *G11C 16/10* (2013.01); *G11C 16/30* (2013.01); *G11C 16/32* (2013.01); *H01L 23/5283* (2013.01)

(58) Field of Classification Search
CPC ....... G11C 16/26; G11C 5/06; G11C 16/0483; G11C 16/08; G11C 16/10; G11C 16/30; G11C 16/32; G11C 15/08; H01L 23/5283

USPC .................................................... 365/189.011
See application file for complete search history.

(56) References Cited

U.S. PATENT DOCUMENTS 9,666,296 B1 * 5/2017 Maejima ................. G11C 16/08
10,255,977 B2 * 4/2019 Shimizu ................. G11C 16/30
(Continued)

FOREIGN PATENT DOCUMENTS

JP 2017-157260 A 9/2017
JP 2022113999 A * 8/2022 ......... G11C 11/4074
(Continued)

*Primary Examiner* — Viet Q Nguyen
(74) *Attorney, Agent, or Firm* — Oblon, McClelland, Maier & Neustadt, L.L.P.

(57) ABSTRACT

A semiconductor memory device includes: conductive layers including a first range and a second range; a first semiconductor layer opposed to the conductive layers in the first range; a second semiconductor layer opposed to the conductive layers in the second range; a first bit line electrically connected to one end of the first semiconductor layer; and a second bit line electrically connected to one end of the second semiconductor layer. When a sense time of the first bit line when a predetermined operation is performed on a first memory cell including a first electric charge accumulating portion is assumed to be a first operation parameter and a sense time of the second bit line when the predetermined operation is performed on a second memory cell including a second electric charge accumulating portion is assumed to be a second operation parameter, the second operation parameter differs from the first operation parameter.

20 Claims, 73 Drawing Sheets

(51) Int. Cl.
*G11C 16/26* (2006.01)
*G11C 16/30* (2006.01)
*G11C 16/32* (2006.01)
*H01L 23/528* (2006.01)

(56) References Cited

U.S. PATENT DOCUMENTS

| | | | | |
|---|---|---|---|---|
| 10,892,020 | B2* | 1/2021 | Hioka | G11C 16/30 |
| 11,810,624 | B2* | 11/2023 | Kato | G11C 16/0483 |
| 12,046,391 | B2* | 7/2024 | Men | H01B 13/00 |
| 2015/0002263 | A1* | 1/2015 | Ayeva | G07C 9/00309 |
| | | | | 340/5.61 |
| 2022/0238164 | A1 | 7/2022 | Kato | |
| 2023/0320107 | A1* | 10/2023 | Nakatsuka | H10B 80/00 |
| | | | | 365/185.18 |
| 2024/0021251 | A1* | 1/2024 | Kato | H10B 43/50 |

FOREIGN PATENT DOCUMENTS

| | | | | | |
|---|---|---|---|---|---|
| JP | 2023163451 | A | * 11/2023 | ......... | G11C 16/0483 |
| TW | 202034337 | A | * 9/2020 | ......... | G11C 16/0483 |

* cited by examiner

FIG. 74
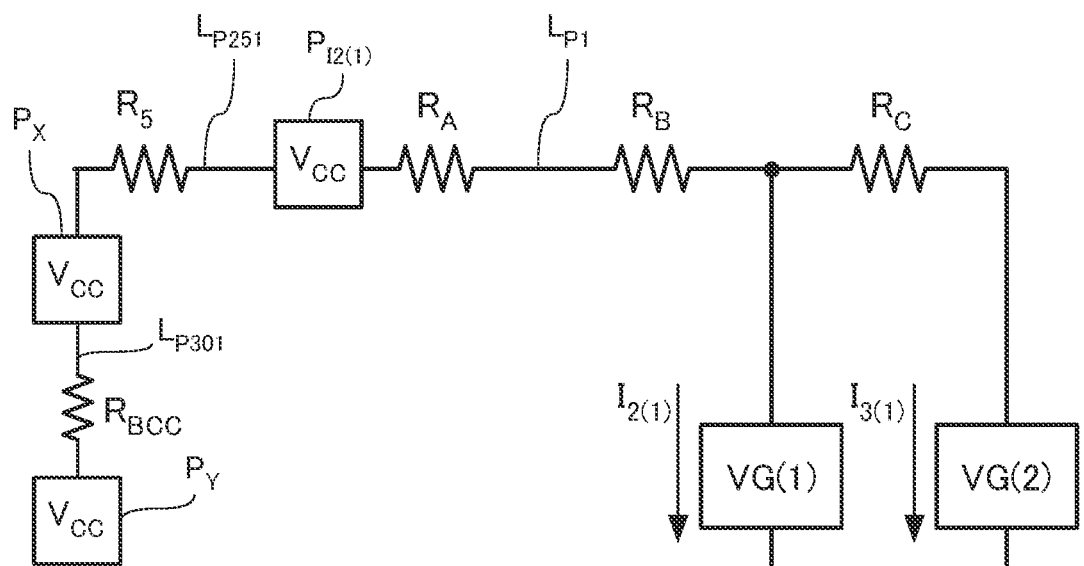
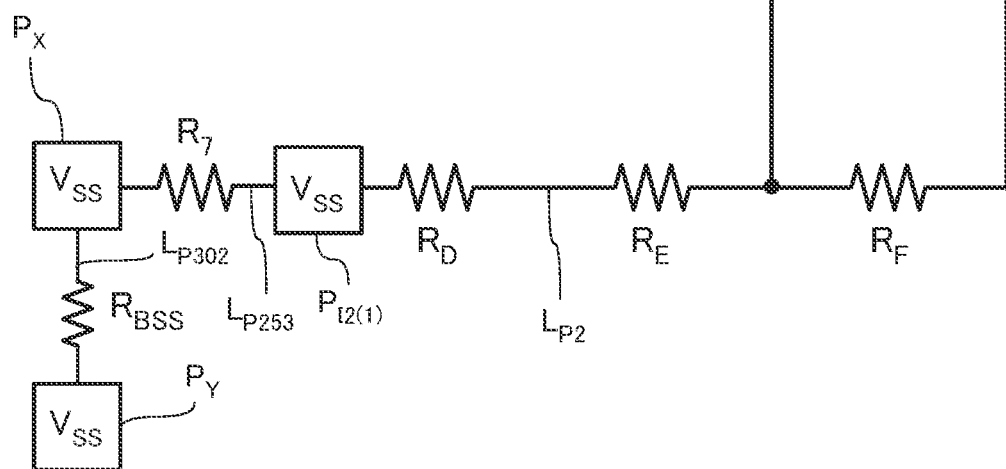

SEMICONDUCTOR MEMORY DEVICE

CROSS-REFERENCE TO RELATED APPLICATIONS

This application is based upon and claims the benefit of Japanese Patent Application No. 2022-074383, filed on Apr. 28, 2022, the entire contents of which are incorporated herein by reference.

BACKGROUND

Field

Embodiments described herein relate generally to a semiconductor memory device.

Description of the Related Art

There has been known a semiconductor memory device that includes a substrate, a plurality of conductive layers stacked in a direction intersecting with a surface of this substrate, a semiconductor layer opposed to these plurality of conductive layers, and a gate insulating layer disposed between the conductive layers and the semiconductor layer. The gate insulating layer includes a memory portion that can store data, and the memory portion is, for example, an insulating electric charge accumulating layer of silicon nitride ($Si_3N_4$) or the like and a conductive electric charge accumulating layer, such as a floating gate.

BRIEF DESCRIPTION OF THE DRAWINGS

FIG. 74 is a schematic circuit diagram illustrating configurations of the power supply terminals $P_Y(V_{CC})$, $P_Y(V_{SS})$, the external pad electrodes $P_X(V_{CC})$, $P_X(V_{SS})$, the bonding electrodes $P_{I2}(V_{CC})$, $P_{I2}(V_{SS})$, and the voltage generating circuits VG.

DETAILED DESCRIPTION

Figure 1:
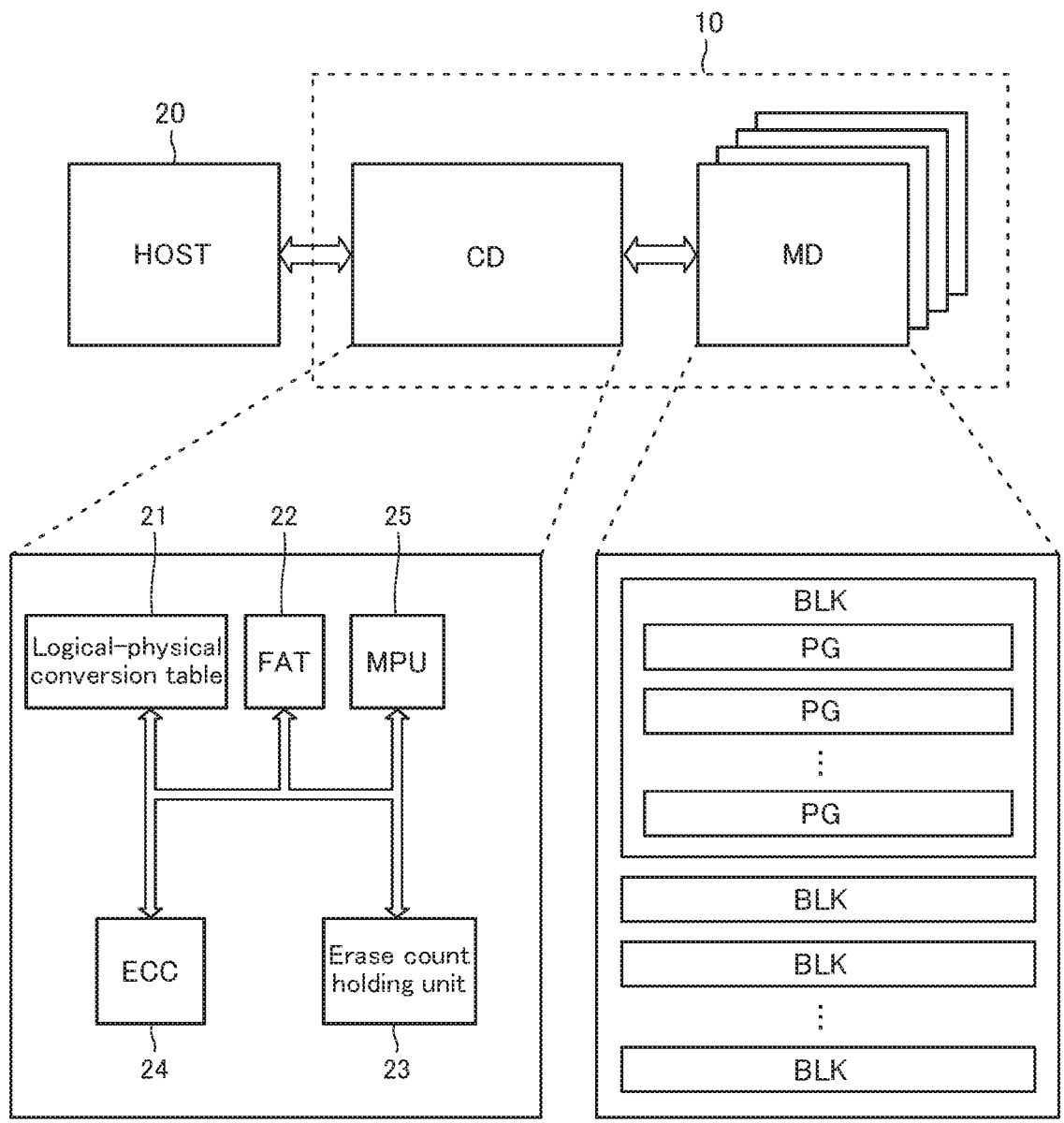
FIG. 1 is a schematic block diagram illustrating a configuration of a memory system 10 according to a first embodiment.

A semiconductor memory device according to one embodiment comprises: a plurality of first conductive layers arranged in a first direction, extending in a second direction intersecting with the first direction, and overlapping with a sense amplifier region viewed from the first direction; a plurality of second conductive layers arranged in the first direction, extending in the second direction, and not overlapping with the sense amplifier region viewed from the first direction; a first semiconductor layer extending in the first direction and opposed to the first conductive layers; a second semiconductor layer extending in the first direction and opposed to the second conductive layers; a first electric charge accumulating portion disposed between the first conductive layers and the first semiconductor layer; a second electric charge accumulating portion disposed between the second conductive layers and the second semiconductor layer; a first bit line electrically connected to one end of the first semiconductor layer; a second bit line electrically connected to one end of the second semiconductor layer; a first driver circuit that controls a voltage applied to the first conductive layer; and a second driver circuit that controls a voltage applied to the second conductive layer. When a magnitude and a supply time of one or a plurality of voltages applied to the first conductive layer when a predetermined operation is performed on a first memory cell including the first electric charge accumulating portion are assumed to be first operation parameters, and a magnitude and a supply time of one or a plurality of voltages applied to the second conductive layer when the predetermined operation is performed on a second memory cell including the second electric charge accumulating portion are assumed to be second operation parameters, at least a part of the second operation parameters differs from at least a part of the first operation parameters.

Next, the semiconductor memory devices according to embodiments are described in detail with reference to the drawings. The following embodiments are only examples, and not described for the purpose of limiting the present invention. The following drawings are schematic, and for convenience of description, a part of a configuration and the like is sometimes omitted. Parts common in a plurality of embodiments are attached by same reference numerals and their descriptions may be omitted.

In this specification, when referring to a "semiconductor memory device", it may mean a memory die and may mean a memory system including a controller die, such as a memory chip, a memory card, and a Solid State Drive (SSD). Further, it may mean a configuration including a host computer, such as a smartphone, a tablet terminal, and a personal computer.

A "control circuit" in this specification may mean a peripheral circuit, such as a sequencer, disposed in a memory die, may mean a controller die, a controller chip, or the like connected to a memory die, and may mean a configuration including both of them.

In this specification, when it is referred that a first configuration "is electrically connected" to a second configuration, the first configuration may be directly connected to the second configuration, and the first configuration may be connected to the second configuration via a wiring, a semiconductor member, a transistor, or the like. For example, when three transistors are connected in series, even when the second transistor is in OFF state, the first transistor is "electrically connected" to the third transistor.

In this specification, when it is referred that the first configuration "is connected between" the second configuration and a third configuration, it may mean that the first configuration, the second configuration, and the third configuration are connected in series and the second configuration is connected to the third configuration via the first configuration.

In this specification, when it is referred that a circuit or the like "electrically conducts" two wirings or the like, it may mean, for example, that this circuit or the like includes a transistor or the like, this transistor or the like is disposed in a current path between the two wirings, and this transistor or the like is turned ON.

In this specification, a direction parallel to an upper surface of the substrate is referred to as an X-direction, a direction parallel to the upper surface of the substrate and perpendicular to the X-direction is referred to as a Y-direction, and a direction perpendicular to the upper surface of the substrate is referred to as a Z-direction.

In this specification, a direction along a predetermined plane may be referred to as a first direction, a direction along this predetermined plane and intersecting with the first direction may be referred to as a second direction, and a direction intersecting with this predetermined plane may be referred to as a third direction. These first direction, second direction, and third direction may each correspond to any of the X-direction, the Y-direction, and the Z-direction and need not correspond to these directions.

Expressions such as "above" and "below" in this specification are based on the substrate. For example, a direction away from the substrate along the Z-direction is referred to as above and a direction approaching the substrate along the Z-direction is referred to as below. A lower surface and a lower end of a certain configuration mean a surface and an end portion at the substrate side of this configuration. An upper surface and an upper end of a certain configuration mean a surface and an end portion at a side opposite to the substrate of this configuration. A surface intersecting with the X-direction or the Y-direction is referred to as a side surface and the like.

First Embodiment

[Memory System 10]

FIG. 1 is a schematic block diagram illustrating a configuration of the memory system 10 according to the first embodiment.

The memory system 10, for example, reads, writes, and erases user data according to a signal transmitted from a host computer 20. The memory system 10 is, for example, any system that can store the user data including a memory chip, a memory card, and an SSD. The memory system 10 includes a plurality of memory dies MD and a controller die CD.

The memory die MD stores the user data. The memory die MD includes a plurality of memory blocks BLK. The memory block BLK includes a plurality of pages PG. The memory block BLK may be an execution unit of an erase operation. The page PG may be an execution unit of a read operation and a write operation.

As illustrated in FIG. 1, the controller die CD is connected to the plurality of memory dies MD and the host computer 20. The controller die CD includes, for example, a logical-physical conversion table 21, a File Allocation Table (FAT) 22, an erase count holding unit 23, an ECC circuit 24, and a Micro Processor Unit (MPU) 25.

The logical-physical conversion table 21 correlates a logical address received from the host computer 20 with a physical address assigned to the page PG in the memory die MD, and latches them. The logical-physical conversion table 21 is achieved by, for example, a Random Access Memory (RAM) (not illustrated).

The FAT 22 latches FAT information indicating states of the respective pages PG. Such FAT information includes, for example, information indicating "valid", "invalid", and "erased". For example, a "valid" page PG stores valid data that is read according to an instruction from the host computer 20. An "invalid" page PG stores invalid data that is not read according to an instruction from the host computer 20. An "erased" page PG stores no data after performing the erase process. The FAT 22 is achieved by, for example, a RAM (not illustrated).

The erase count holding unit 23 correlates the physical address corresponding to the memory block BLK with a count of the erase operation performed on the memory block BLK, and latches them. The erase count holding unit 23 is achieved by, for example, a RAM (not illustrated).

The ECC circuit 24 detects an error in data read from the memory die MD, and corrects the data when it is possible.

The MPU 25 refers to the logical-physical conversion table 21, the FAT 22, the erase count holding unit 23, and the ECC circuit 24, and performs processes, such as a conversion between the logical address and the physical address, a bit error detection/correction, a garbage collection (compaction), and a wear leveling.

[Circuit Configuration of Memory Die MD]

Figure 2:
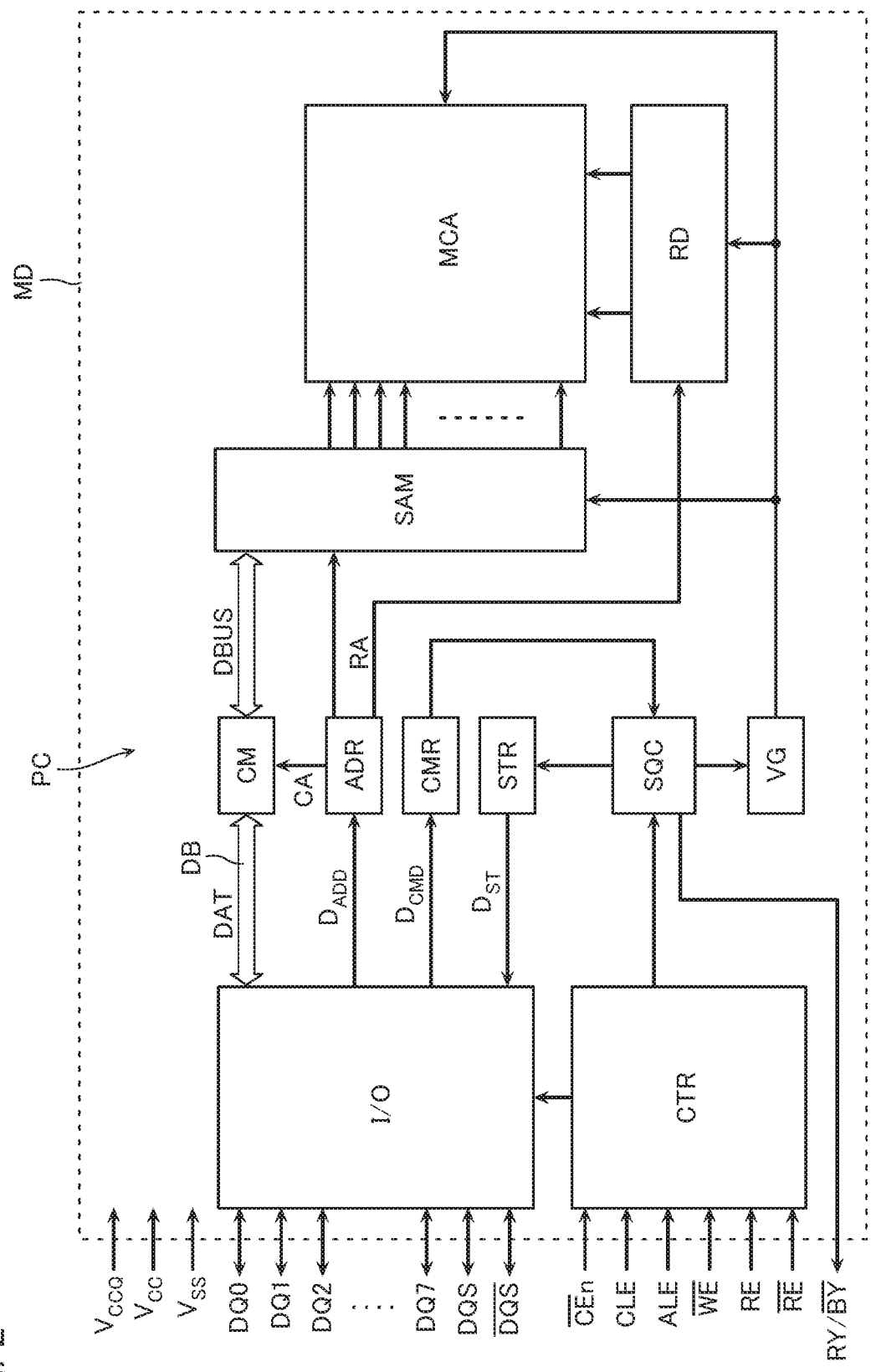
FIG. 2 is a schematic block diagram illustrating a configuration of a memory die MD according to the first embodiment.
Figure 3:
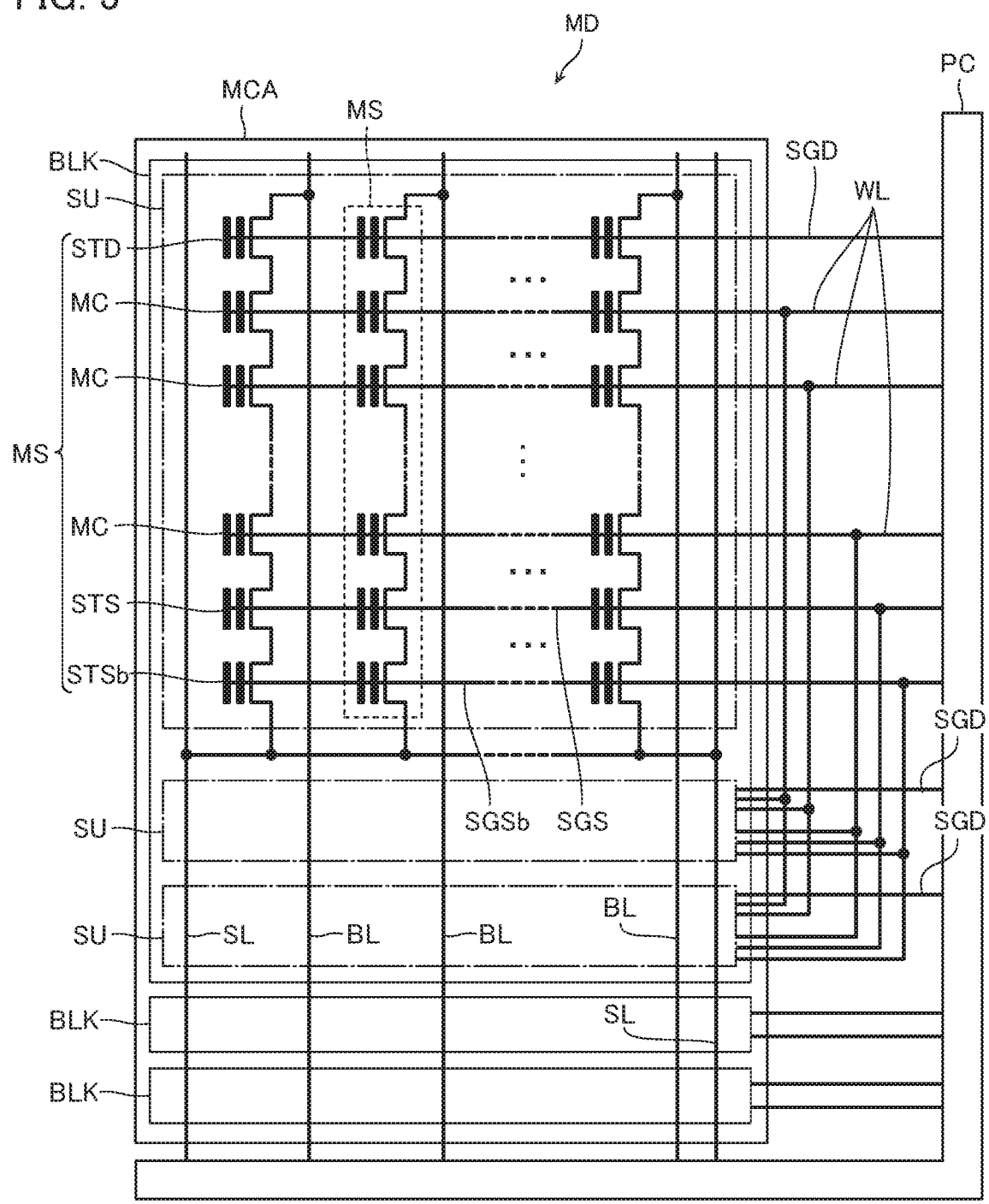
FIG. 3 is a schematic circuit diagram illustrating a configuration of a part of the memory die MD.
Figure 4:
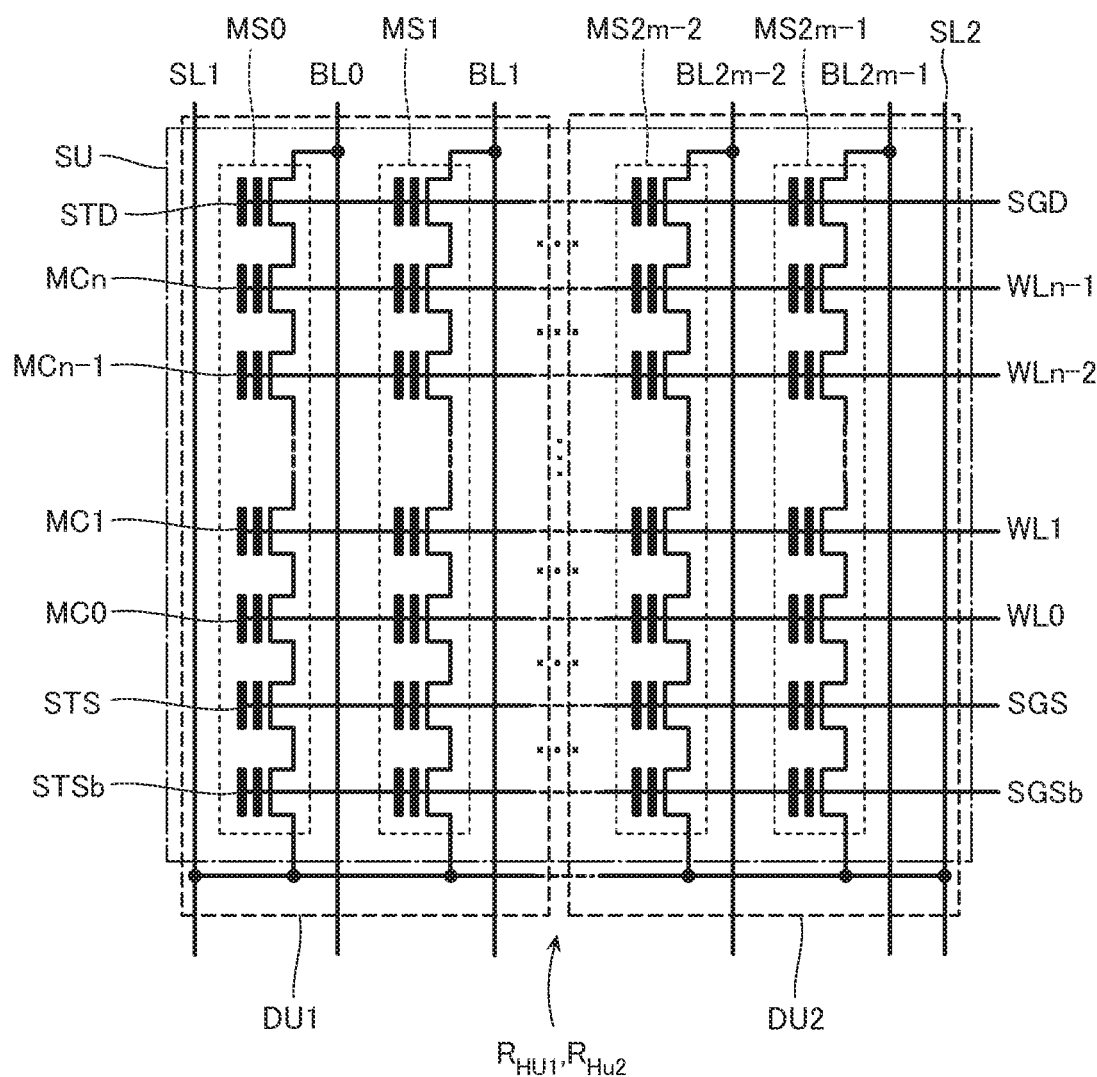
FIG. 4 is a schematic circuit diagram illustrating a configuration of a string unit SU in FIG. 3.
Figure 5:
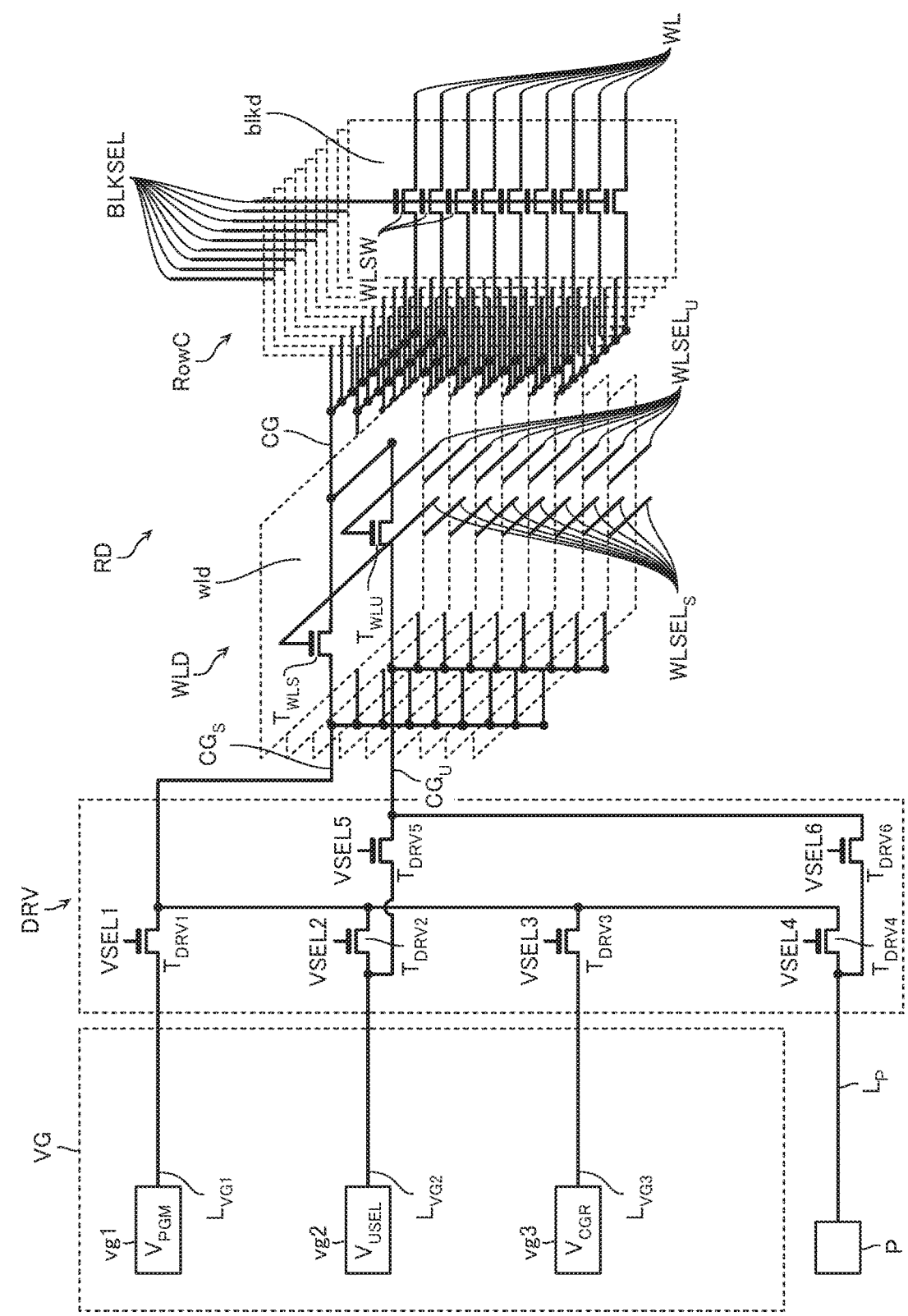
FIG. 5 is a schematic circuit diagram illustrating a configuration of a voltage generating circuit VG, a CG driver circuit DRV, and a row decoder RD.
Figure 6:
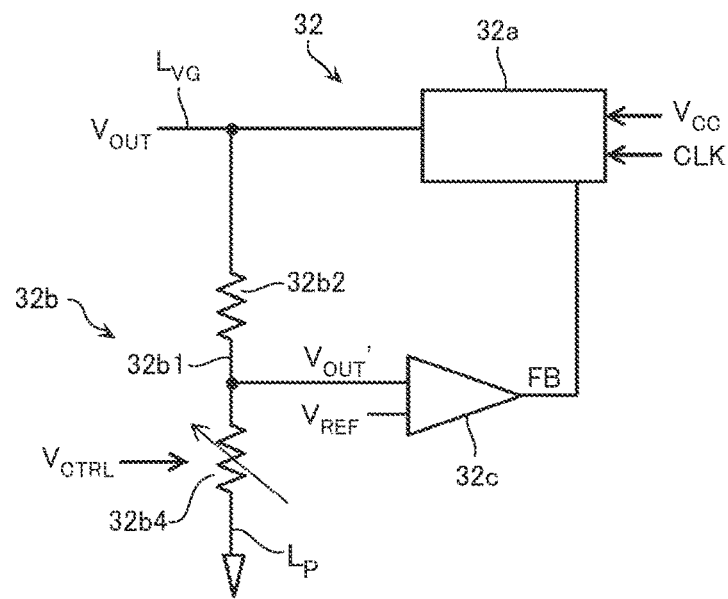
FIG. 6 is a schematic circuit diagram illustrating a configuration of a charge pump circuit 32 in the voltage generating circuit VG.
Figure 7:
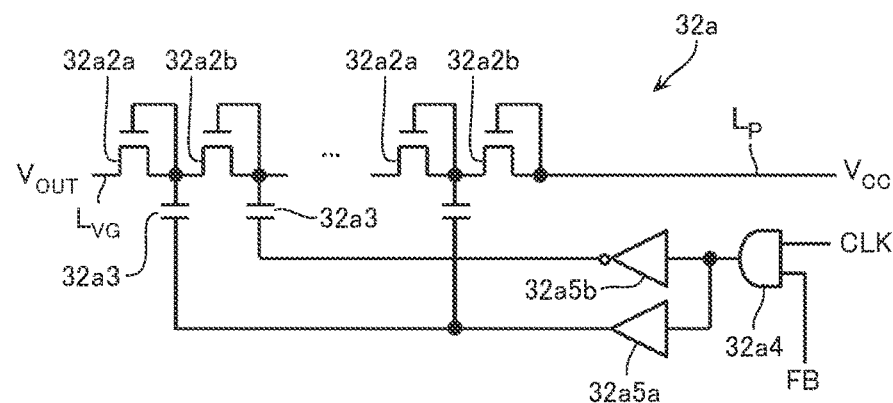
FIG. 7 is a schematic circuit diagram illustrating a configuration of a voltage output circuit 32*a*.
Figure 8:
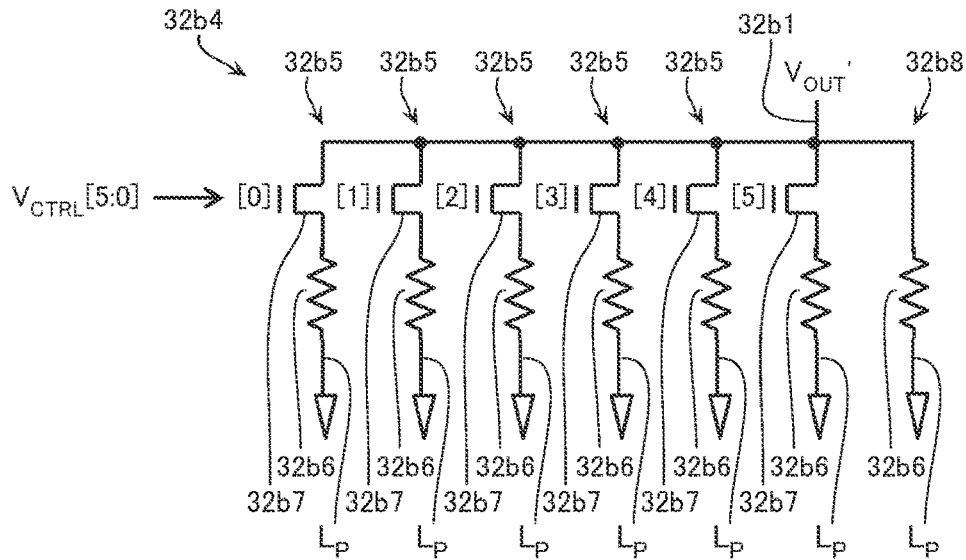
FIG. 8 is a schematic circuit diagram illustrating a configuration of a variable resistor element 32*b*4.
Figure 9:
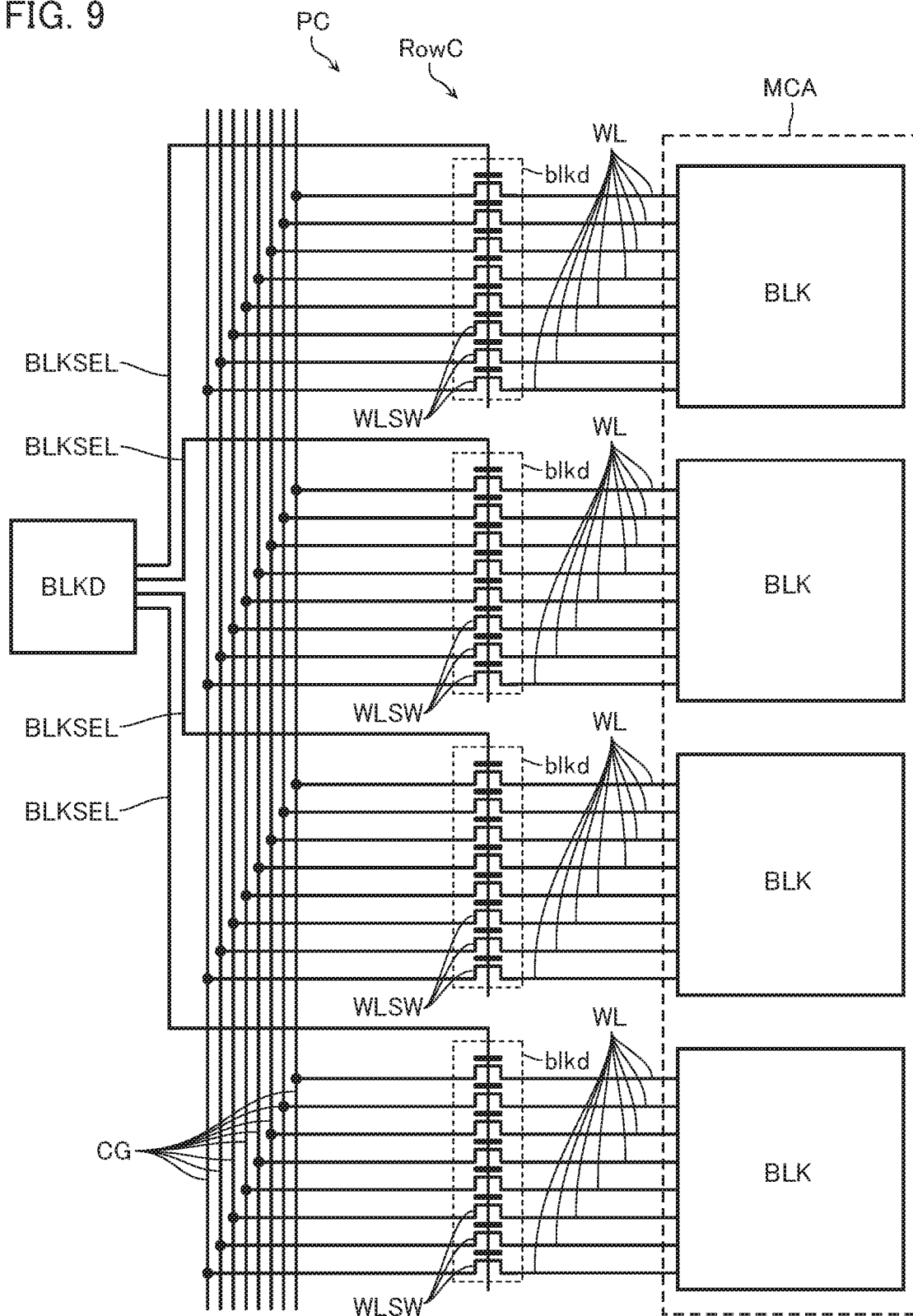
FIG. 9 is a schematic block diagram illustrating a configuration of a row control circuit RowC and a block decoder BLKD.
Figure 10:
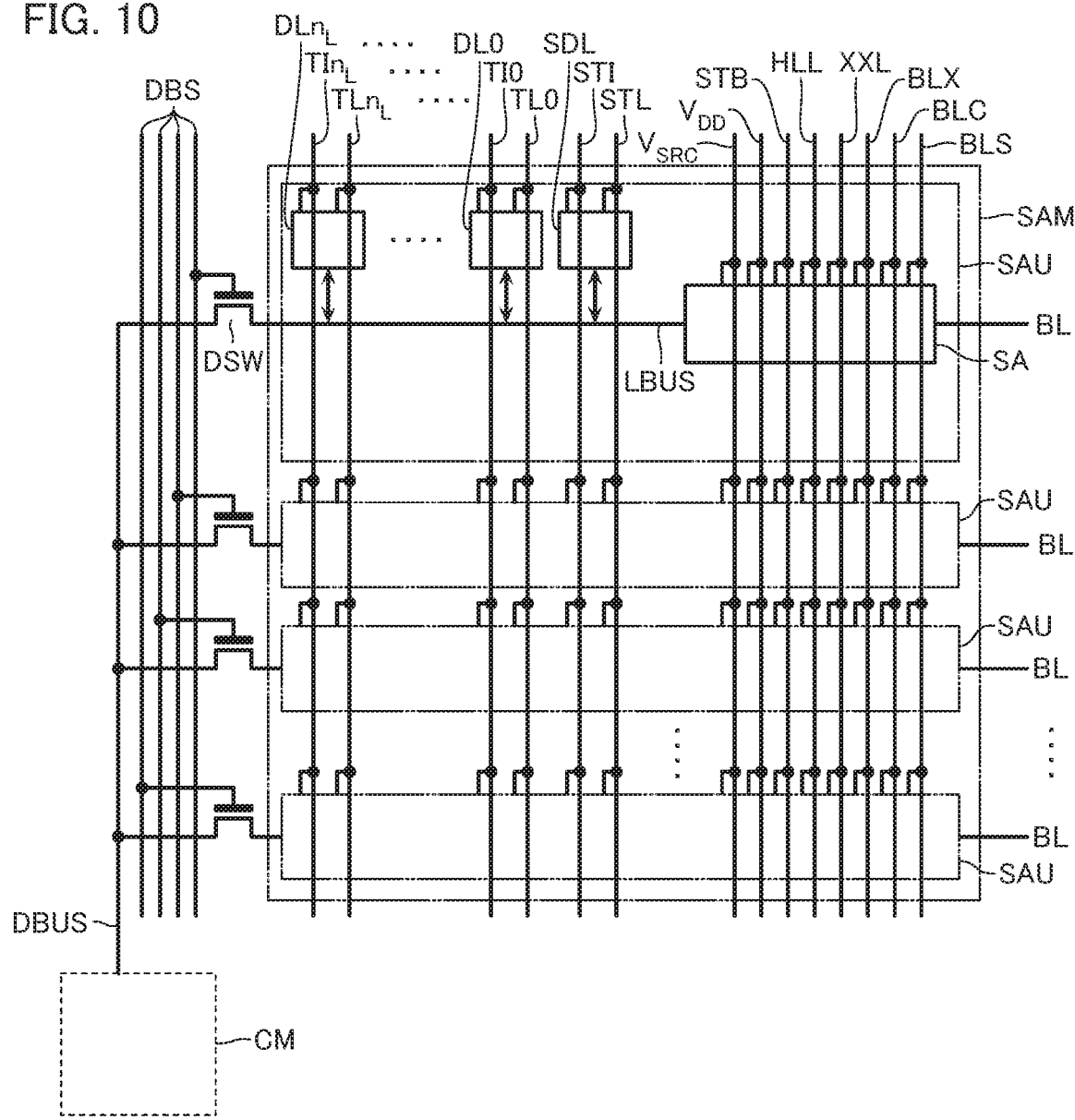
FIG. 10 is a schematic block diagram illustrating a configuration of a sense amplifier module SAM.
Figure 11:
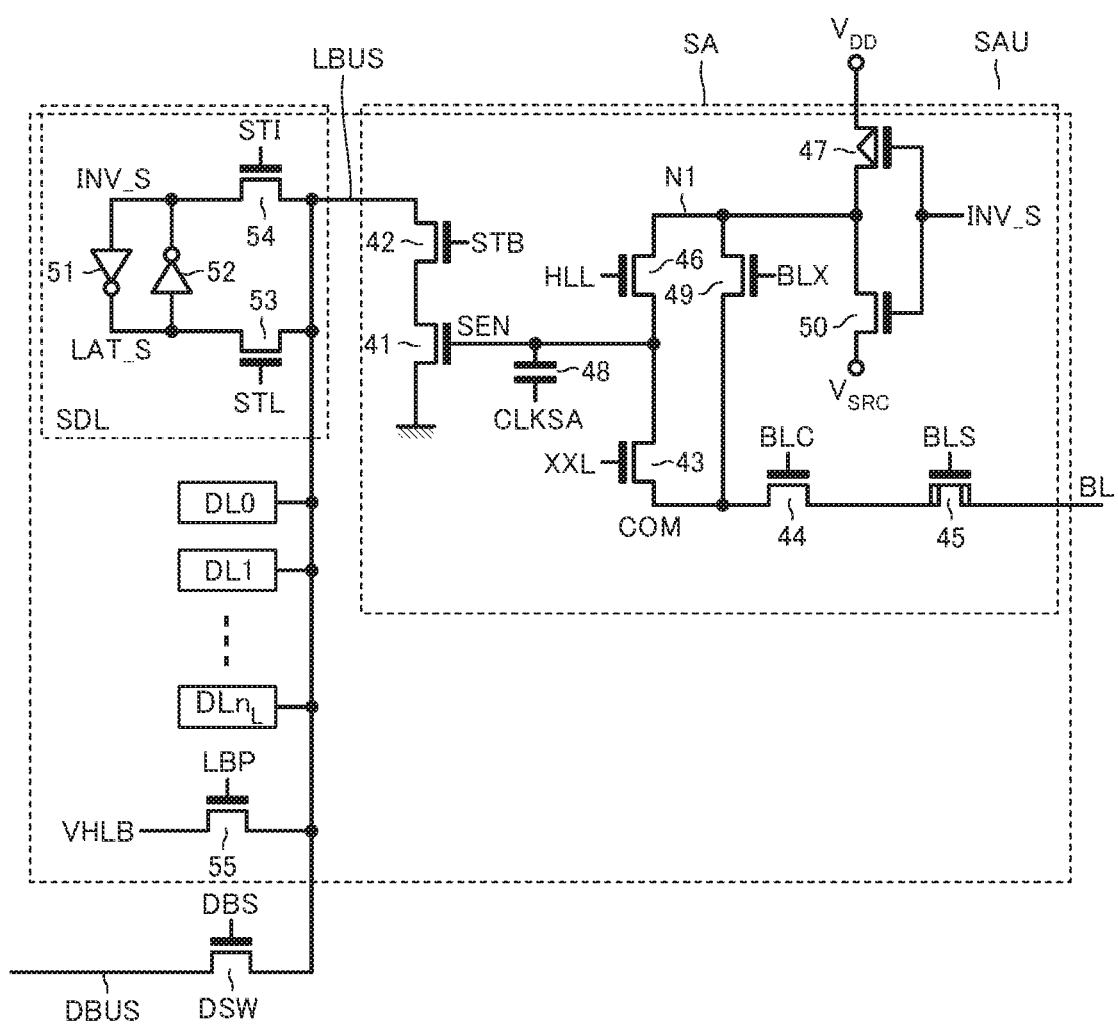
FIG. 11 is a schematic circuit diagram illustrating a configuration of a sense amplifier unit SAU.

FIG. 2 is a schematic block diagram illustrating a configuration of the memory die MD according to the first embodiment. FIG. 3 is a schematic circuit diagram illustrating a configuration of a part of the memory die MD. FIG. 4 is a schematic circuit diagram illustrating a configuration of a string unit SU in FIG. 3. FIG. 5 is a schematic circuit diagram illustrating a configuration of a voltage generating circuit VG, a CG driver circuit DRV, and a row decoder RD. FIG. 6 is a schematic circuit diagram illustrating a configuration of the charge pump circuit 32 in the voltage generating circuit VG. FIG. 7 is a schematic circuit diagram illustrating a configuration of a voltage output circuit 32$a$. FIG. 8 is a schematic circuit diagram illustrating a configuration of a variable resistor element 32$b$4. FIG. 9 is a schematic block diagram illustrating a configuration of a row control circuit RowC and a block decoder BLKD. FIG. 10 is a schematic block diagram illustrating a configuration of a sense amplifier module SAM. FIG. 11 is a schematic circuit diagram illustrating a configuration of a sense amplifier unit SAU.

FIG. 2 illustrates a plurality of control terminals and the like. These plurality of control terminals are expressed as control terminals corresponding to a high active signal (positive logic signal) in some cases. The plurality of control terminals are expressed as control terminals corresponding to a low active signal (negative logic signal) in some cases. The plurality of control terminals are expressed as control terminals corresponding to both the high active signal and the low active signal in some cases. In FIG. 2, a reference sign of the control terminal corresponding to the low active signal includes an over line (overbar). In this specification, a reference sign of the control terminal corresponding to the low active signal includes a slash ("/"). The description of FIG. 2 is an example, and specific aspects are appropriately adjustable. For example, a part of or all of the high active signals can be changed to the low active signals, or a part of or all of the low active signals can be changed to the high active signals.

Figure 28A:
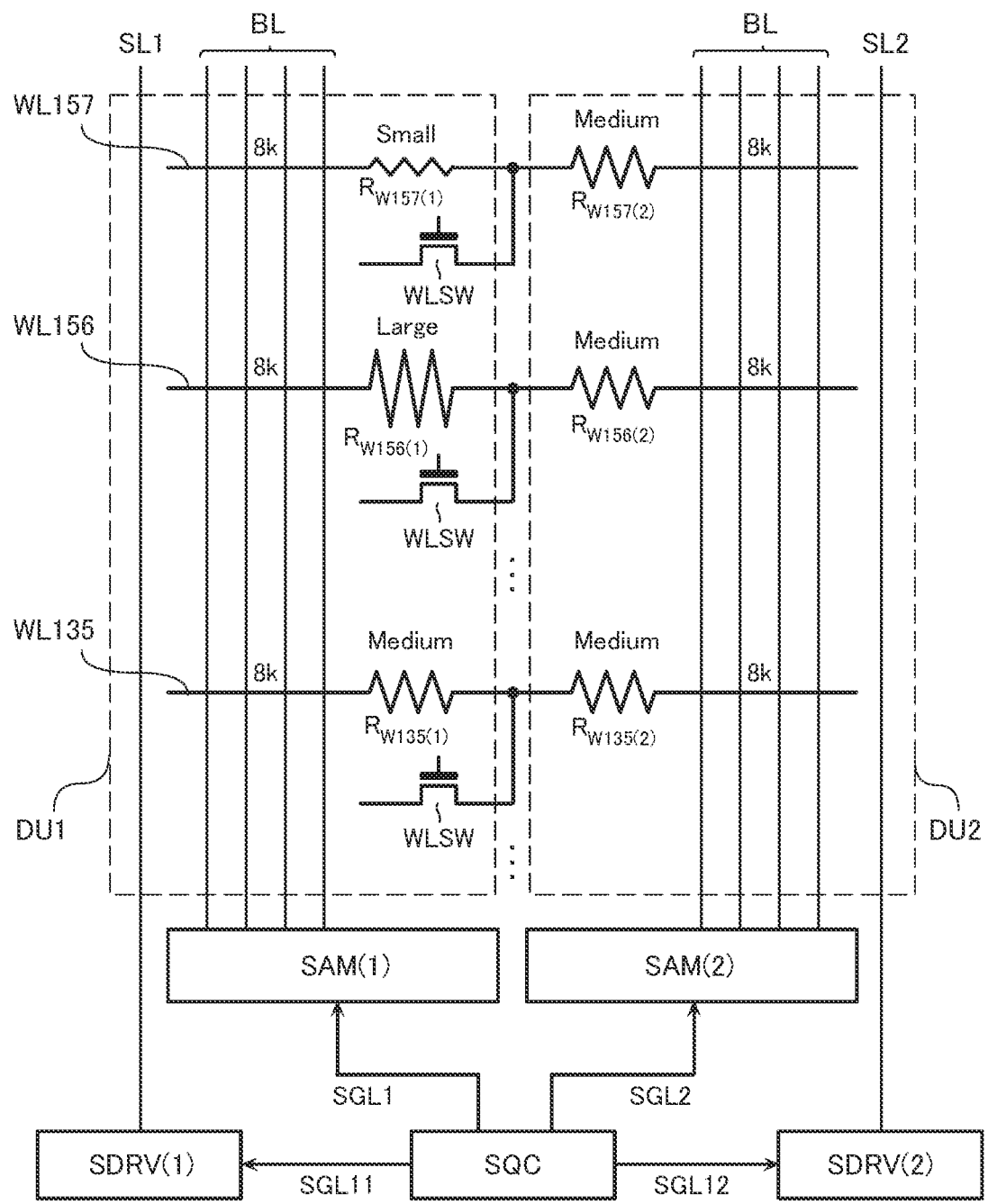
FIG. 28A is a schematic diagram for describing adjustment of the operation parameters of a bit line BL and source lines SL1, SL2 according to the first embodiment.

As illustrated in FIG. 2, the memory die MD includes a memory cell array MCA and a peripheral circuit PC. The peripheral circuit PC includes the voltage generating circuit VG, the row decoder RD, the sense amplifier module SAM, and a sequencer SQC. The peripheral circuit PC includes a cache memory CM, an address register ADR, a command register CMR, and a status register STR. The peripheral circuit PC includes an input/output control circuit I/O and a logic circuit CTR. Additionally, the peripheral circuit PC includes source line driver circuits SDRV (FIG. 28A).

[Circuit Configuration of Memory Cell Array MCA]

As illustrated in FIG. 3, the memory cell array MCA includes the above-described plurality of memory blocks BLK. Each of these plurality of memory blocks BLK includes a plurality of the string units SU. Each of these plurality of string units SU includes a plurality of memory strings MS. Each of these plurality of memory strings MS has one end connected to the peripheral circuit PC via a bit line BL. Each of these plurality of memory strings MS has the other end connected to the peripheral circuit PC via a common source line SL (a common source line SL1 in a divided range DU1 described later and a common source line SL2 in a divided range DU2 described later; see FIG. 4).

The memory string MS includes a drain-side select transistor STD, a plurality of memory cells MC (memory transistors), a source-side select transistor STS, and a source-side select transistor STSb. The drain-side select transistor STD, the plurality of memory cells MC, the source-side select transistor STS, and the source-side select transistor STSb are connected in series between the bit line BL and the source line SL. Hereinafter, the drain-side select transistor STD, the source-side select transistor STS, and the source-side select transistor STSb are simply referred to as select transistors (STD, STS, STSb) in some cases.

The memory cell MC is a field-effect type transistor. The memory cell MC includes a semiconductor layer, a gate insulating film, and a gate electrode. The semiconductor layer functions as a channel region. The gate insulating film includes an electric charge accumulating film. The memory cell MC has a threshold voltage that changes according to an electric charge amount in the electric charge accumulating film. The memory cell MC stores data of one bit or a plurality of bits. The gate electrodes of the plurality of memory cells MC corresponding to one memory string MS are connected to respective word lines WL. Each of these word lines WL is connected to all the memory strings MS in one memory block BLK in common.

The select transistors (STD, STS, STSb) are field-effect type transistors. The select transistors (STD, STS, STSb) include semiconductor layers, gate insulating films, and gate electrodes. The semiconductor layer functions as a channel region. The gate electrodes of the select transistors (STD, STS, STSb) are connected to the select gate lines (SGD, SGS, SGSb), respectively. One drain-side select gate line SGD is connected to all the memory strings MS in one string unit SU in common. One source-side select gate line SGS is connected to all the memory strings MS in one memory block BLK in common. One source-side select gate line SGSb is connected to all the memory strings MS in one memory block BLK in common.

[Divided Ranges DU1, DU2 of Word Lines WL]

As illustrated in FIG. 4, the respective plurality of word lines WL are physically or virtually divided in the two divided ranges DU1, DU2 by hook-up regions $R_{HU1}$, $R_{HU2}$ (for example, FIG. 12) described later. Then, for example, to each of the divided ranges DU1, DU2 of the plurality of word lines WL, the half of the memory cells MC among the plurality of memory cells MC connected to one word line WL (for example, a word line WL0) are connected.

In the example of FIG. 4, the string unit SU includes n pieces of word lines WL0 to WLn−1 and 2m pieces of bit lines BL0 to BL2m−1. To 2m pieces of the bit lines BL0 to BL2m−1, 2m pieces of memory strings MS0 to MS2m−1 are connected. n and m indicate an integer of one or more. In this case, m pieces of the respective memory cells MC are connected to the divided range DU1 of n pieces of the word lines WL0 to WLn−1. Additionally, m pieces of the respective memory cells MC are also connected to the divided range DU2 of n pieces of the word lines WL0 to WLn−1. 2m pieces of the memory cells MC connected to n pieces of the word lines WL0 to WLn−1 are referred to as memory cells MC0 to MCn−1, respectively, in some cases.

As illustrated in FIG. 4, among 2m pieces of the memory strings MS0 to MS2m−1, one ends of m pieces of the memory strings MS0 to MSm−1 in the divided range DU1 are connected to the peripheral circuit PC via m pieces of the bit lines BL0 to BLm−1, respectively, in the divided range DU1. Additionally, among 2m pieces of the memory strings MS0 to MS2m−1, one ends of m pieces of the memory strings MSm to MS2m−1 in the divided range DU2 are connected to the peripheral circuit PC via m pieces of the bit lines BLm to BL2m−1, respectively, in the divided range DU2.

As illustrated in FIG. 4, the source lines SL1, SL2 are disposed corresponding to the divided ranges DU1, DU2. Among 2m pieces of the memory strings MS0 to MS2m−1, respective other ends of m pieces of the memory strings MS0 to MSm−1 in the divided range DU1 are connected to the peripheral circuit PC via the common source line SL1 in the divided range DU1. Additionally, among 2m pieces of the memory strings MS0 to MS2m−1, respective other ends of m pieces of the memory strings MSm to MS2m−1 in the divided range DU2 are connected to the peripheral circuit PC via the common source line SL2 in the divided range DU2.

Note that as described above, while the plurality of word lines WL0 to WLn−1 are physically or virtually divided into the two divided ranges DU1, DU2, as described later, one word line WL (divided range DU1, DU2) is connected to a word line switch WLSW via a wiring and a contact CC corresponding to the word line WL. Therefore, the same voltage is applied to one word line WL (divided ranges DU1, DU2) at the same timing.

On the other hand, different voltages can be applied to the plurality of bit lines BL included in the divided range DU1 and the plurality of bit lines BL included in the divided range DU2 at different timings. Additionally, different voltages can be applied to the source line SL1 corresponding to the divided range DU1 and the source line SL2 corresponding to the divided range DU2 at different timings.

Note that similarly to the word lines WL, the select gate lines (SGD, SGS, SGSb) are physically or virtually divided into the two divided ranges DU1, DU2. The select gate lines (SGD, SGS, SGSb) are connected to the word line switches WLSW via the wirings and the contacts CC.

Accordingly, the same voltage is applied to the respective select gate lines (SGD, SGS, SGSb) at the same timing.

[Circuit Configuration of Voltage Generating Circuit VG]

For example, as illustrated in FIG. 5, the voltage generating circuit VG (FIG. 2) includes a plurality of voltage generating units vg1 to vg3. The voltage generating units vg1 to vg3 generate voltages of predetermined magnitudes and output them via voltage supply lines $L_{VG}$ in the read operation, the write operation, and the erase operation. For example, the voltage generating unit vg1 outputs a program voltage $V_{PGM}$ described later in the write operation. The voltage generating unit vg2 outputs a read pass voltage $V_{READ}$ described later in the read operation. The voltage generating unit vg2 outputs a write pass voltage $V_{PASS}$ described later in the write operation. The voltage generating unit vg3 outputs a reading voltage described later in the read operation. The voltage generating unit vg3 outputs a verify voltage described later in the write operation. For example, the voltage generating units vg1 to vg3 may be a step-up circuit, such as a charge pump circuit, or may be a step-down circuit, such as a regulator. These step-down circuit and step-up circuit are each connected to a voltage supply line $L_P$. The voltage supply line $L_P$ is applied with a power supply voltage $V_{CC}$ or a ground voltage $V_{SS}$ (FIG. 2). These voltage supply lines $L_P$ are, for example, connected to pad electrodes P. The operating voltage output from the voltage generating circuit VG is adjusted as necessary in accordance with a control signal from the sequencer SQC.

For example, as illustrated in FIG. 6, the charge pump circuit 32 in the voltage generating circuit VG includes the voltage output circuit 32a, a voltage dividing circuit 32b, and a comparator 32c. The voltage output circuit 32a outputs a voltage $V_{OUT}$ to a voltage supply line $L_{VG}$. The voltage dividing circuit 32b is connected to the voltage supply line $L_{VG}$. The comparator 32c outputs a feedback signal FB to the voltage output circuit 32a according to a magnitude relation between a voltage $V_{OUT}'$ output from the voltage dividing circuit 32b and a reference voltage $V_{REF}$.

As illustrated in FIG. 7, the voltage output circuit 32a includes a plurality of transistors 32a2a, 32a2b. The plurality of transistors 32a2a, 32a2b are alternately connected between the voltage supply line $L_{VG}$ and the voltage supply line $L_P$. The illustrated voltage supply line $L_P$ is applied with the power supply voltage $V_{CC}$. Gate electrodes of the plurality of transistors 32a2a, 32a2b connected in series are connected to their respective drain electrodes and capacitors 32a3. The voltage output circuit 32a includes an AND circuit 32a4, a level shifter 32a5a, and a level shifter 32a5b. The AND circuit 32a4 outputs a logical disjunction of a clock signal CLK and the feedback signal FB. The level shifter 32a5a steps up the output signal of the AND circuit 32a4 and outputs it. The level shifter 32a5a includes an output terminal connected to the gate electrode of the transistor 32a2a via the capacitor 32a3. The level shifter 32a5b steps up an inverted signal of the output signal of the AND circuit 32a4 and outputs it. The level shifter 32a5b includes an output terminal connected to the gate electrode of the transistor 32a2b via the capacitor 32a3.

When the feedback signal FB is in an "H" state, the AND circuit 32a4 outputs the clock signal CLK. In response to this, the electrons are transferred from the voltage supply line $L_{VG}$ to the voltage supply line $L_P$, and the voltage of the voltage supply line $L_{VG}$ increases. Meanwhile, when the feedback signal FB is in an "L" state, the AND circuit 32a4 does not output the clock signal CLK. Therefore, the voltage of the voltage supply line $L_{VG}$ does not increase.

As illustrated in FIG. 6, the voltage dividing circuit 32b includes a resistor element 32b2 and the variable resistor element 32b4. The resistor element 32b2 is connected between the voltage supply line $L_{VG}$ and a voltage dividing terminal 32b1. The variable resistor element 32b4 is connected in series between the voltage dividing terminal 32b1 and the voltage supply line $L_P$. The voltage supply line $L_P$ is applied with the ground voltage $V_{SS}$. The variable resistor element 32b4 has a resistance value adjustable in accordance with an operating voltage control signal $V_{CTRL}$. Therefore, a magnitude of the voltage $V_{OUT}'$ of the voltage dividing terminal 32b1 is adjustable in accordance with the operating voltage control signal $V_{CTRL}$.

As illustrated in FIG. 8, the variable resistor element 32b4 includes a plurality of current paths 32b5. The plurality of current paths 32b5 are connected in parallel between the voltage dividing terminal 32b1 and the voltage supply lines $L_P$. The plurality of current paths 32b5 each include a resistor element 32b6 and a transistor 32b7 connected in series. The resistor elements 32b6 disposed in the respective current paths 32b5 may have mutually different resistance values. Different bits of the operating voltage control signal $V_{CTRL}$ are input to the respective gate electrodes of the transistors 32b7. The variable resistor element 32b4 may include a current path 32b8 without the transistor 32b7.

As illustrated in FIG. 6, the comparator 32c outputs the feedback signal FB. The feedback signal FB turns to the "L"

state, for example, when the voltage $V_{OUT}{}'$ of the voltage dividing terminal 32b1 is larger than the reference voltage $V_{REF}$. The feedback signal FB turns to the "H" state, for example, when the voltage $V_{OUT}{}'$ is smaller than the reference voltage $V_{REF}$.

Note that the voltage generating circuit VG (FIG. 2) described with reference to FIG. 5 to FIG. 8 has the configuration that generates the program voltage $V_{PGM}$, the read pass voltage $V_{READ}$, the write pass voltage $V_{PASS}$, the reading voltage, and the verify voltage applied to the word lines WL (wirings CG). However, not only the operating voltage applied to the word line WL, the voltage generating circuit VG can generate a plurality of patterns of operating voltages applied to the bit line BL, the source line SL, and the select gate lines (SGD, SGS, SGSb) in the read operation, the write operation, and the erase operation on the memory cell array MCA, and the operating voltages can be output to a plurality of voltage supply lines. These operating voltages are appropriately adjusted in accordance with a control signal from the sequencer SQC.

[Circuit Configuration of Row Decoder RD]

For example, as illustrated in FIG. 5, the row decoder RD includes the row control circuit RowC, a word line decoder WLD, the CG driver circuit DRV, and an address decoder (not illustrated). For example, as illustrated in FIG. 9, the row control circuit RowC includes a plurality of block decoder units blkd and a block decoder BLKD.

The plurality of block decoder units blkd correspond to the plurality of memory blocks BLK in the memory cell array MCA. The block decoder unit blkd includes a plurality of the word line switches WLSW. The plurality of word line switches WLSW correspond to the plurality of word lines WL in the memory block BLK. The word line switch WLSW is, for example, a field-effect type NMOS transistor. A drain electrode of the word line switch WLSW is connected to the word line WL. A source electrode of the word line switch WLSW is connected to a wiring CG. The wirings CG are connected to all of the block decoder units blkd in the row control circuit RowC. A gate electrode of the word line switch WLSW is connected to a signal supply line BLKSEL. A plurality of the signal supply lines BLKSEL are disposed corresponding to all of the block decoder units blkd. Additionally, the signal supply line BLKSEL is connected to all of the word line switches WLSW in the block decoder unit blkd.

The block decoder BLKD decodes a block address in, for example, the read operation and the write operation. In the read operation, the write operation, and the like, for example, one signal line BLKSEL corresponding to the block address in the address register ADR (FIG. 2) turns to the "H" state, and the other signal lines BLKSEL turn to the "L" state. For example, the one signal line BLKSEL is applied with a predetermined driving voltage having a positive magnitude, and the other signal lines BLKSEL are applied with the ground voltage $V_{SS}$ or the like. Accordingly, all of the word lines WL in one memory block BLK corresponding to this block address are electrically conductive to all of the wirings CG. All of the word lines WL in the other memory blocks BLK turn to a floating state.

The word line decoder WLD includes a plurality of word line decode units wld. The plurality of word line decode units wld correspond to the plurality of memory cells MC in the memory string MS. In the illustrated example, the word line decode unit wld includes two transistors $T_{WLS}$, $T_{WLU}$. The transistors $T_{WLS}$, $T_{WLU}$ are, for example, field-effect type NMOS transistors. The transistors $T_{WLS}$, $T_{WLU}$ include drain electrodes connected to the wirings CG. The transistor $T_{WLS}$ includes a source electrode connected to a wiring $CG_S$. The transistor $T_{WLU}$ includes a source electrode connected to a wiring $CG_U$. The transistor $T_{WLS}$ includes a gate electrode connected to a signal line $WLSEL_S$. The transistor $T_{WLU}$ includes a gate electrode connected to a signal line $WLSEL_U$. A plurality of the signal lines $WLSEL_S$ are disposed corresponding to the one transistors $T_{WLS}$ included in all of the word line decode units wld. A plurality of the signal lines $WLSEL_U$ are disposed corresponding to the other transistors $T_{WLU}$ included in all of the word line decode units wld.

In the read operation, the write operation, and the like, for example, the signal line $WLSEL_S$ corresponding to one word line decode unit wld corresponding to a page address in the address register ADR (FIG. 2) turns to the "H" state, and the signal line $WLSEL_U$ corresponding to this turns to the "L" state. The signal lines $WLSEL_S$ corresponding to the other word line decode units wld turn to the "L" state, and the signal lines $WLSEL_U$ corresponding to them turn to the "H" state. The wiring $CG_S$ is applied with a voltage corresponding to a selected word line WL. The wiring $CG_U$ is applied with a voltage corresponding to an unselected word line WL. Accordingly, the one word line WL corresponding to the page address is applied with the voltage corresponding to the selected word line WL. The other word lines WL are applied with the voltage corresponding to the unselected word line WL.

The CG driver circuit DRV includes, for example, six transistors $T_{DRV1}$ to $T_{DRV6}$. The transistors $T_{DRV1}$ to $T_{DRV6}$ are, for example, field-effect type NMOS transistors. The transistors $T_{DRV1}$ to $T_{DRV4}$ include drain electrodes connected to the wiring $CG_S$. The transistors $T_{DRV5}$, $T_{DRV6}$ include drain electrodes connected to the wiring $CG_U$. The transistor $T_{DRV1}$ includes a source electrode connected to an output terminal of the voltage generating unit vg1 via a voltage supply line $L_{VG1}$. The transistors $T_{DRV2}$, $T_{DRV5}$ include source electrodes connected to an output terminal of the voltage generating unit vg2 via a voltage supply line $L_{VG2}$. The transistor $T_{DRV3}$ includes a source electrode connected to an output terminal of the voltage generating unit vg3 via a voltage supply line $L_{VG3}$. The transistors $T_{DRV4}$, $T_{DRV6}$ include source electrodes connected to the pad electrode P via the voltage supply line $L_P$. The transistors $T_{DRV1}$ to $T_{DRV6}$ include gate electrodes to which signal lines VSEL1 to VSEL6 are connected, respectively.

In the read operation, the write operation, and the like, for example, one of the plurality of signal lines VSEL1 to VSEL4 corresponding to the wiring $CG_S$ turns to the "H" state, and the other turn to the "L" state. One of the two signal lines VSEL5, VSEL6 corresponding to the wiring $CG_U$ turns to the "H" state, and the other signal line turns to the "L" state.

The address decoder (not illustrated), for example, sequentially refers to a row address RA of the address register ADR (FIG. 2) in accordance with the control signal from the sequencer SQC (FIG. 2). The row address RA includes the block address and the page address described above. The address decoder controls the voltages of the signal lines BLKSEL, $WLSEL_S$, and $WLSEL_U$ to the "H" state or the "L" state.

In the example of FIG. 5, the row decoder RD includes one block decoder unit blkd for each memory block BLK. However, this configuration can be changed as necessary. For example, one block decoder unit blkd may be disposed for two or more memory blocks BLK.

[Circuit Configuration of Sense Amplifier Module SAM]

For example, as illustrated in FIG. 10, the sense amplifier module SAM (FIG. 2) includes a plurality of the sense amplifier units SAU. The plurality of sense amplifier units SAU correspond to the plurality of bit lines BL. The sense amplifier units SAU each include a sense amplifier SA, a wiring LBUS, latch circuits SDL and DL0 to DLn$_L$ (n$_L$ is a natural number). The sense amplifier module SAM (FIG. 2) includes a charge transistor 55 (FIG. 11) for precharge. A gate of the charge transistor 55 is connected to a signal line LBP, and one end of the charge transistor 55 is connected to the wiring LBUS. A voltage VHLB is applied to the other end of the charge transistor 55. The signal line LBP is connected to the sequencer SQC. The wiring LBUS is connected to a wiring DBUS via a switch transistor DSW.

As illustrated in FIG. 11, the sense amplifier SA includes a sense transistor 41. The sense transistor 41 discharges an electric charge of the wiring LBUS according to current flowing in the bit line BL. The source electrode of the sense transistor 41 is connected to the voltage supply line to which the ground voltage V$_{SS}$ is applied. The drain electrode is connected to the wiring LBUS via a switch transistor 42. The gate electrode is connected to the bit line BL via a sense node SEN, a discharge transistor 43, a node COM, a clamp transistor 44, and a high breakdown voltage transistor 45. The sense node SEN is connected to an internal control signal line CLKSA via a capacitor 48.

The sense amplifier SA includes a voltage transfer circuit. The voltage transfer circuit selectively electrically conducts the node COM and the sense node SEN with a voltage supply line to which a voltage V$_{DD}$ is applied or a voltage supply line to which a voltage V$_{SRC}$ is applied in accordance with data latched by a latch circuit SDL. The voltage transfer circuit includes a node N1, a charge transistor 46, a charge transistor 49, a charge transistor 47, and a discharge transistor 50. The charge transistor 46 is connected between the node N1 and the sense node SEN. The charge transistor 49 is connected between the node N1 and the node COM. The charge transistor 47 is connected between the node N1 and the voltage supply line to which the voltage V$_{DD}$ is applied. The discharge transistor 50 is connected between the node N1 and the voltage supply line to which the voltage V$_{SRC}$ is applied. The charge transistor 47 and the discharge transistor 50 include gate electrodes connected to a node INV_S of the latch circuit SDL in common.

The sense transistor 41, the switch transistor 42, the discharge transistor 43, the clamp transistor 44, the charge transistor 46, the charge transistor 49, and the discharge transistor 50 are, for example, enhancement type NMOS transistors. The high breakdown voltage transistor 45 is, for example, a depletion type NMOS transistor. The charge transistor 47 is, for example, a PMOS transistor.

The switch transistor 42 includes a gate electrode connected to a signal line STB. The discharge transistor 43 includes a gate electrode connected to a signal line XXL. The clamp transistor 44 includes a gate electrode connected to a signal line BLC. The high breakdown voltage transistor 45 includes a gate electrode connected to a signal line BLS. The charge transistor 46 includes a gate electrode connected to a signal line HLL. The charge transistor 49 includes a gate electrode connected to a signal line BLX. These signal lines STB, XXL, BLC, BLS, HLL, BLX are connected to the sequencer SQC.

The latch circuit SDL includes nodes LAT_S, INV_S, an inverter 51, an inverter 52, a switch transistor 53, and a switch transistor 54. The inverter 51 includes an output terminal connected to the node LAT_S and an input terminal connected to the node INV_S. The inverter 52 includes an input terminal connected to the node LAT_S and an output terminal connected to the node INV_S. The switch transistor 53 is disposed in a current path between the node LAT_S and the wiring LBUS. The switch transistor 54 is disposed in a current path between the node INV_S and the wiring LBUS. The switch transistors 53, 54 are, for example, NMOS transistors. The switch transistor 53 includes a gate electrode connected to the sequencer SQC via a signal line STL. The switch transistor 54 includes a gate electrode connected to the sequencer SQC via a signal line STI.

The latch circuits DL0 to DLn$_L$ are configured almost similarly to the latch circuit SDL. However, as described above, the node INV_S of the latch circuit SDL is conductive to the gate electrodes of the charge transistor 47 and the discharge transistor 50 in the sense amplifier SA. In this respect, the latch circuits DL0 to DLn$_L$ are different from the latch circuit SDL.

The switch transistor DSW is, for example, an NMOS transistor. The switch transistor DSW is connected between the wiring LBUS and the wiring DBUS. The switch transistor DSW includes a gate electrode connected to the sequencer SQC via a signal line DBS.

As illustrated in FIG. 10 as an example, the above-described signal lines STB, HLL, XXL, BLX, BLC, BLS are each connected between all of the sense amplifier units SAU included in the sense amplifier module SAM in common. Additionally, the above-described internal control signal line CLKSA is connected between all of the sense amplifier units SAU included in the sense amplifier module SAM in common. The voltage supply line to which the voltage V$_{DD}$ is applied and the voltage supply line to which the voltage V$_{SRC}$ is applied are each connected between all of the sense amplifier units SAU included in the sense amplifier module SAM in common. The signal line STI and the signal line STL of the latch circuit SDL are each connected between all of the sense amplifier units SAU included in the sense amplifier module SAM in common. Similarly, the signal lines TI0 to TIn$_L$, TL0 to TLn$_L$ corresponding to the signal line STI and the signal line STL in the latch circuits DL0 to DLn$_L$ are each connected between all of the sense amplifier units SAU included in the sense amplifier module SAM in common. Meanwhile, a plurality of the above-described signal lines DBS are disposed corresponding to all of the respective sense amplifier units SAU included in the sense amplifier module SAM.

Figure 30:
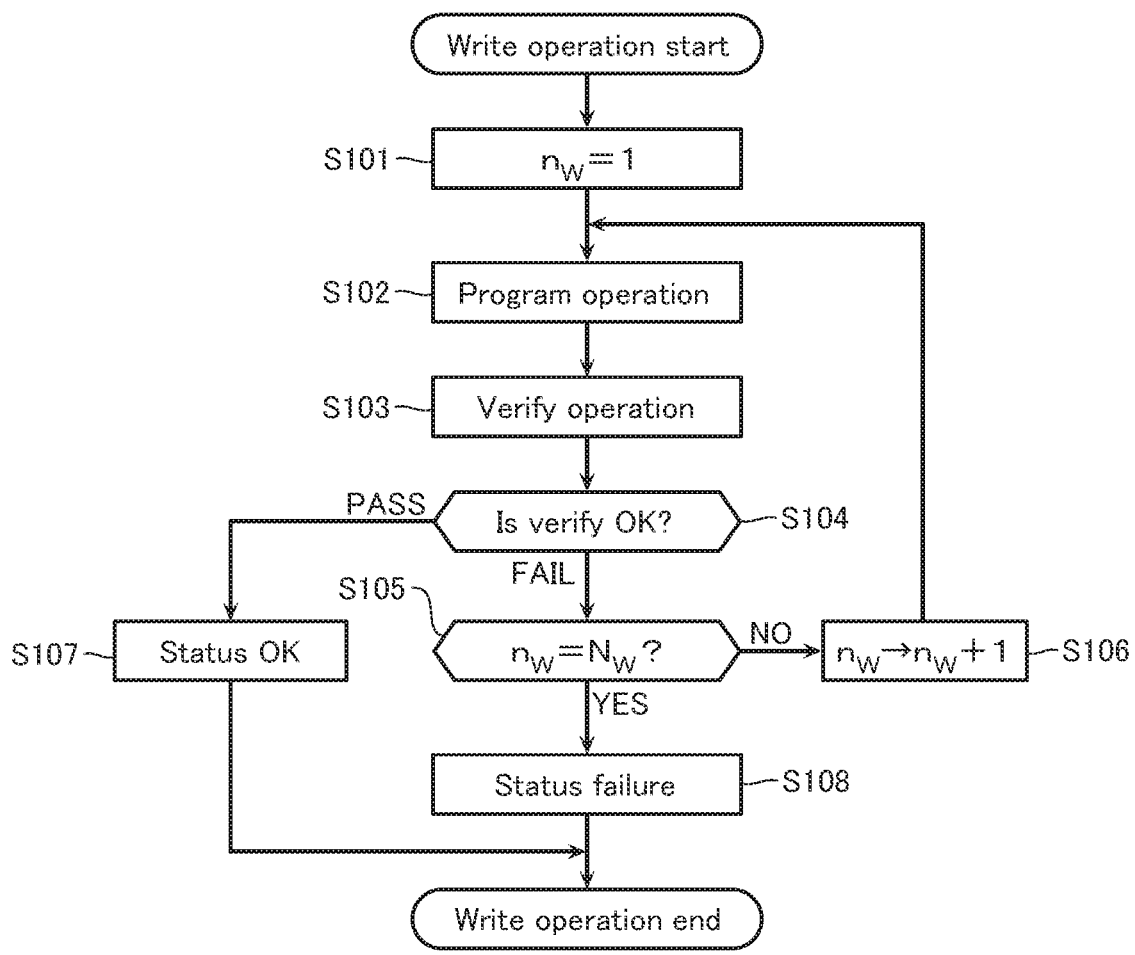
FIG. 30 is a flowchart for describing a write operation of a semiconductor memory device according to a third embodiment.

Two sense amplifier modules SAM(1), SAM(2) of the sense amplifier modules SAM corresponding to the divided ranges DU1, DU2 of the word lines WL are disposed (FIG. 30 described later). The configurations of the two sense amplifier modules SAM(1), SAM(2) are similar to the sense amplifier modules SAM described with reference to FIG. 10 and FIG. 11.

[Configuration of Source Line Driver Circuit SDRV]

The source line driver circuit SDRV (FIG. 28A described later) is a circuit that applies the voltage from the voltage generating circuit VG to the source lines SL1, SL2. The source line driver circuits SDRV are connected to the voltage generating circuit VG via the voltage supply line and connected to the source lines SL1, SL2.

[Circuit Configuration of Cache Memory CM]

The cache memory CM (FIG. 2) includes a plurality of latch circuits. The plurality of latch circuits are connected to the latch circuits in the sense amplifier module SAM via the wiring DBUS. Data DAT included in these plurality of latch circuits is sequentially transferred to the sense amplifier module SAM or the input/output control circuit I/O.

A decode circuit and a switch circuit (not illustrated) are connected to the cache memory CM. The decode circuit decodes a column address CA latched in the address register ADR. The switch circuit electrically conducts the latch circuit corresponding to the column address CA with a bus DB (FIG. 2) in response to the output signal of the decode circuit.

[Circuit Configuration of Sequencer SQC]

The sequencer SQC (FIG. 2) outputs the internal control signal to the row decoder RD, the sense amplifier module SAM, and the voltage generating circuit VG in accordance with command data $D_{CMD}$ latched in a command register CMR. The sequencer SQC outputs status data $D_{ST}$ indicating the state of itself to the status register STR as necessary.

The sequencer SQC generates a ready/busy signal and outputs it to a terminal RY//BY. In a period (busy period) in which the terminal RY//BY is in the "L" state, an access to the memory die MD is basically inhibited. In a period (ready period) in which the terminal RY//BY is in the "H" state, the access to the memory die MD is permitted.

[Circuit Configuration of Input/Output Control Circuit I/O]

The input/output control circuit I/O includes data signal input/output terminals DQ0 to DQ7, toggle signal input/output terminals DQS, /DQS, a plurality of input circuits, a plurality of output circuits, a shift register, and a buffer circuit. The plurality of input circuits, the plurality of output circuits, the shift register, and the buffer circuit are each connected to a terminal to which a power supply voltage $V_{CCQ}$ and the ground voltage $V_{SS}$ are applied.

The data input via the data signal input/output terminals DQ0 to DQ7 is output to the cache memory CM, the address register ADR, or the command register CMR from the buffer circuit in response to the internal control signal from the logic circuit CTR. The data output via the data signal input/output terminals DQ0 to DQ7 is input to the buffer circuit from the cache memory CM or the status register STR in response to the internal control signal from the logic circuit CTR.

The plurality of input circuits include, for example, a comparator connected to any of the data signal input/output terminals DQ0 to DQ7 or both of the toggle signal input/output terminals DQS, /DQS. The plurality of output circuits include, for example, an Off Chip Driver (OCD) circuit connected to any of the data signal input/output terminals DQ0 to DQ7 or any of the toggle signal input/output terminals DQS, /DQS.

[Circuit Configuration of Logic Circuit CTR]

The logic circuit CTR (FIG. 2) receives an external control signal from the controller die CD via external control terminals /CEn, CLE, ALE, /WE, RE, /RE, and outputs the internal control signal to the input/output control circuit I/O in response to the external control signal.

[Structure of Memory Die MD]

Figure 12:
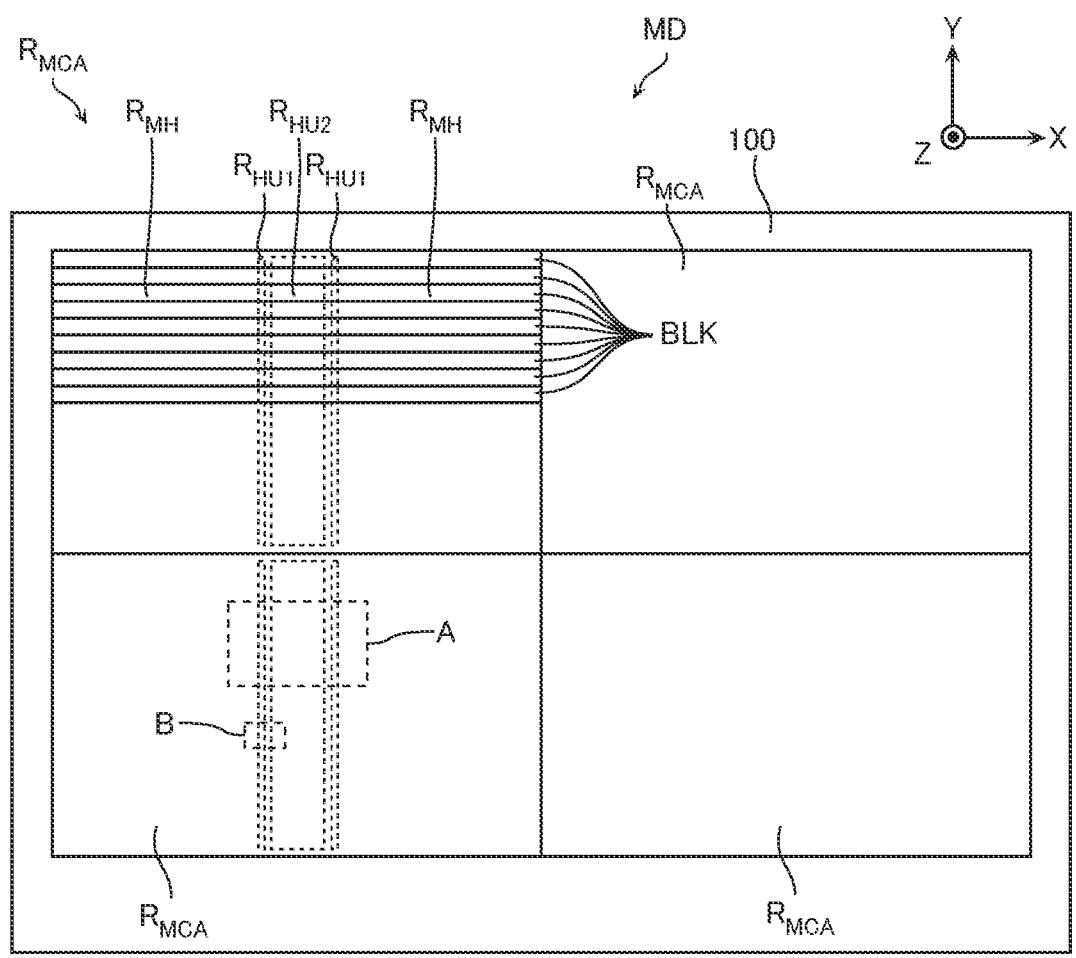
FIG. 12 is a schematic plan view of the memory die MD.
Figure 13:
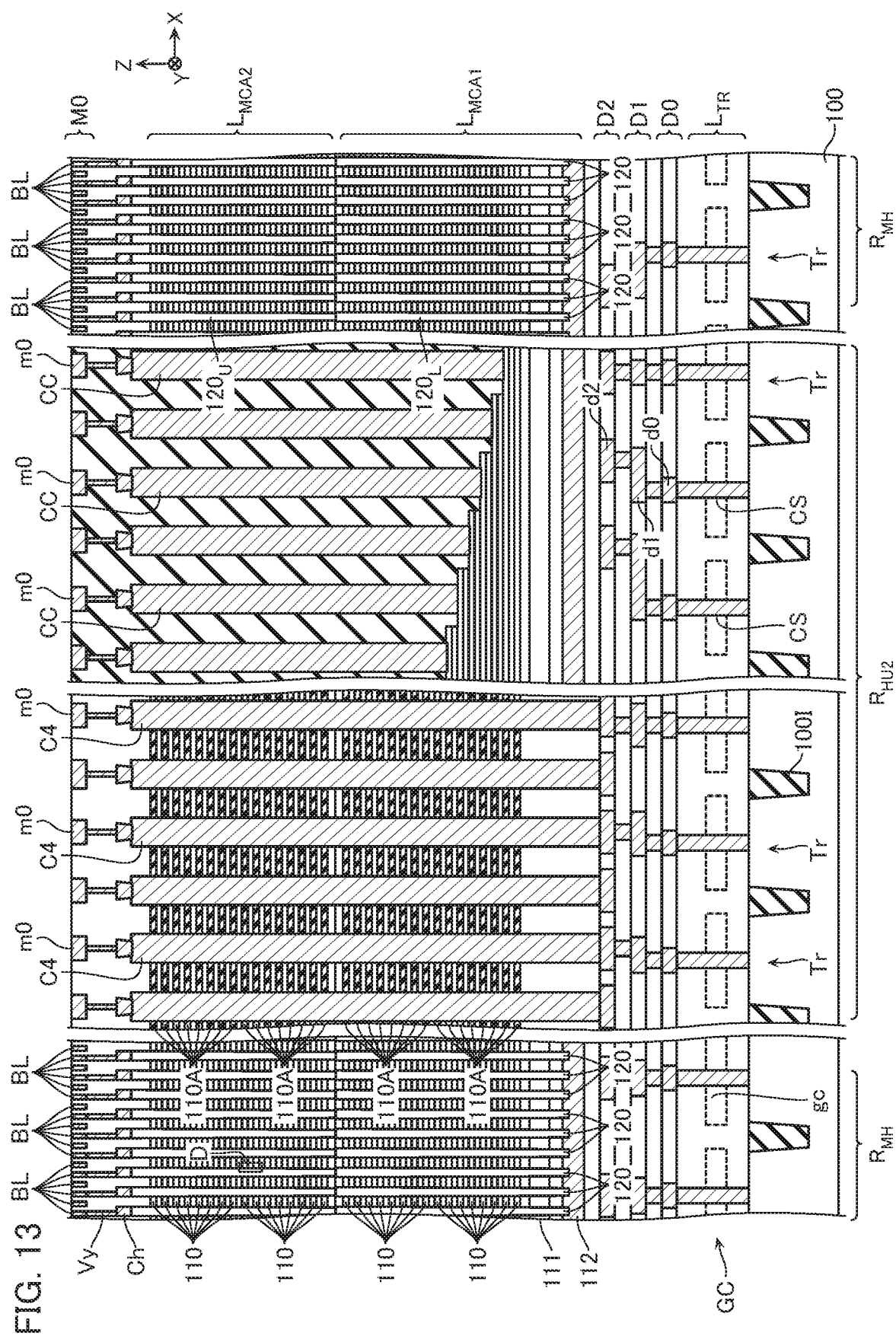
FIG. 13 is a schematic cross-sectional view of the memory die MD.
Figure 14:
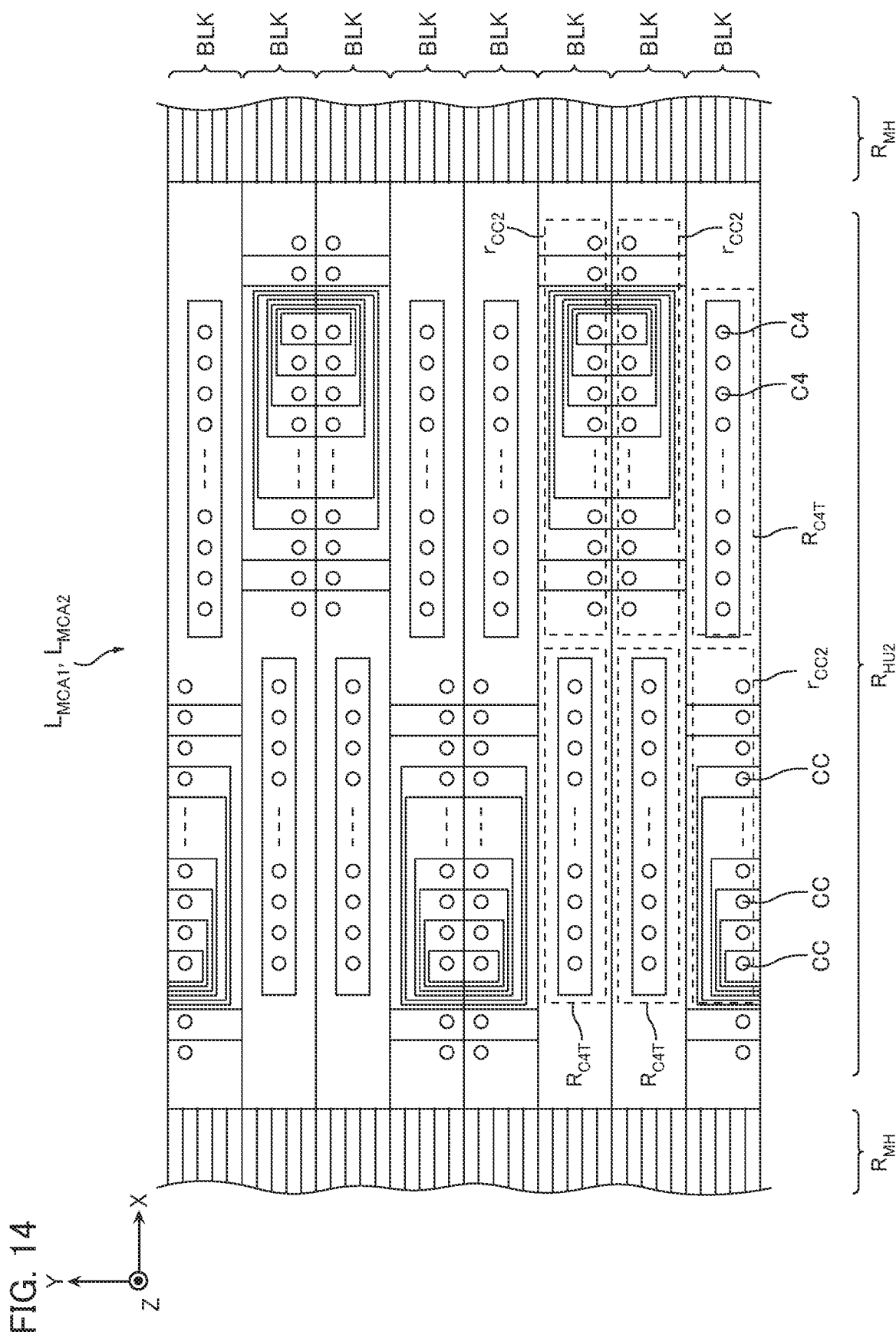
FIG. 14 is a schematic enlarged view of a part indicated by A in FIG. 12.
Figure 17:
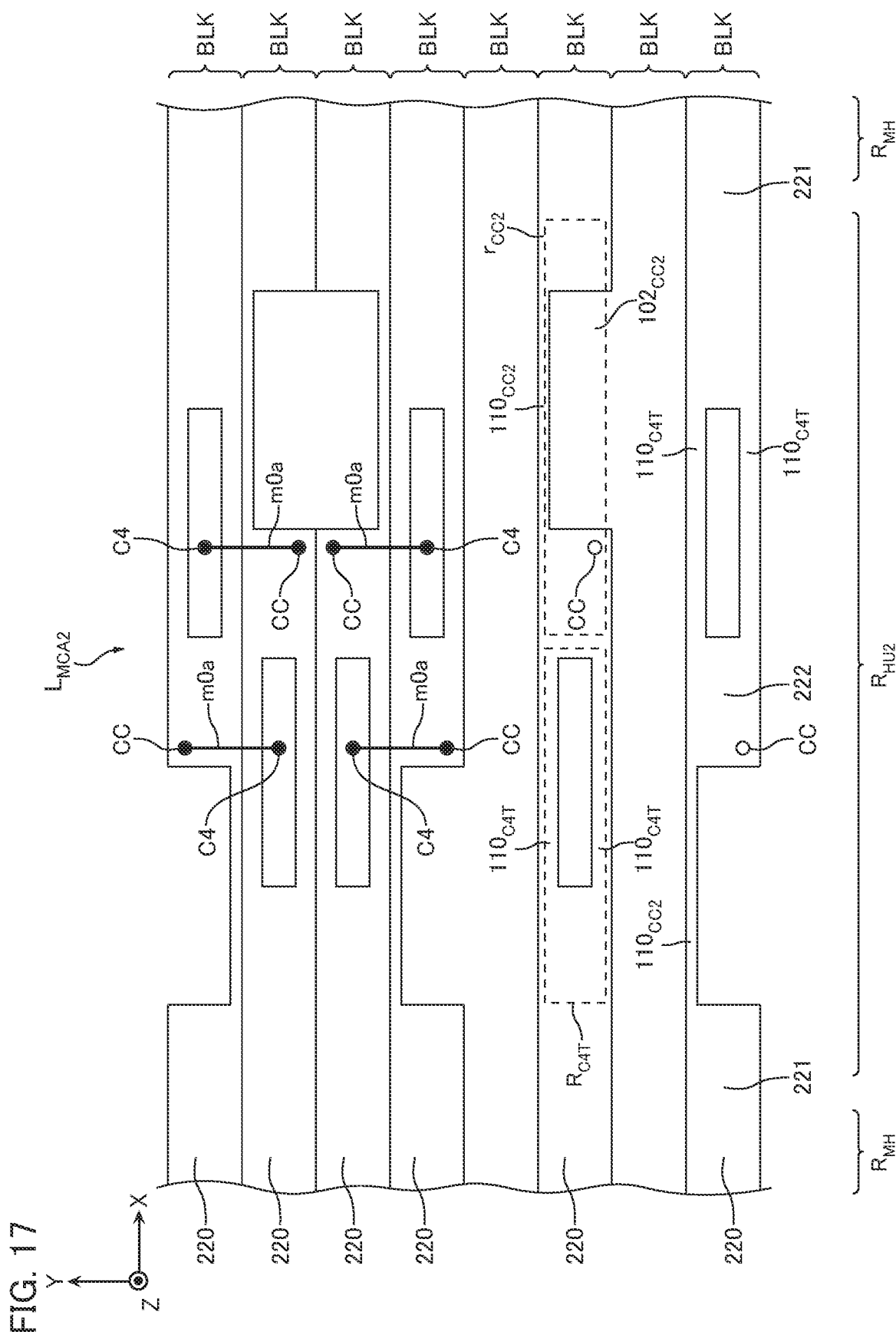
FIG. 17 is a schematic plan view illustrated with a part of a structure illustrated in FIG. 14 omitted.
Figure 18:
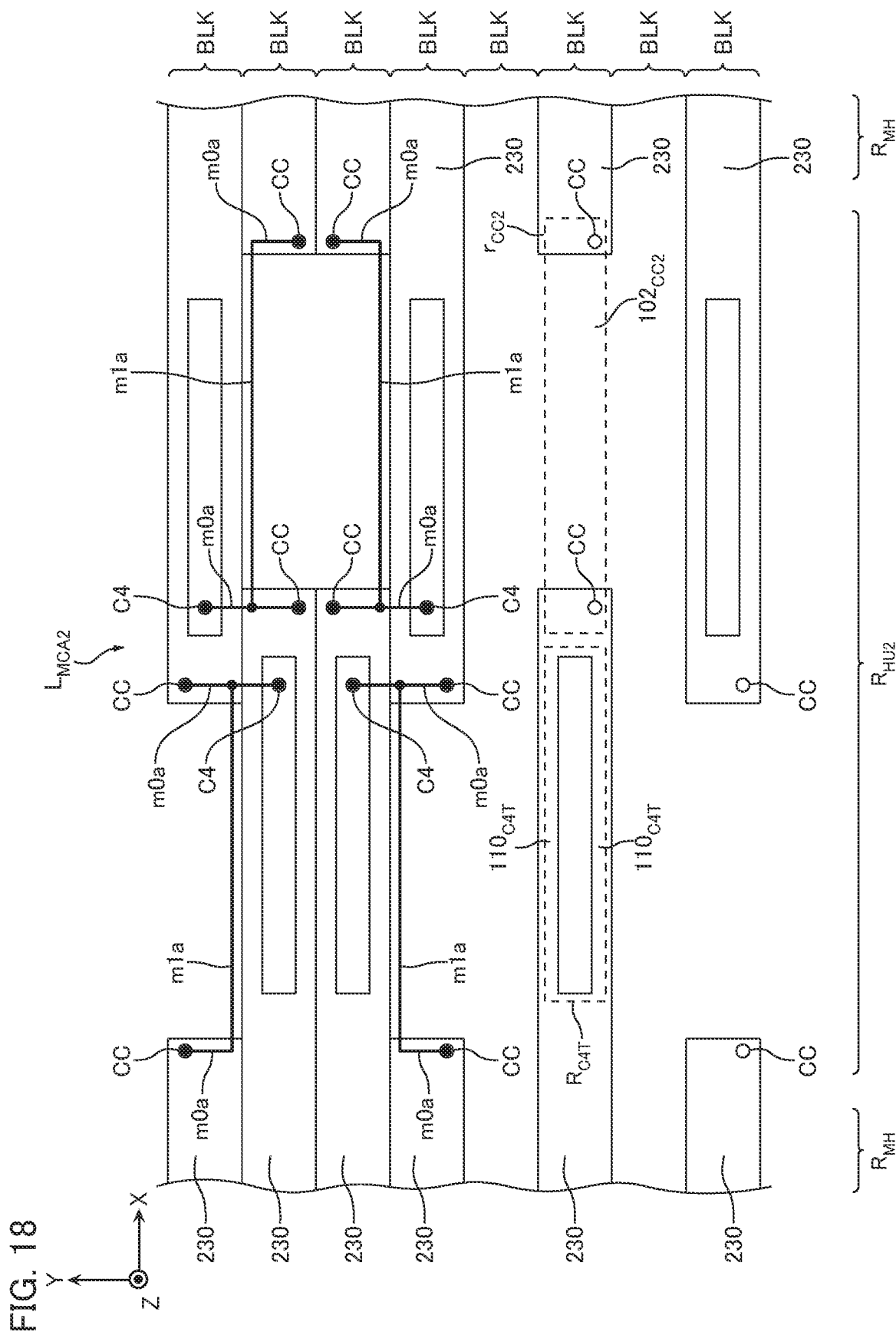
FIG. 18 is a schematic plan view illustrated with a part of a structure illustrated in FIG. 14 omitted.
Figure 19:
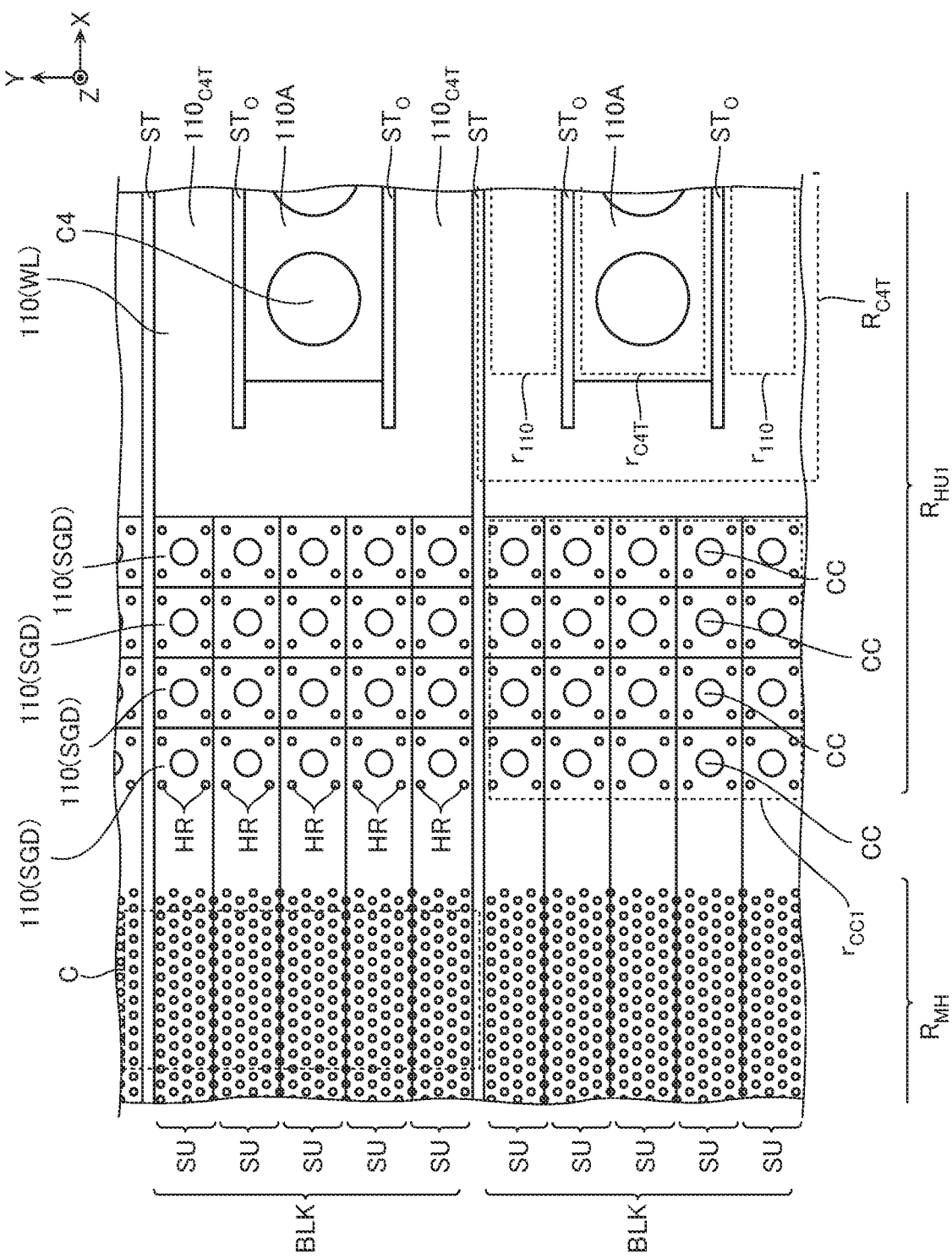
FIG. 19 is a schematic enlarged view of a part indicated by B in FIG. 12.
Figure 20:
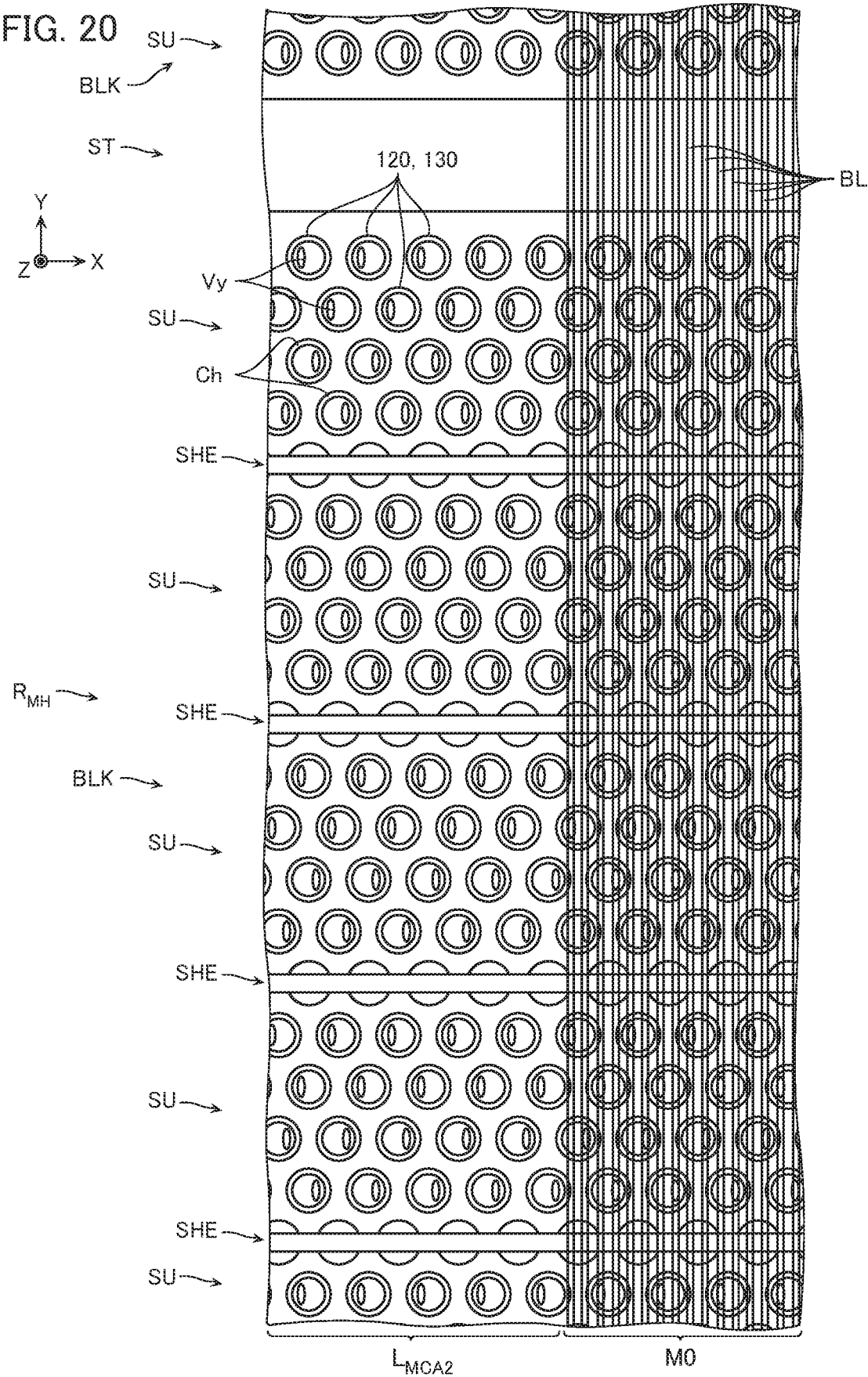
FIG. 20 is a schematic enlarged view of a part indicated by C in FIG. 19.
Figure 21:
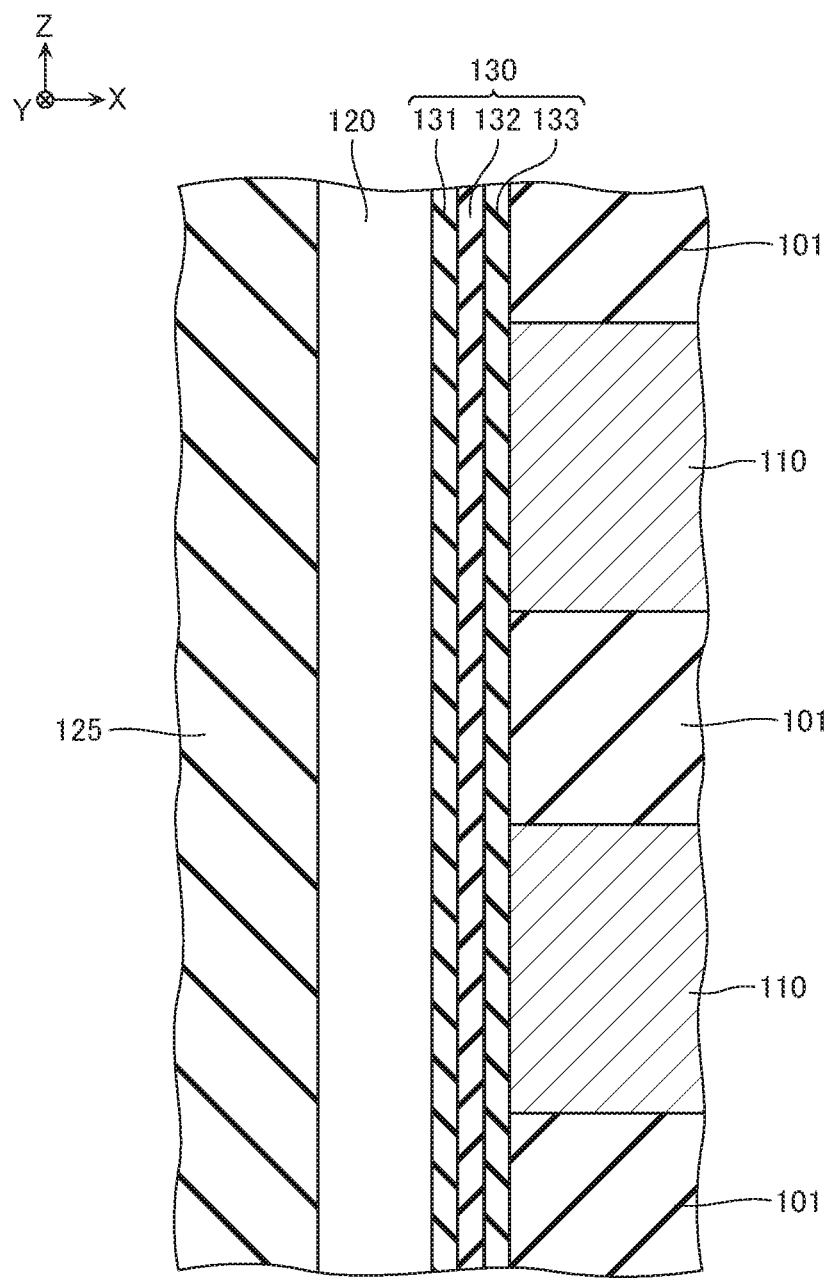
FIG. 21 is a schematic enlarged view of a part indicated by D in FIG. 13.
Figure 22:
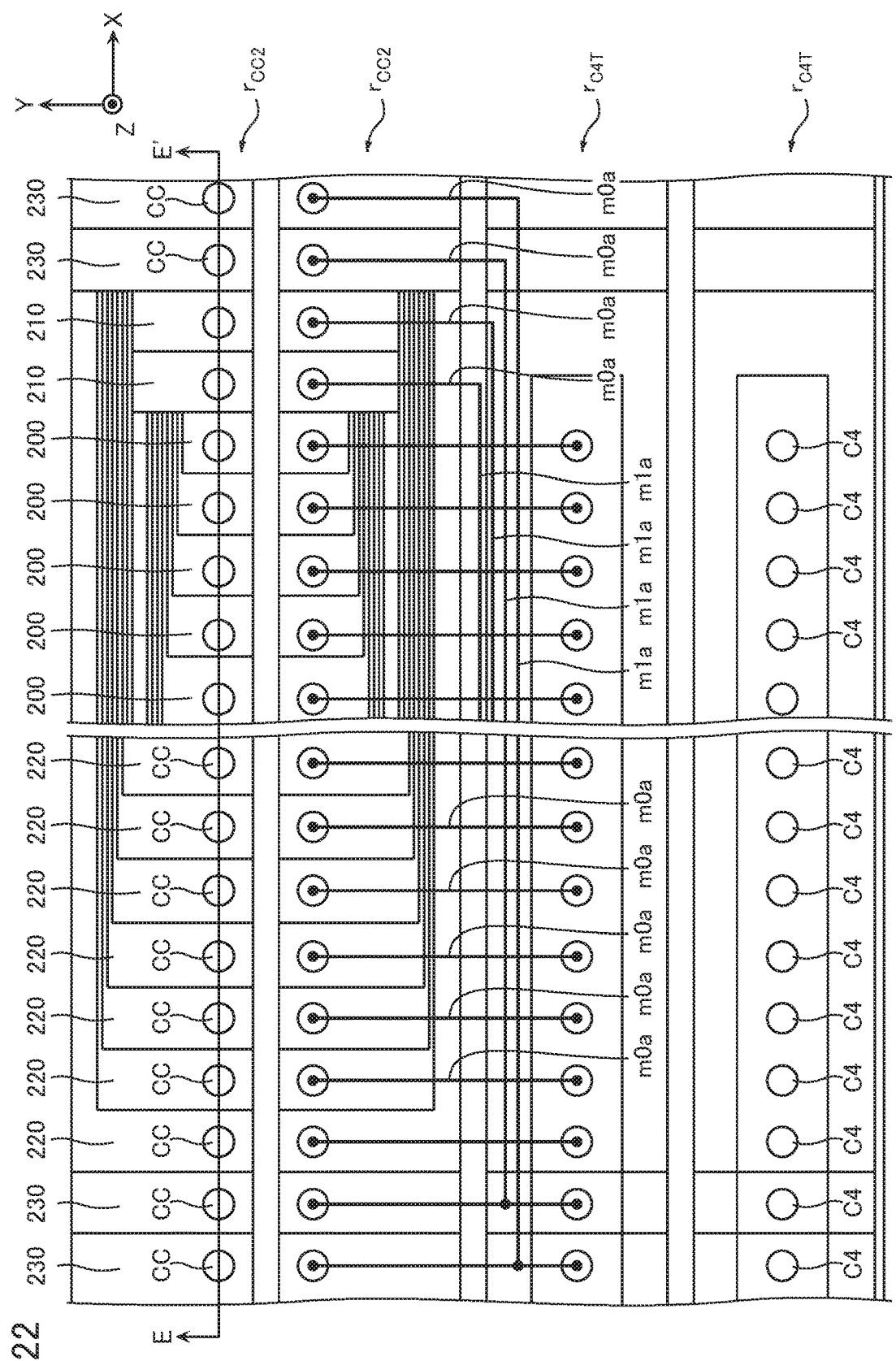
FIG. 22 is a schematic enlarged view of FIG. 14.
Figure 23:
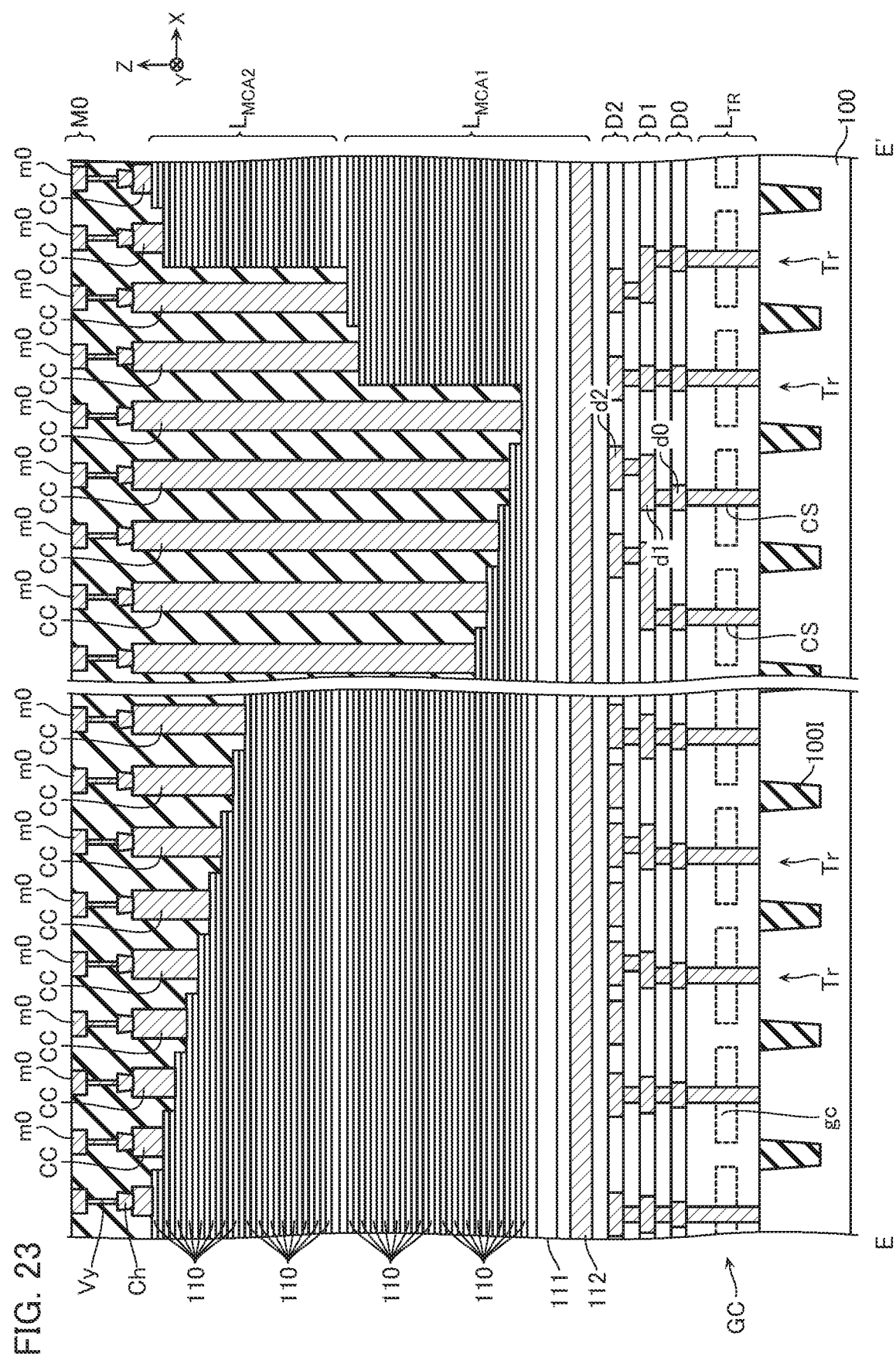
FIG. 23 is a schematic cross-sectional view of a structure illustrated in FIG. 22 taken along the line E-E' and viewed along the arrow direction.

FIG. 12 is a schematic plan view of the memory die MD. FIG. 13 is a schematic cross-sectional view of the memory die MD. FIG. 13 is a drawing for describing the schematic configuration of the memory die MD, and does not indicate the specific number of configurations, shapes, arrangement, or the like of the configuration. FIG. 14 is a schematic enlarged view of a part indicated by A in FIG. 12. However, FIG. 14 omits a part of a configuration (first hook-up region $R_{HU1}$ described later) in FIG. 12. FIG. 15 to FIG. 18 are schematic plan views illustrated with a part of a structure illustrated in FIG. 14 omitted. FIG. 19 is a schematic enlarged view of a part indicated by B in FIG. 12. FIG. 20 is a schematic enlarged view of a part indicated by C in FIG. 19. FIG. 21 is a schematic enlarged view of a part indicated by D in FIG. 13. FIG. 22 is a schematic enlarged view of FIG. 14. FIG. 23 is a schematic cross-sectional view of a structure illustrated in FIG. 22 taken along the line E-E' and viewed along the arrow direction.

Note that FIG. 15 to FIG. 18 illustrate ones (conductive layers 200, conductive layers 210, conductive layers 220, or conductive layers 230) disposed at predetermined height positions among a plurality of conductive layers 110 described in FIG. 14. FIG. 15 to FIG. 18 omit configurations included in the second and fourth memory blocks BLK counted from the Y-direction negative side among the plurality of memory blocks BLK arranged in the Y-direction.

For example, as illustrated in FIG. 12, the memory die MD includes a semiconductor substrate 100. In the illustrated example, the semiconductor substrate 100 includes four memory cell array regions $R_{MCA}$ arranged in the X-direction and the Y-direction. Additionally, the memory cell array region $R_{MCA}$ includes two memory hole regions $R_{MH}$ arranged in the X-direction, the two first hook-up regions $R_{HU1}$ arranged between them in the X-direction, and the second hook-up region $R_{HU2}$ disposed between them.

Note that, for example, the above-described divided range DU1 of the word lines WL is the range of the word lines WL corresponding to the memory hole region $R_{MH}$ at the X-direction negative side among the two memory hole regions $R_{MH}$ arranged in the X-direction. Additionally, for example, the above-described divided range DU2 of the word lines WL is the range of the word lines WL corresponding to the memory hole region $R_{MH}$ at the X-direction positive side among the two memory hole regions $R_{MH}$ arranged in the X-direction.

For example, as illustrated in FIG. 13, the memory die MD includes the semiconductor substrate 100, a transistor layer $L_{TR}$ disposed on the semiconductor substrate 100, a wiring layer D0 disposed above the transistor layer $L_{TR}$, a wiring layer D1 disposed above the wiring layer D0, a wiring layer D2 disposed above the wiring layer D1, a memory cell array layer $L_{MCA1}$ disposed above the wiring layer D2, a memory cell array layer $L_{MCA2}$ disposed above the memory cell array layer $L_{MCA1}$, a wiring layer M0 disposed above the memory cell array layer $L_{MCA2}$, and a wiring layer (not illustrated) disposed above the wiring layer M0.

[Structure of Semiconductor Substrate 100]

For example, the semiconductor substrate 100 is formed of P-type silicon (Si) containing P-type impurities, such as boron (B). On a surface of the semiconductor substrate 100, an N-type well region containing N-type impurities, such as phosphorus (P), a P-type well region containing P-type impurities, such as boron (B), a semiconductor substrate region in which the N-type well region or the P-type well region is not disposed, and an insulating region 100I are disposed.

[Structure of Transistor Layer $L_{TR}$]

For example, as illustrated in FIG. 13, a wiring layer GC is disposed on an upper surface of the semiconductor substrate 100 via an insulating layer (not illustrated). The wiring layer GC includes a plurality of electrodes gc opposed to the surface of the semiconductor substrate 100. The respective regions of the semiconductor substrate 100 and the plurality of electrodes gc included in the wiring layer GC are each connected to a contact CS.

The respective N-type well region, P-type well region, and semiconductor substrate region of the semiconductor substrate 100 function as channel regions of the plurality of transistors Tr, one of electrodes of a plurality of capacitors, and the like constituting the peripheral circuit PC.

The respective plurality of electrodes gc included in the wiring layer GC function as the gate electrodes of the plurality of transistors Tr, the other electrodes of the plurality of capacitors, and the like constituting the peripheral circuit PC.

The contact CS extends in the Z-direction and is connected to the semiconductor substrate 100 or the upper surface of the electrode gc at a lower end. In a connection part between the contact CS and the semiconductor substrate 100, an impurity region containing N-type impurities or P-type impurities is disposed. For example, the contact CS may include a stacked film of a barrier conductive film, such as titanium nitride (TiN), and a metal film, such as tungsten (W), or the like.

[Structures of Wiring Layers D0, D1, D2]

For example, as illustrated in FIG. 13, a plurality of wirings included in the wiring layers D0, D1, D2 are electrically connected to at least one of the configurations in the memory cell array MCA or the configurations in the peripheral circuit PC.

The wiring layers D0, D1, D2 include a plurality of wirings d0, d1, d2, respectively. For example, these plurality of wirings d0, d1, d2 may include a stacked film of a barrier conductive film, such as titanium nitride (TiN), and a metal film, such as tungsten (W), or the like.

[Structures in Memory Hole Region $R_{MH}$ of Memory Cell Array Layers $L_{MCA1}$, $L_{MCA2}$]

For example, as illustrated in FIG. 14, in the memory cell array layers $L_{MCA1}$, $L_{MCA2}$, the plurality of memory blocks BLK arranged in the Y-direction are disposed. For example, as illustrated in FIG. 19, the memory block BLK includes the plurality of string units SU arranged in the Y-direction. Between the two memory blocks BLK adjacent in the Y-direction, an inter-block insulating layer ST, such as silicon oxide ($SiO_2$), is disposed. For example, as illustrated in FIG. 20, between the two string units SU adjacent in the Y-direction, an inter-string unit insulating layer SHE, such as silicon oxide ($SiO_2$), is disposed.

For example, as illustrated in FIG. 13, the memory block BLK includes the plurality of conductive layers 110 arranged in the Z-direction and a plurality of semiconductor layers 120 extending in the Z-direction. Additionally, for example, as illustrated in FIG. 21, the memory block BLK includes a respective plurality of gate insulating films 130 disposed between the plurality of conductive layers 110 and the plurality of semiconductor layers 120.

The conductive layer 110 is an approximately plate-shaped conductive layer extending in the X-direction. The conductive layer 110 may include a stacked film of a barrier conductive film, such as titanium nitride (TiN), and a metal film, such as tungsten (W) and molybdenum (Mo), or the like. Additionally, the conductive layer 110 may contain, for example, polycrystalline silicon containing impurities, such as phosphorus (P) or boron (B). Between the plurality of conductive layers 110 arranged in the Z-direction, an insulating layer 101 (FIG. 21), such as silicon oxide ($SiO_2$), is disposed.

For example, as illustrated in FIG. 13, a conductive layer 111 is disposed below the conductive layer 110. The conductive layer 111 may contain, for example, polycrystalline silicon containing impurities, such as phosphorus (P) or boron (B). Additionally, between the conductive layer 111 and the conductive layer 110, an insulating layer, such as silicon oxide ($SiO_2$), is disposed.

A conductive layer 112 is disposed below the conductive layer 111. The conductive layer 112 may contain, for example, polycrystalline silicon containing impurities, such as phosphorus (P) or boron (B). The conductive layer 112, for example, may contain metal, such as tungsten (W), and any conductive layer including a conductive layer, such as tungsten silicide. Between the conductive layer 112 and the conductive layer 111, an insulating layer, such as silicon oxide ($SiO_2$), is disposed.

The conductive layer 112 functions as the source line SL (FIG. 3). The conductive layer 112 is disposed in the memory cell array layer $L_{MCA1}$. The conductive layer 112 is, for example, disposed in common in the memory hole region $R_{MH}$ corresponding to the divided range DU1 and disposed in common in the memory hole region $R_{MH}$ corresponding to the divided range DU2 among the two memory hole regions $R_{MH}$ included in the memory cell array region $R_{MCA}$ (FIG. 12).

The conductive layer 111 functions as the source-side select gate line SGSb (FIG. 3) and the gate electrodes of the plurality of source-side select transistors STSb connected to the source-side select gate line SGSb. The conductive layer 111 is disposed in the memory cell array layer $L_{MCA1}$, and extends in the X-direction across the two memory hole regions $R_{MH}$ arranged in the X-direction, the two first hook-up regions $R_{HU1}$ disposed between the two memory hole regions $R_{MH}$ arranged in the X-direction, and the second hook-up region $R_{HU2}$ disposed between the two memory hole regions $R_{MH}$ arranged in the X-direction. The conductive layer 111 is electrically independent in every memory block BLK.

Among the plurality of conductive layers 110, one or a plurality of conductive layers 110 positioned at the lower-most layer function as the source-side select gate line SGS (FIG. 3) and gate electrodes of the plurality of source-side select transistors STS connected to the source-side select gate line SGS. These conductive layers 110 are disposed in the memory cell array layer $L_{MCA1}$, and extends in the X-direction across the two memory hole regions Ru arranged in the X-direction, the two first hook-up regions $R_{HU1}$ disposed between them, and the second hook-up region $R_{HU2}$ disposed between them. These plurality of conductive layers 110 are electrically independent in every memory block BLK.

Figure 15:
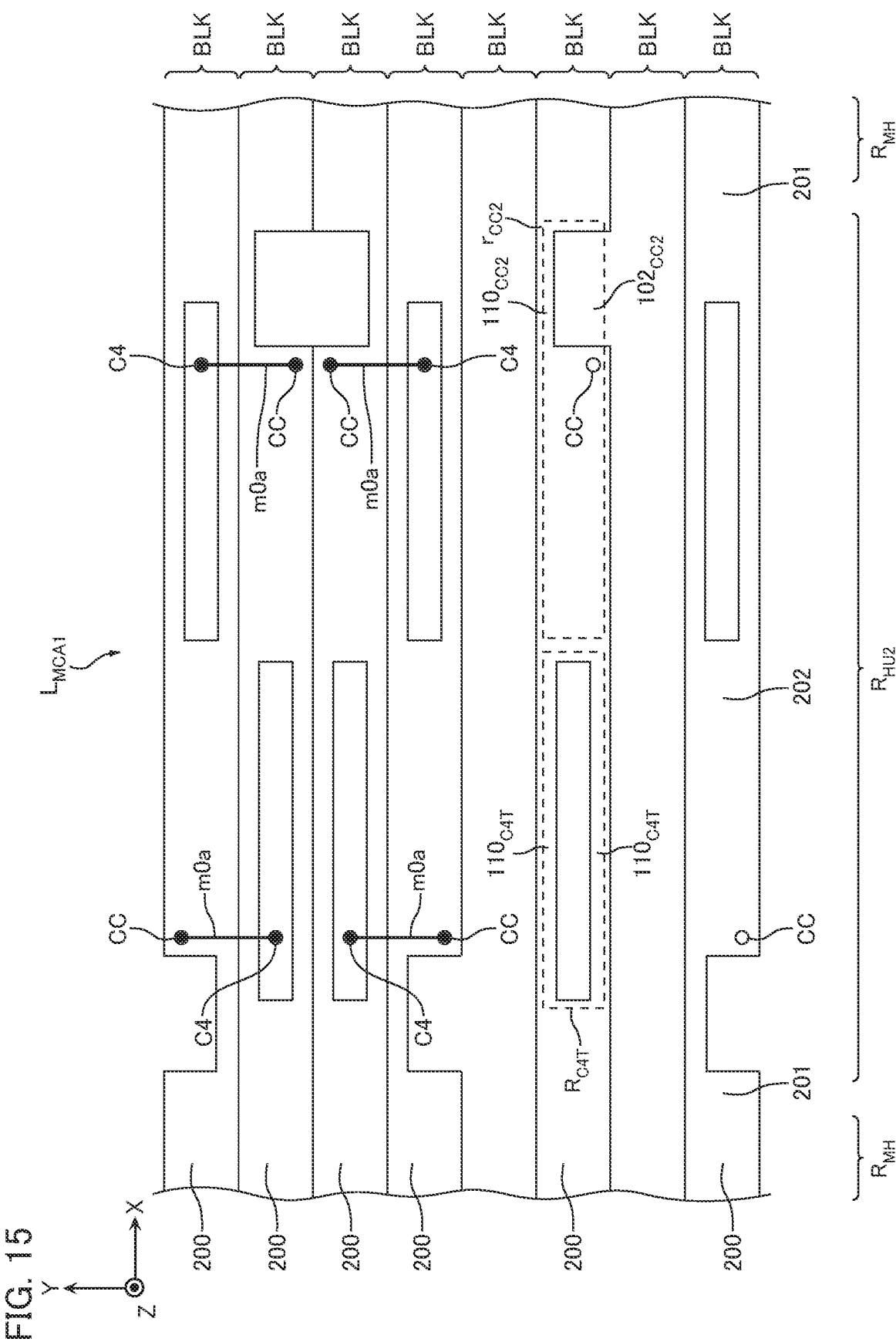
FIG. 15 is a schematic plan view illustrated with a part of a structure illustrated in FIG. 14 omitted.

A plurality of conductive layers 110 positioned above these conductive layers 110 function as a part of the word lines WL (FIG. 3) and the gate electrodes of the plurality of memory cells MC (FIG. 3) connected to the part of the word lines WL. For example, as illustrated in FIG. 15 as an example, these plurality of conductive layers 110 are disposed in the memory cell array layer $L_{MCA1}$, and extends in the X-direction across the two memory hole regions $R_{MH}$ arranged in the X-direction, the two first hook-up regions $R_{HU1}$ (omitted in FIG. 15, see FIG. 12) disposed between them, and the second hook-up region $R_{HU2}$ disposed between them. These plurality of conductive layers 110 include two parts 201 disposed in the two memory hole regions $R_{MH}$ and a part 202 connected to both of these two parts 201. The two parts 201 are electrically connected via the part 202. These plurality of conductive layers 110 are electrically independent in every memory block BLK. In the following description, the conductive layer 110 may be referred to as a conductive layer 200.

Figure 16:
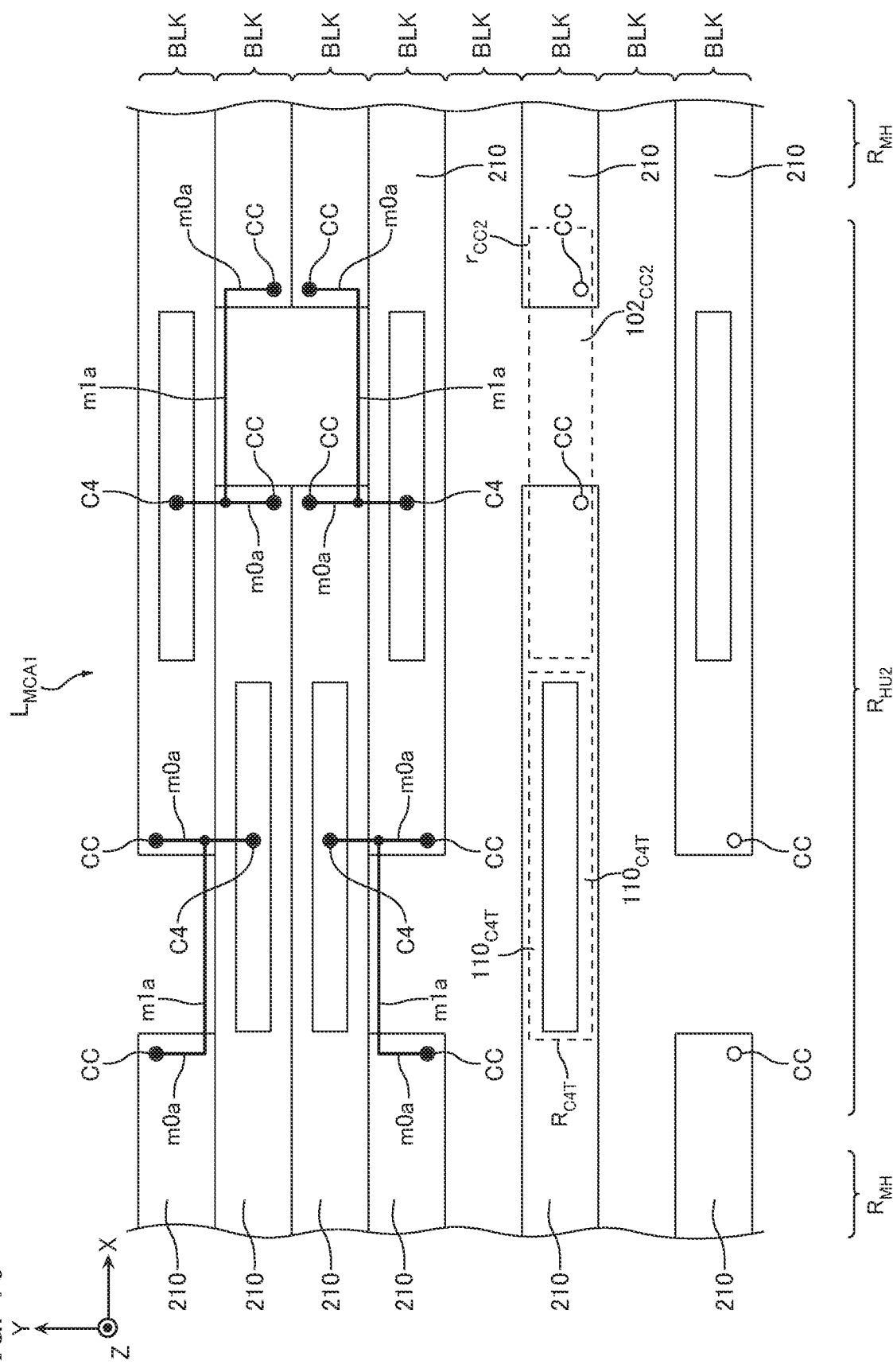
FIG. 16 is a schematic plan view illustrated with a part of a structure illustrated in FIG. 14 omitted.

Additionally, above these conductive layers 110, a pair of sets of the conductive layers 110 arranged in the X-direction are stacked in the Z-direction. The sets of these plurality of conductive layers 110 function as a part of the word lines WL (FIG. 3) and gate electrodes of the plurality of memory cells MC (FIG. 3) connected to the part of the word lines WL. The sets of these plurality of conductive layers 110 are disposed in the memory cell array layer $L_{MCA1}$. For example, as illustrated in FIG. 16 as an example, these two respective conductive layers 110 extend in the X-direction across one or the other memory hole region $R_{MH}$, one or the other first hook-up region $R_{HU1}$ (omitted in FIG. 16, see FIG. 12), and a part of the second hook-up region $R_{HU2}$. These two conductive layers 110 are electrically connected via the contact CC and the wiring. Additionally, these plurality of conductive layers 110 are electrically independent in every memory block BLK. In the following description, the conductive layer 110 may be referred to as the conductive layer 210.

Additionally, the plurality of conductive layers 110 positioned above these conductive layers 110 function as a part of the word lines WL (FIG. 3) and gate electrodes of the plurality of memory cells MC (FIG. 3) connected to the part of the word lines WL. For example, as illustrated in FIG. 17 as an example, the plurality of conductive layers 110 are disposed in the memory cell array layer $L_{MCA2}$, and extend in the X-direction across the two memory hole regions $R_{MH}$ arranged in the X-direction, the two first hook-up regions $R_{HU1}$ (omitted in FIG. 17, see FIG. 12) disposed between them, and the second hook-up region $R_{HU2}$ disposed between them. These plurality of conductive layers 110 include two parts 221 disposed in the two memory hole regions $R_{MH}$ and a part 222 connected to both of these two parts 221. The two parts 221 are electrically connected via the part 222. These plurality of conductive layers 110 are electrically independent in every memory block BLK. In the following description, the conductive layer 110 may be referred to as the conductive layer 220.

Additionally, above these conductive layers 110, a pair of sets of the conductive layers 110 arranged in the X-direction are stacked in the Z-direction. The sets of these plurality of conductive layers 110 function as a part of the word lines WL (FIG. 3) and gate electrodes of the plurality of memory cells MC (FIG. 3) connected to the part of the word lines WL. The sets of these plurality of conductive layers 110 are disposed in the memory cell array layer $L_{MCA2}$. For example, as illustrated in FIG. 18 as an example, these two respective conductive layers 110 extend in the X-direction across one or the other memory hole region $R_{MH}$, one or the other first hook-up region $R_{HU1}$ (omitted in FIG. 18, see FIG. 12), and a part of the second hook-up region $R_{HU2}$. These two conductive layers 110 are electrically connected via the contact CC and the wiring. Additionally, these plurality of conductive layers 110 are electrically independent in every memory block BLK. In the following description, the conductive layer 110 may be referred to as the conductive layer 230.

One or a plurality of conductive layers 110 positioned above these conductive layers 110 are disposed in the memory cell array layer $L_{MCA2}$ and function as the drain-side select gate line SGD and gate electrodes of the plurality of drain-side select transistors STD (FIG. 3) connected to the drain-side select gate line SGD. These plurality of conductive layers 110 have widths in the Y-direction smaller than widths of the other conductive layers 110, for example, as illustrated in FIG. 19. Between the two conductive layers 110 adjacent in the Y-direction, the inter-string unit insulating layer SHE is disposed, for example, as illustrated in FIG. 20. These plurality of conductive layers 110 are electrically independent in every string unit SU.

For example, as illustrated in FIG. 20, the semiconductor layers 120 are arranged in a predetermined pattern in the X-direction and the Y-direction. The semiconductor layers 120 each function as channel regions of the plurality of memory cells MC and the select transistors (STD, STS, STSb) included in one memory string MS (FIG. 3). The semiconductor layer 120 includes, for example, polycrystalline silicon (Si). The semiconductor layer 120 has, for example, an approximately cylindrical shape and includes an insulating layer 125 (FIG. 21), such as silicon oxide, at its center part.

For example, as illustrated in FIG. 13, the semiconductor layer 120 includes a semiconductor region $120_L$ included in the memory cell array layer $L_{MCA1}$ and a semiconductor region $120_U$ included in the memory cell array layer $L_{MCA2}$. The semiconductor layer 120 has a lower end connected to the conductive layer 112. The semiconductor layer 120 has an upper end connected to the bit line BL via contacts Ch, Vy.

The semiconductor region $120_L$ is a substantially cylindrically-shaped region extending in the Z-direction. Outer peripheral surfaces of the semiconductor regions $120_L$ are each surrounded by the plurality of conductive layers 110 and the conductive layer 111 included in the memory cell array layer $L_{MCA1}$ and opposed to these plurality of conductive layers 110 and the conductive layer 111. Note that the diameter of the lower end portion of the semiconductor region $120_L$ (for example, a part positioned below the plurality of conductive layers 110 and the conductive layer 111 included in the memory cell array layer $L_{MCA1}$) is smaller than a diameter of the upper end portion of the semiconductor region $120_L$ (for example, a part positioned above the plurality of conductive layers 110 included in memory cell array layer $L_{MCA1}$).

The semiconductor region $120_U$ is a substantially cylindrically-shaped region extending in the Z-direction. Outer peripheral surfaces of the semiconductor regions $120_U$ are each surrounded by the plurality of conductive layers 110 included in the memory cell array layer $L_{MCA2}$ and opposed to these plurality of conductive layers 110. Note that the diameter of the lower end portion of the semiconductor region $120_U$ (for example, a part positioned below the plurality of conductive layers 110 included in the memory cell array layer $L_{MCA2}$) is smaller than a diameter of the upper end portion of the semiconductor region $120_U$ (for example, a part positioned above the plurality of conductive layers 110 included in memory cell array layer $L_{MCA2}$) and a diameter of the upper end portion of the semiconductor region $120_L$.

The gate insulating film 130 (FIG. 21) has an approximately cylindrical shape that covers the outer peripheral surface of the semiconductor layer 120. The gate insulating film 130 includes a tunnel insulating film 131, an electric charge accumulating film 132, and a block insulating film 133, which are stacked between the semiconductor layer 120 and the conductive layers 110. The tunnel insulating film 131 and the block insulating film 133 are insulating films of, for example, silicon oxide ($SiO_2$) or silicon oxynitride (SiON). The electric charge accumulating film 132 is a film, for example, silicon nitride ($Si_3N_4$) that can accumulate an electric charge. The tunnel insulating film 131, the electric charge accumulating film 132, and the block insulating film 133, which have approximately cylindrical shapes, extend in the Z-direction along the outer peripheral surface of the semiconductor layer 120 excluding the contact portion of the semiconductor layer 120 and the conductive layer 112.

Note that FIG. 21 illustrates an example of the gate insulating film 130 including the electric charge accumulating film 132, such as silicon nitride. However, the gate insulating film 130, for example, may include a floating gate, such as polycrystalline silicon, containing N-type or P-type impurities.

[Structure in First Hook-Up Region $R_{HU1}$ of Memory Cell Array Layers $L_{MCA1}$, $L_{MCA2}$]

As illustrated in FIG. 19, in the first hook-up region $R_{HU1}$, contact connection sub-regions $r_{CC1}$ each disposed corresponding to the memory block BLK is disposed. Contact connection sub-regions $R_{C4T}$ are disposed in regions corresponding to a part of the memory blocks BLK.

In the contact connection sub-region $r_{CC1}$, the end portions in the X-direction of the plurality of conductive layers 110 functioning as the drain-side select gate lines SGD are disposed. Additionally, in the contact connection sub-region $r_{CC1}$, a plurality of the contacts CC arranged in a matrix viewed from the Z-direction are disposed. These plurality of contacts CC extend in the Z-direction, and have lower ends connected to the conductive layers 110. The contacts CC may, for example, include a stacked film of a barrier conductive film, such as titanium nitride (TiN), and a metal film, such as tungsten (W), or the like.

Among the plurality of contacts CC arranged in the X-direction, the contact CC closest to the memory hole region $R_{MH}$ is connected to the first conductive layer 110 counted from above. Further, the contact CC second closest to the memory hole region $R_{MH}$ is connected to the second conductive layer 110 counted from above. Hereinafter, similarly, the contact CC a-th (a is a natural number) closest to the memory hole region $R_{MH}$ is connected to the a-th conductive layer 110 counted from above. These plurality of contacts CC are connected to drain electrodes of the transistors Tr via wirings m0 or the like in the wiring layer M0 or the like, contacts C4, the wirings d0, d1, d2 in the wiring layers D0, D1, D2, and the contacts CS.

Supporting structures HR disposed near the contacts CC are disposed in the first hook-up region $R_{HU1}$. For example, the supporting structure HR extends in the Z-direction and is connected to the conductive layer 112 at the lower end. The supporting structure HR contains, for example, silicon oxide ($SiO_2$).

The contact connection region $R_{C4T}$ includes two insulating layers $ST_O$ arranged in the Y-direction between the two inter-block insulating layers ST arranged in the Y-direction. Between these two insulating layers $ST_O$, a contact connection sub-region $r_{C4T}$ is disposed. Between the inter-block insulating layer ST and the insulating layer $ST_O$, a conductive layer connection sub-region $r_{110}$ is disposed. These regions extend in the X-direction along the inter-block insulating layer ST.

The insulating layer $ST_O$ extends in the Z-direction, and is connected to the conductive layer 112 (FIG. 13) at the lower end. The insulating layer $ST_O$ contains silicon oxide ($SiO_2$) or the like.

For example, as illustrated in FIG. 13, the contact connection sub-region $r_{C4T}$ includes a plurality of insulating layers 110A arranged in the Z-direction and a plurality of the contacts C4 extending in the Z-direction.

The insulating layer 110A is an approximately plate-shaped insulating layer extending in the X-direction. The insulating layer 110A may include an insulating layer of silicon nitride (SiN) or the like. Between the plurality of insulating layers 110A arranged in the Z-direction, insulating layers of silicon oxide ($SiO_2$) or the like are disposed.

A plurality of the contacts C4 are arranged in the X-direction. The contact C4 may include a stacked film of a barrier conductive film, such as titanium nitride (TiN), and a metal film, such as tungsten (W), or the like. For example, as illustrated in FIG. 13, the outer peripheral surfaces of the contacts C4 are each surrounded by the insulating layers 110A and the insulating layers 101, and connected to these insulating layers 110A and insulating layers 101. The contact C4 extends in the Z-direction, is connected to the wiring m0 in the wiring layer M0 at the upper end, and is connected to the wiring d2 in the wiring layer D2 at the lower end.

For example, as illustrated in FIG. 19, the conductive layer connection sub-region $r_{110}$ includes narrow-width portions $110_{C4T}$ of the plurality of conductive layers 110 arranged in the Z-direction.

[Structure of Memory Cell Array Layers $L_{MCA1}$, $L_{MCA2}$ in Second Hook-Up Region $R_{HU2}$]

As illustrated in FIG. 14, in the second hook-up region $R_{HU2}$, a plurality of contact connection sub-regions $r_{CC2}$ and a plurality of the contact connection regions $R_{C4T}$ are disposed corresponding to the plurality of memory blocks BLK.

The contact connection sub-region $r_{CC2}$ includes parts of the plurality of conductive layers 110 functioning as the word lines WL or the source-side select gate lines SGS. The contact connection sub-region $r_{CC2}$ includes the plurality of contacts CC arranged in the X-direction viewed from Z-direction. As illustrated in FIG. 23, these respective plurality of contacts CC are connected to the conductive layers 110. Additionally, as illustrated in FIG. 22, these plurality of contacts CC are connected to drain electrodes of the transistors Tr via wirings m0 or the like in the wiring layer M0 or the like, contacts C4, the wirings d0, d1, d2 in the wiring layers D0, D1, D2, and the contacts CS.

As illustrated in FIG. 15, the part 202 of the conductive layer 200 includes a narrow-width portion $110_{CC2}$ disposed in the contact connection sub-region $r_{CC2}$. Additionally, an opening $102_{CC2}$ is disposed in a region adjacent to the narrow-width portion $110_{CC2}$ in the Y-direction. The narrow-width portion $110_{CC2}$ electrically conducts the two parts 201 adjacent in the X-direction together with the narrow-width portion $110_{C4T}$ in the contact connection region $R_{C4T}$. To the conductive layer 200, one contact CC is connected. In the opening $102_{CC2}$, the contact CC connected to the conductive layer 110 disposed below further is disposed.

Additionally, as illustrated in FIG. 16, between the two conductive layers 210 arranged in the X-direction, the narrow-width portion $110_{CC2}$ as illustrated in FIG. 15 as an example is not disposed. The contacts CC are connected to these two respective conductive layers 210. The opening $102_{CC2}$ is disposed between these two conductive layers 210. In the opening $102_{CC2}$, the contact CC connected to the conductive layer 110 disposed below further is disposed.

As illustrated in FIG. 17, the part 222 of the conductive layer 220 includes the narrow-width portion $110_{CC2}$ disposed in the contact connection sub-region $r_{CC2}$. Additionally, the opening $102_{CC2}$ is disposed in a region adjacent to the narrow-width portion $110_{CC2}$ in the Y-direction. The narrow-width portion $110_{CC2}$ electrically conducts the two parts 221 adjacent in the X-direction together with the narrow-width portion $110_{C4T}$ in the contact connection region $R_{C4T}$. To the conductive layer 220, one contact CC is connected. In the opening $102_{CC2}$, the contact CC connected to the conductive layer 110 disposed below further is disposed.

Additionally, as illustrated in FIG. 18, between the two conductive layers 230 arranged in the X-direction, the narrow-width portion $110_{CC2}$ as illustrated in FIG. 17 as an example is not disposed. The contacts CC are connected to these two respective conductive layers 230. The opening $102_{CC2}$ is disposed between these two conductive layers 230. In the opening $102_{CC2}$, the contact CC connected to the conductive layer 110 disposed below further is disposed.

[Structure of Wiring Layer M0 or the Like]

For example, as illustrated in FIG. 13, the plurality of wirings included in the wiring layer M0 are electrically connected to at least one of the configurations in the memory cell array layers $L_{MCA1}$, $L_{MCA2}$ or the configurations in the transistor layer $L_{TR}$.

The wiring layers M0 include a plurality of the wirings m0. These plurality of wirings m0 may include, for example, a stacked film of a barrier conductive film, such as titanium nitride (TiN), and a metal film, such as copper (Cu), or the like.

Parts of the plurality of wirings m0 function as the bit lines BL (FIG. 3). For example, as illustrated in FIG. 20, the bit lines BL extend in the X-direction and the Y-direction. These plurality of bit lines BL are each connected to one semiconductor layer 120 included in each string unit SU.

Additionally, parts of the plurality of wirings m0 function as wirings m0a illustrated in FIG. 15 to FIG. 18 as an example. The wiring m0a is a wiring disposed in a current path between the above-described contact CC and contact C4 and extends in the Y-direction.

As described above, the wiring layer is further disposed above the wiring layer M0. Each of these wiring layers includes a plurality of wirings. These plurality of wirings, for example, may include, for example, a stacked film of a barrier conductive film, such as titanium nitride (TiN) and tantalum nitride (TaN), and a metal film, such as copper (Cu), or the like.

Parts of these plurality of wirings function as wirings m1a illustrated in FIG. 16 and FIG. 18 as an example. The wiring m1a is a wiring disposed in a current path between the above-described contact CC and contact C4 and extends in the X-direction.

[Threshold Voltage of Memory Cell MC]

Next, with reference to FIG. 24A to FIG. 24C, the threshold voltage of the memory cell will be described.

Figure 24:
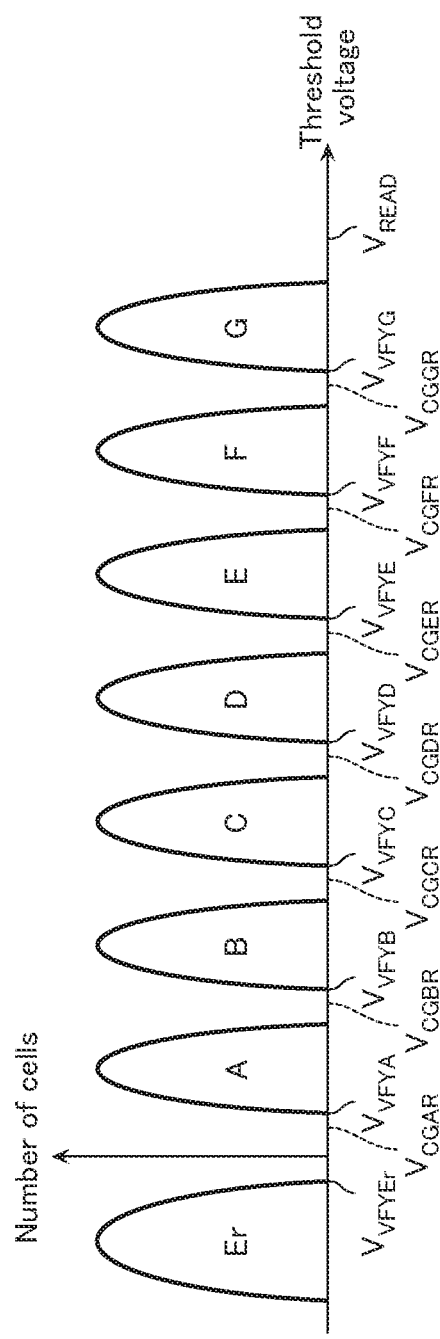
FIG. 24A is a schematic histogram for describing a threshold voltage of a memory cell MC storing 3-bit data.
FIG. 24B is a table showing an example of a relation between the threshold voltage of the memory cell MC storing the 3-bit data and the stored data.
FIG. 24C is a table showing an example of another relation between the threshold voltage of the memory cell MC storing the 3-bit data and the stored data.

FIG. 24A is a schematic histogram for describing the threshold voltage of the memory cell MC storing 3-bit data. The horizontal axis plots the voltage of the word line WL, and the vertical axis plots the number of the memory cells MC. FIG. 24B is a table showing an example of a relation between the threshold voltage of the memory cell MC storing the 3-bit data and the stored data. FIG. 24C is a table showing an example of another relation between the threshold voltage of the memory cell MC storing the 3-bit data and the stored data.

In the example of FIG. 24A, the threshold voltages of the memory cells MC are controlled in eight states. The threshold voltage of the memory cell MC controlled in a state Er is smaller than an erase verify voltage $V_{VFYEr}$. For example, the threshold voltage of the memory cell MC controlled in a state A is larger than a verify voltage $V_{VFYA}$ and smaller than a verify voltage $V_{VFYB}$. For example, the threshold voltage of the memory cell MC controlled in a state B is larger than the verify voltage $V_{VFYB}$ and smaller than a verify voltage $V_{VFYC}$. Hereinafter, similarly, the threshold voltages of the memory cells MC controlled in a state C to a state F are larger than the verify voltage $V_{VFYC}$ to a verify voltage $V_{VFYF}$ and smaller than a verify voltage $V_{VFYD}$ to a verify voltage $V_{VFYG}$, respectively. For example, the threshold voltage of the memory cell MC controlled in a state G is larger than the verify voltage $V_{VFYG}$ and smaller than the read pass voltage $V_{READ}$.

In the example in FIG. 24A, a reading voltage $V_{CGAR}$ is set between a threshold distribution corresponding to the state Er and a threshold distribution corresponding to the state A. A reading voltage $V_{CGBR}$ is set between the threshold distribution corresponding to the state A and a threshold distribution corresponding to the state B. Hereinafter, similarly, a reading voltage $V_{CGBR}$ to a reading voltage $V_{CGGR}$ are set from a voltage between the threshold distribution corresponding to the state B and a threshold distribution corresponding to the state C to a voltage between a threshold distribution corresponding to the state F and a threshold distribution corresponding to the state G, respectively.

For example, the state Er corresponds to the lowest threshold voltage. For example, the memory cell MC in the state Er is the memory cell MC in an erase state. For example, data "111" is assigned to the memory cell MC in the state Er.

The state A corresponds to the threshold voltage higher than the threshold voltage corresponding to the state Er. For example, data "101" is assigned to the memory cell MC in the state A.

The state B corresponds to the threshold voltage higher than the threshold voltage corresponding to the state A. For example, data "001" is assigned to the memory cell MC in the state B.

Hereinafter, similarly, the state C to the state G in the drawing correspond to threshold voltages higher than the threshold voltages corresponding to the state B to the state F. For example, data "011", "010", "110", "100", and "000" are assigned to the memory cells MC in these states.

In the case of the assignment as exemplified in FIG. 24B, the data of a lower bit is distinguishable with one reading voltage $V_{CGDR}$. The data of a middle bit is distinguishable with three reading voltages $V_{CGAR}$, $V_{CGCR}$, $V_{CGFR}$. The data of an upper bit is distinguishable with three reading voltages $V_{CGBR}$, $V_{CGER}$, $V_{CGGR}$.

The number of bits of the data stored in the memory cell MC, the number of states, the assignment of the data to each state, and the like are changeable as necessary.

For example, in the case of the assignment as exemplified in FIG. 24C, the data of a lower bit is distinguishable with one reading voltage $V_{CGDR}$. The data of a middle bit is distinguishable with the two reading voltages $V_{CGBR}$, $V_{CGFR}$. The data of an upper bit is distinguishable with the four reading voltages $V_{CGAR}$, $V_{CGCR}$, $V_{CGER}$, $V_{CGGR}$.

[Read Operation]

Next, the read operation of the semiconductor memory device according to this embodiment will be described.

Figure 25:
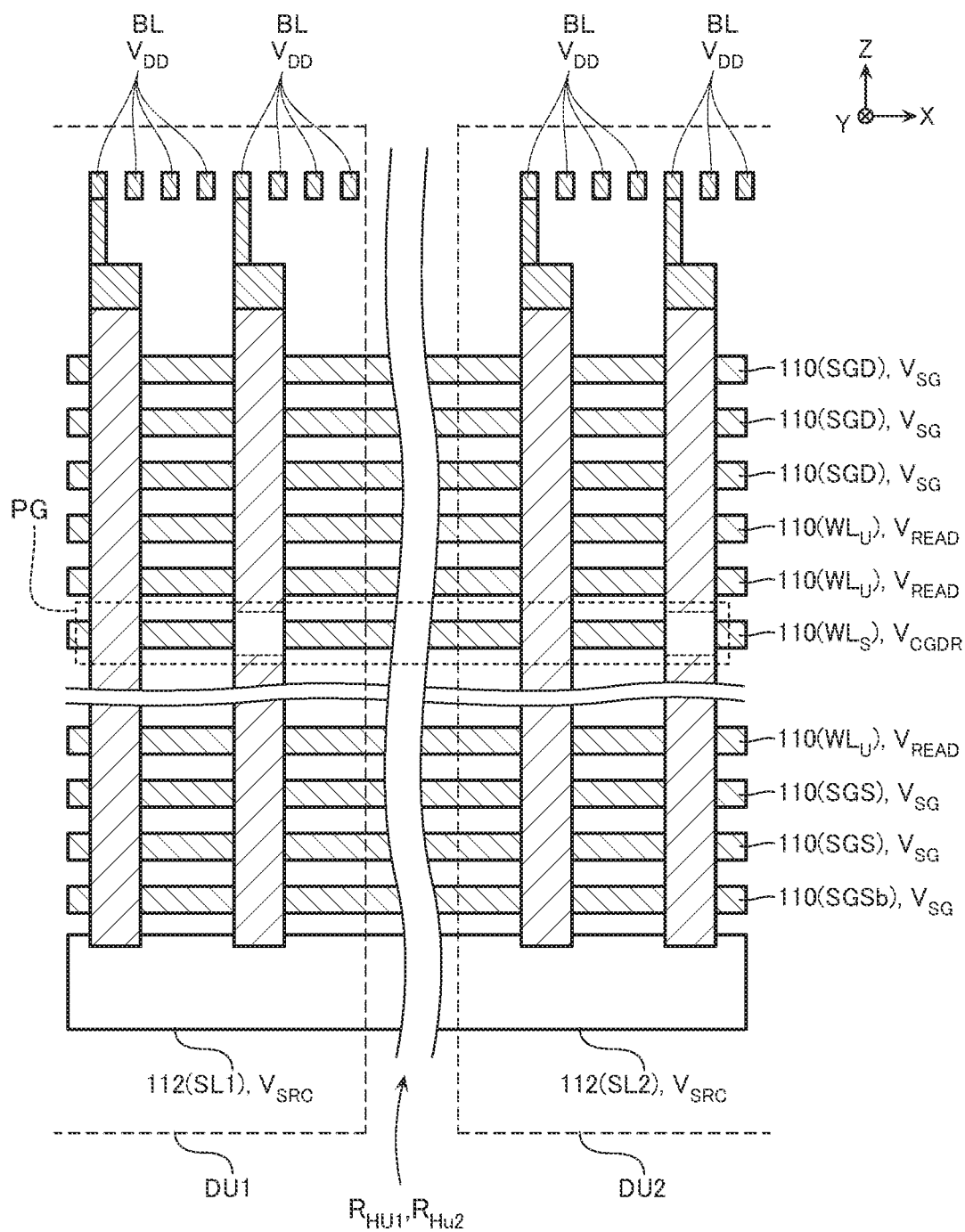
FIG. 25 is a schematic cross-sectional view for describing a read operation.
Figure 26:
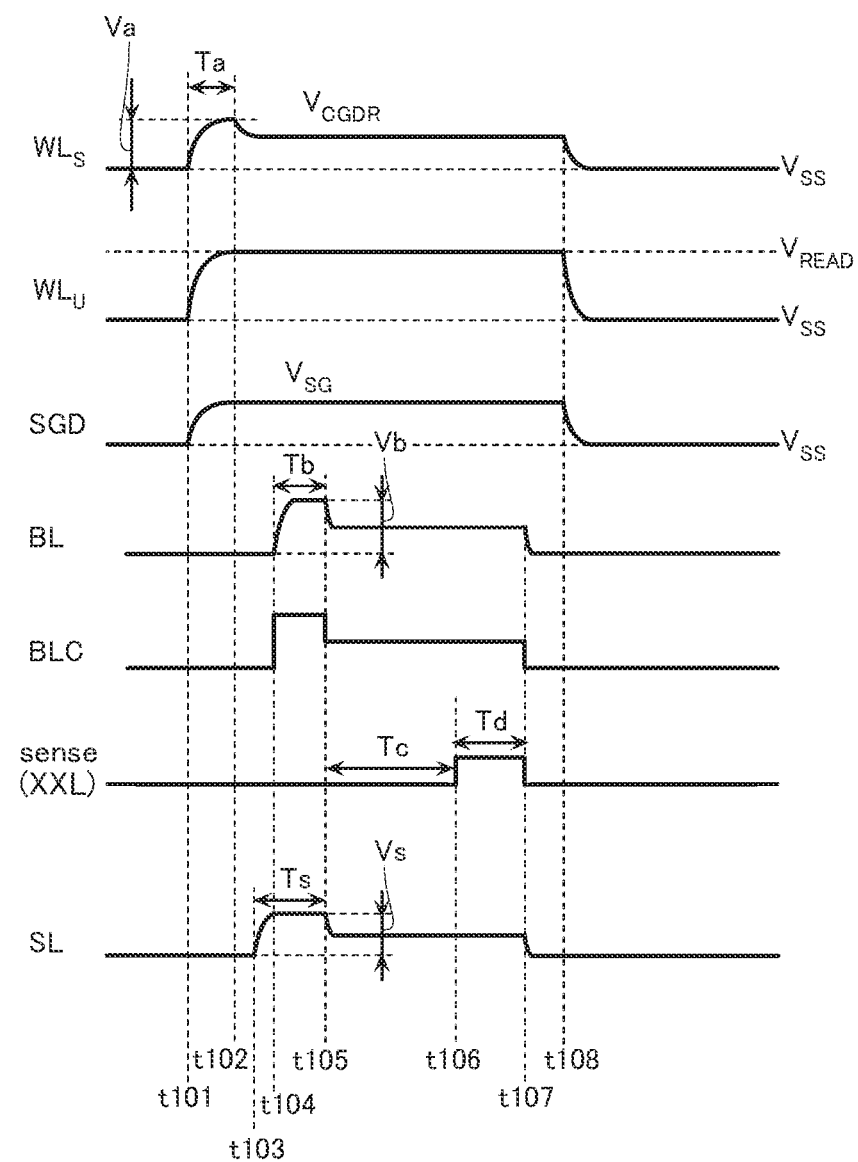
FIG. 26 is a timing chart for describing the read operation.

FIG. 25 is a schematic cross-sectional view for describing the read operation. FIG. 26 is a timing chart for describing the read operation.

In the following description, the word line WL that is a target of the operation may be referred to as a "selected word line $WL_S$" and the word line WL other than the target of the operation may be referred to as an "unselected word line $WL_U$". In the following description, an example where the read operation is performed on the memory cell MC connected to the selected word line $WL_S$ (hereinafter sometimes referred to as a "selected memory cell MC") among the plurality of memory cells MC included in the string unit SU as a target of the operation will be described. In the following description, the configuration including such a plurality of selected memory cells MC may be referred to as a selected page PG.

In FIG. 25, the word lines WL are divided into the divided ranges DU1, DU2. In the example of FIG. 25, the divided range DU1 is the range at the X-direction negative side of the word lines WL and the divided range DU2 is the range at the X-direction positive side of the word lines WL. The source line SL is also divided into the source lines SL1, SL2 corresponding to the divided ranges DU1, DU2.

At timing t101 of the read operation, for example, as illustrated in FIG. 25 and FIG. 26, the read pass voltage $V_{READ}$ is applied to the unselected word line $WL_U$ to set the unselected memory cell MC to the ON state. Further, the reading voltage used for reading (any of the reading voltages $V_{CGAR}$ to $V_{CGGR}$ described with reference to FIG. 24A) or a voltage larger than that is applied to the selected word line $WL_S$. A voltage $V_{SG}$ is applied to the select gate lines (SGD, SGS, SGSb). The voltage $V_{SG}$ has a magnitude enough to form electron channels in the channel regions of the select transistors (STD, STS, STSb), thereby causing the select transistors (STD, STS, STSb) to be in the ON state.

A wait time Ta is provided from timing t101 to timing t102 of the read operation. The wait time Ta is, for example, a wait time for charging the selected word line $WL_S$.

At timing t102 of the read operation, the reading voltage used for reading (any of the reading voltages $V_{CGAR}$ to $V_{CGGR}$ described with reference to FIG. 24A) is applied to the selected word line $WL_S$. Accordingly, for example, as illustrated in FIG. 25, a part of the selected memory cell MC enters the ON state and the remaining selected memory cells MC enters the OFF state.

At timing t103 of the read operation, for example, a voltage Vs is applied to the source lines SL1, SL2 to start charging the source lines SL1, SL2.

At timing t104 of the read operation, for example, the bit lines BL are charged. For example, the latch circuit SDL in FIG. 11 is caused to latch "H" to set states of the signal lines STB, XXL, BLC, BLS, HLL, BLX to "L, L, H, H, H, H". Thus, the voltage $V_{DD}$ is applied to the bit lines BL and the sense node SEN, and charging of them starts.

A wait time Ts is provided from timing t103 to timing t105 of the read operation. The wait time Ts is, for example, a wait time for converging the source line SL.

A wait time Tb is provided from timing t104 to timing t105 of the read operation. The wait time Tb is, for example, a wait time for converging the current of the bit line BL.

At timing t105 of the read operation, for example, the voltage of the signal line BLC is reduced and the voltage $V_{DD}$ is applied to the bit line BL. In this respect, the voltage of the signal line BLC is adjusted to a voltage around which the clamp transistor 44 (FIG. 11) connected to the signal line BLC is maintained in the ON state.

Additionally, at timing t105 of the read operation, for example, the voltage of the source lines SL1, SL2 is reduced and the voltage $V_{SRC}$ is applied to the source lines SL1, SL2. The voltage $V_{SRC}$, for example, has a magnitude similar extent to the ground voltage $V_{SS}$. The voltage $V_{SRC}$ may be, for example, a voltage slightly larger than the ground voltage $V_{SS}$ and sufficiently smaller than the voltage $V_{DD}$.

A wait time Tc is provided from timing t105 to timing t106 of the read operation. The wait time Tc is, for example, a wait time for stabilizing current of the bit line BL. Hereinafter, the wait time Tc is referred to as a "stabilization wait time" in some cases.

At timing t106 of the read operation, the ON state/OFF state of the memory cell MC is detected by the sense amplifier module SAM (FIG. 2), and the data indicating the state of this memory cell MC is obtained.

Hereinafter, the operation is referred to as a sense operation in some cases. In the sense operation, for example, states of the signal lines STB, XXL, BLC, BLS, HLL, BLX (FIG. 11) are set to be "L, H, H, H, L, L". Thus, the electric charge of the sense node SEN connected to the selected memory cell MC in the ON state is discharged via the bit line BL, and the voltage of this sense node decreases. On the other hand, the electric charge of the sense node SEN connected to the selected memory cell MC in the OFF state is maintained, and the voltage of this sense node is maintained.

A wait time Td is provided from timing t106 to timing t107 (FIG. 26) of the read operation. The wait time Td is, for example, a wait time for detecting the state of the memory cell MC. Hereinafter, the wait time Td is referred to as "sense time" in some cases.

The sense operation is terminated at timing t107 of the read operation. For example, the states of the signal lines STB, XXL, BLC, BLS, HLL, BLX (FIG. 11) are set to be "L, L, L, L, L, L". Thus, the sense node SEN is electrically separated from the bit line BL. Additionally, supply of current to the bit line BL is terminated.

Although the illustration is omitted, at a predetermined timing at and after timing t106 of the read operation, the wiring LBUS is charged by the charge transistor 55 (FIG. 11) and after that the signal line STB temporarily enters the "H" state. Here, the sense transistor 41 is in the ON state or the OFF state according to the electric charge of the sense node SEN. Therefore, the voltage from the wiring LBUS enters the "H" state or the "L" state according to the electric charge of the sense node SEN. Afterwards, the data of the wiring LBUS is latched by any of the latch circuit SDL or the latch circuits DL0 to $DLn_L$.

At timing t108 of the read operation, the ground voltage $V_{SS}$ is applied to the selected word line $WL_S$, the unselected word lines $WL_U$, and the select gate lines (SGD, SGS, SGSb).

Note that in FIG. 26, the example in which one reading voltage $V_{CGDR}$ is applied to the selected word line $WL_S$ in the read operation and the sense operation is performed once in the state has been described. The operation is, for example, performed when the data is assigned by the aspect as illustrated in FIG. 24B and the data in the low-order bit is determined.

For example, to determine the data in the middle-order bit, the reading voltage $V_{CGAR}$ is applied to the selected word line $WL_S$ and the sense operation is performed once in the state. Additionally, the reading voltage $V_{CGCR}$ is applied to the selected word line $WL_S$, and the sense operation is performed once in the state. Further, the reading voltage $V_{CGFR}$ is applied to the selected word line $WL_S$, and the sense operation is performed once in the state.

For example, to determine the data in the high-order bit, the reading voltage $V_{CGBR}$ is applied to the selected word line $WL_S$, and the sense operation is performed once in the state. Additionally, the reading voltage $V_{CGER}$ is applied to the selected word line $WL_S$, and the sense operation is performed once in the state. Further, the reading voltage $V_{CGGR}$ is applied to the selected word line $WL_S$, and the sense operation is performed once in the state.

[Variation of Wiring Resistance in Read Operation]

As described with reference to FIG. 15 and FIG. 17, the conductive layers 200, 220, the two parts 201, 221 disposed in the two memory hole regions $R_H$, and the parts 202, 222 connected to both of these two parts 201, 221. The two parts 201, 221 are electrically connected via the parts 202, 222.

As described with reference to FIG. 16 and FIG. 18, the two conductive layers 210 arranged in the X-direction or the two conductive layers 230 arranged in the X-direction are spaced in the X-direction and are electrically connected via the contact CC and the wiring m0a, m1a.

Here, for sake of convenience of manufacturing process, the plurality of conductive layers 110 contain a high heatresistant material, such as tungsten (W) and molybdenum (Mo). On the other hand, the wirings m0a, m1a contain a material having a high conductive property, such as copper (Cu). In the configuration, for example, a wiring resistance between the two parts 201 of the conductive layer 200 and a wiring resistance between the two parts 221 of the conductive layer 220 are larger than a wiring resistance between the two conductive layers 210 arranged in the X-direction and a wiring resistance between the two conductive layers 230 arranged in the X-direction.

Additionally, caused by a difference in, for example, the above-described connection structure and material of the wiring, there may be a case where a peculiar difference occurs between the wiring resistance between the divided range DU1 of the word lines WL and the word line switch WLSW, and a wiring resistance between the divided range DU2 of the word lines WL and the word line switch WLSW.

For example, the third conductive layer 200 counted from the Y-direction negative side illustrated in FIG. 15 is connected to the contact CC at the position at the X-direction positive side of the hook-up region $R_{HU2}$. Additionally, the narrow-width portion $110_{C4T}$ of the conductive layer 200 is disposed at the X-direction negative side of the hook-up region $R_{HU2}$. Further, the narrow-width portion $110_{CC2}$ of the conductive layer 200 is disposed at the X-direction positive side of the hook-up region $R_{HU2}$. In this case, when the wiring resistance between the divided range (for example, the divided range DU1) at the X-direction negative side of the conductive layer 200 (word line WL) and the word line switch WLSW is assumed to be a wiring resistance $R_W(1)$, and a wiring resistance between the divided range (for example, the divided range DU2) at the X-direction positive side of the conductive layer 200 (word line WL) and the word line switch WLSW is assumed to be a wiring resistance $R_W(2)$, resistance values of the wiring resistance $R_W(1)$ and the wiring resistance $R_W(2)$ are approximately the same magnitude. For example, the wiring resistances $R_W(1)$, $R_W(2)$ correspond to wiring resistances $R_{W135(1)}$, $R_{W135(2)}$ of a word line WL135 in FIG. 27 and FIG. 28A described later, respectively.

For example, the first conductive layer 220 counted from the Y-direction negative side illustrated in FIG. 17 is connected to the contact CC at the center position in the X-direction of the hook-up region $R_{HU2}$. The narrow-width portion $110_{CC2}$ of the conductive layer 220 is disposed at the X-direction negative side of the hook-up region $R_{HU2}$. The narrow-width portion $110_{C4T}$ of the conductive layer 220 is disposed at the X-direction positive side of the hook-up region $R_{HU2}$. Then, a width of the conductive layer 220 of the narrow-width portion $110_{CC2}$ is narrower than that of the narrow-width portion $110_{MC}$. The narrow-width portion $110_{CC2}$ is longer than the narrow-width portion $110_{C4T}$. In this case, when the wiring resistance between the divided range (for example, the divided range DU1) at the X-direction negative side of the conductive layer 220 (word line WL) and the word line switch WLSW is assumed to be a wiring resistance $R_W(11)$, and a wiring resistance between the divided range (for example, the divided range DU2) at the X-direction positive side of the conductive layer 220 (word line WL) and the word line switch WLSW is assumed to be a wiring resistance $R_W(12)$, a resistance value of the wiring resistance $R_W(11)$ is larger than a resistance value of the wiring resistance $R_W(12)$. Note that a difference in the resistance value between the wiring resistances $R_W(11)$ and $R_W(12)$ is large. For example, the wiring resistances $R_W(11)$, $R_W(12)$ correspond to wiring resistances $R_{W156(1)}$, $R_{W156(2)}$ of the word line WL156 in FIG. 27 and FIG. 28A described later, respectively.

Note that the narrow-width portion $110_{CC2}$ in FIG. 17 is referred to as a third range and the narrow-width portion $110_{C4T}$ in FIG. 17 is referred to as a fourth range in some cases.

For example, the fourth conductive layer 230 counted from the Y-direction positive side illustrated in FIG. 18 is connected to the two contacts CC at the position at the X-direction negative side and at the center position of the hook-up region $R_{HU2}$. The two contacts CC are connected to the contact C4 via the wirings m0a of the wiring layer M0. In this case, when the wiring resistance between the divided range (for example, the divided range DU1) at the X-direction negative side of the conductive layer 230 (word line WL) and the word line switch WLSW is assumed to be a wiring resistance $R_W(21)$, and a wiring resistance between the divided range (for example, the divided range DU2) at the X-direction positive side of the conductive layer 230 (word line WL) and the word line switch WLSW is assumed to be a wiring resistance $R_W(22)$, a resistance value of the wiring resistance $R_W(21)$ is smaller than a resistance value of the wiring resistance $R_W(22)$. Note that a difference in the resistance value between the wiring resistances $R_W(21)$ and $R_W(22)$ is large. For example, the wiring resistances $R_W(21)$, $R_W(22)$ correspond to wiring resistances $R_{W157(1)}$, $R_{W157(2)}$ of a word line WL157 in FIG. 27 and FIG. 28A described later, respectively.

Thus, when the difference in the wiring resistance $R_W$ occurs between the divided range DU1 and the word line switch WLSW and the divided range DU2 and the word line switch WLSW, in the read operation, for example, there may be a case where the selected memory cell MC that should be determined to be in the OFF state is determined to be in the ON state.

[Adjustment of Operation Parameters]
[Adjustment of Operation Parameters of Selected Word Line $WL_S$]

The operation parameters of the selected word line $WL_S$ in the read operation include the wait time Ta in FIG. 26 and a voltage Va applied to the selected word line $WL_S$ from timing t101 to timing t102 in FIG. 26. The voltage Va has a magnitude equal to or more than the reading voltage (the reading voltage $V_{CGDR}$ in the example of FIG. 26).

Figure 27:
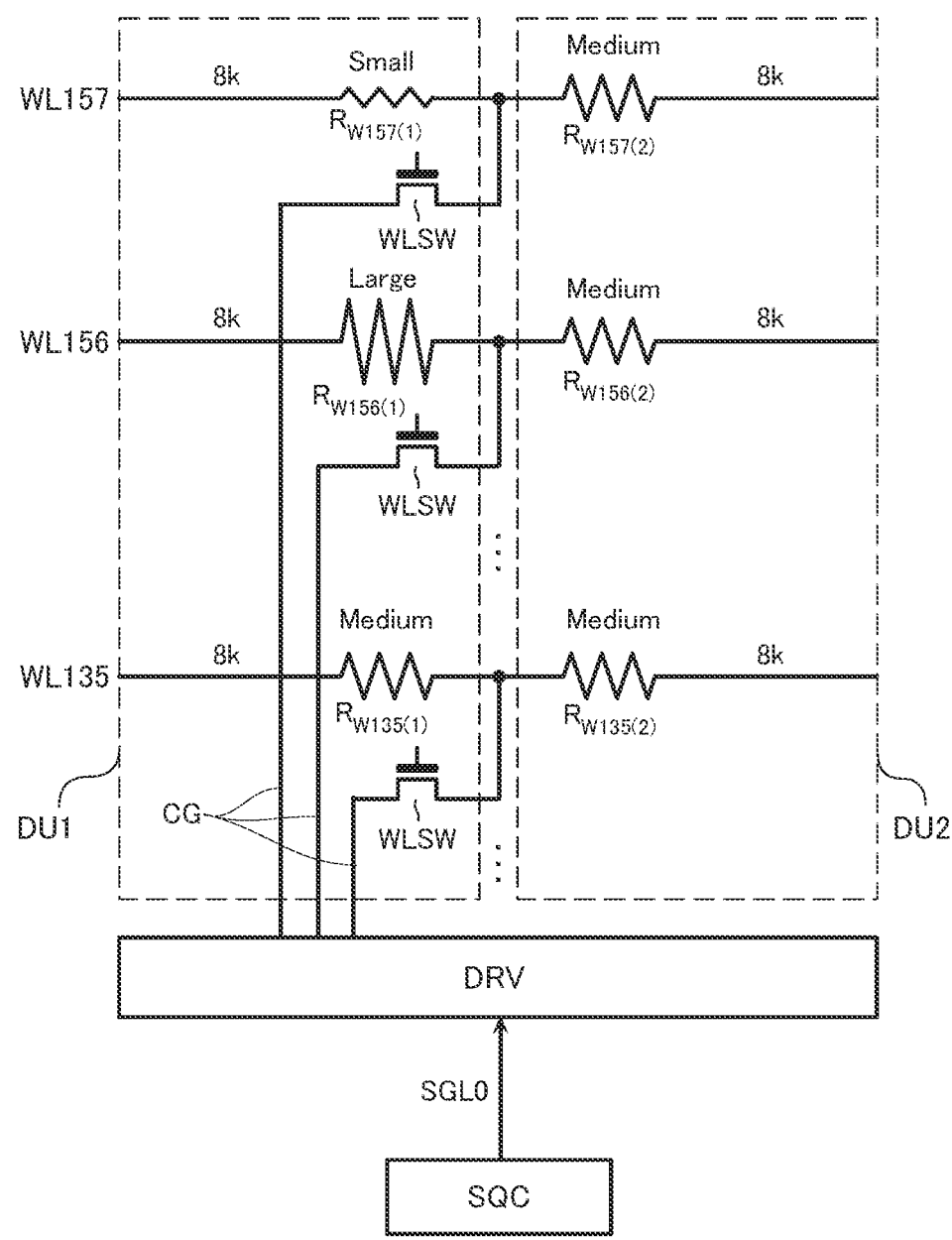
FIG. 27 is a schematic diagram for describing adjustment of an operation parameter of a selected word line $WL_S$ according to the first embodiment.

FIG. 27 is a schematic diagram for describing adjustment of the operation parameter of the selected word line $WL_S$ according to the first embodiment. The word line WL135, WL156, WL157 in FIG. 27 are equivalent to a word line WLn−1 when n in FIG. 4 is 136, 157, or 158. "8k" in FIG. 27 indicates that each of storage capacities of the divided ranges DU1, DU2 of the word lines WL135, WL156, WL157 is 8 k bytes. Therefore, the memory cells MC by the number corresponding to the storage capacity by 8 k bytes of the read target are connected to the divided ranges DU1, DU2 of each of the word lines WL135, WL156, WL157. Accordingly, to each of the word lines WL135, WL156, WL157, the memory cells MC by the number corresponding to the storage capacity of 16 k bytes of the read target are connected. Note that the values in FIG. 27 are one example, and the values are not limited to them.

As illustrated in FIG. 27, each of the word lines WL135, WL156, WL157 is connected to the CG driver circuit DRV with the wiring CG via the word line switch WLSW. Note that while the word line decoder WLD or the like is provided between the word line switch WLSW and the CG driver circuit DRV (FIG. 5), FIG. 27 omits it. The CG driver circuit DRV performs a voltage supply operation on the word line WL (the wiring CG) in accordance with a control signal SGL0 from the sequencer SQC. The control signal SGL0 includes signals of the signal lines VSEL1 to VSEL6 in FIG. 5.

The respective wiring resistances $R_{W135(1)}$, $R_{W156(1)}$, $R_{W157(1)}$ are resistances of various wirings and the contacts CC between the divided range DU1 of the word lines WL135, WL156, WL157 and the word line switches WLSW. The respective wiring resistances $R_{W135(2)}$, $R_{W156(2)}$, $R_{W157(2)}$ are resistances of various wirings and the contacts CC between the divided range DU2 of the word lines WL135, WL156, WL157 and the word line switches WLSW. For example, the wiring resistances $R_{W135(1)}$, $R_{W135(2)}$, $R_{W156(2)}$, $R_{W157(2)}$ are medium (described as "Medium" in the drawing) resistance values. The wiring resistance $R_{W156(1)}$ is the large (described as "Large" in the drawing) resistance value. The wiring resistance $R_{W157(1)}$ is a small (described as "Small" in the drawing) resistance value.

As described above, the same voltage is applied to one word line WL (divided ranges DU1, DU2) at the same timing. In this case, the operation parameters (the wait time Ta and the voltage Va) of the selected word line $WL_S$ are adjusted in units of the word lines WL.

For example, when the selected word line $WL_S$ is the word line WL (for example, the word line WL157 in FIG. 27) having the small wiring resistance $R_W$, the wait time Ta is set to be shorter than and the voltage Va is set to be smaller than those in the case of the selected word line $WL_S$ being the word line WL (for example, the word line WL135 in FIG. 27) having the medium wiring resistance $R_W$. Additionally, when the selected word line $WL_S$ is the word line WL (for example, the word line WL156 in FIG. 27) having the large wiring resistance $R_W$, the wait time Ta is set to be longer than and the voltage Va is set to be larger than those in the case of the selected word line $WL_S$ being the word line WL (for example, the word line WL135 in FIG. 27) having the medium wiring resistance $R_W$. Note that any one of the operation parameters (the wait time Ta and the voltage Va) of the selected word line $WL_S$ may be adjusted. By thus adjusting the operation parameters, in the read operation, the selected word line $WL_S$ can be appropriately charged according to the wiring resistance $R_W$ of the selected word line $WL_S$. That is, the voltage appropriate for the wiring resistance $R_W$ can be applied to the selected word line $WL_S$, thereby ensuring reducing excessive charge or insufficient charge. Consequently, reliability of the read operation is improved.

Note that in FIG. 27, when any one of the two divided ranges DU1, DU2 of the word lines WL is not the read target while the other becomes the read target, the operation parameters (the wait time Ta and the voltage Va) of the selected word line $WL_S$ may be adjusted according to the wiring resistance $R_W$ of the divided range of the read target in the selected word line $WL_S$.

[Adjustment of Operation Parameters of Bit Line BL and Source Lines SL1, SL2]

The operation parameters of the bit lines BL in the read operation include the wait time Tb in FIG. 26, a voltage Vb applied to the bit line BL from timing t104 to timing t105 in FIG. 26, the wait time Tc in FIG. 26, and the wait time Td in FIG. 26.

The operation parameters of the source lines SL1, SL2 in the read operation include the wait time Ts in FIG. 26 and the voltage Vs applied to the source lines SL1, SL2 from timing t103 to timing t105 in FIG. 26.

FIG. 28A is a schematic diagram for describing adjustment of the operation parameters of the bit lines BL and the source lines SL1, SL2 according to the first embodiment. Note that the meanings of the word lines WL135, WL156, WL157 in FIG. 28A and "8k" in FIG. 28A are similar to those described in FIG. 27. Additionally, the magnitudes of the wiring resistances $R_W$ of the word lines WL135, WL156, WL157 in FIG. 28A are also similar to those described in FIG. 27.

As illustrated in FIG. 28A, the bit lines BL of the divided range DU1 are connected to the sense amplifier module SAM(1). The bit lines BL of the divided range DU2 are connected to the sense amplifier module SAM(2). The sense amplifier module SAM(1) performs the voltage supply operation and the sense operation on the bit line BL in accordance with a control signal SGL1 from the sequencer SQC. The sense amplifier module SAM(2) performs the voltage supply operation and the sense operation on the bit line BL in accordance with a control signal SGL2 from the sequencer SQC. Both of the control signals SGL1, SGL2 include signals of the signal lines STB, XXL, BLC, BLS, HLL, BLX, CLKSA, LBP.

Figure 28B:
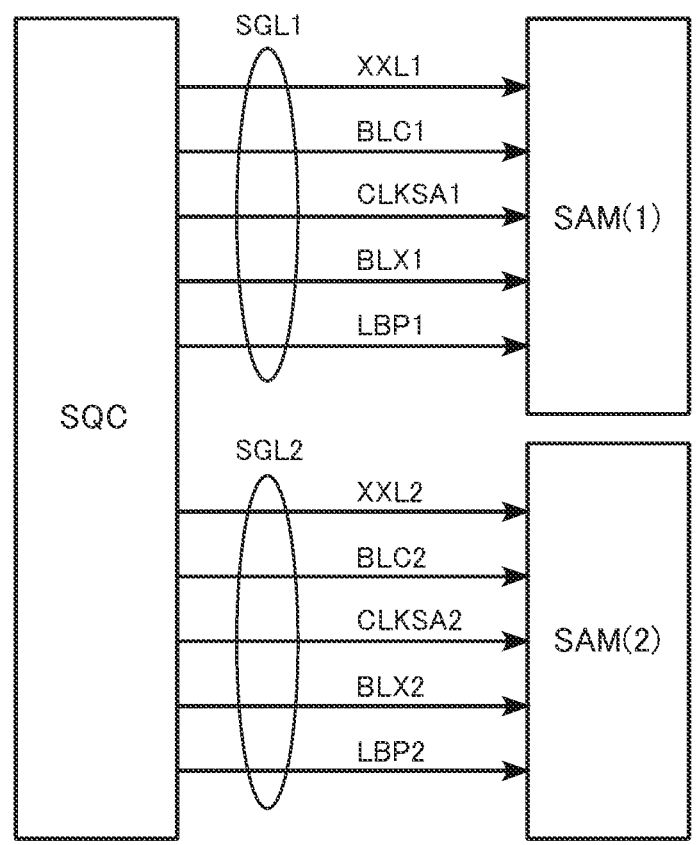
FIG. 28B is a diagram illustrating signal lines of control signals SGL1, SGL2 between a sequencer SQC and sense amplifier modules SAM(1), SAM(2)

The sense time (the wait time Td in FIG. 26) is controlled by a signal from the signal line XXL. It is considered that the typical method of separation control includes the following method. A wiring (a signal line XXL1 in FIG. 28B) through which the XXL signal passes and that connects the sequencer SQC and the sense amplifier module SAM(1) and a wiring (a signal line XXL2 in FIG. 28B) through which the XXL signal passes and that connects the sequencer SQC and the sense amplifier module SAM(2) are provided. The sequencer SQC separately controls the signal from the signal line XXL1 included in the control signal SGL1 and the signal from the signal line XXL2 included in the control signal SGL2.

As illustrated in FIG. 28A, the source line SL1 corresponding to the divided range DU1 is connected to a source line driver circuit SDRV(1). The source line SL2 corresponding to the divided range DU2 is connected to a source line driver circuit SDRV(2). The source line driver circuit SDRV(1) performs the voltage supply operation on the source line SL1 in accordance with a control signal SGL11 from the sequencer SQC. The source line driver circuit SDRV(2) performs the voltage supply operation on the source line SL2 in accordance with a control signal SGL12 from the sequencer SQC.

The wait time Ts and the voltage Vs (FIG. 26) are controlled by the source line driver circuit SDRV. The sequencer SQC separately controls the signal included in the control signal SGL11 and the signal included in the control signal SGL12 to separately control the wait time Ts and the voltage Vs of the source line SL of the divided range DU1 and the wait time Ts and the voltage Vs of the source line SL of the divided range DU2. Note that together with controlling the operation parameters of the bit lines BL, the operation parameters of the source line SL may be controlled. Alternatively, together with controlling the operation parameters of the source line SL, the operation parameters of the bit lines BL may be controlled. In this case, by controlling the signals of the above-described signal lines BLC, BLX, and the like, the operation parameters of the bit lines BL are controlled.

As described above, different voltages can be applied to the plurality of bit lines BL included in the divided range DU1 and the plurality of bit lines BL included in the divided range DU2 at different timings. In this case, the operation parameters (the wait time Tb, the voltage Vb, the wait time Tc, and the wait time Td) of the bit line BL are adjusted in units of the divided ranges DU1, DU2 of the word lines WL.

For example, when the selected word line $WL_S$ is the word line WL157, in the operation parameters (the wait time Tb, the voltage Vb, the wait time Tc, and the wait time Td) of the bit lines BL of the divided range DU1 (the divided range of the "small" wiring resistance $R_{W157(1)}$) of the word line WL157, the wait time Tb is set to be shorter than, the voltage Vb is set to be smaller than, the wait time Tc is set to be longer than, and the wait time Td (sense time) is set to be longer than those of the operation parameters of the bit lines BL of the divided range DU2 (the divided range of the "middle" wiring resistance $R_{W157(2)}$) of the word line WL157.

When the selected word line $WL_S$ is the word line WL156, in the operation parameters of the bit lines BL of the divided range DU1 (the divided range of the "large" wiring resistance $R_{W156(1)}$) of the word line WL156, the wait time Tb is set to be longer than, the voltage Vb is set to be larger than, the wait time Tc is set to be longer than, and the wait time Td (sense time) is set to be shorter than those of the operation parameters of the bit lines BL of the divided range DU2 (the divided range of the "middle" wiring resistance $R_{W156(2)}$) of the word line WL156.

Note that any one of or a plurality of the operation parameters (the wait time Tb, the voltage Vb, the wait time Tc, and the wait time Td) of the bit lines BL may be adjusted. By adjusting the operation parameter, in the read operation, the appropriate charge and the sense operation can be performed on the bit lines BL belonging to the divided ranges DU1, DU2 according to the wiring resistances $R_W$ of the divided ranges DU1, DU2 of the selected word line $WL_S$. Consequently, reliability of the read operation is improved.

As described above, different voltages can be applied to the source line SL1 corresponding to the divided range DU1 and the source line SL2 corresponding to the divided range DU2 at the different timings. In this case, the operation parameters (the wait time Ts and the voltage Vs) of the source lines SL1, SL2 are adjusted in units of the divided ranges DU1, DU2 of the word lines WL.

For example, when selected word line $WL_S$ is the word line WL157, in the operation parameters (the wait time Ts and the voltage Vs) of the source line SL1 of the divided range DU1 (the divided range of the "small" wiring resistance $R_{W157(1)}$) of the word line WL157, the wait time Ts is set to be shorter than and the voltage Vs is set to be smaller than those of the operation parameters of the source line SL2 of the divided range DU2 (the divided range of the "middle" wiring resistance $R_{W157(2)}$) of the word line WL157.

When the selected word line $WL_S$ is the word line WL156, in the operation parameters of the source line SL1 of the divided range DU1 (the divided range of the "large" wiring resistance $R_{W156(1)}$) of the word line WL156, the wait time Ts is set to be longer than and the voltage Vs is set to be larger than those of the operation parameters of the source line SL2 of the divided range DU2 (the divided range of the "middle" wiring resistance $R_{W156(2)}$) of the word line WL156.

Note that any one of the operation parameters (the wait time Ts and the voltage Vs) of the source lines SL1, SL2 may be adjusted. By adjusting the operation parameter, in the read operation, the source lines SL1, SL2 belonging to the divided ranges DU1, DU2 can be appropriately charged according to the wiring resistances $R_W$ of the divided ranges DU1, DU2 of the selected word line $WL_S$. Consequently, reliability of the read operation is improved.

Second Embodiment

Figure 29:
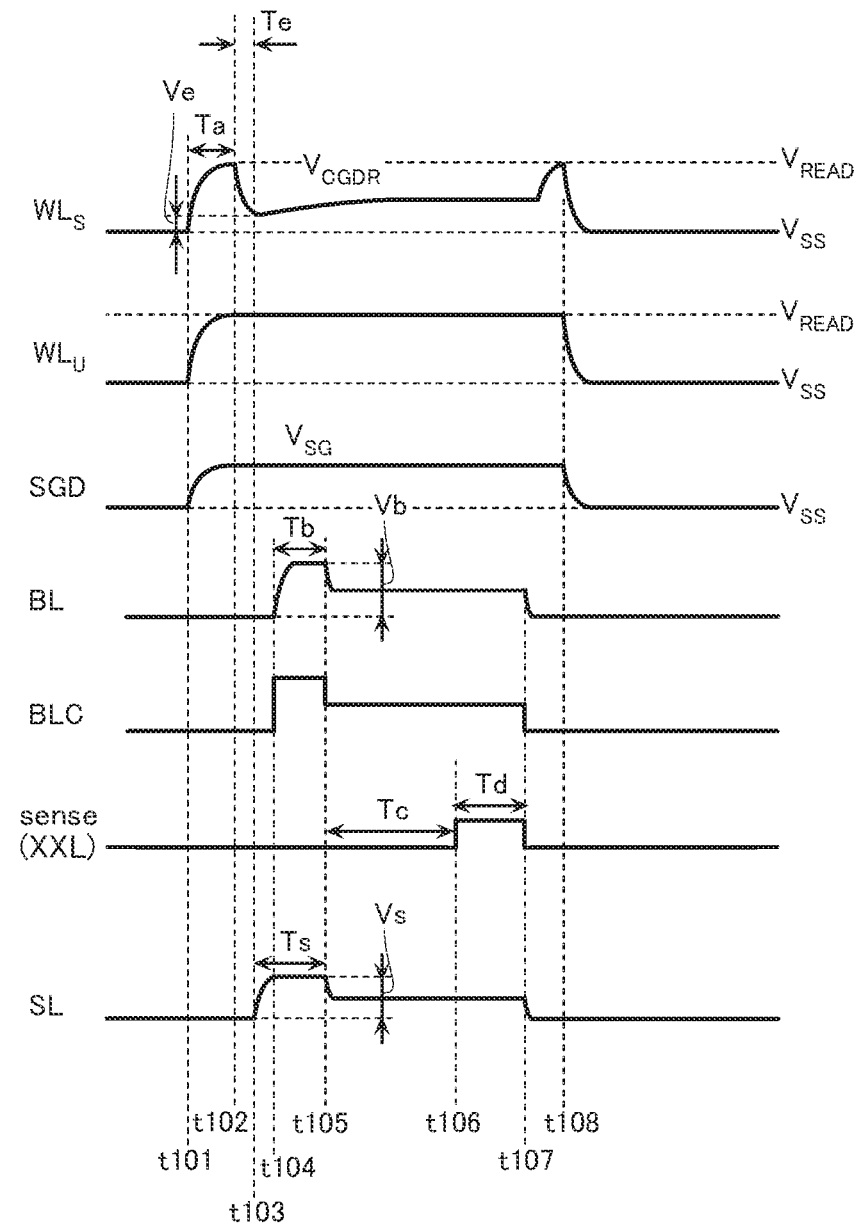
FIG. 29 is a timing chart for describing a read operation of a semiconductor memory device according to a second embodiment.

Next, with reference to FIG. 29, a semiconductor memory device according to the second embodiment will be described. FIG. 29 is a timing chart for describing the read operation of the semiconductor memory device.

In the first embodiment, with reference to FIG. 26 to FIG. 28B, the execution method of the read operation has been exemplified. However, the method is merely an example, and the execution method of the read operation is appropriately adjustable.

For example, the semiconductor memory device according to the second embodiment is basically configured similarly to the semiconductor memory device according to the first embodiment. The read operation according to the second embodiment is basically performed similarly to the read operation according to the first embodiment.

However, in the read operation according to the second embodiment, at timing t101, the read pass voltage $V_{READ}$ is applied to the selected word line $WL_S$.

In the read operation according to the second embodiment, at timing t102, a voltage Ve equal to or less than the reading voltage (the reading voltage $V_{CGDR}$ in the example of FIG. 29) is applied to the selected word line $WL_S$.

In the read operation according to the second embodiment, a wait time Te is provided from timing t102 to timing t103. The wait time Te is, for example, a wait time for discharging the electric charge of the selected word line $WL_S$.

In the read operation according to the second embodiment, at timing t103, the reading voltage is applied to the selected word line $WL_S$.

The operation parameters of the selected word line $WL_S$ according to the second embodiment include, for example, the wait time Te. The operation parameters of the selected word line $WL_S$ according to the second embodiment include, for example, the voltage Ve applied to the selected word line $WL_S$ from timing t102 to timing t103. The wait time Te and the voltage Ve are adjusted in units of the word lines WL.

For example, when the selected word line $WL_S$ is the word line WL (for example, the word line WL157 in FIG. 27) having the small wiring resistance $R_W$, the wait time Te is set to be shorter than and the voltage Ve is set to be larger than those when the selected word line $WL_S$ is the word line (for example, the word line WL135 in FIG. 27) having the medium wiring resistance $R_W$. When the selected word line $WL_S$ is the word line WL (for example, the word line WL156 in FIG. 27) having the large wiring resistance $R_W$, the wait time Te is set to be longer than and the voltage Ve is set to be smaller than those when the selected word line $WL_S$ is the word line WL (for example, the word line WL135 in FIG. 27) having the medium wiring resistance $R_W$. Note that any one of the operation parameters (the wait time Te and the voltage Ve) of the selected word line $WL_S$ may be adjusted. By adjusting the operation parameter, in the read operation, the electric charge of the selected word line $WL_S$ can be appropriately charged according to the wiring resistance $R_W$ of the selected word line $WL_S$. Consequently, reliability of the read operation is improved.

Note that in FIG. 27, when any one of the two divided ranges DU1, DU2 of the word lines WL is not the read target while the other becomes the read target, the operation parameters (the wait time Te and the voltage Ve) of the selected word line $WL_S$ may be adjusted according to the wiring resistance $R_W$ of the divided range of the read target in the selected word line $WL_S$.

Third Embodiment

Next, with reference to FIG. 30 to FIG. 34, a semiconductor memory device according to the third embodiment will be described.

In the first embodiment and the second embodiment, the example in which the operation parameters used for the read operation are adjusted has been described. In contrast to this, in the third embodiment, an example in which operation parameters used for the write operation are adjusted will be described.

The semiconductor memory device according to the third embodiment is basically configured similarly to the semiconductor memory device according to the first embodiment or the second embodiment. Note that in the read operation of the semiconductor memory device according to the third embodiment, the operation parameter may be adjusted by the aspect similarly to the first embodiment or the second embodiment, or the operation parameter need not be adjusted.

[Write Operation]

Next, the write operation of the semiconductor memory device according to this embodiment will be described.

Figure 31:
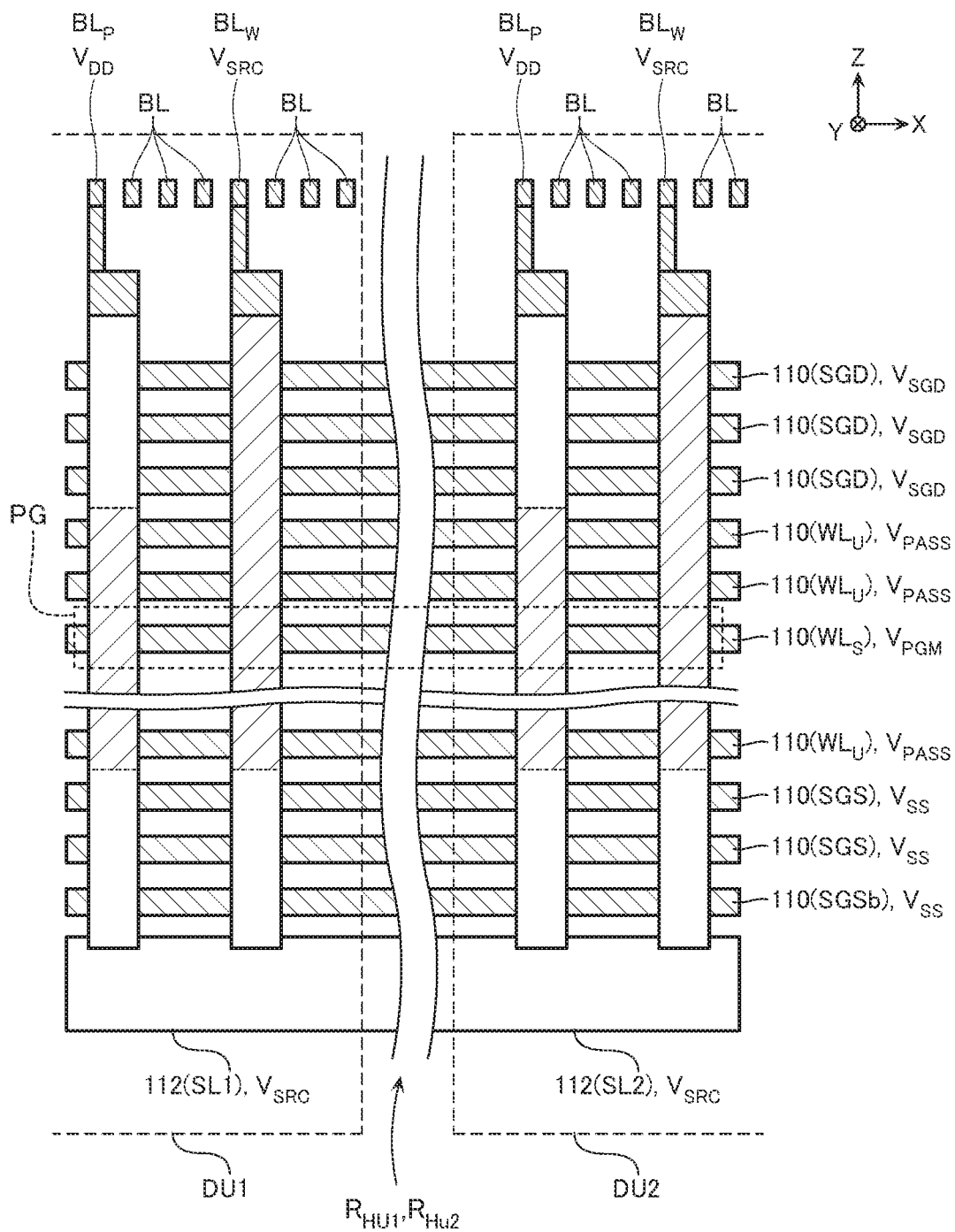
FIG. 31 is a schematic cross-sectional view for describing a program operation included in the write operation.
Figure 32:
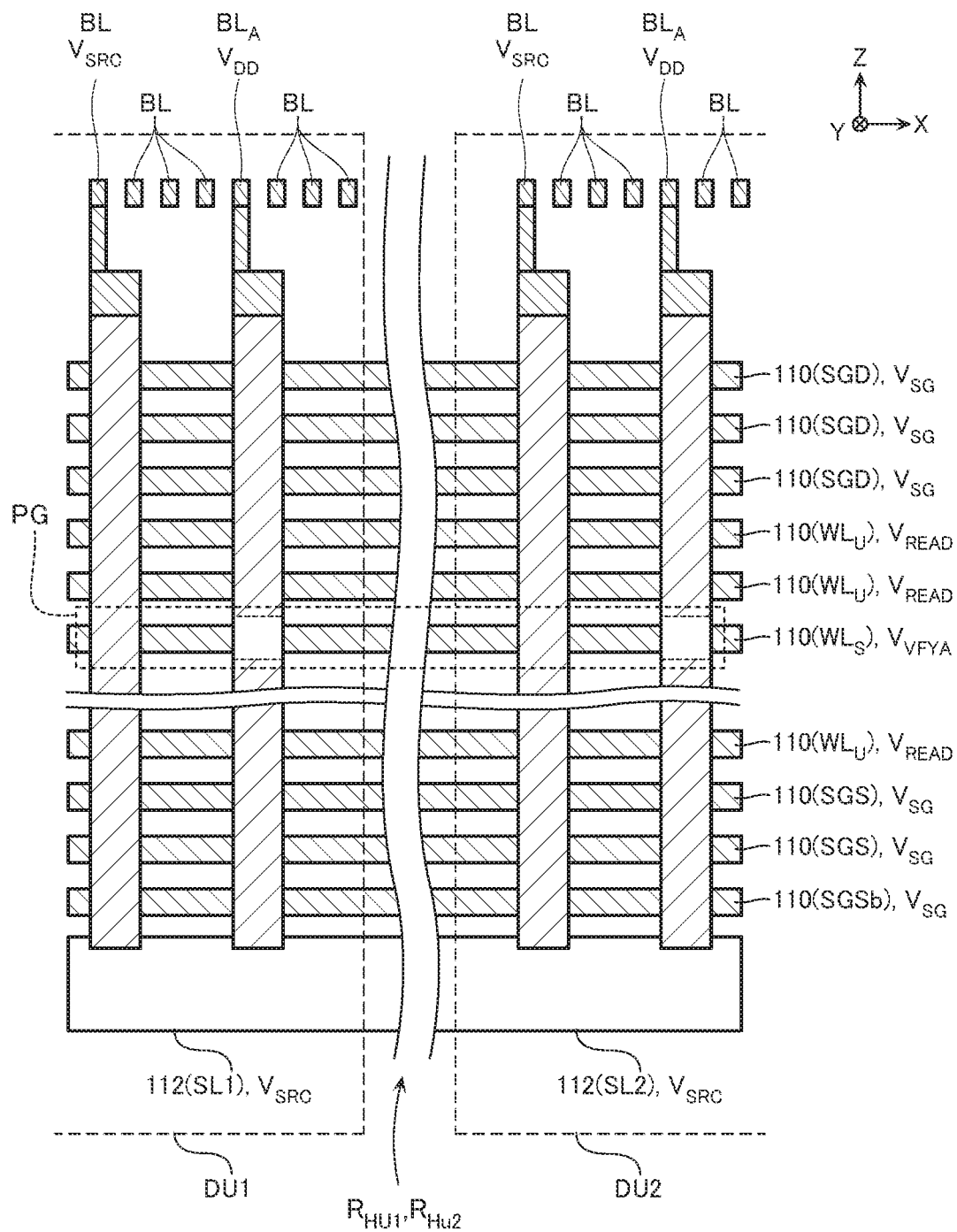
FIG. 32 is a schematic cross-sectional view for describing a verify operation included in the write operation.
Figure 33:
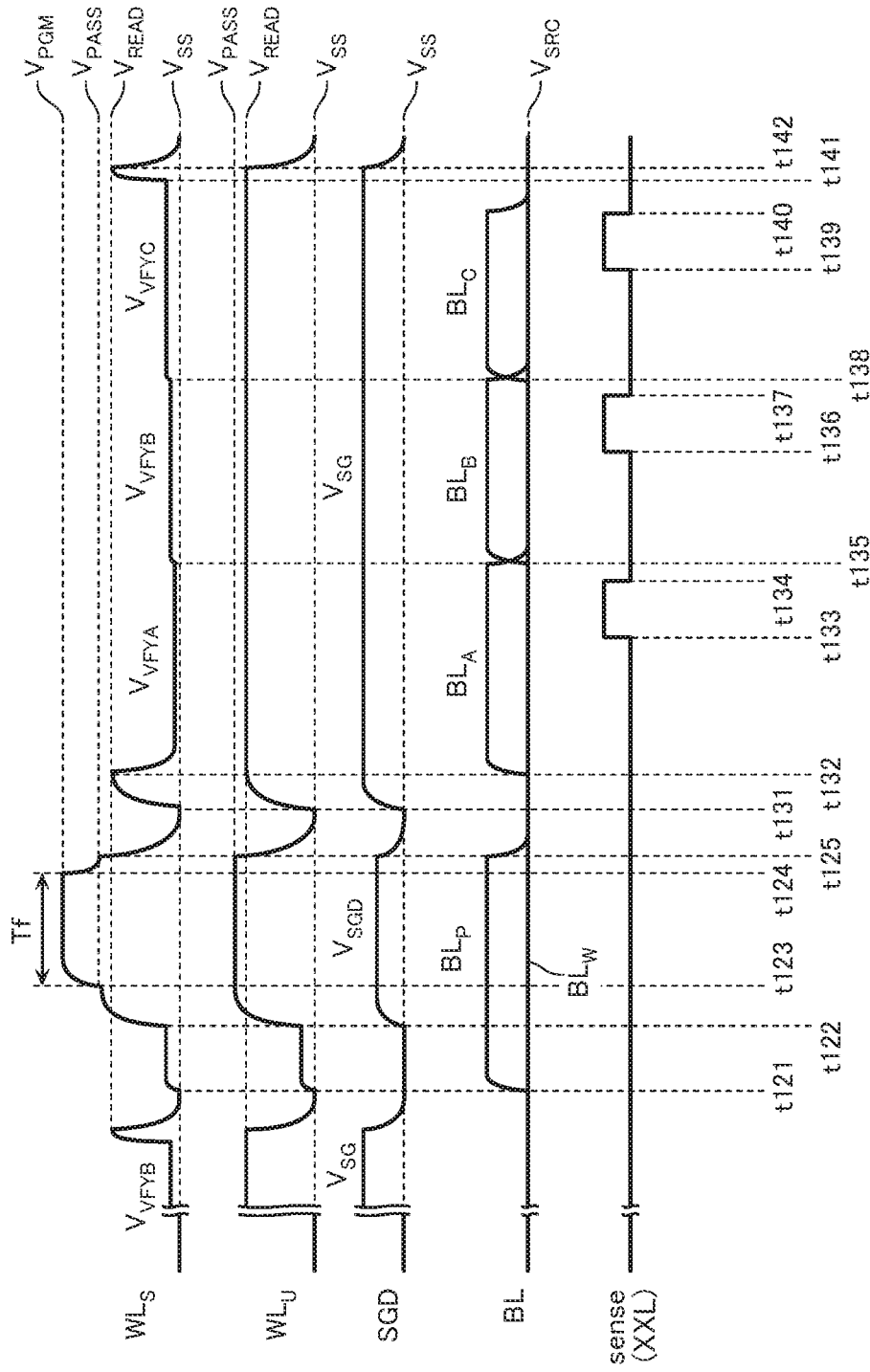
FIG. 33 is a timing chart for describing the write operation.
Figure 34:
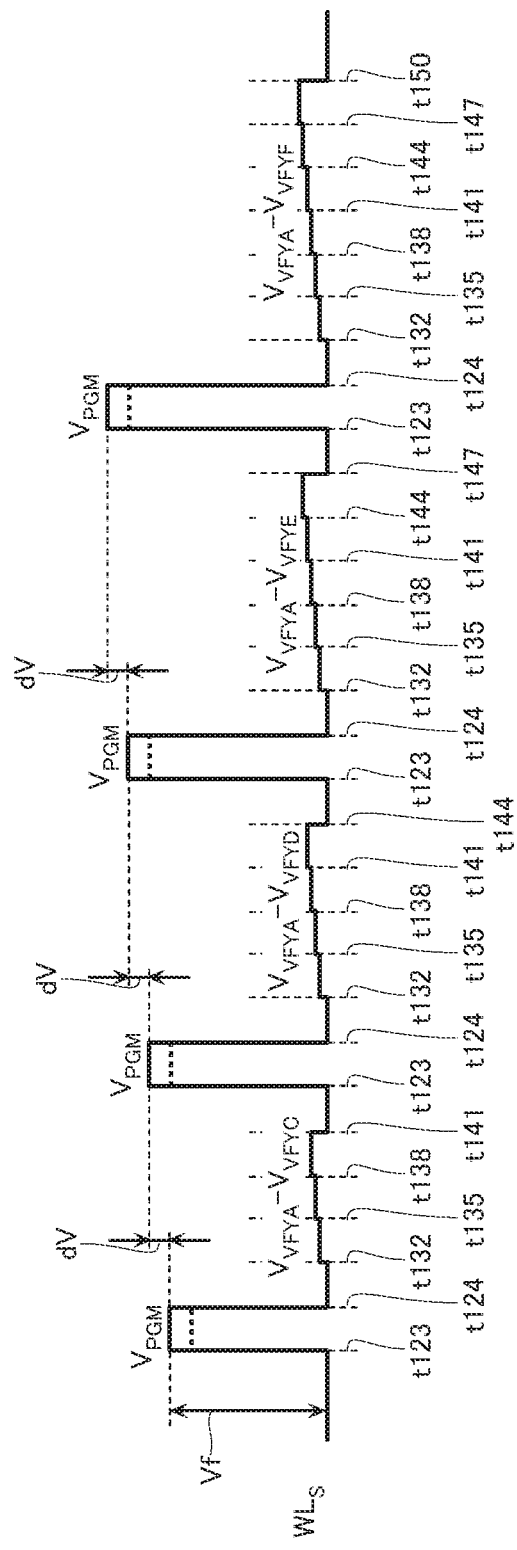
FIG. 34 is a timing chart for describing the write operation.

FIG. 30 is a flowchart for describing the write operation. FIG. 31 is a schematic cross-sectional view for describing a program operation included in the write operation. FIG. 32 is a schematic cross-sectional view for describing a verify operation included in the write operation. FIG. 33 and FIG. 34 are timing charts for describing the write operation.

At Step S101, for example, as illustrated in FIG. 30, a loop count $n_W$ is set to 1. The loop count $n_W$ is a variable indicating a write loop count. For example, the user data written to the memory cell MC are latched to the latch circuits DL0 to $DLn_L$ in the sense amplifier unit SAU (FIG. 11).

At Step S102, the program operation is performed. The program operation is an operation that applies the program voltage to the selected word line $WL_S$ to increase the threshold voltage of the memory cell MC. This operation is, for example, performed from timing t121 to timing t125 in FIG. 33.

At timing t121 of the program operation, for example, the voltage $V_{SRC}$ is applied to a bit line $BL_W$ connected to the selected memory cell MC on which the adjustment of the threshold voltage is performed among the plurality of selected memory cells MC and the voltage $V_{DD}$ is applied to a bit line $BL_P$ connected to the selected memory cell MC on which the adjustment of the threshold voltage is not performed among the plurality of selected memory cells MC. For example, the latch circuit SDL (FIG. 11) corresponding to the bit line $BL_W$ is caused to latch "L", and the latch circuit SDL (FIG. 11) corresponding to the bit line $BL_P$ is caused to latch "H". The states of the signal lines STB, XXL, BLC, BLS, HLL, BLX are "L, L, H, H, L, H". Hereinafter, the selected memory cell MC on which the adjustment of the threshold voltage is performed among the plurality of selected memory cells MC is referred to as a "write memory cell MC" and the selected memory cell MC on which the adjustment of the threshold voltage is not performed is referred to as an "inhibited memory cell MC" in some cases.

At timing t122 of the program operation, the write pass voltage $V_{PASS}$ is applied to the selected word line $WL_S$ and the unselected word line $WL_U$. The voltage $V_{SGD}$ is applied to the drain-side select gate line SGD. For example, the write pass voltage $V_{PASS}$ has a magnitude equal to or more than the read pass voltage $V_{READ}$ described with reference to FIG. 24A. The voltage $V_{SGD}$ is smaller than the voltage $V_{SG}$ described with reference to FIG. 25 and FIG. 26 and has a magnitude enough to cause the drain-side select transistor STD to be in the ON state or the OFF state according to the voltage of the bit line BL.

At timing t123 of the program operation, the program voltage $V_{PGM}$ is applied to the selected word line $WL_S$. The program voltage $V_{PGM}$ is larger than the write pass voltage $V_{PASS}$.

Here, for example, as illustrated in FIG. 31, the voltage $V_{SRC}$ is applied to the channel of the semiconductor layer 120 connected to the bit line $BL_W$. Between such a semiconductor layer 120 and the selected word line $WL_S$, a relatively large electric field is generated. This causes the electrons in the channel of the semiconductor layer 120 to tunnel into the electric charge accumulating film 132 (FIG. 21) via the tunnel insulating film 131 (FIG. 21). This increases the threshold voltage of the write memory cell MC.

The channel of the semiconductor layer 120 connected to the bit line $BL_P$ is in an electrically floating state, and the voltage of this channel is increased up to approximately the write pass voltage $V_{PASS}$ by the capacitive coupling to the unselected word line $WL_U$. Between such the semiconductor layer 120 and the selected word line $WL_S$, an electric field smaller than any of the above-described electric fields is generated. Therefore, the electrons in the channel of the semiconductor layer 120 do not tunnel into the electric charge accumulating film 132 (FIG. 21). Therefore, the threshold voltage of the inhibited memory cell MC does not increase.

A wait time Tf is provided from timing t123 to timing t124 of the program operation. The wait time Tf is, for example, wait time to increase the threshold voltage of the write memory cell MC.

At timing t124 of the program operation, the write pass voltage $V_{PASS}$ is applied to the selected word line $WL_S$ and the unselected word lines $WL_U$.

At timing t125 of the program operation, the ground voltage $V_{SS}$ is applied to the selected word line $WL_S$, the unselected word lines $WL_U$, and the select gate lines (SGD, SGS, SGSb).

At Step S103 (FIG. 30), the verify operation is performed.

At timing t131 of the verify operation, for example, as illustrated in FIG. 33, the read pass voltage $V_{READ}$ is applied to the selected word line $WL_S$ and the unselected word line $WL_U$ and all of the memory cells MC are set to be in the ON state. Additionally, the voltage $V_{SG}$ is applied to the select gate lines (SGD, SGS, SGSb) and the select transistors (STD, STS, STSb) are set to be in the ON state.

At timing t132 of the verify operation, the predetermined verify voltage (any of the verify voltages $V_{VFYA}$ to $V_{VFYG}$ described with reference to FIG. 24A) is applied to the selected word line $WL_S$. Thus, for example, as illustrated in FIG. 33, a part of the selected memory cells MC enter the ON state and the remaining selected memory cells MC enter the OFF state.

At timing t132, for example, charging of the bit line BL is performed. In this respect, for example, based on the data in the latch circuits DL0 to $DLn_L$, the bit line BL (a bit line $BL_A$ in the example in FIG. 33) connected to the memory cell MC corresponding to a specific state (the state A in the example in FIG. 33) is applied with the voltage $V_{DD}$, and the other bit lines BL are applied with the voltage $V_{SRC}$.

In timing t133 to timing t134 of the verify operation, for example, as illustrated in FIG. 33, the sense operation is performed. In this respect, for example, data indicating the ON state/OFF state of the memory cell MC may be latched to the latch circuits DL0 to $DLn_L$.

In timing t135 to timing t137 of the verify operation, the processes similar to the processes from timing t132 to timing t134 are performed on the memory cell MC in another state (the state B in the example of FIG. 33). Note that in FIG. 33, the bit line BL connected to the memory cell MC corresponding to the state B is described as a bit line $BL_B$.

In timing t138 to timing t140 of the verify operation, the processes similar to the processes from timing t132 to timing t134 are performed on the memory cell MC in another state (the state C in the example of FIG. 33). Note that in FIG. 33, the bit line BL connected to the memory cell MC corresponding to the state C is described as a bit line $BL_C$.

At timing t141, the read pass voltage $V_{READ}$ is applied to the selected word line $WL_S$ and the unselected word line $WL_U$ and all of the memory cells MC are set to be in the ON state. Additionally, the voltage $V_{SG}$ is applied to the select gate lines (SGD, SGS, SGSb) and the select transistors (STD, STS, STSb) are set to be in the ON state.

At timing t142 of the verify operation, the ground voltage $V_{SS}$ is applied to the selected word line $WL_S$, the unselected word lines $WL_U$, and the select gate lines (SGD, SGS, SGSb).

Afterwards, the data latched to the latch circuit SDL is transferred to a counter circuit (not illustrated). The counter circuit counts the number of the memory cells MC whose threshold voltages have reached the target value or the number of the memory cells MC whose threshold voltages have not reached the target value.

Note that in the example of FIG. 33, an example in which three patterns of the verify voltages $V_{VFYA}$, $V_{VFYB}$, $V_{VFYC}$ are applied to the selected word line $WL_S$ in the verify operation has been described. However, the number of verify voltages applied to the selected word line $WL_S$ in the verify operation may be two patterns or less, may be four patterns or more, and, for example, as illustrated in FIG. 34 as an example, may be changed according to the loop count $n_W$.

At Step S104 (FIG. 30), the result of the verify operation is determined. For example, with reference to the counter circuit, when the number of the memory cells MC whose threshold voltages have not reached the target value is a certain number or more, it is determined to be verify FAIL and the procedure proceeds to Step S105. On the other hand, for example, when the number of the memory cells MC whose threshold voltages have not reached the target value is equal to or less than a certain number, it is determined to be verify PASS and the procedure proceeds to Step S107.

At Step S105, whether the loop count $n_W$ has reached a predetermined count $N_W$ is determined. When it has not reached the predetermined count $N_W$, the procedure proceeds to Step S106. When it has reached the predetermined count $N_W$, the procedure proceeds to Step S108.

At Step S106, 1 is added to the loop count $n_W$, and the procedure proceeds to Step S102. At Step S106, for example, a predetermined voltage dV is added to the program voltage $V_{PGM}$. Therefore, for example, as illustrated in FIG. 34, the program voltage $V_{PGM}$ increases together with the increase in the loop count $n_W$.

At Step S107, the status data $D_{ST}$ indicating normal termination of the write operation is stored in the status register STR (FIG. 2) to terminate the write operation. Note that the status data $D_{ST}$ is output to the controller die CD (FIG. 1) according to a status read operation.

At Step S108, the status data $D_{ST}$ indicating failing to normally terminate the write operation is stored in the status register STR (FIG. 2) to terminate the write operation.

[Variation in Wiring Resistance in Write Operation]

As described above, the wiring resistance between the two parts 201 (FIG. 15) of the conductive layer 200 and the wiring resistance between the two parts 221 (FIG. 17) of the conductive layer 220 are larger than the wiring resistance between the two conductive layers 210 (FIG. 16) arranged in the X-direction and the wiring resistance between the two conductive layers 230 (FIG. 18) arranged in the X-direction.

Additionally, caused by a difference in, for example, the above-described connection structure and material of the wiring, there may be a case where a peculiar difference occurs between the wiring resistance between the divided range DU1 of the word line WL and the word line switch WLSW, and a wiring resistance between the divided range DU2 of the word line WL and the word line switch WLSW.

In this case, in the write operation, the threshold voltage of the selected memory cell MC increases more than necessary in some cases.

[Adjustment of Operation Parameters of Selected Word Line $WL_S$]

The operation parameters of the selected word line $WL_S$ in the write operation include a wait time Tf in FIG. 33 and an initial voltage Vf (the program voltage $V_{PGM}$ when the loop count $n_W$ is 1) of the program voltage $V_{PGM}$ in FIG. 34.

For example, when the selected word line $WL_S$ is the word line WL (for example, the word line WL157 in FIG. 27) having the small wiring resistance $R_W$, the wait time Tf is set to be shorter than and the voltage Vf is set to be smaller than those when the selected word line $WL_S$ is the word line WL (for example, the word line WL135 in FIG. 27) having the medium wiring resistance $R_W$. When the selected word line $WL_S$ is the word line WL (for example, the word line WL156 in FIG. 27) having the large wiring resistance $R_W$, the wait time Tf is set to be longer than and the voltage Vf is set to be larger than those when the selected word line $WL_S$ is the word line WL (for example, the word line WL135 in FIG. 27) having the medium wiring resistance $R_W$. Note that any one of the operation parameters (the wait time Tf and the voltage Vf) of the selected word line $WL_S$ in the write operation may be adjusted. By thus adjusting the operation parameter, in the write operation, the amount of increase in the threshold voltage of the selected memory cell MC can be reduced according to the wiring resistance $R_W$ of the selected word line $WL_S$. Consequently, reliability of the write operation is improved.

Note that in FIG. 27, when any one of the two divided ranges DU1, DU2 of the word lines WL is not the write target while the other becomes the read target, the operation parameters (the wait time Tf and the voltage Vf) of the selected word line $WL_S$ may be adjusted according to the wiring resistance $R_W$ of the divided range of the read target in the selected word line $WL_S$.

Fourth Embodiment

Figure 35:
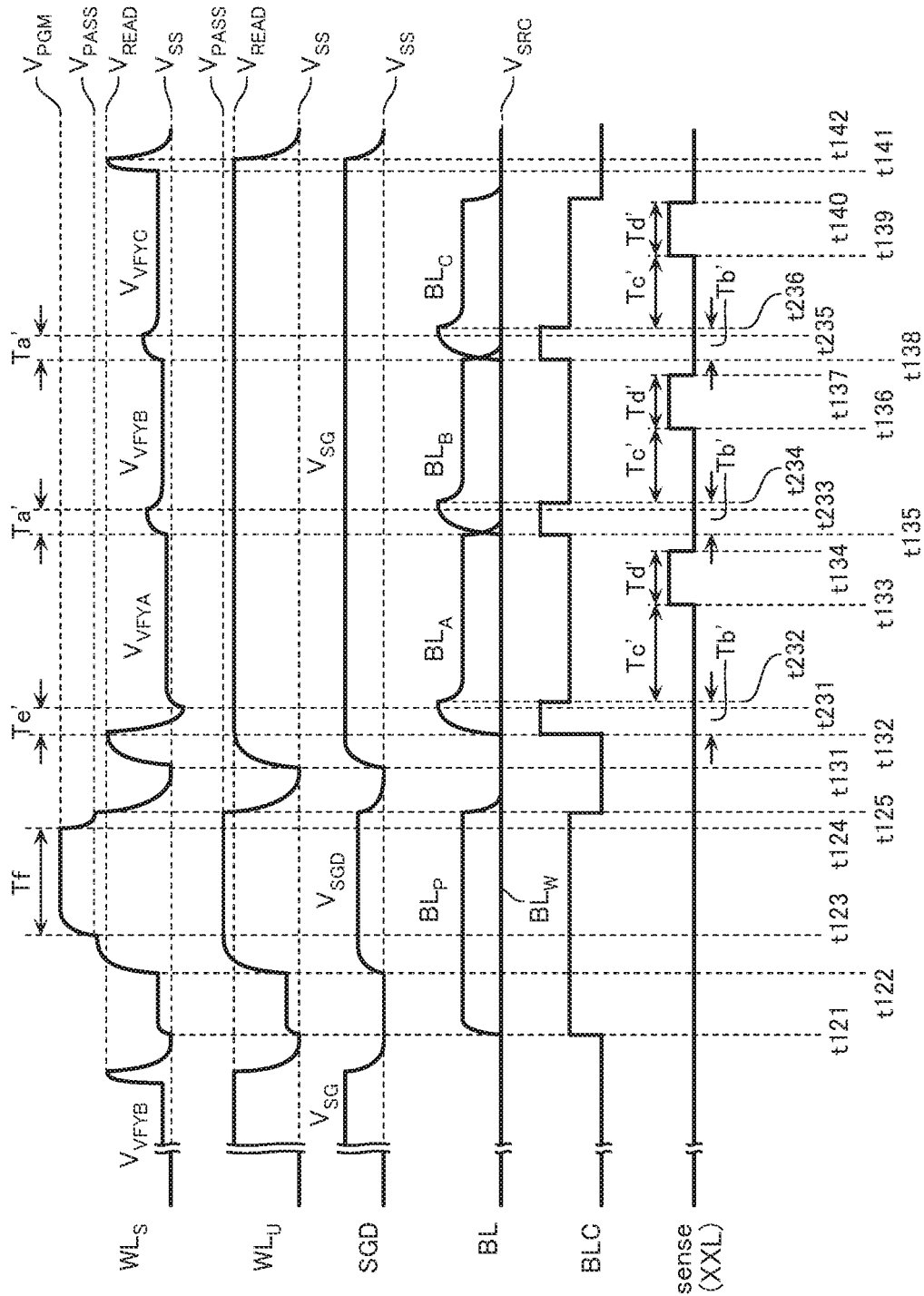
FIG. 35 is a timing chart for describing a write operation of a semiconductor memory device according to a fourth embodiment.

Next, with reference to FIG. 35, a semiconductor memory device according to the fourth embodiment will be described. FIG. 35 is a timing chart for describing a write operation of the semiconductor memory device.

In the third embodiment, with reference to FIG. 30 to FIG. 34, the execution method of the write operation has been exemplified. However, the method is merely an example, and the execution method of the write operation is appropriately adjustable.

For example, the semiconductor memory device according to the fourth embodiment is basically configured similarly to the semiconductor memory device according to the third embodiment. However, the write operation according to the fourth embodiment differs from the write operation according to the third embodiment. The write operation according to the fourth embodiment is basically performed similarly to the write operation according to the third embodiment.

However, in the write operation according to the fourth embodiment, at timing t132, the verify voltage (the verify voltage $V_{VFYA}$ in the example of FIG. 35) used first in the verify operation or voltage smaller than that is applied to the selected word line $WL_S$.

Additionally, in the write operation according to the fourth embodiment, a wait time Te' is provided from timing t132 to timing t231. The wait time Te' is, for example, a wait time for discharging the electric charge of the selected word line $WL_S$.

Additionally, in the write operation according to the fourth embodiment, in timings t231, t233, t235, the verify voltage (the verify voltages $V_{VFYA}$, $V_{VFYB}$, $V_{VFYC}$ in the example of FIG. 35) is applied to the selected word line $WL_S$.

In the write operation according to the fourth embodiment, a wait time Tb' is provided from timing t132 to timing t232, from timing t135 to timing t234, and from timing t138 to timing t236. The wait time Tb' is, for example, a wait time for converging the current of the bit line BL.

Additionally, in the write operation according to the fourth embodiment, at timings t232, t234, t236, the voltage of the signal line BLC (the voltage of the bit line BL) is reduced. In this respect, the voltage of the signal line BLC is adjusted to voltage around which the clamp transistor 44 (FIG. 11) connected to the signal line BLC is maintained in the ON state.

Additionally, in the write operation according to the fourth embodiment, a wait time Tc' is provided from timing t232 to timing t133, from timing t234 to timing t136, and from timing t236 to timing t139. The wait time Tc' is, for example, a wait time for stabilizing current of the bit line BL. Hereinafter, the wait time Tc' is referred to as a "stabilization wait time" in some cases.

Additionally, in the write operation according to the fourth embodiment, a wait time Td' is provided from timing t133 to timing t134, from timing t136 to timing t137, and from timing t139 to timing t140. The wait time Td' is, for example, a wait time for detecting the state of the memory cell MC. Hereinafter, the wait time Td' is referred to as "sense time" in some cases.

Additionally, in the write operation according to the fourth embodiment, at timings t135, t138, the verify voltage (the verify voltages $V_{VFYB}$, $V_{VFYC}$ in the example of FIG. 35) used next in the verify operation or the voltage larger than that is applied to the selected word line $WL_S$.

Additionally, in the write operation according to the fourth embodiment, a wait time Ta' is provided from timing t135 to timing t233 and from timing t138 to timing t235. The wait time Ta' is, for example, a wait time for charging the selected word line $WL_S$.

Note that the operation parameters of the selected word line $WL_S$ in the write operation according to the fourth embodiment is adjusted in units of the word lines WL. Additionally, the operation parameters of the bit lines BL in the write operation according to the fourth embodiment are adjusted in units of the divided ranges DU1, DU2 of the word lines WL.

The operation parameters of the selected word line $WL_S$ in the write operation according to the fourth embodiment include, for example, the wait time Ta' and the wait time Te'. Additionally, the operation parameters of the bit lines BL in the write operation according to the fourth embodiment include the wait time Tb', the wait time Tc', and the wait time Td'.

By adjusting the wait time Ta' in the operation parameter, the excessive charge of the selected word line $WL_S$ can be reduced. Additionally, by adjusting the wait time Tb' in the operation parameter, current of the bit line BL can be reduced to the extent that the influence of the excessive charge of the selected word line $WL_S$ is cancelled. Additionally, by adjusting the wait time Tc' in the operation parameter, cell current can be stabilized to the extent that the influence of the excessive charge of the selected word line $WL_S$ is cancelled. Additionally, by adjusting the wait time Td' (sense time) in the operation parameter, an amount of decrease in electric charge in the sense node SEN can be reduced to the extent that the influence of the excessive charge of the selected word line $WL_S$ is cancelled. Additionally, by adjusting the wait time Te' in the operation parameter, the excessive discharge of the selected word line $WL_S$ can be reduced.

The operation parameter of the selected word line $WL_S$ in the write operation, for example, includes the voltage applied to the selected word line $WL_S$ from timing t132 to timing t231. By adjusting the operation parameter, the excessive discharge of the selected word line $WL_S$ can be reduced.

The operation parameter of the bit line BL in the write operation, for example, includes the voltage (the voltage of the bit line BL) applied to the signal line BLC from timing t132 to timing t232. By adjusting this operation parameter, the current of the bit line BL can be increased to the extent that the influence of the excessive discharge of the selected word line $WL_S$ is cancelled.

The operation parameter of the bit line BL in the write operation, for example, includes the voltage (the voltage of the bit line BL) applied to the signal line BLC from timing t135 to timing t234 and from timing t138 to timing t236. By adjusting the operation parameter, current of the bit line BL can be reduced to the extent that the influence of the excessive charge of the selected word line $WL_S$ is cancelled.

The operation parameter of the selected word line $WL_S$ in the write operation, for example, includes the voltage applied to the selected word line $WL_S$ from timing t135 to timing t233 and from timing t138 to timing t235. By adjusting the operation parameter, the excessive charge of the selected word line $WL_S$ can be reduced.

Fifth Embodiment

Figure 36:
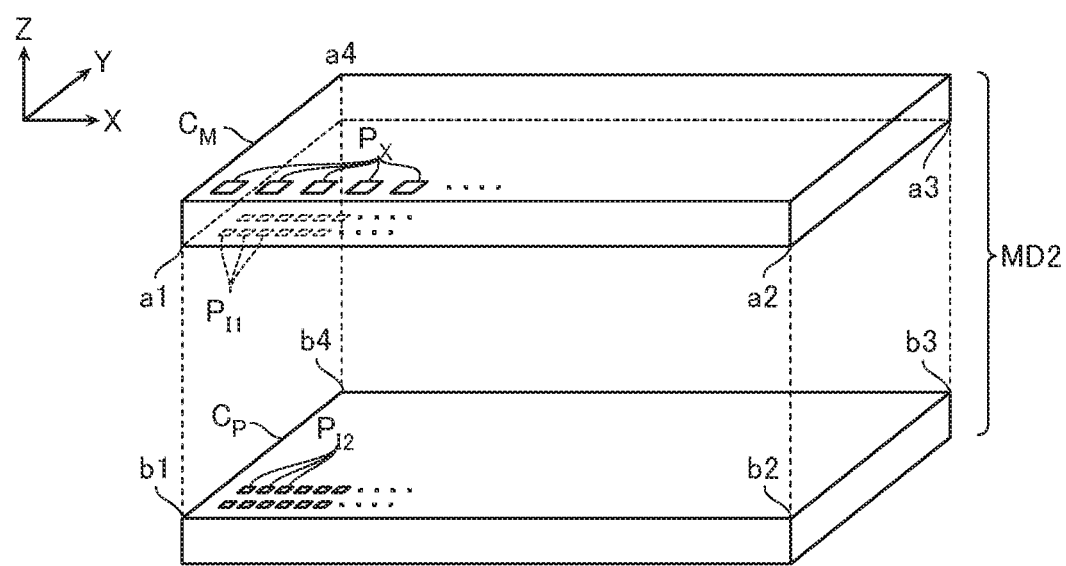
FIG. 36 is a schematic exploded perspective view illustrating an example of a configuration of a semiconductor memory device according to a fifth embodiment.

Next, a semiconductor memory device according to the fifth embodiment will be described.
[Structure of Memory Die MD]
FIG. 36 is a schematic exploded perspective view illustrating an example of a configuration of a semiconductor memory device according to this embodiment. As illustrated in FIG. 36, the memory die MD includes a chip $C_M$ at the memory cell array MCA side and a chip $C_P$ at the peripheral circuit PC side.

On the upper surface of the chip $C_M$, a plurality of external pad electrodes $P_X$ connectable to bonding wires (not illustrated) are disposed. On the lower surface of the chip $C_M$, a plurality of bonding electrodes $P_{I1}$ are disposed. On the upper surface of the chip $C_P$, a plurality of bonding electrodes $P_{I2}$ are disposed. Hereinafter, regarding the chip $C_M$, a surface on which the plurality of bonding electrodes $P_{I1}$ are disposed is referred to as a front surface and a surface on which the plurality of external pad electrodes $P_X$ are disposed is referred to as a back surface. Regarding the chip $C_P$, a surface on which the plurality of bonding electrodes $P_{I2}$ are disposed is referred to as a front surface and a surface on the side opposite to the front surface is referred to as a back surface. In the illustrated example, the front surface of the chip $C_P$ is disposed above the back surface of the chip $C_P$ and the back surface of the chip $C_M$ is disposed above the front surface of the chip $C_M$.

In the chip $C_M$ and the chip $C_P$, the front surface of the chip $C_M$ is disposed to be opposed to the front surface of the chip $C_P$. The respective plurality of bonding electrodes $P_{I1}$ are disposed corresponding to the plurality of bonding electrodes $P_{I2}$ and are disposed at positions where the plurality of bonding electrodes $P_{I1}$ can be bonded to the plurality of bonding electrodes $P_{I2}$. The bonding electrode $P_{I1}$ and the bonding electrode $P_{I2}$ function as bonding electrodes to bond the chip $C_M$ and the chip $C_P$ together to electrically conduct them.

In the example of FIG. 36, corner portions a1, a2, a3, a4 of the chip $C_M$ correspond to corner portions b1, b2, b3, b4 of the chip $C_P$, respectively.

Figure 37:
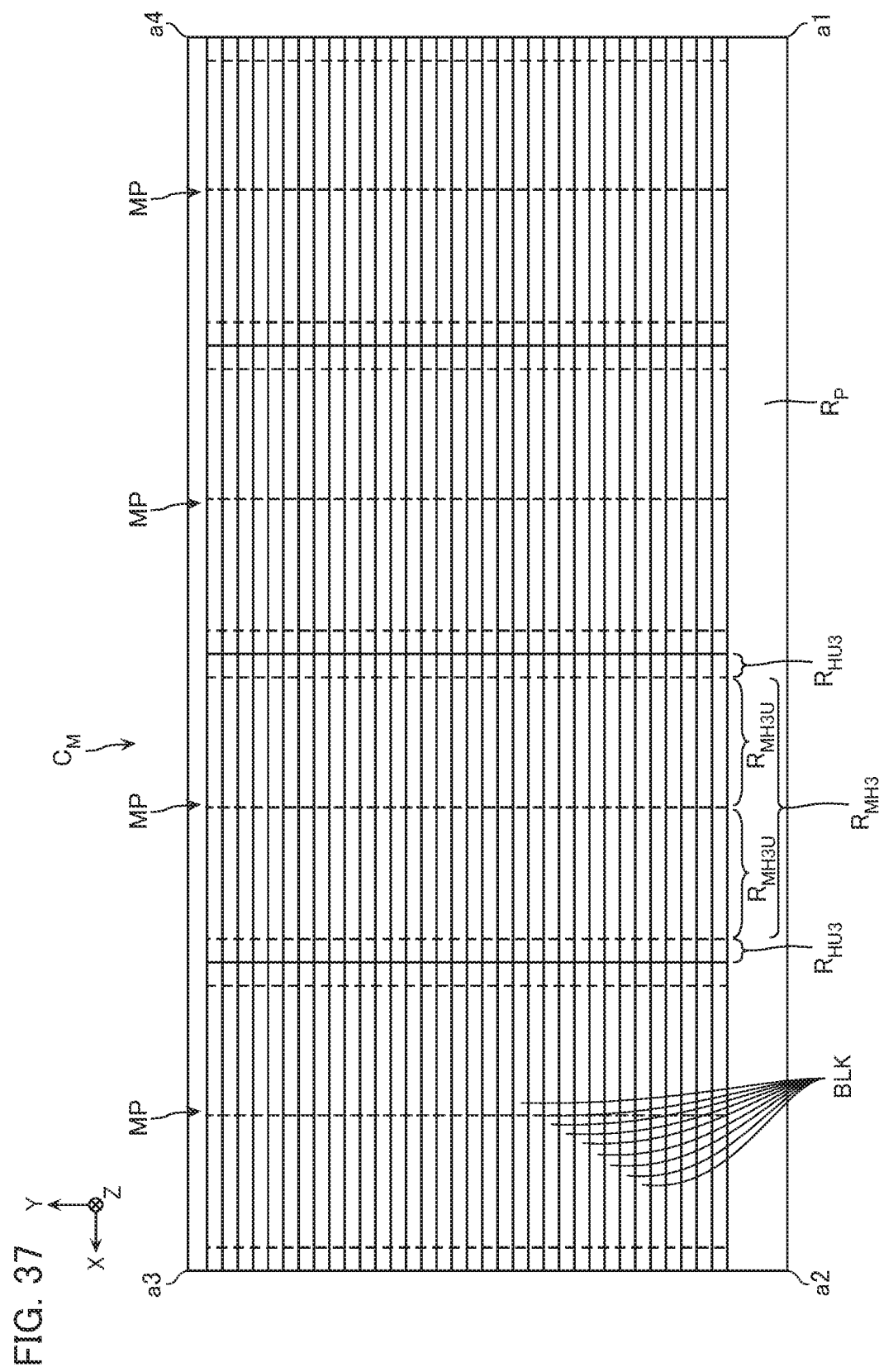
FIG. 37 is a schematic bottom view illustrating an example of a configuration of a chip $C_M$.
Figure 38:
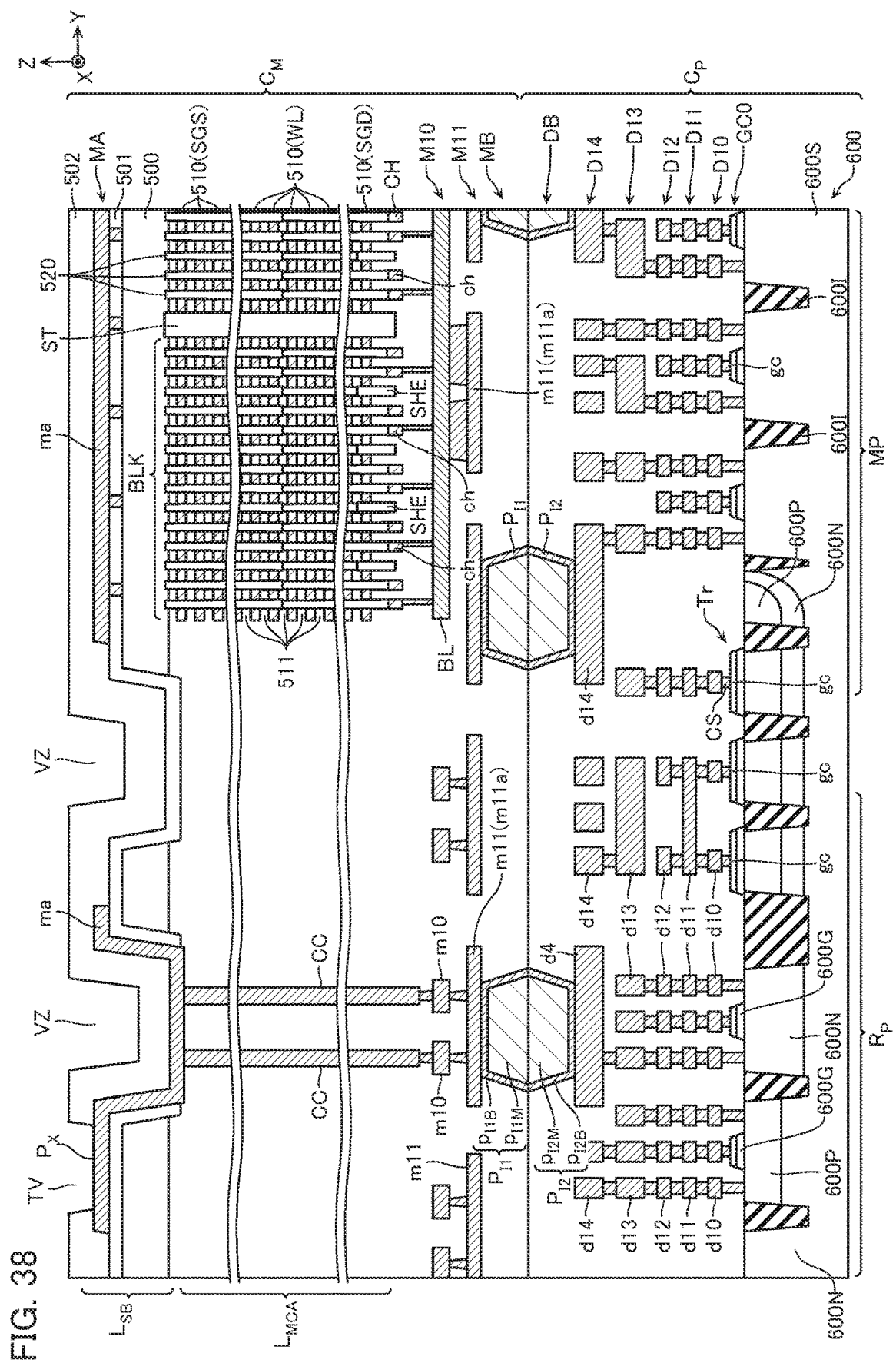
FIG. 38 is a schematic cross-sectional view illustrating a configuration of a part of the memory die MD according to the fifth embodiment.
Figure 39:
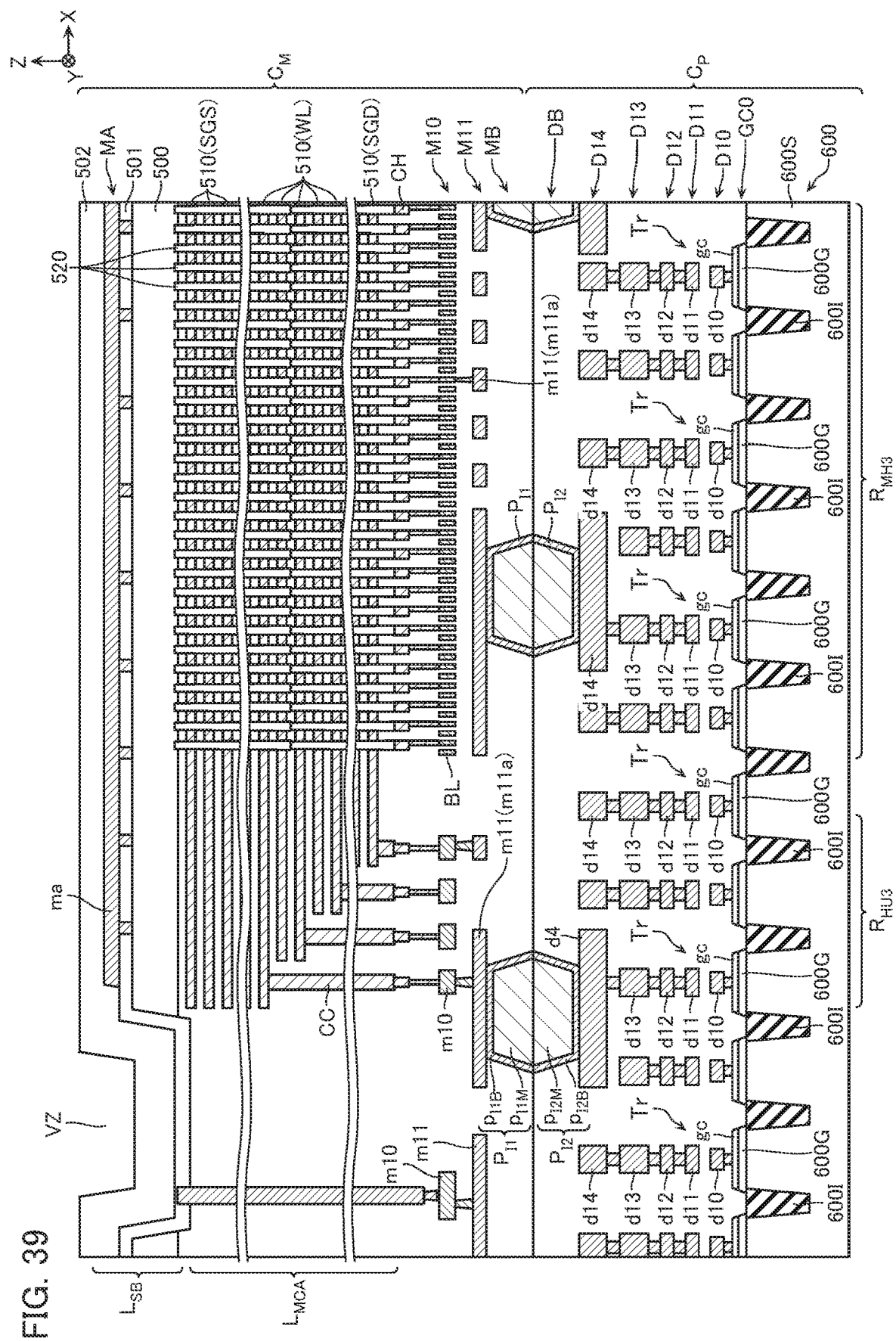
FIG. 39 is a schematic cross-sectional view illustrating a configuration of a part of the memory die MD according to the fifth embodiment.
Figure 40:
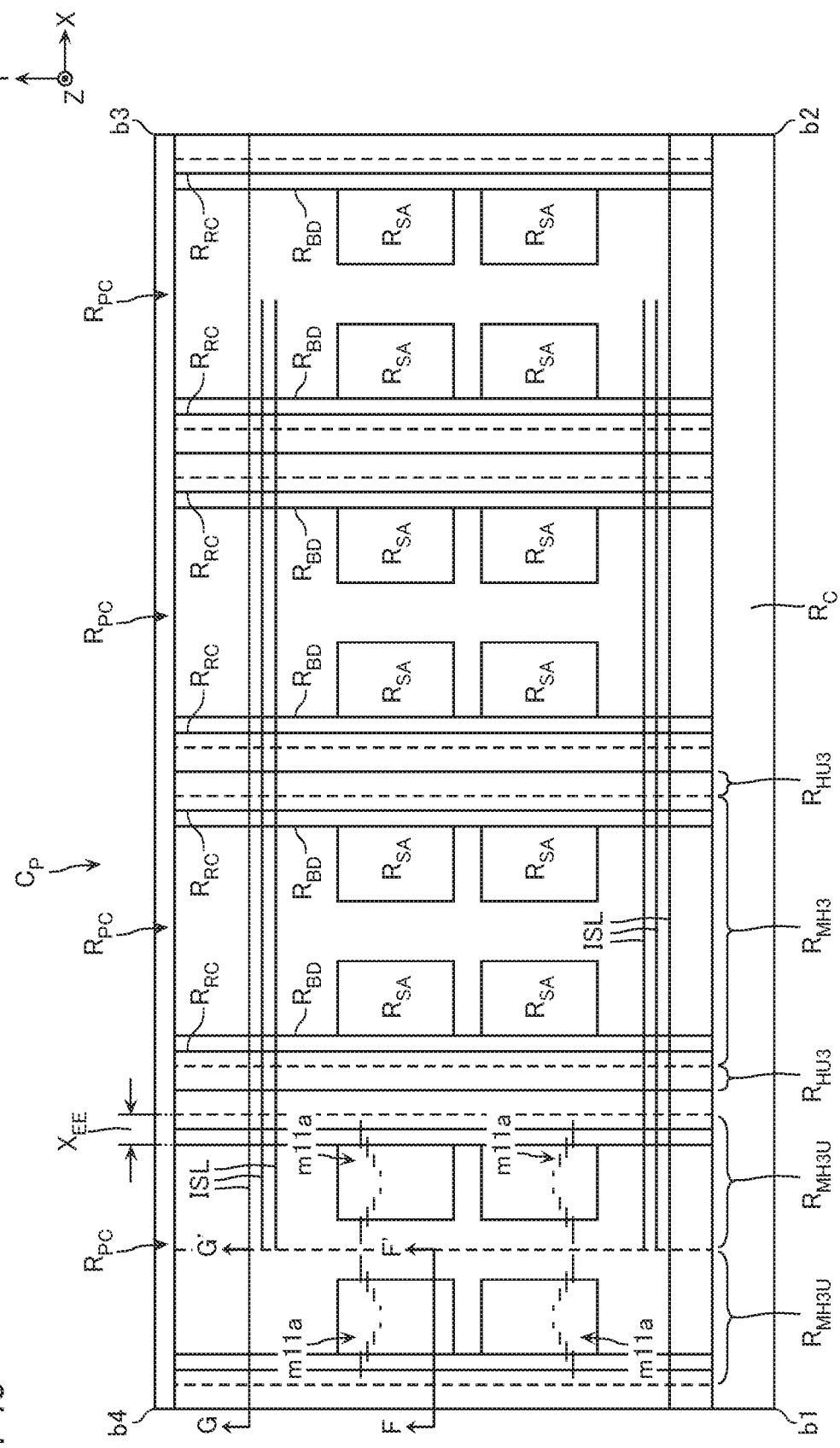
FIG. 40 is a schematic plan view illustrating an example of a configuration of a chip $C_P$.

FIG. 37 is a schematic bottom view illustrating an example of a configuration of the chip $C_M$. FIG. 37 omits a part of the configuration, such as the bonding electrodes Pr. FIG. 38 and FIG. 39 are schematic cross-sectional views illustrating a configuration of a part of the memory die MD. FIG. 40 is a schematic plan view illustrating an example of a configuration of a chip $C_P$. FIG. 40 omits a part of the configuration, such as the bonding electrodes $P_{I2}$.

[Structure of Chip $C_M$]

In the example of FIG. 37, the chip $C_M$ includes four memory planes MP arranged in the X-direction. Each of these four memory planes MP includes the plurality of memory blocks BLK arranged in the Y-direction. In the example of FIG. 37, each of the plurality of memory blocks BLK includes hook-up regions $R_{HU3}$ disposed at both end portions in the X-direction and a memory hole region $R_{MH3}$ disposed between them. Additionally, in the example of FIG. 37, the memory hole region $R_{MH3}$ is divided into two regions $R_{MH3U}$ in the X-direction. Widths in the X-direction of these two regions $R_{MH3U}$ may be all the same or need not be the same. Note that one of the two regions $R_{MH3U}$ corresponds to the divided range DU1 and the other corresponds to the divided range DU2. Additionally, the chip $C_M$ includes a peripheral region $R_P$ disposed at one end side in the Y-direction with respect to the four memory planes MP.

Note that in the illustrated example, the hook-up regions $R_{HU3}$ are disposed on both end portions in the X-direction of the memory plane MP. However, the configuration is merely an example, and the specific configuration is appropriately adjustable. For example, the hook-up region $R_{HU3}$ may be disposed not on both end portions in the X-direction of the memory plane MP but on one end portion in the X-direction. Additionally, the hook-up region $R_{HU3}$ may be disposed at the center position or a position near the center in the X-direction of the memory plane MP.

For example, as illustrated in FIG. 38, the chip $C_M$ includes a substrate layer $L_{SB}$, a memory cell array layer $L_{MCA}$ disposed below the substrate layer $L_{SB}$, a contact layer CH disposed below the memory cell array layer $L_{MCA}$, a plurality of wirings layers M10, M11 disposed below the contact layer CH, and chip bonding electrode layers MB disposed below the wiring layers M10, M11.

[Structure of Substrate Layer $L_{SB}$ in Chip $C_M$]

For example, as illustrated in FIG. 38, the substrate layer $L_{SB}$ includes a conductive layer 500 disposed on the upper surface of the memory cell array layer $L_{MCA}$, an insulating layer 501 disposed on the upper surface of the conductive layer 500, a back side wiring layer MA disposed on the upper surface of the insulating layer 501, and an insulating layer 502 disposed on the upper surface of the back side wiring layer MA.

The conductive layer 500, for example, may contain a semiconductor layer, such as silicon (Si), into which N-type impurities, such as phosphorus (P), or P-type impurities, such as boron (B), are implanted, may contain a metal, such as tungsten (W), or may contain silicide, such as tungsten silicide (WSi).

The conductive layer 500 functions as parts of the source lines SL1, SL2 (FIG. 4). The four conductive layers 500 are disposed corresponding to the four memory planes MP (FIG. 37). The memory plane MP have end portions in the X-direction and Y-direction where regions VZ that do not include the conductive layers 500 are disposed.

The insulating layer 501 contains, for example, silicon oxide ($SiO_2$).

The back side wiring layer MA includes a plurality of wirings ma. These plurality of wirings ma may contain aluminum (Al) or the like.

Parts of the plurality of wirings ma function as parts of the source lines SL1, SL2 (FIG. 4). The four wirings ma are disposed corresponding to the four memory planes MP (FIG. 37). Each of the wirings ma is electrically connected to the conductive layer 500.

Parts of the plurality of wirings ma function as the external pad electrodes $P_X$. This wiring ma is disposed in the peripheral region $R_P$. This wiring ma is connected to the contact CC in the memory cell array layer $L_{MCA}$ in the region VZ not including the conductive layer 500. A part of the wiring ma is exposed to outside the memory die MD via an opening TV provided in the insulating layer 502.

The insulating layer 502 is, for example, a passivation layer made of an insulating material, such as polyimide.

[Structure in Memory Hole Region $R_{MH3}$ in Memory Cell Array Layer $L_{MCA}$ in Chip $C_M$]

The structure in the memory hole region $R_{MH3}$ of the fifth embodiment is similar to the structure in the memory hole region $R_{MH}$ in the memory cell array layer $L_{MCA1}$, $L_{MCA2}$ of the first embodiment, which has been described with reference to FIG. 13, FIG. 20, FIG. 21, or the like, and therefore the overlapping description will be omitted. In this case, the conductive layer 110 in FIG. 13 or the like is replaced by a conductive layer 510 in FIG. 38 or the like, the insulating layer 101 in FIG. 13 or the like is replaced by the insulating layer 511 in FIG. 38 or the like, and the semiconductor layer 120 in FIG. 13 or the like is replaced by a semiconductor layer 520 in FIG. 38 or the like. Note that in the first embodiment, while the bit lines BL are disposed at the Z-direction positive side and the source lines SL1, SL2 are disposed at the Z-direction negative side, in the fifth embodiment, the bit lines BL are disposed at the Z-direction negative side and the source lines SL1, SL2 are disposed at the Z-direction positive side.

[Structure in Hook-Up Region $R_{HU3}$ in Memory Cell Array Layer $L_{MCA}$ in Chip $C_M$]

As illustrated in FIG. 39, the plurality of contacts CC are disposed in the hook-up region $R_{HU}$. Each of these plurality of contacts CC extends in the Z-direction and is connected to the conductive layer 510 at the upper end.

[Structure in Peripheral Region $R_P$ in Memory Cell Array Layer $L_{MCA}$ in Chip $C_M$]

For example, as illustrated in FIG. 38, the plurality of contacts CC are disposed corresponding to the external pad electrode $P_X$ in the peripheral region $R_P$. These plurality of contacts CC are connected to the external pad electrodes $P_X$ at the upper ends.

[Structure of Contact Layer CH]

A plurality of contacts ch included in the contact layer CH, for example, are electrically connected to at least one of the configuration in the memory cell array layer $L_{MCA}$ or the configuration in the chip $C_P$.

The contact layer CH includes the plurality of contacts ch as a plurality of wirings. For example, these plurality of contacts ch may include a stacked film of a barrier conductive film, such as titanium nitride (TiN), and a metal film, such as tungsten (W), or the like. The contacts ch are disposed corresponding to the plurality of semiconductor layers 520 and connected to lower ends of the plurality of semiconductor layers 520.

[Structure of Wiring Layers M10, M11 in Chip $C_M$]

For example, a plurality of wirings included in the wiring layers M10, M11 are electrically connected to at least one of the configuration in the memory cell array layer $L_{MCA}$ or the configuration in the chip $C_P$.

The wiring layers M10 include a plurality of the wirings m10. These plurality of wirings m10 may include, for example, a stacked film of a barrier conductive film, such as titanium nitride (TiN), and a metal film, such as copper (Cu), or the like. Note that parts of the plurality of wirings m10 function as the bit lines BL. The bit lines BL are arranged in the X-direction and extend in the Y-direction.

For example, as illustrated in FIG. 38, the wiring layer M11 includes a plurality of wirings m11. For example, these plurality of wirings m11 may include a stacked film of a barrier conductive film, such as titanium nitride (TiN), and a metal film, such as tungsten (W), or the like. Additionally, the plurality of wirings m11 may be, for example, a metal film, such as copper (Cu). Note that a wiring pattern in the wiring layer M11 will be described later.

[Structure of Chip Bonding Electrode Layer MB]

A plurality of wirings included in the chip bonding electrode layer MB are, for example, electrically connected to at least one of the configuration in the memory cell array layer $L_{MCA}$ or the configuration in the chip $C_P$.

The chip bonding electrode layer MB includes the plurality of bonding electrodes $P_{I1}$. For example, these plurality of bonding electrodes $P_{I1}$ may include a stacked film of a barrier conductive film $P_{I1B}$, such as titanium nitride (TiN), and a metal film $P_{I1M}$, such as copper (Cu), or the like.

[Structure of Chip $C_P$]

For example, as illustrated in FIG. 40, the chip $C_P$ includes four peripheral circuit regions $R_{PC}$ arranged in the X-direction corresponding to the memory planes MP. On both end portions of each of these four peripheral circuit regions $R_{PC}$ in the X-direction, row control circuit regions $R_{RC}$ are disposed. Additionally, between these two row control circuit regions $R_{RC}$, two block decoder regions $R_{BD}$ arranged in the X-direction are disposed. Between these two block decoder regions $R_{BD}$, four sense amplifier regions $R_{SA}$ arranged in the X-direction and the Y-direction are disposed. Although the illustration is omitted, a circuit is disposed in another region in the peripheral circuit region $R_{PC}$. Additionally, a circuit region $R_C$ is disposed in a region opposed to the peripheral region $R_P$ of the chip $C_P$.

In the row control circuit region $R_{RC}$, the plurality of block decoder units blkd (the word line switches WLSW constituting the block decoder units blkd) described with reference to FIG. 9 are disposed. In the block decoder region $R_{BD}$, the block decoder BLKD described with reference to FIG. 9 is disposed. In the sense amplifier region $R_{SA}$, for example, the sense amplifier SA corresponding to the bit line BL described with reference to FIG. 11 is disposed. The circuit region $R_C$ includes an input/output circuit (not illustrated). This input/output circuit is connected to the external pad electrode $P_X$ via, for example, the contact CC described with reference to FIG. 38.

FIG. 40 illustrates the regions overlapping with the hook-up region $R_{HU3}$ (FIG. 37) viewed from the Z-direction are indicated by the dotted lines. As described above, the memory hole region $R_{MH3}$ is divided into the two regions $R_{MH3U}$ in the X-direction (FIG. 37).

In the example of FIG. 40, a part of the row control circuit region $R_{RC}$ is disposed in a region overlapping with the hook-up region $R_{HU3}$ (FIG. 37) viewed from the Z-direction. Additionally, a part of the row control circuit region $R_{RC}$ is disposed in a region overlapping with the memory hole region $R_{MH3}$ (FIG. 37) viewed from the Z-direction. In the example of FIG. 40, the width in the X-direction of the row control circuit region $R_{RC}$ is larger than the width in the X-direction of the hook-up region $R_{HU3}$ (FIG. 37).

For example, as illustrated in FIG. 38, the chip $C_P$ includes a semiconductor substrate 600, electrode layers GC0 disposed above the semiconductor substrate 600, wiring layers D10, D11, D12, D13, D14 disposed above the electrode layers GC0, and chip bonding electrode layers DB disposed above the wiring layers D10, D11, D12, D13, D14.

As illustrated in FIG. 40, a plurality of general signal through wirings ISL extending in the X-direction are disposed across the four peripheral circuit regions $R_{PC}$, which are arranged in the X-direction corresponding to the four memory planes MP. These plurality of general signal through wirings ISL are, for example, formed in the wiring layers D10 to D14 in the chip $C_P$.

[Structure of Semiconductor Substrate 600 in Chip $C_P$]

The semiconductor substrate 600, for example, contains P-type silicon (Si) containing P-type impurities, such as boron (B). On the surface of the semiconductor substrate 600, for example, an N-type well region 600N containing N-type impurities, such as phosphorus (P), a P-type well region 600P containing P-type impurities, such as boron (B), a semiconductor substrate region 600S in which the N-type well region 600N or the P-type well region 600P is not disposed, and an insulating region 6001 are disposed. A part of the P-type well region 600P is disposed in the semiconductor substrate region 600S, and a part of the P-type well region 600P is disposed in the N-type well region 600N. Each of the N-type well region 600N, the P-type well region 600P, which is disposed in the N-type well region 600N and the semiconductor substrate region 600S, and the semiconductor substrate region 600S functions as the plurality of transistors Tr, parts of a plurality of capacitors, and the like constituting the peripheral circuit PC.

[Structure of Electrode Layer GC0 in Chip $C_P$]

The electrode layer GC0 is disposed on the upper surface of the semiconductor substrate 600 via an insulating layer 600G. The electrode layer GC0 includes a plurality of electrodes gc opposed to the surface of the semiconductor substrate 600. Each of the regions of the semiconductor substrate 600 and the plurality of electrodes gc included in the electrode layer GC0 is connected to the contact CS.

Each of the N-type well region 600N, the P-type well region 600P, which is disposed in the N-type well region 600N and the semiconductor substrate region 600S, and the semiconductor substrate region 600S of the semiconductor substrate 600 functions as channel regions of the plurality of transistors Tr, one electrodes of a plurality of capacitors, and the like constituting the peripheral circuit PC.

The respective plurality of electrodes gc included in the wiring layer GC0 function as the gate electrodes of the plurality of transistors Tr, the other electrodes of the plurality of capacitors, and the like constituting the peripheral circuit PC.

The contact CS extends in the Z-direction and is connected to the semiconductor substrate 600 or the upper surface of the electrode gc at a lower end. In a connection part between the contact CS and the semiconductor substrate 600, an impurity region containing N-type impurities or P-type impurities is disposed. For example, the contact CS may include a stacked film of a barrier conductive film, such as titanium nitride (TiN), and a metal film, such as tungsten (W), or the like.

[Structure of Wiring Layers D10, D11, D12, D13, D14 in Chip $C_P$]

For example, as illustrated in FIG. 38, a plurality of wirings included in the wiring layers D10, D11, D12, D13, D14 are, for example, electrically connected to at least one of the configuration in the memory cell array layer $L_{MCA}$ or the configuration in the chip $C_P$.

The wiring layers D10, D11, D12 include a plurality of wirings d10, d11, d12, respectively. For example, these plurality of wirings d10, d11, d12 may include a stacked film of a barrier conductive film, such as titanium nitride (TiN), and a metal film, such as tungsten (W), or the like.

The wiring layers D13, D14 include a plurality of wirings d13, d14, respectively. For example, these plurality of wirings d13, d14 may include a stacked film of a barrier conductive film, such as a stacked film of titanium nitride (TiN), tantalum nitride (TaN), tantalum nitride (TaN), and tantalum (Ta), and a metal film, such as copper (Cu), or the like.

[Structure of Chip Bonding Electrode Layer DB]

A plurality of wirings included in the chip bonding electrode layer DB are, for example, electrically connected to at least one of the configuration in the memory cell array layer $L_{MCA}$ or the configuration in the chip $C_P$.

The chip bonding electrode layer DB includes the plurality of bonding electrodes $P_{I2}$. For example, these plurality of bonding electrodes $P_{I2}$ may include a stacked film of a barrier conductive film $P_{I2B}$, such as a stacked film of titanium nitride (TiN), tantalum nitride (TaN), tantalum nitride (TaN), and tantalum (Ta), and a metal film $P_{I2M}$, such as copper (Cu), or the like.

[Wiring Pattern in Wiring Layer M11]

As described with reference to, for example, FIG. 9, the word line switch WLSW is connected to each of the word lines WL. Here, there is a case where comparatively large voltage is applied to the word line WL, and therefore a high breakdown voltage transistor is used as the word line switch WLSW. Here, the high breakdown voltage transistor becomes comparatively large in some cases. From the relation, an area of the row control circuit region $R_{RC}$ described with reference to FIG. 40 becomes comparatively large in some cases.

Here, when the area of the row control circuit region $R_{RC}$ is larger than the area of the hook-up region $R_{HU}$, it is considered that a part of the row control circuit region $R_{RC}$ is disposed in a region overlapping with the hook-up region $R_{HU3}$ viewed from the Z-direction, and a part of the remainder is disposed in a region not overlapping with the memory plane MP viewed from the Z-direction. However, in this case, the whole area of the peripheral circuit region Rec becomes larger than the area of the memory plane MP, and the circuit area of the memory die MD increases in some cases.

Therefore, in the fifth embodiment, as described with reference to FIG. 40, a part of the row control circuit region $R_{RC}$ is disposed in the region overlapping with the hook-up region $R_{HU3}$ viewed from the Z-direction and a part of the remainder is disposed in the region overlapping with the memory hole region $R_{MH3}$ viewed from the Z-direction.

When the structure is employed, a part of the bit lines BL are disposed at a position overlapping with the row control circuit regions $R_{RC}$ and the block decoder regions $R_{BD}$, not the sense amplifier regions $R_{SA}$, viewed from the Z-direction.

Therefore, in the fifth embodiment, wirings m11a extending in the X-direction are disposed in the wiring layer M11, and via these wirings m11a, a part of the bit lines BL and the configuration in the sense amplifier region $R_{SA}$ is electrically connected. With the configuration, the increase in the circuit area of the memory die MD in association with the increase in the area of the row control circuit region $R_{RC}$ is reduced, and the semiconductor memory device that allows high integration can be provided.

[Variation in Wiring Resistance in Read Operation]

Figure 41:
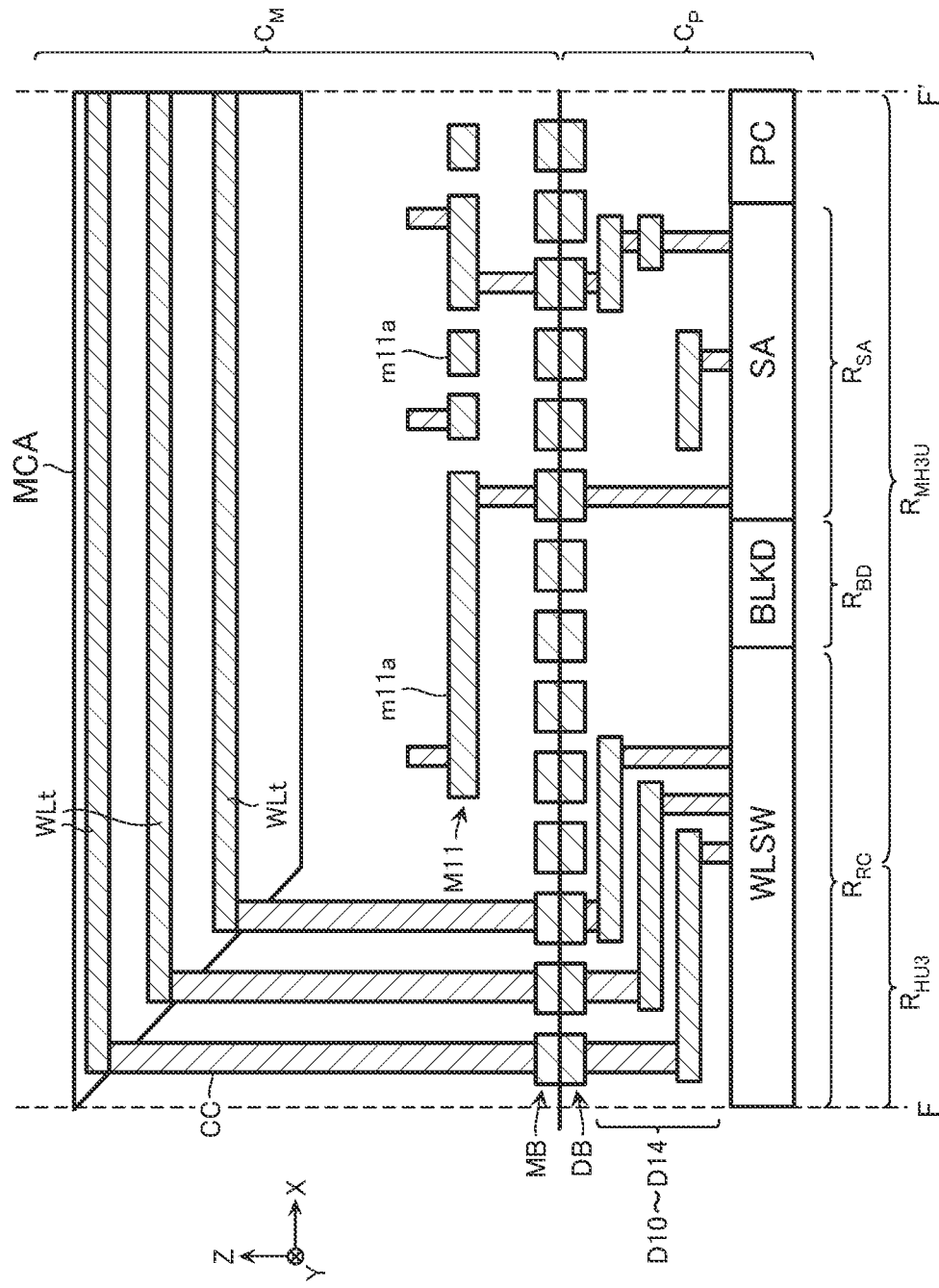
FIG. 41 is a schematic cross-sectional view of a structure illustrated in FIG. 40 taken along the line F-F' and viewed along the arrow direction.
Figure 42:
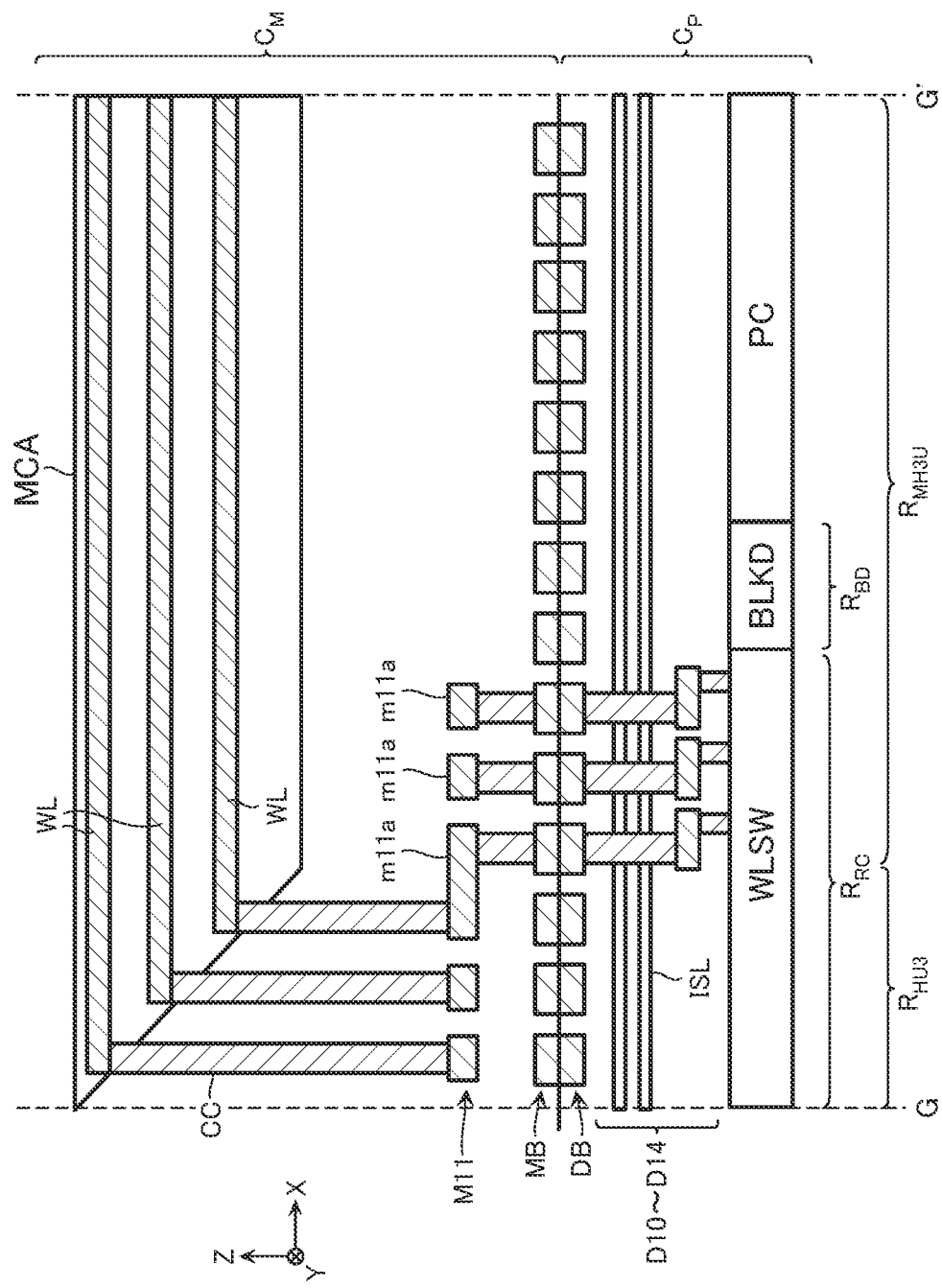
FIG. 42 is a schematic cross-sectional view of a structure illustrated in FIG. 40 taken along the line G-G' and viewed along the arrow direction.

FIG. 41 is a schematic cross-sectional view of a structure illustrated in FIG. 40 taken along the line F-F' and viewed along the arrow direction. FIG. 42 is a schematic cross-sectional view of a structure illustrated in FIG. 40 taken along the line G-G' and viewed along the arrow direction. FIG. 41 and FIG. 42 are simplified cross-sectional views. Note that in FIG. 41 and FIG. 42, the same reference numerals age given to the configurations same as the configurations in FIG. 37 to FIG. 40, and the overlapping description will be omitted.

As described with reference to FIG. 40, a part of the bit lines BL are electrically connected to the sense amplifier SA in the sense amplifier region $R_{SA}$ via the wirings m11a in the wiring layer M11. In this case, as illustrated in FIG. 41, as wirings that electrically connect the word line switches WLSW of the row control circuit region $R_{RC}$ close to the sense amplifier region $R_{SA}$ in the X-direction and the word lines WL (hereinafter referred to as specific word lines WLt), the wirings m11a in the wiring layer M11 cannot be used, and the wirings d10, d11, d12 in the wiring layers D10, D11, D12 need to be used. Meanwhile, as illustrated in FIG. 42, as wirings that electrically connect the word lines WL other than the specific word lines WLt and the word line switches WLSW, the wirings m11a in the wiring layer M11 are used.

Here, when any one of the two divided ranges DU1, DU2 of the word lines WL (the divided range DU1 or the divided range DU2) has a failure, there may be a case where the divided ranges of the different word lines WL not having a failure are combined to ensure a storage capacity for 16 k bytes of read target. In this case, there may be a case where the divided range of the specific word lines WLt and the divided range of the word lines WL other than the specific word lines WLt are combined. Therefore, there may be a case where a peculiar difference occurs between a wiring resistance between the divided range of the specific word lines WLt and the word line switches WLSW and a wiring resistance between the divided range of the word lines WL other than the specific word lines WLt and the word line switches WLSW.

Note that when the divided range of the specific word lines WLt is combined with the divided range of the word lines WL other than the specific word lines WLt, the specific word line WLt or the divided range is referred to as a first conductive layer and the word line WL other than the specific word line WLt or the divided range is referred to as a second conductive layer in some cases. The first conductive layer is a conductive layer overlapping with the sense amplifier region $R_{SA}$ viewed from the Z-direction, and the second conductive layer is a conductive layer not overlapping with the sense amplifier region $R_{SA}$ viewed from the Z-direction.

[Adjustment of Operation Parameters]
[Adjustment of Operation Parameters of Selected Word Line $WL_S$ in Read Operation]

The operation parameters of the selected word line $WL_S$ in the read operation according to the fifth embodiment are similar to those described in the first embodiment (FIG. 26) and the second embodiment (FIG. 29). That is, the operation parameters of the selected word line $WL_S$ in the read operation include the wait time Ta in FIG. 26 and the voltage Va applied to the selected word line $WL_S$ from timing t101 to timing t102 in FIG. 26. The operation parameters of the selected word line $WL_S$ in the read operation include the wait time Te in FIG. 29 and the voltage Ve applied to the selected word line $WL_S$ from timing t102 to timing t103 in FIG. 29.

Figure 43:
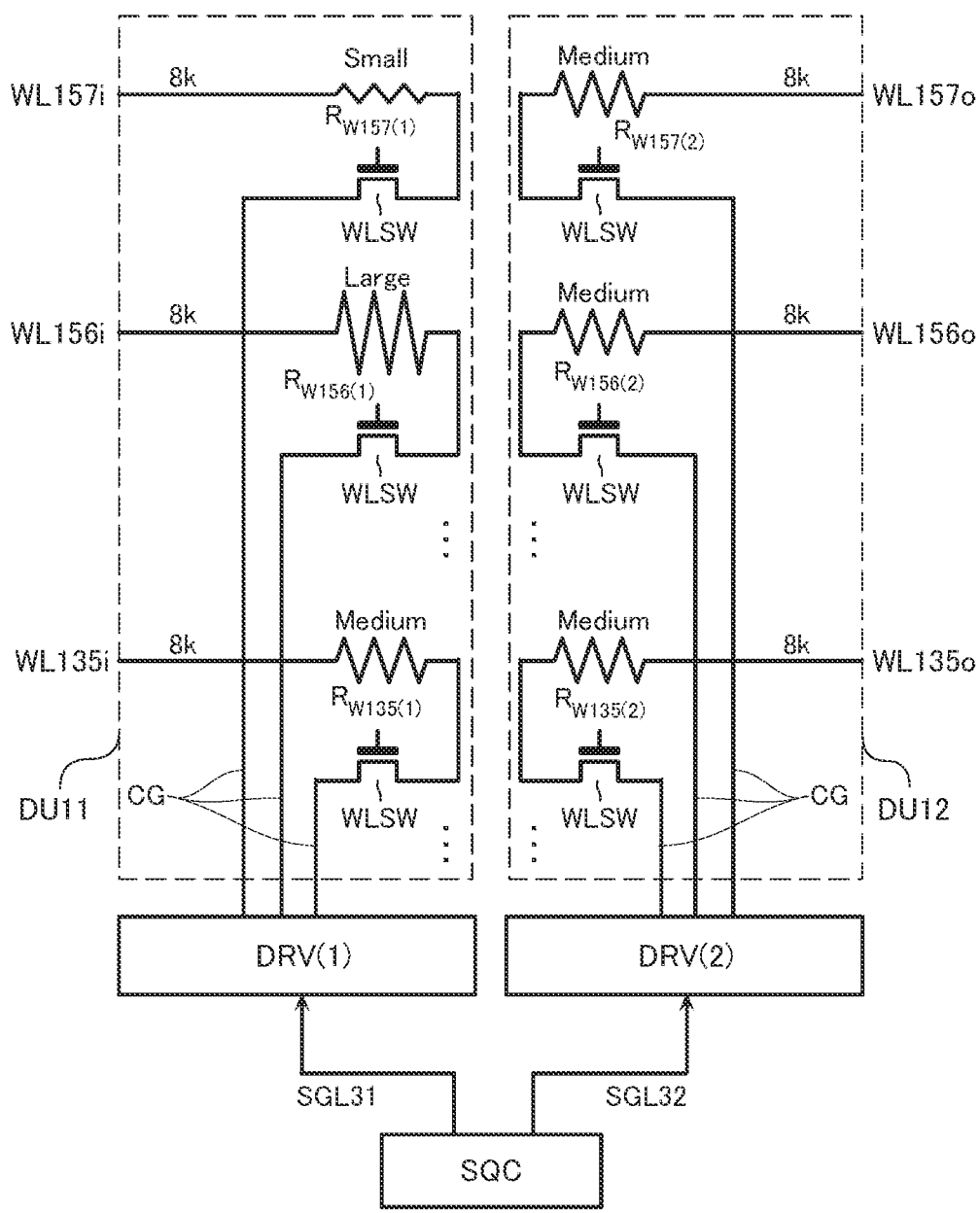
FIG. 43 is a schematic diagram for describing adjustment of an operation parameter of the selected word line $WL_S$ according to the fifth embodiment.

FIG. 43 is a schematic diagram for describing adjustment of the operation parameter of the selected word line $WL_S$ according to the fifth embodiment. Note that the meaning of "8k" in FIG. 43 is similar to that described in FIG. 27.

A word line WL135i and a word line WL135o in FIG. 43 are different word lines, and by combining divided ranges of these word lines WL135i, WL135o, 16 k bytes of the read target are configured. Similarly, by combining divided ranges of word lines WL156i, WL156o, 16 k bytes of the read target are configured, and by combining divided ranges of word lines WL157i, WL157o, 16 k bytes of the read target are configured. Note that magnitudes of the wiring resistances $R_W$ of the word lines WL135i, WL135o, WL156i, WL156o, WL157i, WL157o in FIG. 43 are similar to those described in FIG. 27.

As illustrated in FIG. 43, the respective word lines WL135i, WL156i, WL157i in the divided range DU1 are connected to a CG driver circuit DRV(1) with the wirings CG via the word line switches WLSW. Additionally, the respective word lines WL135o, WL156o, WL157o of the divided range DU2 are connected to a CG driver circuit DRV(2) with the wirings CG via the word line switches WLSW. Thus, the word line switches WLSW are connected to each of the divided ranges DU1, DU2. Note that although the word line decoder WLD and the like are disposed between the word line switches WLSW and the CG driver circuits DRV(1), DRV(2) (FIG. 5), FIG. 43 omits them.

The respective CG driver circuits DRV(1), DRV(2) perform a voltage supply operation on the divided ranges DU1, DU2 of the word lines WL (wirings CG) in accordance with control signals SGL31, SGL32 from the sequencer SQC. Each of the control signals SGL31, SGL32 includes the signals from the signal lines VSEL1 to VSEL6 in FIG. 5.

In the first embodiment (FIG. 27) and the second embodiment (FIG. 29), the operation parameters (the wait time Ta, the voltage Va, the wait time Te, and the voltage Ve) of the selected word line $WL_S$ are adjusted in units of the word lines WL. In contrast to this, in the fifth embodiment (FIG. 43), the operation parameters (the wait time Ta, the voltage Va, the wait time Te, and the voltage Ve) of the selected word line $WL_S$ are adjusted in units of the divided ranges DU1, DU2 of the word lines WL.

For example, when the selected word lines $WL_S$ are the word lines WL157i, WL157o, in the operation parameters (the wait time Ta, the voltage Va, the wait time Te, and the voltage Ve) of the divided range DU1 (the divided range having the "small wiring resistance $R_{W157(1)}$) of the word line WL157i, the wait time Ta is set to be shorter than, the voltage Va is set to be smaller than, the wait time Te is set to be shorter than, and the voltage Ve is set to be larger than those of the operation parameters of the divided range DU2 (the divided range having the "middle" wiring resistance $R_{W157(2)}$) of the word line WL157o. When the selected word lines $WL_S$ are the word lines WL156i, WL156o, in the operation parameters of the divided range DU1 (the divided range having the "large" wiring resistance $R_{W156(1)}$) of the word line WL156i, the wait time Ta is set to be longer than, the voltage Va is set to be larger than, the wait time Te is set to be longer than, and the voltage Ve is set to be smaller than those of the operation parameters of the divided range DU2 (the divided range having the "middle" wiring resistance $R_{W156(2)}$) of the word line WL156o. Note that any one of or a plurality of the operation parameters (the wait time Ta, the voltage Va, the wait time Te, and the voltage Ve) of the divided ranges DU1, DU2 may be adjusted. By adjusting the operation parameter, in the read operation, the appropriate charge can be performed on each of the divided ranges DU1, DU2 of the selected word lines $WL_S$ according to the wiring resistances $R_W$ of the divided ranges DU1, DU2 of the selected word lines $WL_S$.

[Adjustment of Operation Parameters of Selected Word Line $WL_S$ in Write Operation]

The operation parameters of the selected word line $WL_S$ in the write operation according to the fifth embodiment are similar to those described in the third embodiment (FIG. 33, FIG. 34) and the fourth embodiment (FIG. 35). That is, the operation parameters of the selected word line $WL_S$ in the write operation include the wait time Tf in FIG. 33 and the voltage Vf in FIG. 34. The operation parameters of the selected word line $WL_S$ in the write operation include the wait time Ta' and the wait time Te' in FIG. 35.

For example, when the selected word lines $WL_S$ are the word lines WL157i, WL157o, in the operation parameters (the wait time Tf, the voltage Vf, the wait time Ta', and the wait time Te') of the divided range DU1 (the divided range having the "small" wiring resistance $R_{W157(1)}$) of the word line WL157i, the wait time Tf is set to be shorter than, the voltage Vf is set to be smaller than, the wait time Ta' is set to be shorter than, and the wait time Te' is set to be shorter than those of the operation parameters of the divided range DU2 (the divided range having the "middle" wiring resistance $R_{W157(2)}$) of the word line WL157o. When the selected word lines $WL_S$ are the word lines WL156i, WL156o, in the operation parameters of the divided range DU1 (the divided range having the "large" wiring resistance $R_{W156(1)}$) of the word line WL156i, the wait time Tf is set to be longer than, the voltage Vf is set to be larger than, the wait time Ta' is set to be longer than, and the wait time Te' is set to be longer than those of the operation parameters of the divided range DU2 (the divided range having the "middle" wiring resistance $R_{W156(2)}$) of the word line WL156o. Note that any one of or a plurality of the operation parameters (the wait time Tf, the voltage Vf, wait time Ta', and the wait time Te') of the divided ranges DU1, DU2 may be adjusted. By adjusting the operation parameter, in the write operation, the appropriate charge can be performed on each of the divided ranges DU1, DU2 of the selected word lines $WL_S$ according to the wiring resistances $R_W$ of the divided ranges DU1, DU2 of the selected word lines $WL_S$.

[Adjustment of Operation Parameters of Bit Line BL and Source Lines SL1, SL2]

The operation parameters of the bit lines BL in the read operation according to the fifth embodiment are similar to those described in the first embodiment (FIG. 26) and the second embodiment (FIG. 29). That is, the operation parameters of the bit lines BL in the read operation include the wait time Tb in FIG. 26 and FIG. 29, the voltage Vb applied to the bit line BL from timing t104 to timing t105 in FIG. 26 and FIG. 29, the wait time Tc in FIG. 26 and FIG. 29, and the wait time Td in FIG. 26 and FIG. 29.

Additionally, the operation parameters of the source lines SL1, SL2 in the read operation according to the fifth embodiment are similar to those described in the first embodiment (FIG. 26) and the second embodiment (FIG. 29). That is, the operation parameters of the source lines SL1, SL2 in the read operation include the wait time Ts in FIG. 26 and FIG. 29 and the voltage Vs applied to the source lines SL1, SL2 from timing t103 to timing t105 in FIG. 26 and FIG. 29.

Figure 44:
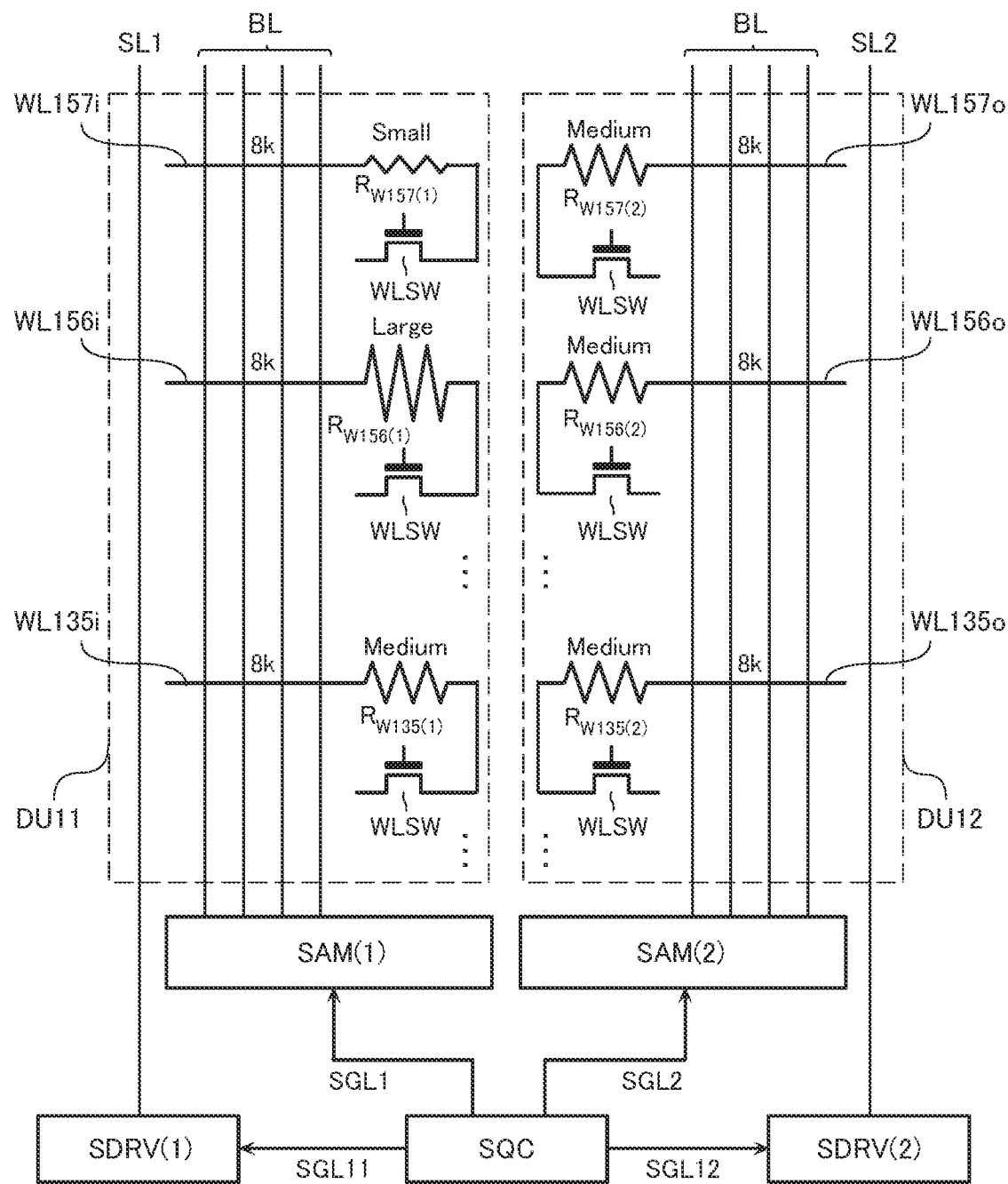
FIG. 44 is a schematic diagram for describing adjustment of the operation parameters of the bit lines BL and the source lines SL1, SL2 according to the fifth embodiment.

FIG. 44 is a schematic diagram for describing adjustment of the operation parameters of the bit lines BL and the source lines SL1, SL2 according to the fifth embodiment. Note that the meaning of the word lines WL135$i$, WL135$o$, WL156$i$, WL156$o$, WL157$i$, WL157$o$ in FIG. 44 are similar to that described in FIG. 43. The meaning of "8k" in FIG. 44 is similar to that described in FIG. 27. Additionally, the magnitudes of the wiring resistances $R_W$ of the word lines WL135$i$, WL135$o$, WL156$i$, WL156$o$, WL157$i$, WL157$o$ in FIG. 44 are also similar to those described in FIG. 27.

The configuration illustrated in FIG. 44 is basically similar to the configuration illustrated in FIG. 28A. However, in the configuration illustrated in FIG. 44, the word line switches WLSW are connected to each of the divided ranges DU1, DU2. Additionally, adjustment of the operation parameters of the bit lines BL and the source lines SL1, SL2 according to the fifth embodiment are similar to the adjustment of the operation parameters of the bit lines BL and the source lines SL1, SL2 according to the first embodiment and the fourth embodiment.

For example, when the selected word lines $WL_S$ are the word lines WL157$i$, WL157$o$, in the operation parameters (the wait time Tb, the voltage Vb, the wait time Tc, and the wait time Td) of the bit lines BL of the divided range DU1 (the divided range having the "small" wiring resistance $R_{W157(1)}$) of the word line WL157$i$, the wait time Tb is set to be shorter than, the voltage Vb is set to be smaller than, the wait time Tc is set to be longer than, and the wait time Td (sense time) is set to be longer than those of the operation parameters of the bit lines BL of the divided range DU2 (the divided range having the "middle" wiring resistance $R_{W157(2)}$) of the word line WL157$o$.

When the selected word lines $WL_S$ are the word lines WL156$i$, WL156$o$, in the operation parameters of the bit lines BL of the divided range DU1 (the divided range having the "large" wiring resistance $R_{W156(1)}$) of the word line WL156$i$, the wait time Tb is set to be longer than, the voltage Vb is set to be larger than, the wait time Tc is set to be longer than, and the wait time Td (sense time) is set to be shorter than those of the operation parameters of the bit lines BL of the divided range DU2 (the divided range having the "middle" wiring resistance $R_{W156(2)}$) of the word line WL156$o$.

Note that any one of or a plurality of the operation parameters (the wait time Tb, the voltage Vb, the wait time Tc, and the wait time Td) of the bit line BL may be adjusted. By adjusting the operation parameter, in the read operation, the appropriate charge and the sense operation can be performed on the bit lines BL belonging to the divided ranges DU1, DU2 according to the wiring resistances $R_W$ of the divided ranges DU1, DU2 of the selected word lines $WL_S$. Consequently, reliability of the read operation is improved.

For example, when the selected word lines $WL_S$ are the word lines WL157$i$, WL157$o$, in the operation parameters (the wait time Ts and the voltage Vs) of the source line SL1 of the divided range DU1 (the divided range having the "small" wiring resistance $R_{W157(1)}$) of the word line WL157$i$, the wait time Ts is set to be shorter than and the voltage Vs is set to be smaller than those of the operation parameters of the source line SL2 of the divided range DU2 (the divided range having the "middle" wiring resistance $R_{W157(2)}$) of the word line WL157.

When the selected word lines $WL_S$ are the word lines WL156$i$, WL156$o$, in the operation parameters of the source line SL1 of the divided range DU1 (the divided range having the "large" wiring resistance $R_{W156(1)}$) of the word line WL156$i$, the wait time Ts is set to be longer than and the voltage Vs is set to be larger than those of the operation parameters of the source line SL2 of the divided range DU2 (the divided range having the "middle" wiring resistance $R_{W156(2)}$) of the word line WL156$o$.

Note that any one of the operation parameters (the wait time Ts and the voltage Vs) of the source lines SL1, SL2 may be adjusted. By adjusting the operation parameter, in the read operation, the source lines SL1, SL2 belonging to the divided ranges DU1, DU2 can be appropriately charged according to the wiring resistances $R_W$ of the divided ranges DU1, DU2 of the selected word line $WL_S$. Consequently, reliability of the read operation is improved.

Sixth Embodiment

In the first embodiment to the fifth embodiment, the respective plurality of word lines WL are physically or virtually divided into the two divided ranges DU1, DU2. In contrast to this, in the sixth embodiment, the respective plurality of word lines WL are physically or virtually divided in four divided ranges DU21, DU22, DU23, DU24.

Figure 45:
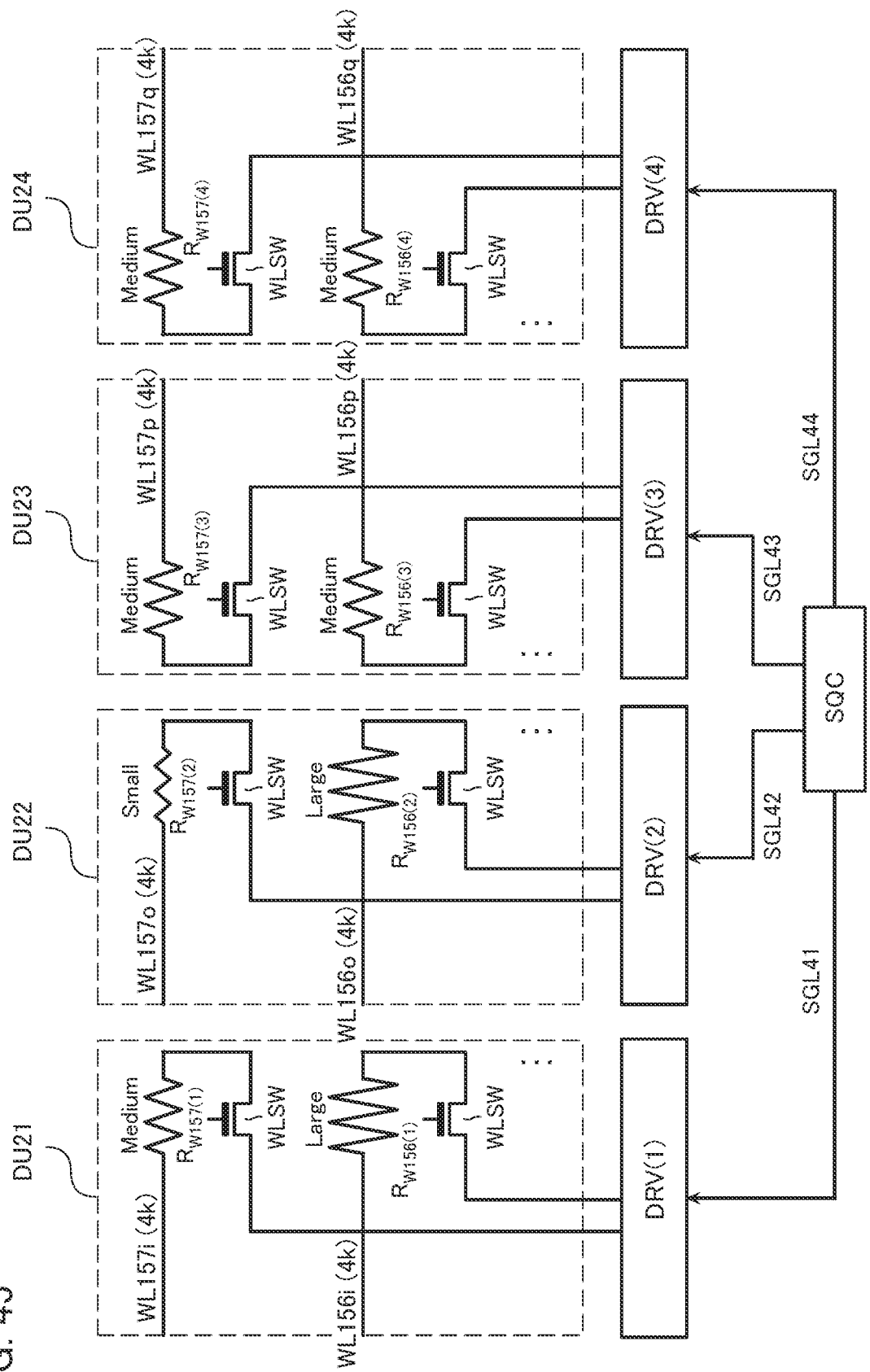
FIG. 45 is a schematic diagram for describing adjustment of the operation parameter of the selected word line $WL_S$ according to a sixth embodiment.

FIG. 45 is a schematic diagram for describing adjustment of the operation parameter of the selected word line $WL_S$ according to the sixth embodiment. The word lines WL156$i$, WL156$o$, WL156$p$, WL156$q$ in FIG. 45 are a combination of the divided ranges of the four different word lines. Similarly, the word lines WL157$i$, WL157$o$, WL156$p$, WL156$q$ are a combination of the divided ranges of the four different word lines are combined.

"4k" in FIG. 45 indicates that each of storage capacities of the divided ranges DU21, DU22, DU23, DU24 of the word lines WL156$i$, WL156$o$, WL156$p$, WL156$q$, WL157$i$, WL157$o$, WL157$p$, WL157$q$ is 4 k bytes. Therefore, the memory cells MC by the number corresponding to the storage capacity by 4 k bytes of the read target are connected to the combination of the divided ranges DU21, DU22, DU23, DU24 of each of the word lines WL156$i$, WL156$o$, WL156$p$, WL156$q$. Additionally, the memory cells MC by the number corresponding to the storage capacity by 4 k bytes of the read target are connected to the divided ranges DU21, DU22, DU23, DU24 of each of the word lines WL157i, WL157o, WL157p, WL157q. Accordingly, to each of the word lines WL156i, WL156o, WL156p, WL156q, the memory cells MC by the number corresponding to the storage capacity of 16 k bytes of the read target are connected. Additionally, to each of the word lines WL157i, WL157o, WL157p, WL157q, the memory cells MC by the number corresponding to the storage capacity of 16 k bytes of the read target are connected. Note that the values in FIG. 45 are one example, and the values are not limited to them.

As illustrated in FIG. 45, the divided ranges DU21, DU22, DU23, DU24 of the word lines WL156i, WL156o, WL156p, WL156q are connected to the CG driver circuits DRV(1), DRV(2), DRV(3), DRV(4), respectively, with the wirings CG via the word line switches WLSW. Additionally, the divided ranges DU21, DU22, DU23, DU24 of the word lines WL157i, WL157o, WL157p, WL157q are connected to the CG driver circuits DRV(1), DRV(2), DRV(3), DRV(4), respectively, with the wirings CG via the word line switches WLSW.

The CG driver circuits DRV(1), DRV(2), DRV(3), DRV(4) perform a voltage supply operation on the divided ranges DU21, DU22, DU23, DU24 of the word lines WL (the wirings CG) in accordance with control signals SGL41, SGL42, SGL43, SGL44, respectively, from the sequencer SQC. The control signals SGL41, SGL42, SGL43, SGL44 each include signals of the signal lines VSEL1 to VSEL6 in FIG. 5.

In the sixth embodiment (FIG. 45), the operation parameters (the wait time Ta, the voltage Va, the wait time Te, and the voltage Ve) of the selected word line $WL_S$ are adjusted in units of the divided ranges DU21, DU22, DU23, DU24 of the word lines WL. Note that the adjustment of the operation parameters of the selected word lines $WL_S$ is as described above, and it will not be further elaborated here.

Figure 46:
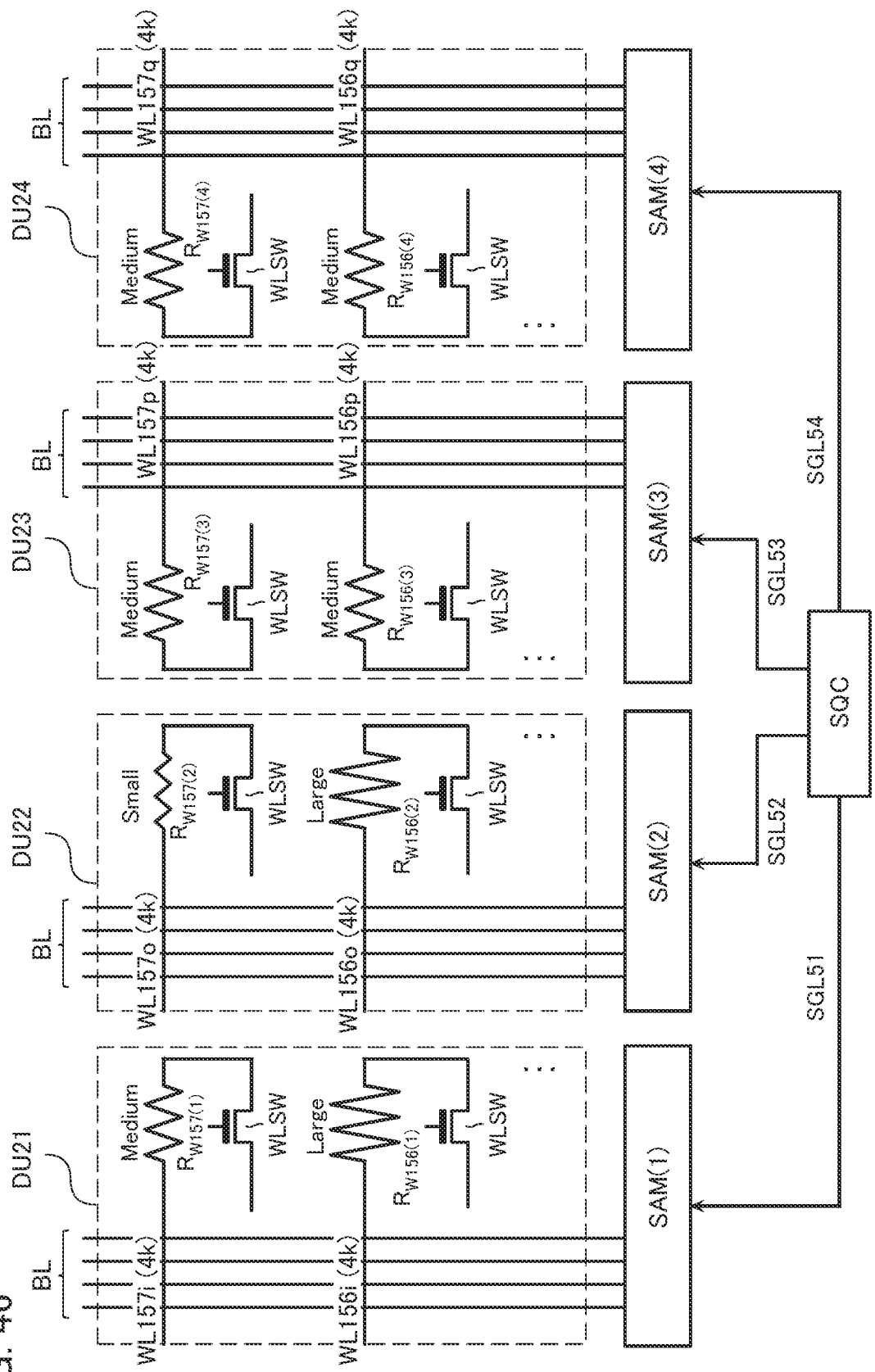
FIG. 46 is a schematic diagram for describing adjustment of the operation parameters of the bit lines BL and the source lines SL1, SL2 according to the sixth embodiment.

FIG. 46 is a schematic diagram for describing adjustment of the operation parameters of the bit lines BL and the source lines SL1, SL2 according to the sixth embodiment. As illustrated in FIG. 46, the bit lines BL of the divided ranges DU21, DU22, DU23, DU24 are connected to the sense amplifier modules SAM(1), SAM(2), SAM(3), SAM(4), respectively. The sense amplifier modules SAM(1), SAM(2), SAM(3), SAM(4) perform the voltage supply operation and the sense operation on the bit lines BL of the divided ranges DU21, DU22, DU23, DU24 in accordance with control signals SGL51, SGL52, SGL53, SGL54 from the sequencer SQC. All of the control signals SGL51, SGL52, SGL53, SGL54 include signals from the signal lines STB, XXL, BLC, BLS, HLL, BLX, CLKSA, LBP.

Note that FIG. 46 omits the source line driver circuits SDRV. However, the source line SL corresponding to the divided ranges DU21, DU22, DU23, DU24 (for example, source lines SL1, SL2, SL3, SL4) are connected to the source line driver circuits SDRV(1), SDRV(2), SDRV(3), SDRV(4), respectively. The source line driver circuits SDRV(1), SDRV(2), SDRV(3), SDRV(4) perform the voltage supply operation on the source lines SL corresponding to the divided ranges DU21, DU22, DU23, DU24 in accordance with the control signals for each of the divided ranges DU21, DU22, DU23, DU24 from the sequencer SQC.

In the sixth embodiment (FIG. 46), the operation parameter (voltage Vs) of the source line SL is adjusted in units of the divided ranges DU21, DU22, DU23, DU24 of the word lines WL. Note that the adjustment of the operation parameters of the source lines SL is as described above, and it will not be further elaborated here.

Seventh Embodiment

The example of application to the NAND flash memory has been described in the above-described embodiments. However, the technique described in this specification is also applicable to a configuration other than the NAND flash memory, such as a three-dimensional NOR flash memory.

Figure 47:
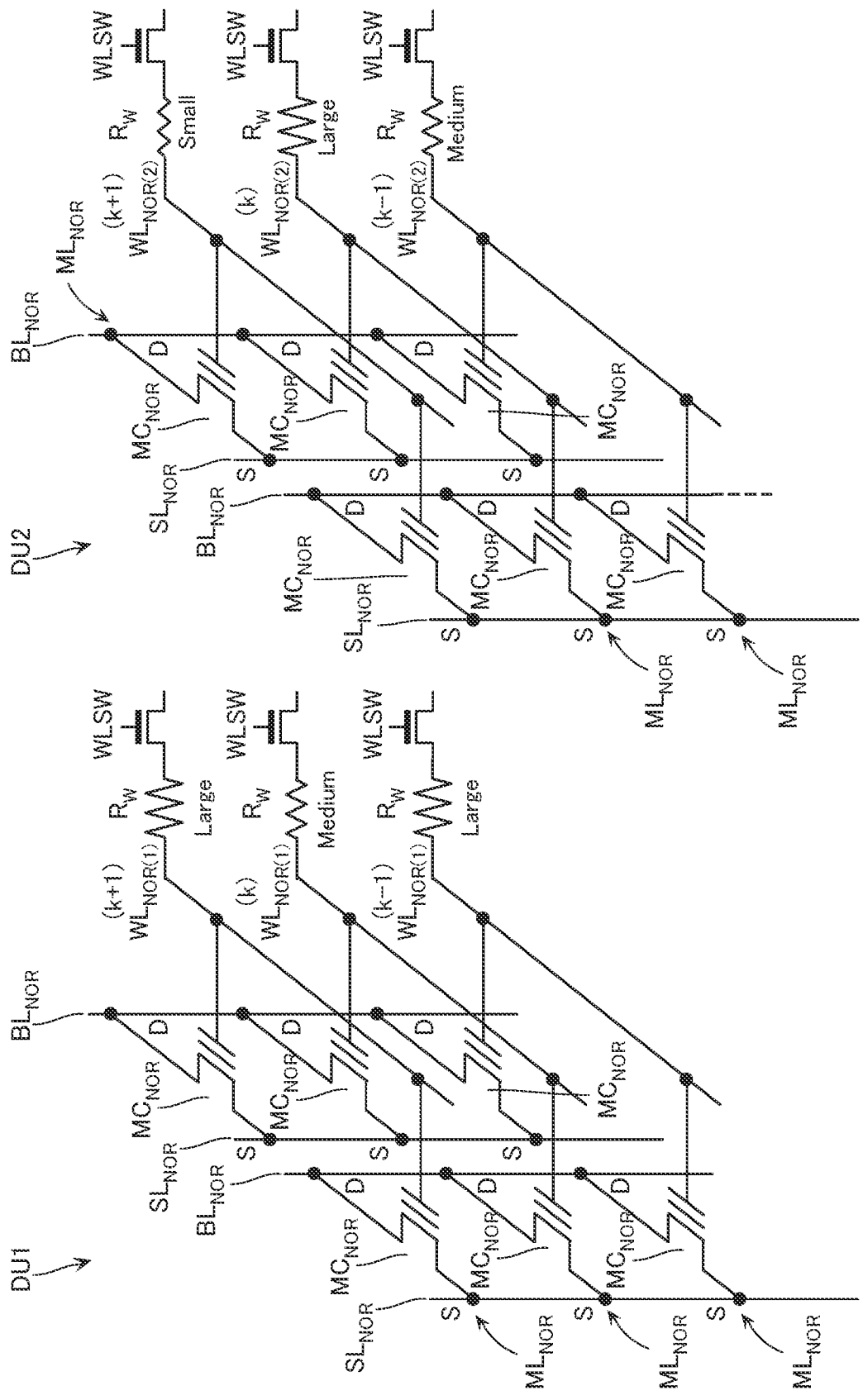
FIG. 47 is a schematic circuit diagram illustrating an example of a configuration of a three-dimensional NOR flash memory.

FIG. 47 is a schematic circuit diagram illustrating an example of a configuration of the three-dimensional NOR flash memory. The NOR flash memory illustrated in FIG. 47 as an example includes a plurality of memory layers $ML_{NOR}$. These plurality of memory layers $ML_{NOR}$ are arranged in a direction perpendicular to the substrate. Additionally, each of these plurality of memory layers $ML_{NOR}$ includes a word line $WL_{NOR}$ and a plurality of memory cells $MC_{NOR}$ connected to the word line $WL_{NOR}$.

The memory cell $MC_{NOR}$ is a field-effect type transistor similarly to the memory cell MC described with reference to FIG. 3. The memory cell $MC_{NOR}$ includes a semiconductor layer, a gate insulating film, and a gate electrode. The semiconductor layer functions as a channel region. The gate insulating film includes an electric charge accumulating film. A threshold voltage of the memory cell MC changes according to an electric charge amount in the electric charge accumulating film.

The memory cell $MC_{NOR}$ has a gate electrode connected to the word line $WL_{NOR}$. The memory cell $MC_{NOR}$ has a drain electrode connected to a bit line $BL_{NOR}$. The memory cell $MC_{NOR}$ has a source electrode connected to a source line $SL_{NOR}$. A respective plurality of the bit lines $BL_{NOR}$ and the source lines $SL_{NOR}$ are disposed corresponding to the plurality of memory cells $MC_{NOR}$ disposed in the memory layer $ML_{NOR}$. The respective bit lines $BL_{NOR}$ and sources line $SL_{NOR}$ are connected to the memory cells $MC_{NOR}$ in the plurality of memory layers $ML_NOR$.

Additionally, as illustrated in FIG. 47, the respective plurality of memory layers $ML_{NOR}$ are connected to the plurality of word line switches WLSW. These plurality of word line switches WLSW are disposed corresponding to the plurality of word lines $WL_{NOR}$. The wiring resistances $R_W$ between the plurality of word lines $WL_{NOR}$ and the plurality of word line switches WLSW are, for example, "large", "middle", and "small".

The plurality of word lines $WL_{NOR}$ are physically or virtually divided into the two divided ranges DU1, DU2. For example, among the plurality of word lines $WL_{NOR}$, the memory cells $MC_{NOR}$ by the number corresponding to the storage capacity by A k bytes of the read target are connected to a k−1-th word line $WL_{NOR(1)}$, and the memory cells $MC_{NOR}$ by the number corresponding to the storage capacity by B k bytes of the read target are connected to a word line $WL_{NOR(2)}$. Note that A and B are any given numbers. Therefore, to the k−1-th word lines $WL_{NOR(1)}$, $WL_{NOR(2)}$, the memory cells $MC_{NOR}$ by the number corresponding to the storage capacity by (A+B) k bytes of the read target are connected. Similarly, the memory cells $MC_{NOR}$ by the number corresponding to the storage capacity by (A+B) k bytes of the read target are connected to the k-th word lines $WL_{NOR(1)}$, $WL_{NOR(2)}$, and the memory cells $MC_{NOR}$ by the number corresponding to the storage capacity by (A+B) k bytes of the read target are connected to the k+1-th word lines $WL_{NOR(1)}$, $WL_{NOR(2)}$.

[Operation of Three-Dimensional NOR Flash Memory]

Figure 48:
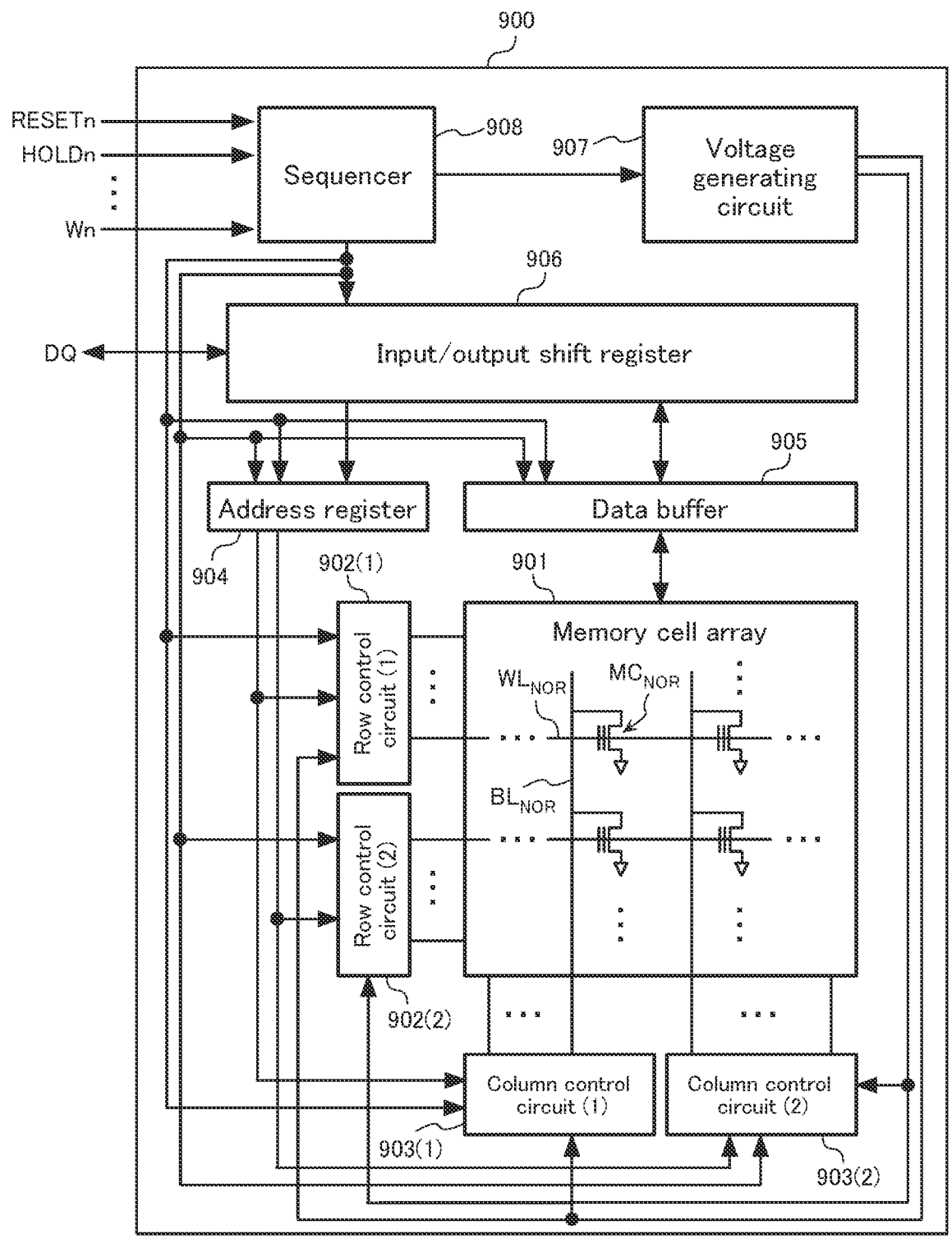
FIG. 48 is a schematic block diagram illustrating an example of a configuration of a semiconductor memory device 900 according to a seventh embodiment.

FIG. 48 is a schematic block diagram illustrating an example of a configuration of a semiconductor memory device 900 according to a seventh embodiment. The semiconductor memory device 900 according to the seventh embodiment is a three-dimensional NOR flash memory.

As illustrated in FIG. 48, the semiconductor memory device 900 includes a memory cell array 901, a row control circuit 902, a column control circuit 903, an address register 904, a data buffer 905, an input/output shift register 906, a voltage generating circuit 907, and a sequencer 908.

The memory cell array 901 includes the plurality of memory cells $MC_{NOR}$. In the semiconductor memory device 900, a gate of each of the memory cells $MC_{NOR}$ is connected to one corresponding word line $WL_{NOR}$ among the plurality of word lines $WL_{NOR}$. One end of a current path of each of the memory cells $MC_{NOR}$ is connected to one corresponding bit line $BL_{NOR}$ among the plurality of bit lines $BL_{NOR}$. The other end of the current path of each of the memory cells $MC_{NOR}$ is connected to the source line $SL_{NOR}$ and is, for example, grounded. The plurality of memory cells $MC_{NOR}$ are arranged in a two-dimensional array or a three-dimensional array.

The memory cell $MC_{NOR}$ is a field effect transistor having a stack gate structure including an electric charge accumulating layer. The electric charge accumulating layer may be a floating gate electrode or may be an electric charge trap film.

The row control circuit 902(1) is connected to the plurality of word lines $WL_{NOR(1)}$ belonging to the divided range DU1 illustrated in FIG. 47, and the row control circuit 902(2) is connected to the plurality of word lines $WL_{NOR(2)}$ belonging to the divided range DU2 illustrated in FIG. 47. The row control circuits 902(1), 902(2) include the plurality of word line switches WLSW corresponding to the plurality of word lines $WL_{NOR}$. The row control circuits 902(1), 902(2) select the word lines according to address information among the plurality of word lines $WL_{NOR}$. The row control circuits 902(1), 902(2) apply the predetermined voltage to the selected word lines (and unselected word lines) according to, for example, a writing sequence, a reading sequence, and an erase sequence.

The column control circuit 903(1) is connected to the plurality of bit lines $BL_{NOR}$ belonging to the divided range DU1 illustrated in FIG. 47, and the column control circuit 903(2) is connected to the plurality of bit lines $BL_{NOR}$ belonging to the divided range DU2 illustrated in FIG. 47. The column control circuit 903(1), 903(2) select the bit lines according to the address information among the plurality of bit lines $BL_{NOR}$. The column control circuit 903(1), 903(2) apply the predetermined voltage to the selected bit lines (and unselected bit lines) according to, for example, the writing sequence, the reading sequence, and the erase sequence.

The address register 904 temporarily stores the address information from the input/output shift register 906. The address register 904 transmits the address information to the row control circuits 902(1), 902(2) and the column control circuits 903(1), 903(2).

The data buffer 905 temporarily stores reading data from the memory cell array 901 and writing data from the input/output shift register 906.

The input/output shift register 906 temporarily stores a signal DQ transferred between the memory cell array 901 and outside the semiconductor memory device 900. The signal DQ possibly includes, for example, the reading data, the writing data, and (or) the address information. The input/output shift register 906 transmits the address information to the address register 904. The input/output shift register 906 transmits the writing data to the data buffer 905. The input/output shift register 906 transmits the reading data supplied from the memory cell array 901 to the host computer 20. The input/output shift register 906 can perform parallel-serial conversion of the signal DQ.

The voltage generating circuit 907 generates a plurality of voltages used for the respective writing sequence, reading sequence, and erase sequence. The voltage generating circuit 907 applies the generated voltage to, for example, the row control circuits 902(1), 902(2) and the column control circuits 903(1), 903(2).

The sequencer 908 controls the whole operation of the semiconductor memory device 900 based on various control signals, such as a reset signal RESETn, a hold signal HOLDn, and a write protect signal Wn. The sequencer 908 outputs the control signal to the row control circuits 902(1), 902(2), the column control circuits 903(1), 903(2), and the voltage generating circuit 907 to ensure controlling the voltage applied to the word line $WL_{NOR}$ and the bit line $BL_{NOR}$, the supply time, and the wait time.

Note that the semiconductor memory device 900 can include another component, such as a status register. The status register temporarily stores a status signal indicating the operating status inside the semiconductor memory device 900 and the execution result of the operation sequence.

In the configuration as well, according to the wiring resistance $R_W$ between the word line $WL_{NOR}$ and the word line switch WLSW, the operation parameter is adjusted in the read operation and the write operation for each of the divided ranges DU1, DU2. Thus, the appropriate read operation and write operation can be performed.

Eighth Embodiment

Figure 49:
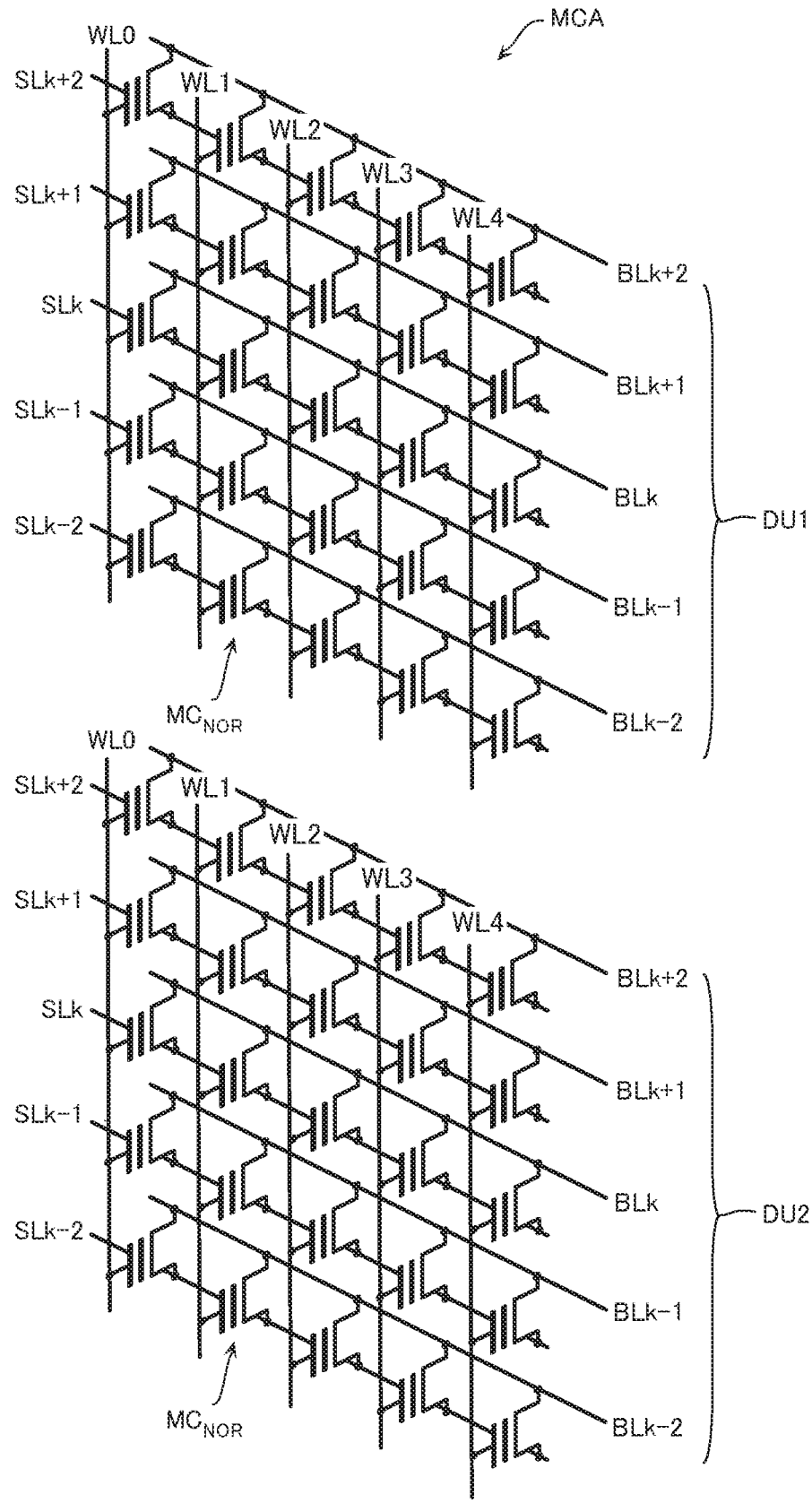
FIG. 49 is a schematic circuit diagram illustrating an example of another configuration of the three-dimensional NOR flash memory.

The configuration of the three-dimensional NOR flash memory is not limited to the configuration described with reference to FIG. 47. FIG. 49 is a schematic circuit diagram illustrating an example of another configuration of the three-dimensional NOR flash memory. In the eighth embodiment, between bit lines BLk−2 to BLk+2 (k is an integer of two or more) and source lines SLk−2 to SLk+2 extending in the horizontal direction, the plurality of memory cells $MC_{NOR}$ are connected in parallel, and the plurality of memory cells $MC_{NOR}$ disposed in the vertical direction are driven by word lines WL0 to WL4 extending perpendicularly in common. Additionally, the plurality of word lines WL0 to WL4 are physically or virtually divided in the two divided ranges DU1, DU2. Note that FIG. 49 omits the word line switches. Note that the configuration illustrated in FIG. 48 is applicable to the three-dimensional NOR flash memory illustrated in FIG. 49.

In the configuration as well, according to the wiring resistance $R_W$ between the word line WL and the word line switch, the operation parameter is adjusted in the read operation and the write operation for each of the divided ranges DU1, DU2. Thus, the appropriate read operation and write operation can be performed.

Ninth Embodiment

The technique described in this specification is, for example, applicable to the configuration other than a flash memory, such as a three-dimensional DRAM.

Figure 50:
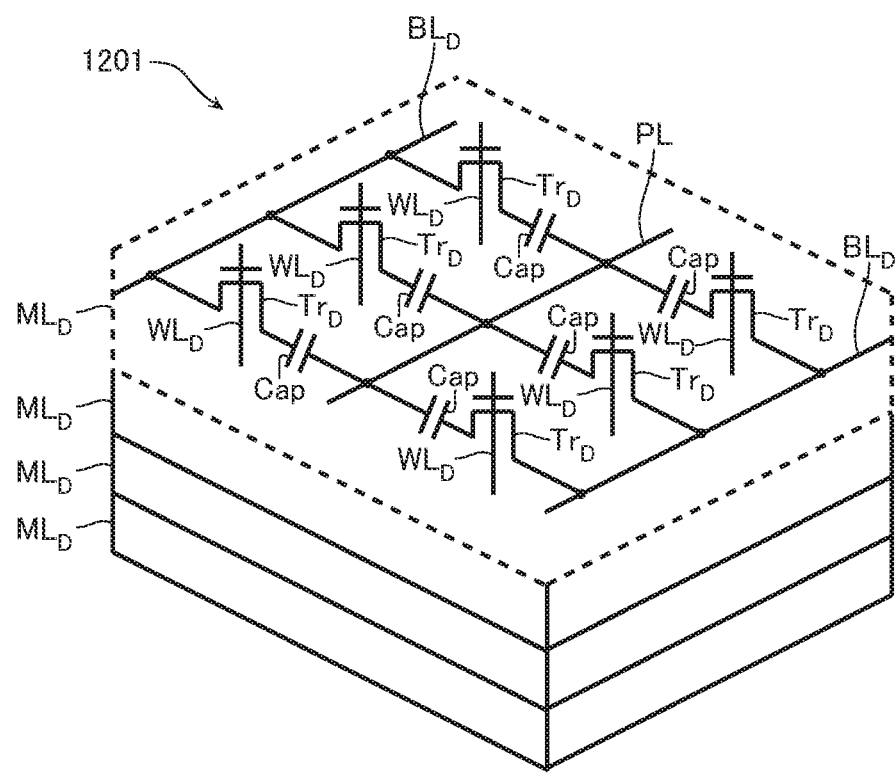
FIG. 50 is a schematic circuit diagram illustrating an example of a configuration of a three-dimensional DRAM.

FIG. 50 is a schematic circuit diagram illustrating an example of a configuration of the three-dimensional DRAM. As illustrated in FIG. 50, a memory cell array 1201 includes a plurality of memory layers $ML_D$. These plurality of memory layers $ML_D$ are arranged in a direction perpendicular to the substrate. Each of these plurality of memory layers $ML_D$ includes a bit line $BL_D$, a plurality of transistors $Tr_D$ connected to the bit line $BL_D$, a plurality of capacitors Cap connected to these plurality of transistors $Tr_D$, and a plate line PL connected to these plurality of capacitors Cap in common. The transistor $Tr_D$ has a source electrode connected to the bit line $BL_D$. The transistor $Tr_D$ has a drain electrode connected to the capacitor Cap. The transistor $Tr_D$ has a gate electrode connected to a word line $WL_D$. Additionally, the respective word lines $WL_D$ and the plate line PL are connected to the transistors $Tr_D$ in the plurality of memory layers $ML_D$.

When the word lines $WL_D$ are applied with a voltage of a low level or a high level and the bit lines $BL_D$ are applied with a voltage of a low level or a high level, the transistors $Tr_D$ are turned ON or turned OFF. This causes an electric charge to be accumulated in the capacitor Cap or causes an accumulated electric charge to be discharged.

The DRAM latches data associated with the electric charge accumulated in the capacitor Cap. Additionally, to maintain the electric charge accumulated in the capacitor Cap, the DRAM performs processing of refreshing the electric charge of the capacitor Cap periodically by a refresh circuit. For convenience of explanation, the refresh circuit and the like are omitted.

The above-described word lines $WL_D$ are divided into a plurality of divided ranges. Note that FIG. 50 omits the word line switches.

Figure 51:
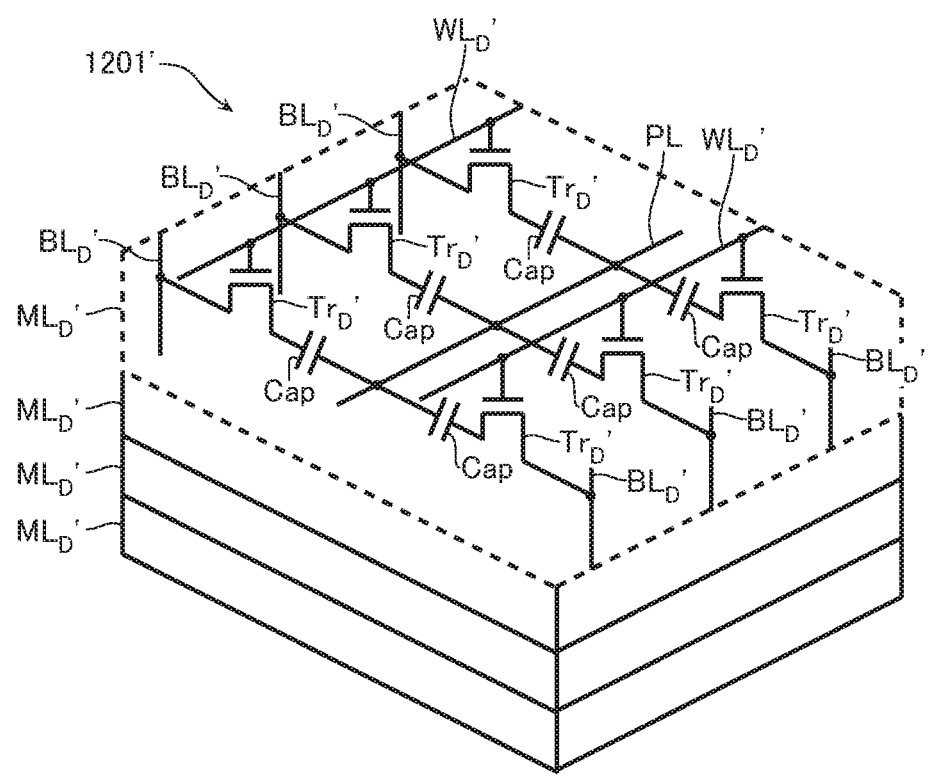
FIG. 51 is a schematic circuit diagram illustrating an example of another configuration of the three-dimensional DRAM.

FIG. 51 is a schematic circuit diagram illustrating an example of another configuration of the three-dimensional DRAM. As illustrated in FIG. 51, a memory cell array 1201' includes a plurality of memory layers $ML_D'$. These plurality of memory layers $ML_D'$ are arranged in a direction perpendicular to the substrate. Each of these plurality of memory layers $ML_D$ includes a word line $WL_D'$, a plurality of transistors $Tr_D'$ connected to the word line $WL_D'$, the plurality of capacitors Cap connected to these plurality of transistors $Tr_D'$, and the plate line PL connected to these plurality of capacitors Cap in common. The transistor $Tr_D'$ has a source electrode connected to a bit line $BL_D'$. The transistor $Tr_D'$ has a drain electrode connected to the capacitor Cap. The transistor $Tr_D'$ has a gate electrode connected to the word line $WL_D'$. Additionally, the respective bit lines $BL_D'$ and the plate line PL are connected to the transistors $Tr_D'$ in the plurality of memory layers $ML_D'$.

The above-described word line $WL_D'$ is also divided into a plurality of divided ranges. Note that FIG. 51 omits the word line switches. In the configuration as well, according to the wiring resistance $R_W$ between the word line $WL_D'$ and the word line switch, the operation parameters in the read operation and the write operation are adjusted for each of the plurality of divided ranges. Thus, the appropriate read operation and write operation can be performed.

[Operation of Three-Dimensional DRAM]

Figure 52:
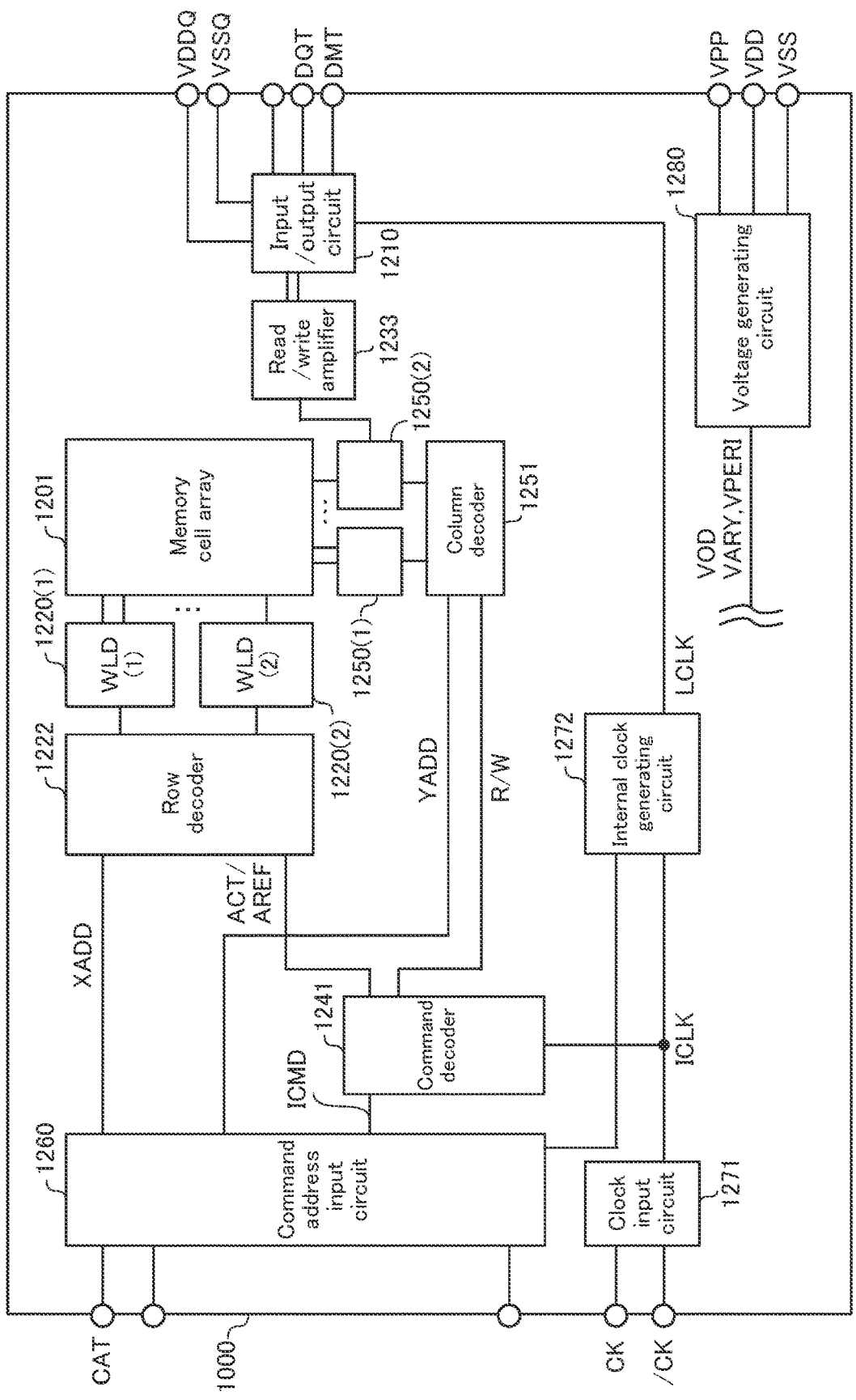
FIG. 52 is a schematic block diagram illustrating an example of a configuration of a semiconductor memory device 1000 according to a ninth embodiment.

FIG. 52 is a schematic block diagram illustrating an example of a configuration of a semiconductor memory device 1000 according to a ninth embodiment. The semiconductor memory device 1000 according to the ninth embodiment is a three-dimensional DRAM. Note that in the following description, it is assumed that the memory cell array is the memory cell array 1201 illustrated in FIG. 50.

As illustrated in FIG. 52, the semiconductor memory device 1000 according to the ninth embodiment includes the memory cell array 1201, an input/output circuit 1210, word line drivers 1220(1), 1220(2) (denoted by WLD(1), WLD(2) in FIG. 52), a row decoder 1222, a read/write amplifier 1233, a command decoder 1241, sense units 1250(1), 1250(2), a column decoder 1251, a command address input circuit 1260, a clock input circuit 1271, an internal clock generating circuit 1272, and a voltage generating circuit 1280.

The semiconductor memory device 1000 also includes a plurality of external terminals, such as clock terminals CK, /CK, a command/address terminal CAT, a data terminal DQT, a data mask terminal DMT, and power supply terminals VPP, VDD, VSS, VDDQ, VSSQ.

Note that, in this embodiment, a configuration other than the memory cell array 1201 in the semiconductor memory device 1000 is referred to as a peripheral circuit in some cases.

The memory cell array 1201 has the configuration described with reference to FIG. 50. As described above, the word line $WL_D$ is physically or virtually divided into a plurality of divided ranges (for example, the two divided ranges DU1, DU2).

Figure 53:
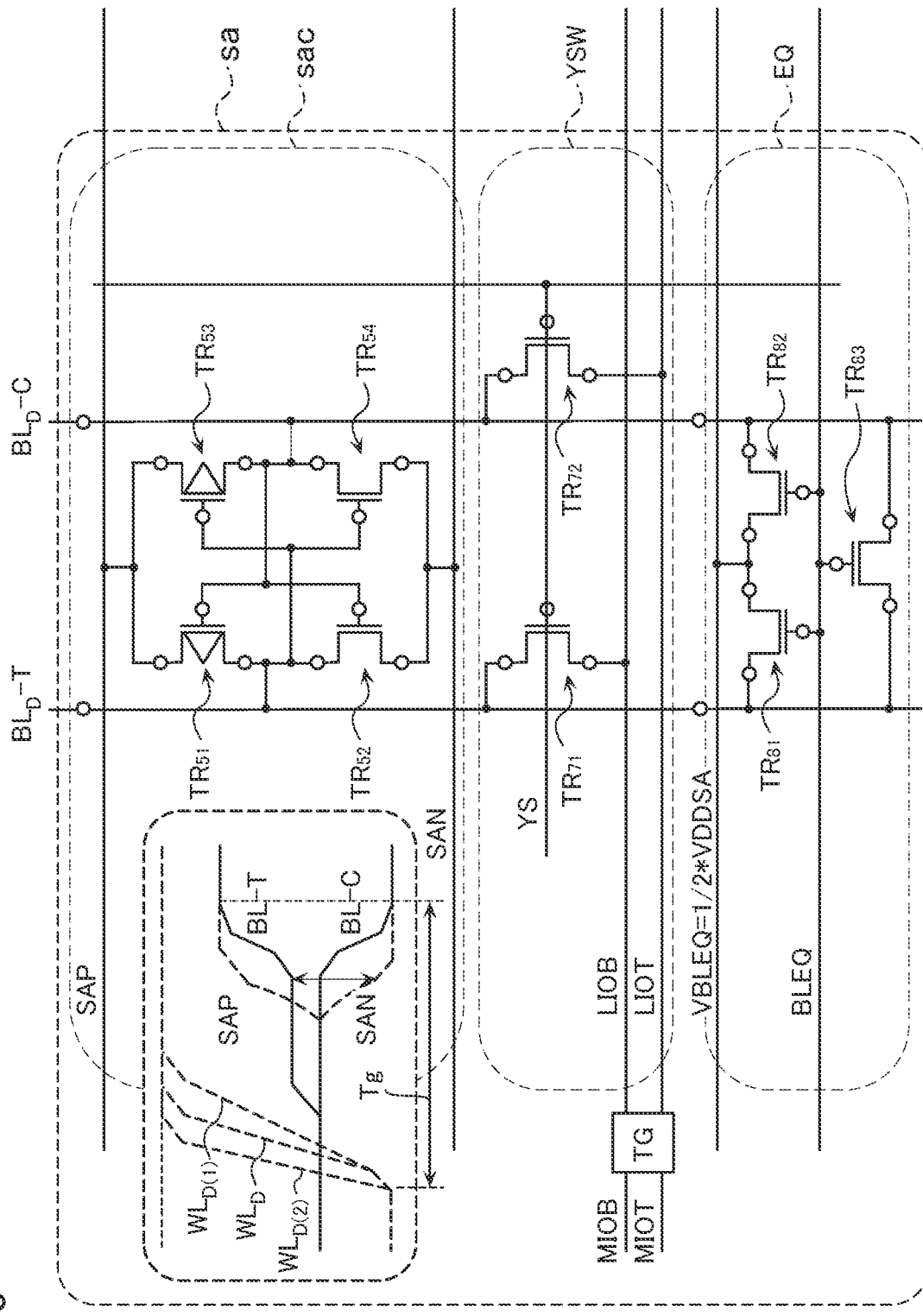
FIG. 53 is a circuit diagram illustrating an example of a configuration of a sense amplifier sa including a sense amplifier circuit sac.

As illustrated in FIG. 53, the sense amplifier sa senses data read from the memory cell MC. The sense amplifier sa is disposed corresponding to the bit lines $BL_D(BL_D$-T, $BL_D$-C in FIG. 53) forming a pair. The sense unit 1250 includes a plurality of the sense amplifiers sa.

The plurality of memory cells MC in the memory cell array 1201 have respective corresponding memory addresses. Among the plurality of external terminals, the command/address terminal CAT receives a memory address from an external device, such as a host computer. The memory address received by the command/address terminal CAT is transferred to the command address input circuit 1260. Upon receiving the memory address, the command address input circuit 1260 transmits a decoded row address XADD to the row decoder 1222 and transmits a decoded column address YADD to the column decoder 1251.

The command/address terminal CAT also receives a command from the external device, such as the host computer. The command received by the command/address terminal CAT is transferred to the command address input circuit 1260. Upon receiving the command, the command address input circuit 1260 transmits the received command to the command decoder 1241 as an internal command ICMD.

The command decoder 1241 includes a circuit that decodes the internal command ICMD and generates a signal for performing the internal command. The command decoder 1241 transmits, for example, an activated command ACT and a refresh command AREF to the row decoder 1222. The row decoder 1222 selects the word line $WL_D$ in accordance with the command ACT and the refresh command AREF received from the command decoder 1241. The row decoder 1222 transmits a signal indicating the selected word line $WL_D$ to the word line driver 1220.

The word line driver 1220(1) is connected to the plurality of word lines $WL_D$ in the divided range (for example, DU1). The word line driver 1220(1) is connected to the plurality of word lines $WL_D$ in the divided range (for example, DU2). Note that the word line drivers 1220(1), 1220(2) are simply referred to as word line drivers 1220 in some cases. The word line driver 1220 receives the signal from the row decoder 1222 and applies a voltage of a low level or a high level to the word line $WL_D$ indicated by the signal. Note that the word line driver 1220 includes the word line switch corresponding to the word line $WL_D$.

The command decoder 1241 transmits, for example, a read/write command R/W to the column decoder 1251. The column decoder 1251 selects the bit line $BL_D$ in accordance with the read/write command R/W received from the command decoder 1241. The column decoder 1251 transmits a signal indicating the selected bit line $BL_D$ to the sense unit 1250.

The sense unit 1250(1) is connected to the plurality of bit lines $BL_D$ in the divided range (for example, DU1). The sense unit 1250(2) is connected to the plurality of bit lines $BL_D$ in the divided range (for example, DU2). Note that the sense units 1250(1), 1250(2) are simply referred to as the sense units 1250 in some cases. The sense unit 1250 receives the signal from the column decoder 1251 and applies a voltage of a low level or a high level to the bit line $BL_D$ indicated by the signal.

When the data is read, the command/address terminal CAT receives the memory address together with a read command. This causes data to be read from the memory cell MC in the memory cell array 1201 designated by the memory address. The reading data is output to the outside from the data terminal DQT via the sense unit 1250, the read/write amplifier 1233, and the input/output circuit 1210.

When the data is written, the command/address terminal CAT receives the memory address together with the write command, and the data terminal DQT receives writing data. As necessary, the data mask terminal DMT receives a data mask. The writing data is transmitted to the memory cell array 1201 via the input/output circuit 1210, the read/write amplifier 1233, and the sense unit 1250. This causes the writing data to be written in the memory cell MC designated by the memory address.

The read/write amplifier 1233 includes various kinds of latch circuits that temporarily latch the reading data and the writing data.

The voltage generating circuit 1280 is applied with a power supply voltage from the power supply terminals VPP, VDD, VSS. The voltage generating circuit 1280 generates various kinds of internal voltages VOD, VARY, VPERI based on the power supply voltage. The internal voltages VOD, VARY are mainly used in the sense amplifier sa, and the internal voltage VPERI is used in another peripheral circuit.

The input/output circuit 1210 is applied with a power supply voltage from the power supply terminals VDDQ, VSSQ. The power supply terminals VDDQ, VSSQ are applied with a dedicated power supply voltage such that a power source noise generated in the input/output circuit 1210 does not propagate to another circuit block. Note that the power supply voltages applied to the power supply terminals VDDQ, VSSQ may be the same voltage as the power supply voltages applied to the power supply terminals VDD, VSS.

The clock terminals CK, /CK are input with a complementary external clock signal. The external clock signal is supplied to the clock input circuit 1271. The clock input circuit 1271 generates an internal clock signal ICLK. The internal clock signal ICLK is supplied to the internal clock generating circuit 1272 and the command decoder 1241.

The internal clock generating circuit 1272 generates various internal clock signals LCLK when it is enabled by a clock enable from the command address input circuit 1260.

The internal clock signal LCLK is used for measuring timings of various internal operations. For example, the internal clock signal LCLK is output to the input/output circuit 1210. The input/output circuit 1210 transmits and receives data from the data terminal DQT based on the input internal clock signal LCLK.

[Configuration of Sense Amplifier]

Next, with reference to FIG. 53, an example of a configuration of the sense amplifier sa will be described. FIG. 53 is a circuit diagram illustrating an example of the configuration of the sense amplifier sa including a sense amplifier circuit sac.

As illustrated in FIG. 53, the bit line $BL_D$-T and the bit line $BL_D$-C forming the pair with the bit line $BL_D$-T connected to the memory cell MC in the memory cell array 1201 are each connected to the sense amplifier circuit sac.

The sense amplifier circuit sac includes transistors $TR_{51}$ to $TR_{54}$. The transistors $TR_{51}$, $TR_{53}$ are low withstand voltage P channel MOS transistors, and the transistors $TR_{52}$, $TR_{54}$ are low withstand voltage N channel MOS transistors.

One terminal of the transistor $TR_{51}$ is connected to a signal line supplied with a sense signal SAP, and the other terminal of the transistor $TR_{51}$ is connected to one terminal of the transistor $TR_{52}$. The other terminal of the transistor $TR_{52}$ is connected to a signal line supplied with a sense signal SAN. Between the transistors $TR_{51}$, $TR_{52}$ (a connection point between the other terminal of the transistor $TR_{51}$ and the one terminal of the transistor $TR_{52}$), the bit line $BL_D$-T is connected.

One terminal of the transistor $TR_{53}$ is connected to a signal line supplied with the sense signal SAP, and the other terminal of the transistor $TR_{53}$ is connected to one terminal of the transistor $TR_{54}$. The other terminal of the transistor $TR_{54}$ is connected to a signal line supplied with the sense signal SAN. Between the transistors $TR_{53}$, $TR_{54}$ (a connection point between the other terminal of the transistor $TR_{53}$ and the one terminal of the transistor $TR_{54}$), the bit line $BL_D$-C is connected.

Gate terminals (gate electrodes) of the transistors $TR_{51}$, $TR_{52}$ are connected between the transistors $TR_{53}$, $TR_{54}$, and gate terminals (gate electrodes) of the transistors $TR_{53}$, $TR_{54}$ are connected between the transistors $TR_{51}$, $TR_{52}$.

A column switch YSW is connected to the bit lines $BL_D$-T, $BL_D$-C in the downstream with respect to the sense amplifier circuit sac. The column switch YSW includes transistors $TR_{71}$, $TR_{72}$. The transistors $TR_{71}$, $TR_{72}$ are low withstand voltage N channel MOS transistors.

One terminal of the transistor $TR_{71}$ is connected to the bit line $BL_D$-T, and the other terminal of the transistor $TR_{71}$ is connected to a local input/output line LIOT. One terminal of the transistor $TR_{72}$ is connected to the bit line $BL_D$-C, and the other terminal of the transistor $TR_{72}$ is connected to a local input/output line LIOB. Gate terminals (gate electrodes) of the transistors $TR_{71}$, $TR_{72}$ are connected to a signal line supplied with a column select signal YS.

Thus, the sense amplifier circuit sac is connected to the local input/output lines LIOT, LIOB via the column switch YSW. A transfer gate TG is connected to the local input/output lines LIOT, LIOB, and is connected to main input/output lines MIOT, MIOB. The transfer gate TG functions as a switch. The main input/output lines MIOT, MIOB are connected to the read/write amplifier 1233.

The bit lines $BL_D$-T, $BL_D$-C in the downstream with respect to the column switch YSW are connected to an equalize circuit EQ. The equalize circuit EQ includes transistors $TR_{81}$ to $TR_{83}$. The transistors $TR_{81}$ to $TR_{83}$ are low withstand voltage N channel MOS transistors.

One terminal of the transistor $TR_{81}$ is connected to the bit line $BL_D$-T, and the other terminal of the transistor $TR_{81}$ is connected to one terminal of the transistor $TR_{82}$. The other terminal of the transistor $TR_{82}$ is connected to the bit line $BL_D$-C. Between the transistors $TR_{81}$, $TR_{82}$, a power line to which an equalize voltage VBLEQ is applied is connected. The equalize voltage VBLEQ has a magnitude of ½ of a power supply voltage VDDSA for the sense amplifier sa.

One terminal of the transistor $TR_{83}$ is connected to the bit line $BL_D$-T, and the other terminal of the transistor $TR_{83}$ is connected to the bit line $BL_D$-C. Gate terminals (gate electrodes) of the transistors $TR_{81}$ to $TR_{83}$ are connected to a signal line supplied with the equalize signal BLEQ.

[Operation of Sense Amplifier]

Next, the operation of the sense amplifier sa including the above-described sense amplifier circuit sac will be described.

Usually in a steady state, the equalize signal BLEQ is driven to a high level. This causes the transistors $TR_{81}$ to $TR_{83}$ of the equalize circuit EQ to be turned ON, and the bit lines $BL_D$-T, $BL_D$-C to be equalized to a precharge voltage.

When an active command ACT is issued, equalizing is released and the corresponding word line $WL_D$ is driven to a VPP level by the word line driver 1220 based on the input row address XADD. The release of equalizing, that is, a non-active state of the equalize circuit EQ is continued from when the active command ACT is issued until a precharge command is issued.

The word line $WL_D$ is driven to the VPP level, and the transistors $Tr_D$ of the corresponding memory cell MC are turned ON. In view of this, the capacitor Cap of the memory cell MC is connected to the bit line $BL_D$-T and the bit line $BL_D$-C. As a result, according to the electric charge of the capacitor Cap of the memory cell MC, the voltage of the bit line $BL_D$-T or the bit line $BL_D$-C is slightly changed. The example of FIG. 53 illustrates the state where the voltage of the bit line $BL_D$-T is slightly increased.

Afterwards, the sense signals SAN, SAP are changed to a low level and a high level, respectively, at a predetermined timing to activate the sense amplifier circuit sac. As a result, a voltage difference between the bit lines $BL_D$-T, $BL_D$-C is amplified. The example in FIG. 53 illustrates the state where the bit line $BL_D$-C is driven to the low level and the bit line $BL_D$-T is driven to the high level.

Next, when the read command is issued, the corresponding column select signal YS is changed to a high level in accordance with the column address YADD input synchronizing with the read command. At the point before the column select signal YS is activated, the local input/output lines LIOT, LIOB are precharged to the power supply voltage $V_{CC}$.

When the column select signal YS is activated, the transistors $TR_{71}$, $TR_{72}$ of the column switch YSW are turned ON, and thus, the bit lines $BL_D$-T, $BL_D$-C are connected to the corresponding local input/output lines LIOT, LIOB. As a result, the local input/output line LIOT is maintained at a precharge level, and the local input/output line LIOB is lowered to a low level from the precharge level.

When the transfer gate TG is turned ON, the local input/output lines LIOT, LIOB are connected to the main input/output lines MIOT, MIOB. As a result, the main input/output line MIOT is maintained at a precharge level, and the main input/output line MIOB is lowered to a low level from the precharge level.

Through the above-described operations, data are read from the memory cell MC.

Note that in FIG. 52 and FIG. 53, instead of the memory cell array 1201 illustrated in FIG. 50, the memory cell array 1201' in FIG. 51 may be applied.

[Adjustment of Operation Parameters in Read Operation of DRAM]

When the wiring resistance between the word line $WL_D$ (for example, the word line $WL_{D(1)}$) and the word line driver 1220 (word line switch) is large, a voltage rise during charging applied to the word line $WL_{D(1)}$ by the word line driver 1220 slows (FIG. 53), and therefore a stabilization wait time Tg of the bit line $BL_D$ is set to be long. On the other hand, when the wiring resistance between the word line $WL_D$ (for example, the word line $WL_{D(2)}$) and the word line driver 1220 (word line switch) is small, the voltage rise during charging applied to the word line $WL_D$ by the word line driver 1220 becomes fast (FIG. 53), and therefore the stabilization wait time Tg of the bit line $BL_D$ is set to be short.

[Structure Example of Three-Dimensional DRAM]

Next, the structure example of the three-dimensional DRAM will be described.

Figure 54:
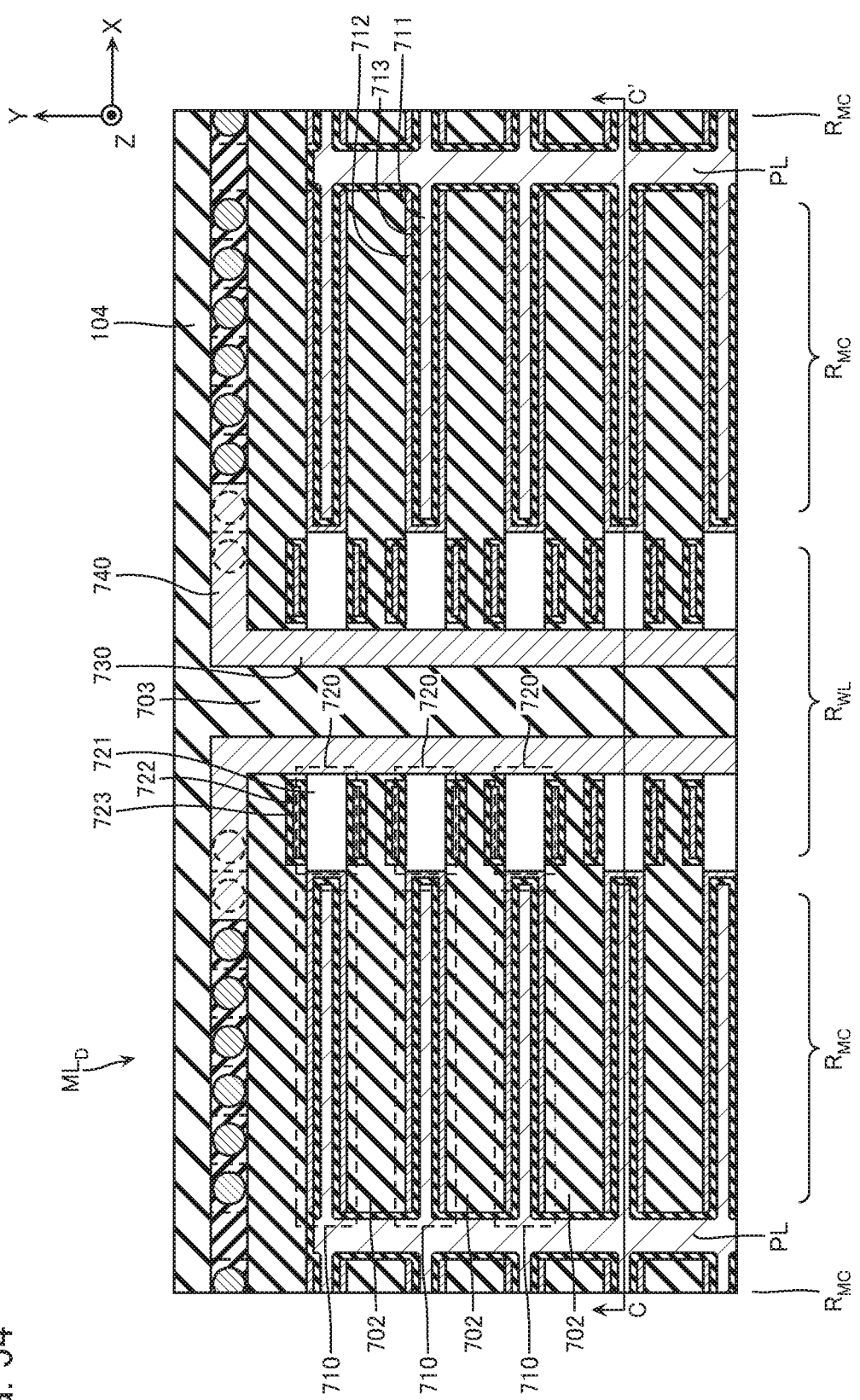
FIG. 54 is a schematic XY cross-sectional view illustrating a configuration of the DRAM.
Figure 55:
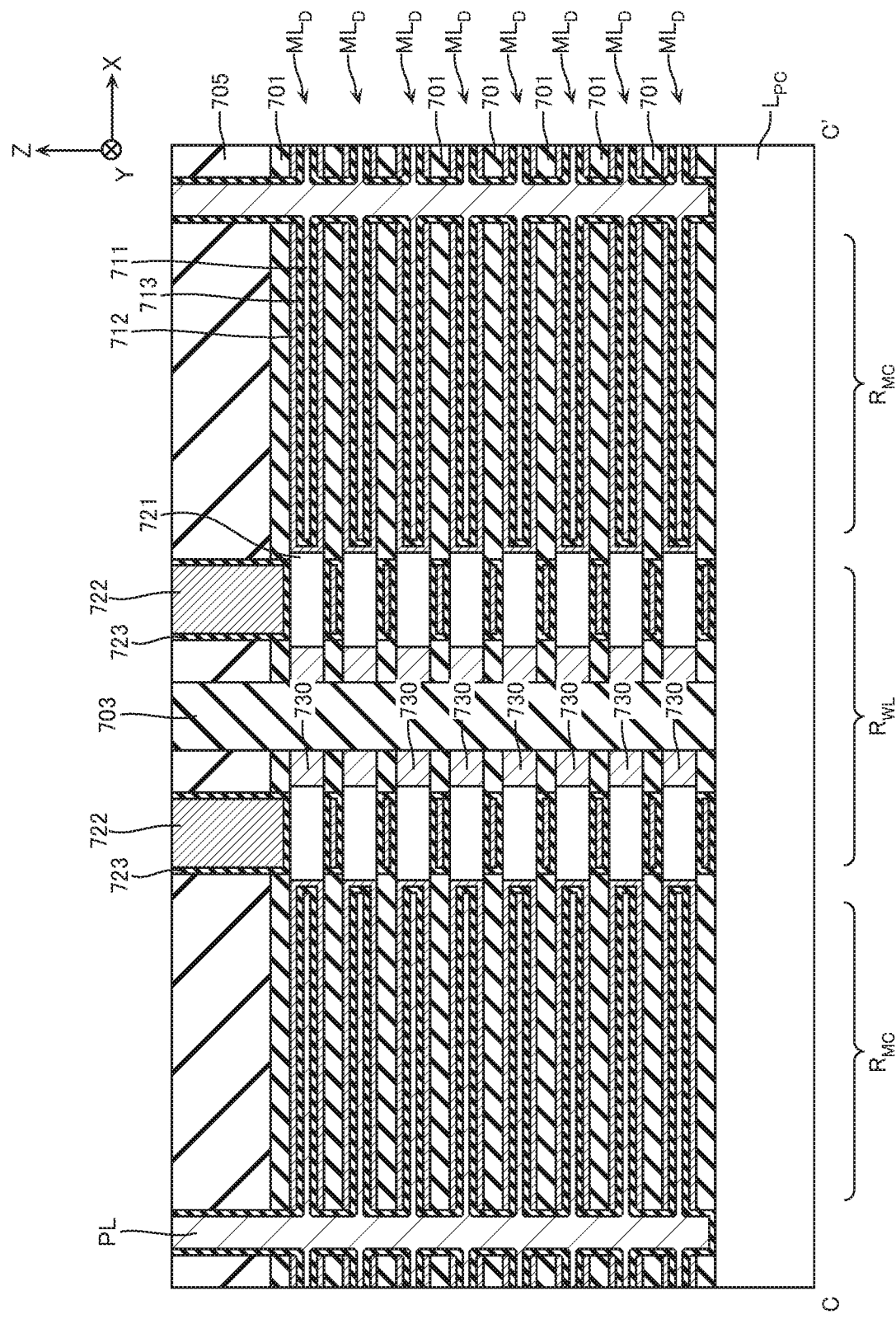
FIG. 55 is a schematic cross-sectional view of a structure illustrated in FIG. 54 taken along the line C-C' and viewed along the arrow direction.

FIG. 54 is a schematic XY cross-sectional view illustrating a configuration of the DRAM. FIG. 55 is a schematic cross-sectional view of a structure illustrated in FIG. 54 taken along the line C-C' and viewed along the arrow direction.

For example, as illustrated in FIG. 55, the memory cell array 1201 includes the plurality of memory layers $ML_D$ and insulating layers 701, such as silicon oxide ($SiO_2$), alternately arranged in the Z-direction. Above these plurality of memory layers $ML_D$ and insulating layers 701, an insulating layer 705, such as silicon oxide ($SiO_2$), is disposed.

As illustrated in FIG. 54, the memory layer $ML_D$ includes a plurality of capacitor structures 710 and insulating layers 702, such as silicon oxide ($SiO_2$), disposed in the memory cell region $R_{MC}$ and alternately arranged in the Y-direction. The capacitor structure 710 includes electrodes 711, 712 and an insulating layer 713 disposed between them.

The electrode 711 functions as one electrode of the capacitor Cap. The electrode 711 extends in the X-direction. One end portion in the X-direction of the electrode 711 is connected to the plate line PL. The electrodes 711, 712, for example, may contain, for example, polysilicon (Poly-Si), tungsten (W), tungsten nitride (WN), tungsten silicide (WSi), tungsten silicide nitride (WSiN), molybdenum (Mo), molybdenum nitride (MoN), iridium (Ir), iridium oxide (IrO), ruthenium (Ru), ruthenium oxide (RuO), tantalum nitride (TaN), titanium nitride (TiN), titanium silicide nitride (TiSiN), ruthenium nitride titanium (RuTiN), and the like, may contain another conductive material, or may contain a stacked film of a plurality of conductive materials.

Note that the plate line PL extends in the Y-direction and the Z-direction and separates the plurality of memory layers $ML_D$ in the X-direction. The respective side surfaces at one side and at the other side in the X-direction of the plate line PL are connected to the plurality of memory layers $ML_D$ and the plurality of electrodes 711 corresponding to the plurality of capacitor structures 710. The plate line PL may contain a material similar to the electrode 711, for example.

The electrode 712 functions as the other electrode of the capacitor Cap. The electrode 712 is opposed to the outer peripheral surface (the upper and lower surfaces and both side surfaces in the Y-direction) of the electrode 711, and extends in the X-direction along the outer peripheral surface of the electrode 711. One end portion in the X-direction of the electrode 712 is connected to a semiconductor layer 721 described later. The electrode 712, for example, may contain a material similar to the electrode 711.

The insulating layer 713 is disposed between the electrodes 711, 712. The insulating layer 713 insulates the electrodes 711, 712. The insulating layer 713, for example, may contain any insulating metal oxide including aluminum oxide (AlO), zirconium oxide (ZrO), hafnium oxide (HfO), niobium oxide (NbO), tantalum oxide (TaO), barium strontium titanate (BST), lead zirconate titanate (PZT), and strontium bismuthate tantalum (SBT), may contain another insulating material, or may be a mixture of them, such as ZrHfO, ZrAlO, and ZrNbO. Additionally, the insulating layer 713 may include a stacked film of a plurality of insulating materials, such as a stacked film (ZAZ) of zirconium oxide, aluminum oxide, and zirconium oxide and a stacked film of ZrHfO, ZrAlO, and ZrNbO. The insulating layer 713 may be a ferroelectric.

Additionally, as illustrated in FIG. 54, the memory layer $ML_D$ includes a plurality of transistor structures 720 disposed in a word line connection region $R_{WL}$ and arranged in the Y-direction. The transistor structure 720 includes the semiconductor layer 721. The word line connection region $R_{WL}$ includes conductive layers 722 and insulating layers 723 disposed on the outer peripheral surfaces of these conductive layer 722.

For example, the semiconductor layer 721 functions as the channel region of the transistor $Tr_D$. The semiconductor layer 721 extends in the X-direction. The semiconductor layer 721, for example, may contain any semiconductor material including silicon (Si), germanium (Ge), carbon (C), zinc oxide tin (ZnSnO: generally referred to as "ZTO"), indium zinc oxide (InZnO: generally referred to as "IZO"), indium gallium zinc oxide (InGaZnO: generally referred to as "IGZO"), indium gallium silicon oxide (InGaSiO: generally referred to as "IGSO"), and indium tungsten oxide (InWO: generally referred to as "IWO"), or may include a stacked film of a plurality of semiconductor materials.

The conductive layers 722 function as the gate electrodes of the plurality of transistors $Tr_D$ arranged in the Z-direction and the word lines $WL_D$. The plurality of conductive layers 722 are disposed corresponding to the plurality of transistor structures 720 arranged in the Y-direction. The conductive layer 722, for example, may contain polysilicon (Poly-Si), tungsten (W), tungsten nitride (WN), tungsten silicide (WSi), tungsten silicide nitride (WSiN), molybdenum (Mo), molybdenum nitride (MoN), iridium (Ir), iridium oxide (IrO), ruthenium (Ru), ruthenium oxide (RuO), tantalum nitride (TaN), titanium nitride (TiN), titanium silicide nitride (TiSiN), ruthenium nitride titanium (RuTiN), and the like, may contain another conductive material, or may contain a stacked film of a plurality of conductive materials.

The insulating layer 723 functions as a gate insulating film of the transistor $Tr_D$. The insulating layer 723 includes a part covering the outer peripheral surface of the conductive layer 722 and a part disposed between the semiconductor layer 721 and the conductive layer 722. The insulating layer 723 insulates the semiconductor layer 721 and the conductive layer 722. The insulating layer 723, for example, may contain any insulating metal oxide including aluminum oxide (AlO), zirconium oxide (ZrO), hafnium oxide (HfO), niobium oxide (NbO), tantalum oxide (TaO), barium strontium titanate (BST), lead zirconate titanate (PZT), and strontium bismuthate tantalum (SBT), may contain another insulating material, or may be a mixture of them, such as ZrHfO, ZrAlO, and ZrNbO. The insulating layer 723 may include a stacked film of a plurality of insulating materials. The insulating layer 723, for example, may contain a material similar to the insulating layer 713.

Additionally, as illustrated in FIG. 54, the memory layer $ML_D$ includes two conductive layers 730 disposed in the word line connection region $R_{WL}$, arranged in the X-direction, and extending in the Y-direction. Additionally, between the two conductive layers 730 arranged in the X-direction, the insulating layer 703, such as silicon oxide ($SiO_2$), is disposed.

The conductive layer 730 functions as the bit line BL. The conductive layer 730 may contain, for example, polysilicon (Poly-Si), tungsten (W), tungsten nitride (WN), tungsten silicide (WSi), tungsten silicide nitride (WSiN), molybdenum (Mo), molybdenum nitride (MoN), iridium (Ir), iridium oxide (IrO), ruthenium (Ru), ruthenium oxide (RuO), tantalum nitride (TaN), titanium nitride (TiN), titanium silicide nitride (TiSiN), ruthenium nitride titanium (RuTiN), and the like, may contain another conductive material, or may contain a stacked film of a plurality of conductive materials, such as a stacked film of titanium nitride (TiN) and tungsten (W).

Additionally, as illustrated in FIG. 54, the memory layer $ML_D$ includes a conductive layer 740 disposed in a bit line connection region $R_{BL}$ and extending in the X-direction. Additionally, an insulating layer 704, such as silicon oxide ($SiO_2$), is disposed on the side surface in the Y-direction of the conductive layer 740.

In the example of FIG. 54, the conductive layer 740 is connected to the end portion in the Y-direction of the conductive layer 730. The conductive layer 740, for example, may contain a material similar to the conductive layer 730. Note that in the example of FIG. 54, the plurality of conductive layers 740 arranged in the X-direction are electrically independent in every memory cell region $R_{MC}$.

In the configuration as well, according to the wiring resistance $R_W$ between the word line $WL_D$ and the word line switch, the operation parameters in the read operation and the write operation are adjusted for each of the plurality of divided ranges. Thus, the appropriate read operation and write operation can be performed.

Tenth Embodiment

In the first embodiment to the ninth embodiment, according to the wiring resistances between the divided ranges DU1, DU2 of the word lines WL and the word line switches WLSW, the operation parameters in the read operation and the write operation are adjusted for each of the plurality of divided ranges DU1, DU2. In contrast to this, in the tenth embodiment, according to the wiring resistance between the external pad electrode $P_X$ and the driver circuit or the like (the CG driver circuit DRV, the source line driver circuit SDRV, and the sense amplifier module SAM), the operation parameters in the read operation and the write operation are adjusted for each of the plurality of divided ranges DU1, DU2.

Figure 56:
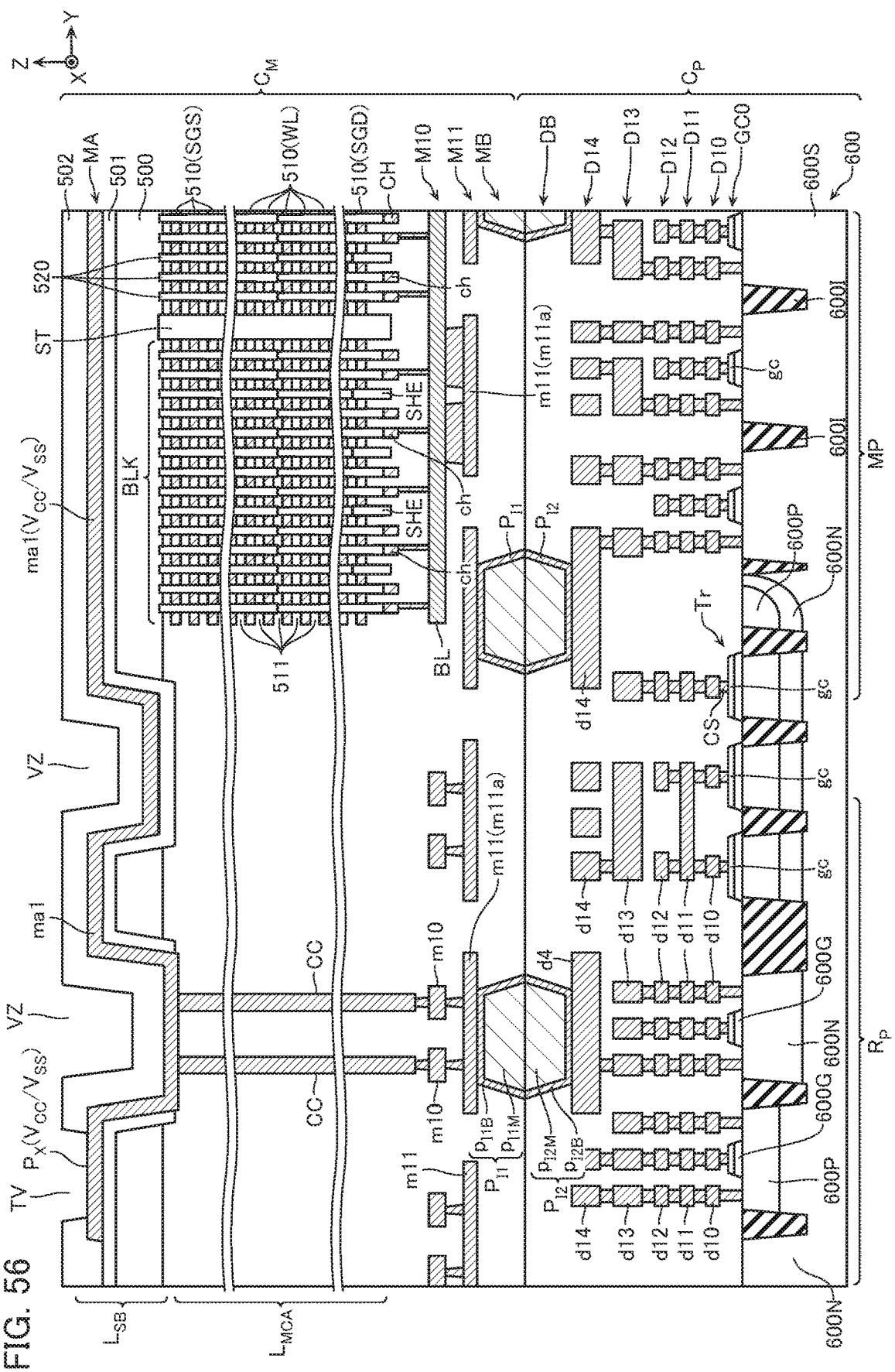
FIG. 56 is a schematic cross-sectional view illustrating a configuration of a part of the memory die MD according to a tenth embodiment.

FIG. 56 is a schematic cross-sectional view illustrating a configuration of a part of the memory die MD according to the tenth embodiment. Note that FIG. 56 is a drawing corresponding to FIG. 38.

As illustrated in FIG. 56, the substrate layer $L_{SB}$ includes the back side wiring layer MA disposed on the upper surface of the insulating layer 501. The back side wiring layer MA includes a plurality of wirings mal. These plurality of wirings mal extend in the Y-direction. These plurality of wirings mal, for example, may contain aluminum (Al).

Parts of the plurality of wirings mal function as the external pad electrodes $P_X$. The external pad electrode $P_X$ is disposed in the peripheral region $R_P$ (FIG. 37). The wiring mal is connected to the contacts CC in the memory cell array layer $L_{MCA}$ in the region VZ not including the conductive layer 500. A part of the wiring mal is exposed to the outside of the memory die MD via an opening TV provided in the insulating layer 502.

In the example of FIG. 56, the external pad electrode $P_X$ is the external pad electrode $P_X$ (hereinafter described as an external pad electrode $P_X(V_{CC})$) to which the power supply voltage $V_{CC}$ is connected or the external pad electrode $P_X$ (hereinafter described as an external pad electrode $P_X(V_{SS})$) to which the ground voltage $V_{SS}$ is connected. In the example of FIG. 56, the plurality of wirings mal are voltage supply lines (power supply lines) that transfer the power supply voltage $V_{CC}$ or the ground voltage $V_{SS}$ applied from the external pad electrode $P_X(V_{CC})$ or $P_X(V_{SS})$.

The plurality of contacts CC are connected to the plurality of bonding electrodes $P_{f1}$ of the chip bonding electrode layer MB via the wirings m10, m11 of the wiring layers M10, M11. The respective plurality of bonding electrodes $P_{f1}$ are connected to the plurality of bonding electrodes $P_{f2}$ in the chip bonding electrode layer DB in the chip $C_P$.

Since the other configurations in FIG. 56 are similar to the configurations described in FIG. 38, the overlapping explanation will be omitted.

Figure 57:
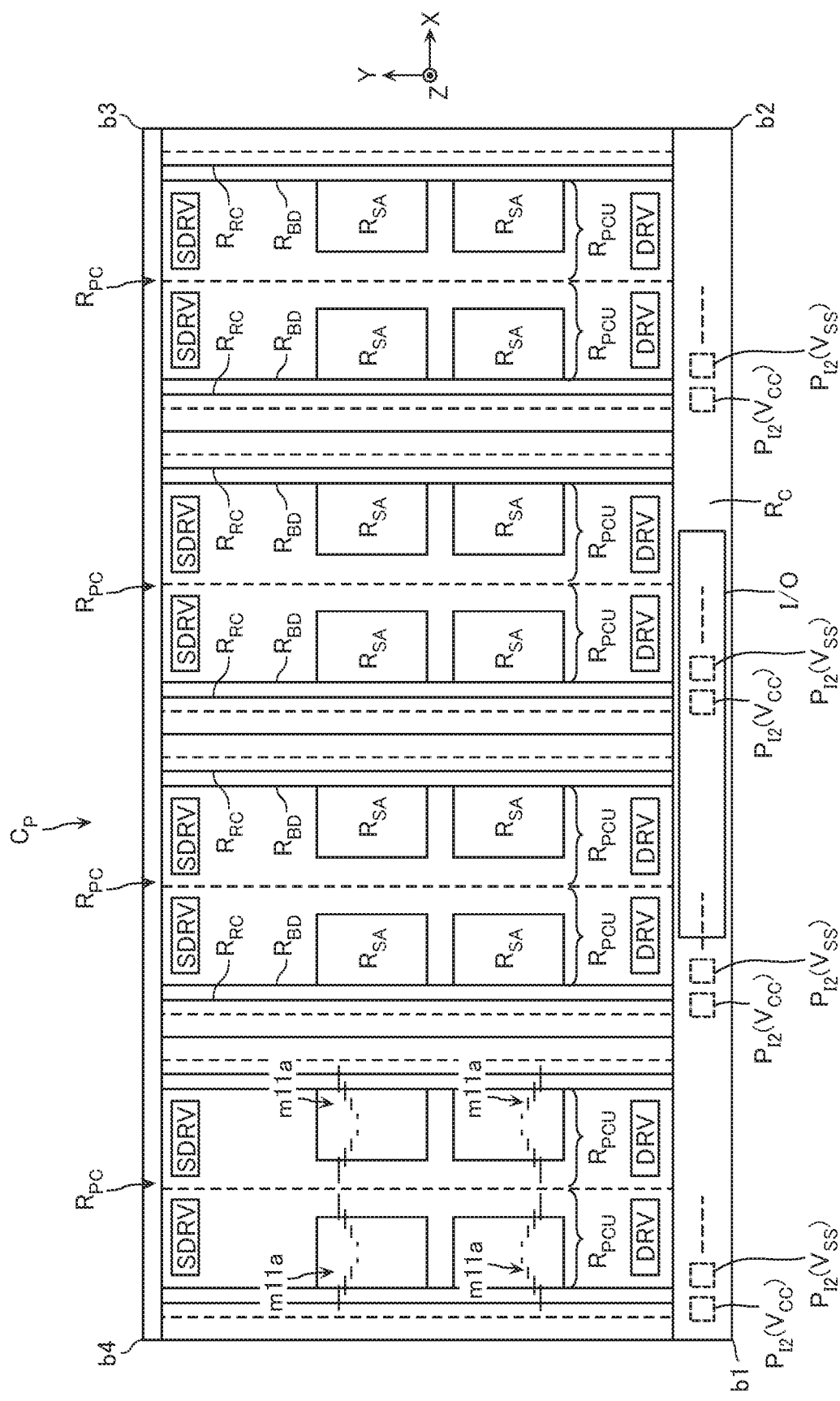
FIG. 57 is a schematic plan view illustrating an example of a configuration of the chip $C_P$ according to the tenth embodiment.

FIG. 57 is a schematic plan view illustrating an example of a configuration of the chip $C_P$ according to the tenth embodiment. FIG. 57 is a drawing corresponding to FIG. 40. As illustrated in FIG. 57, the chip $C_P$ includes the circuit region $R_C$ disposed at one end side in the Y-direction. The circuit region $R_C$ includes the input/output control circuit I/O (FIG. 2). Additionally, the plurality of bonding electrodes $P_{f2}$ arranged in the X-direction are disposed in the chip bonding electrode layer DB on the circuit region $R_C$.

In the example illustrated in FIG. 57, four sets of the bonding electrodes $P_{f2}(V_{CC})$ and the bonding electrodes $P_{f2}(V_{SS})$ are disposed corresponding to the four peripheral circuit regions $R_{PC}$ (four memory planes MP). The bonding electrode $P_{f2}(V_{CC})$ is electrically connected to the external pad electrode $P_X(V_{CC})$ connected to the power supply voltage $V_{CC}$ (FIG. 2). The bonding electrode $P_{f2}(V_{SS})$ is electrically connected to the external pad electrode $P_X(V_{SS})$ connected to the ground voltage $V_{SS}$ (FIG. 2). Note that the bonding electrodes $P_{f2}$ other than the bonding electrodes $P_{f2}(V_{CC})$ or the bonding electrodes $P_{f2}(V_{SS})$ are, for example, electrically connected to the external pad electrodes $P_X$ connected to, for example, the power supply voltage $V_{CCQ}$ (FIG. 2) and the data signal input/output terminals DQ0 to DQ7 (FIG. 2).

Each of the four peripheral circuit regions $R_{PC}$ is divided into two regions $R_{PCU}$ in the X-direction. The voltage generating circuit VG and the CG driver circuit DRV are disposed at the Y-direction negative side of each of the plurality of regions $R_{PCU}$ (the eight regions $R_{PCU}$ in the example of FIG. 57). The voltage generating circuit VG and the source line driver circuit SDRV are disposed at the Y-direction positive side of each of the plurality of regions $R_{PCU}$ (the eight regions $R_{PCU}$ in the example of FIG. 57). Note that FIG. 57 omits the voltage generating circuits VG (see FIG. 5, FIG. 58, and FIG. 59).

Since the other configurations in FIG. 57 are similar to the configurations described in FIG. 40, the overlapping explanation will be omitted.

Figure 58:
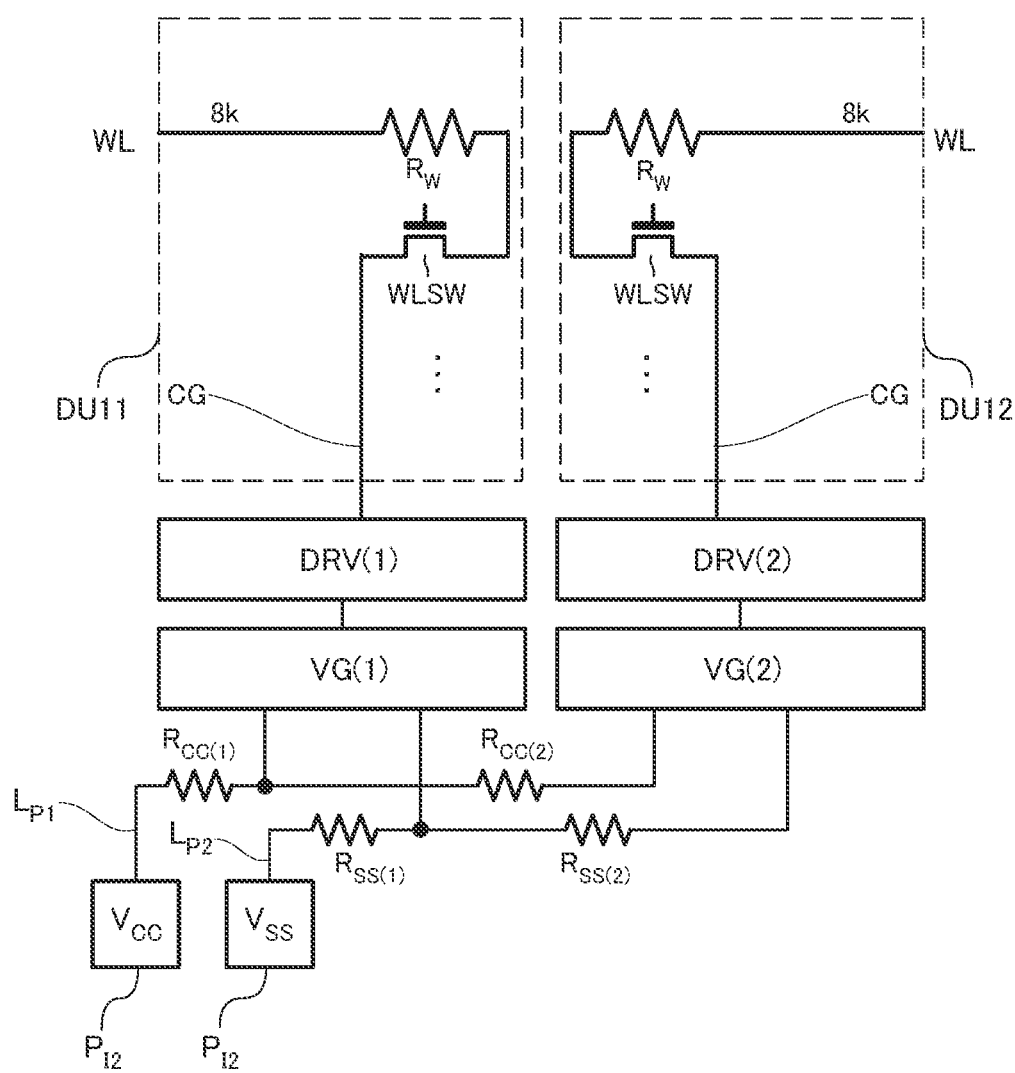
FIG. 58 is a schematic diagram illustrating a connection relation between bonding electrodes $P_{I2}(V_{CC})$, $P_{I2}(V_{SS})$, the voltage generating circuits VG, and the CG driver circuits DRV.

FIG. 58 is a schematic diagram illustrating a connection relation between the bonding electrodes $P_{f2}(V_{CC})$, $P_{f2}(V_{SS})$, the voltage generating circuits VG, and the CG driver circuits DRV. FIG. 58 is a drawing corresponding to FIG. 43. Note that FIG. 58 omits the sequencer SQC.

As illustrated in FIG. 58, the bonding electrode $P_{f2}(V_{CC})$ is connected to a voltage supply line $L_{P1}$, and the voltage supply line $L_{P1}$ is branched and connected to voltage generating circuits VG(1), VG(2). The voltage generating circuit VG(1) is connected to the CG driver circuit DRV(1), and the voltage generating circuit VG(2) is connected to the CG driver circuit DRV(2). A wiring resistance of the voltage supply line $L_{P1}$ between the bonding electrode $P_{f2}(V_{CC})$ and the voltage generating circuit VG(1) (CG driver circuit DRV(1)) is $R_{CC(1)}$. A wiring resistance of the voltage supply line $L_{P1}$ between the bonding electrode $P_{f2}(V_{CC})$ and the voltage generating circuit VG(2) (CG driver circuit DRV(2)) is $R_{CC(1)}+R_{CC(2)}$. Thus, the wiring resistance of the voltage supply line $L_{P1}$ increases according to the distance of the voltage supply line $L_{P1}$. Accordingly, the power supply voltage $V_{CC}$ applied from the bonding electrode $P_{f2}(V_{CC})$ of the voltage generating circuit VG(2) (CG driver circuit DRV(2)) is lower than that of the voltage generating circuit VG(1) (CG driver circuit DRV(1)).

The bonding electrode $P_{f2}(V_{SS})$ is connected to a voltage supply line $L_{P2}$, and the voltage supply line $L_{P2}$ is branched and connected to the voltage generating circuits VG(1), VG(2). The voltage generating circuit VG(1) is connected to the CG driver circuit DRV(1), and the voltage generating circuit VG(2) is connected to the CG driver circuit DRV(2). A wiring resistance of the voltage supply line $L_{P2}$ between the bonding electrode $P_{f2}(V_{SS})$ and the voltage generating circuit VG(1) (CG driver circuit DRV(1)) is $R_{ss(1)}$. A wiring resistance of the voltage supply line $L_{P2}$ between the bonding electrode $P_{f2}(V_{SS})$ and the voltage generating circuit VG(2) (CG driver circuit DRV(2)) is $R_{ss(1)}+R_{ss(2)}$. Thus, the wiring resistance of the voltage supply line $L_{P2}$ increases according to the distance of the voltage supply line $L_{P2}$. Accordingly, the power supply voltage $V_{ss}$ applied from the bonding electrode $P_{f2}(V_{SS})$ of the voltage generating circuit VG(2) (CG driver circuit DRV(2)) increases more than that of the voltage generating circuit VG(1) (CG driver circuit DRV(1)).

As illustrated in FIG. 56, the voltage supply lines $L_{P1}$, $L_{P2}$ include the wirings d10 to d14 of the wiring layers D10 to D14, contacts that electrically connect these wirings d10 to d14, and the contacts CS. The same applies to voltage supply lines $L_{P11}$, $L_{P12}$ (FIG. 59) and a voltage supply line $L_{P21}$ (FIG. 60) described later.

Figure 59:
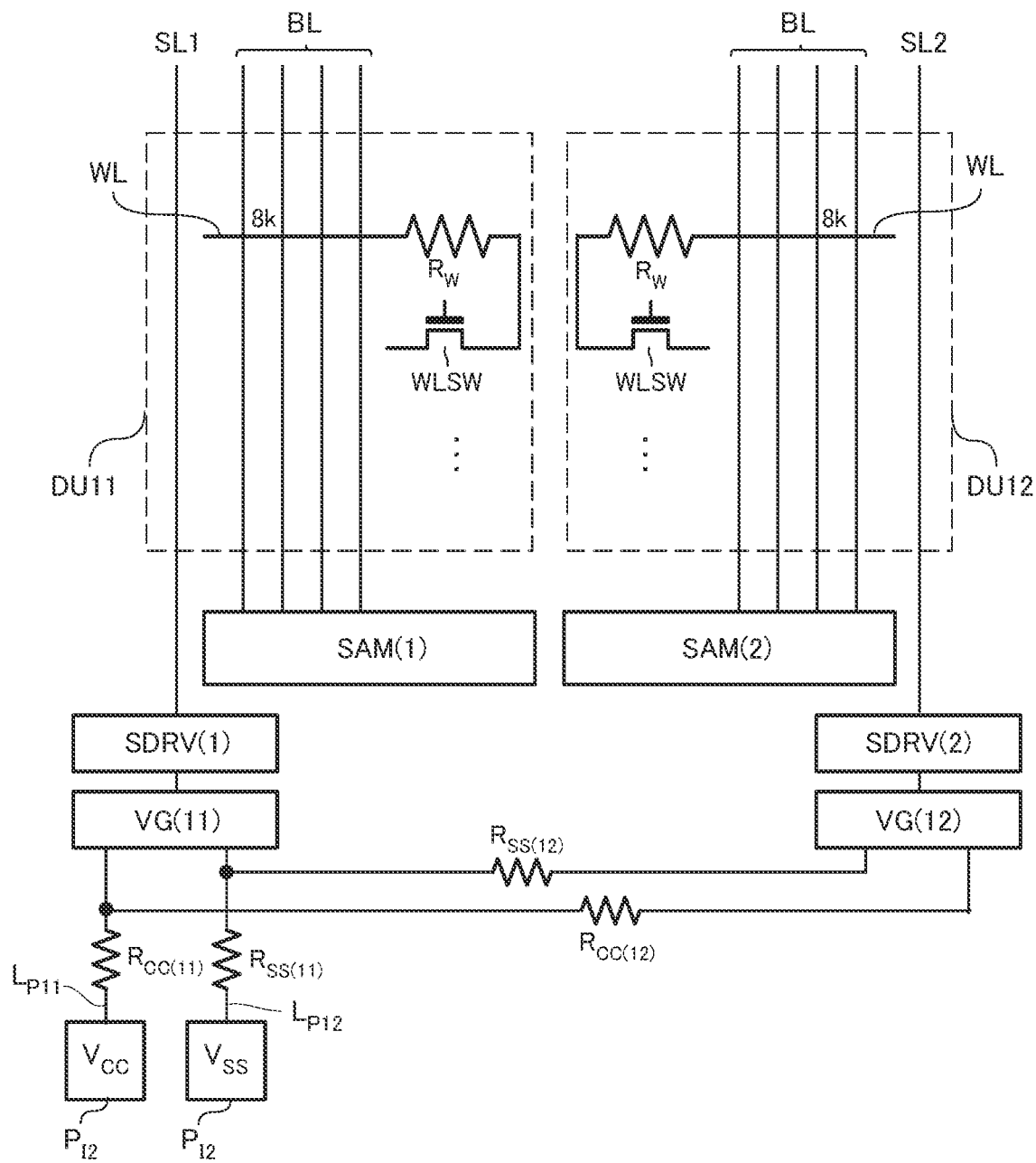
FIG. 59 is a schematic diagram illustrating a connection relation between the bonding electrodes $P_{I2}(V_{CC})$, $P_{I2}(V_{SS})$, the voltage generating circuits VG, and source line driver circuits SDRV.

FIG. 59 is a schematic diagram illustrating a connection relation between the bonding electrodes $P_{f2}(V_{CC})$, $P_{f2}(V_{SS})$, the voltage generating circuits VG, and the source line driver circuits SDRV. FIG. 59 is a drawing corresponding to FIG. 44. Note that FIG. 59 omits the sequencer SQC.

As illustrated in FIG. 59, the bonding electrode $P_{f2}(V_{CC})$ is connected to the voltage supply line $L_{P11}$, and the voltage supply line $L_{P11}$ is branched and connected to voltage generating circuits VG(11), VG(12). The voltage generating circuit VG(11) is connected to the source line driver circuit SDRV(1), and the voltage generating circuit VG(12) is connected to the source line driver circuit SDRV(2).

A wiring resistance of the voltage supply line $L_{P11}$ between the bonding electrode $P_{f2}(V_{CC})$ and the voltage generating circuit VG(11) (source line driver circuit SDRV(1)) is $R_{CC(11)}$. A wiring resistance of the voltage supply line $L_{P11}$ between the bonding electrode $P_{f2}(V_{CC})$ and the voltage generating circuit VG(12) (source line driver circuit SDRV(2)) is $R_{CC(11)}+R_{CC(12)}$. Thus, the wiring resistance of the voltage supply line $L_{P11}$ increases according to the distance of the voltage supply line $L_{P11}$. Accordingly, the power supply voltage $V_{CC}$ applied from the bonding electrode $P_{f2}(V_{CC})$ of the voltage generating circuit VG(12) (source line driver circuit SDRV(2)) is lower than that of the voltage generating circuit VG(11) (source line driver circuit SDRV(1)).

The bonding electrode $P_{f2}(V_{ss})$ is connected to the voltage supply line $L_{P12}$, and the voltage supply line $L_{P12}$ is branched and connected to the voltage generating circuits VG(11), VG(12).

A wiring resistance of the voltage supply line $L_{P12}$ between the bonding electrode $P_{f2}(V_{SS})$ and the voltage generating circuit VG(11) (source line driver circuit SDRV(1)) is $R_{SS(11)}$. A wiring resistance of the voltage supply line $L_{P12}$ between the bonding electrode $P_{f2}(V_{SS})$ and the voltage generating circuit VG(12) (source line driver circuit SDRV (2)) is $R_{SS(11)}+R_{SS(12)}$. Thus, the wiring resistance of the voltage supply line $L_{P12}$ increases according to the distance of the voltage supply line $L_{P12}$. Accordingly, the power supply voltage $V_{ss}$ applied from the bonding electrode $P_{I2}(V_{SS})$ of the voltage generating circuit VG(12) (source line driver circuit SDRV(2)) increases more than that of the voltage generating circuit VG(11) (source line driver circuit SDRV(1)).

Figure 60:
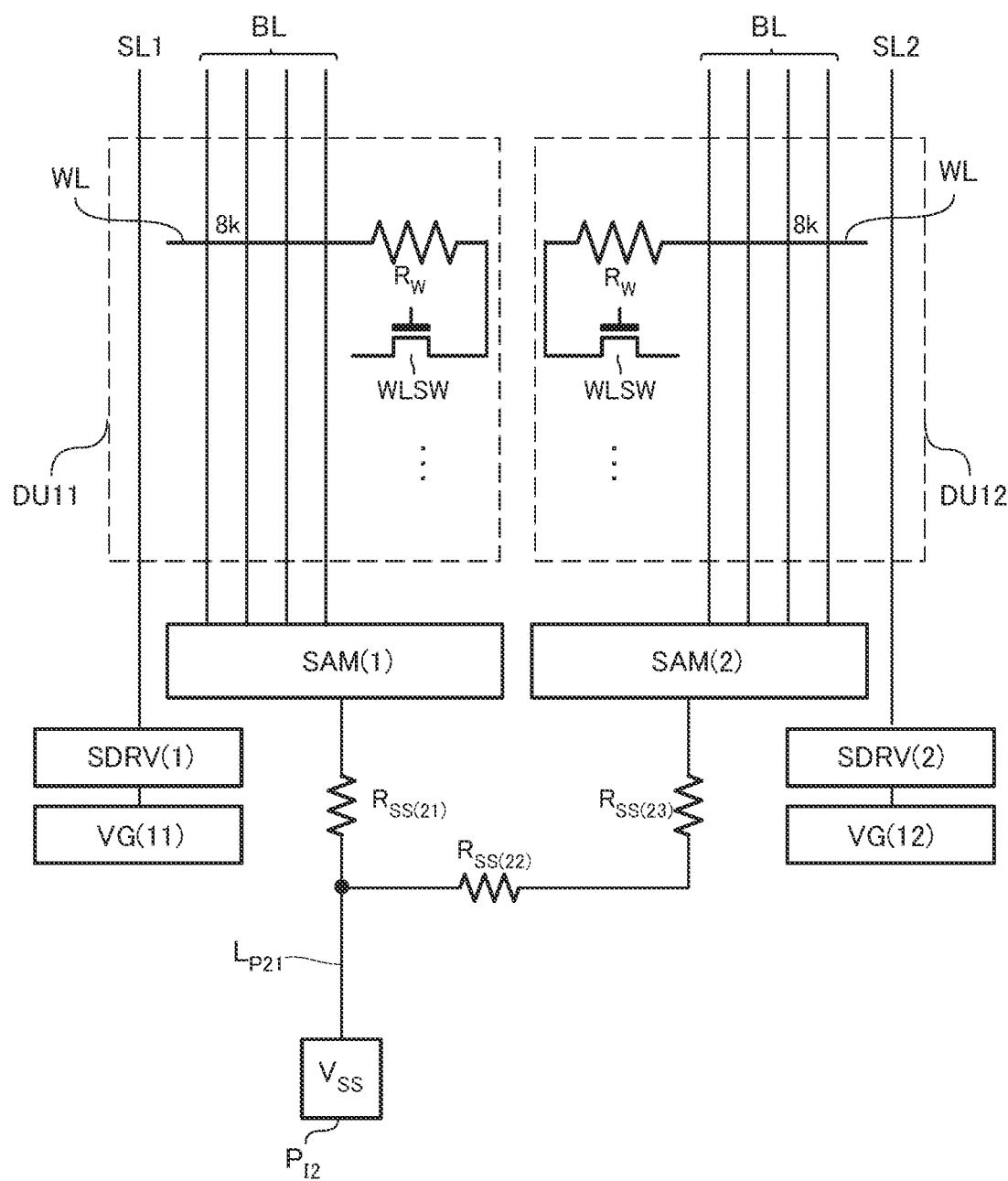
FIG. 60 is a schematic diagram illustrating a connection relation between the bonding electrode $P_{I2}(V_{SS})$ and the sense amplifier modules SAM.

FIG. 60 is a schematic diagram illustrating a connection relation between the bonding electrode $P_{I2}(V_{SS})$ and the sense amplifier modules SAM. FIG. 60 is a drawing corresponding to FIG. 44. Note that FIG. 60 omits the sequencer SQC.

As illustrated in FIG. 60, the bonding electrode $P_{I2}(V_{SS})$ is connected to the voltage supply line $L_{P21}$, and the voltage supply line $L_{P21}$ is branched and connected to the sense amplifier modules SAM(1), SAM(2). The wiring resistance of the voltage supply line $L_{P21}$ between the bonding electrode $P_{I2}(V_{SS})$ and the sense amplifier module SAM(1) is $R_{SS(21)}$. A wiring resistance of the voltage supply line $L_{P21}$ between the bonding electrode $P_{I2}$ ($V_{SS}$) and the sense amplifier module SAM(2) is $R_{SS(22)}+R_{SS(23)}$. Thus, the wiring resistance of the voltage supply line $L_{P21}$ increases according to the distance of the voltage supply line $L_{P21}$. Accordingly, the power supply voltage $V_{ss}$ applied from the bonding electrode $P_{I2}(V_{SS})$ of the sense amplifier module SAM(2) increases more than that of the sense amplifier module SAM(1). Note that in the example of FIG. 59, the voltage $V_{SRC}$ applied to the sense amplifier modules SAM (1), SAM(2) is the ground voltage $V_{SS}$.

Figure 61:
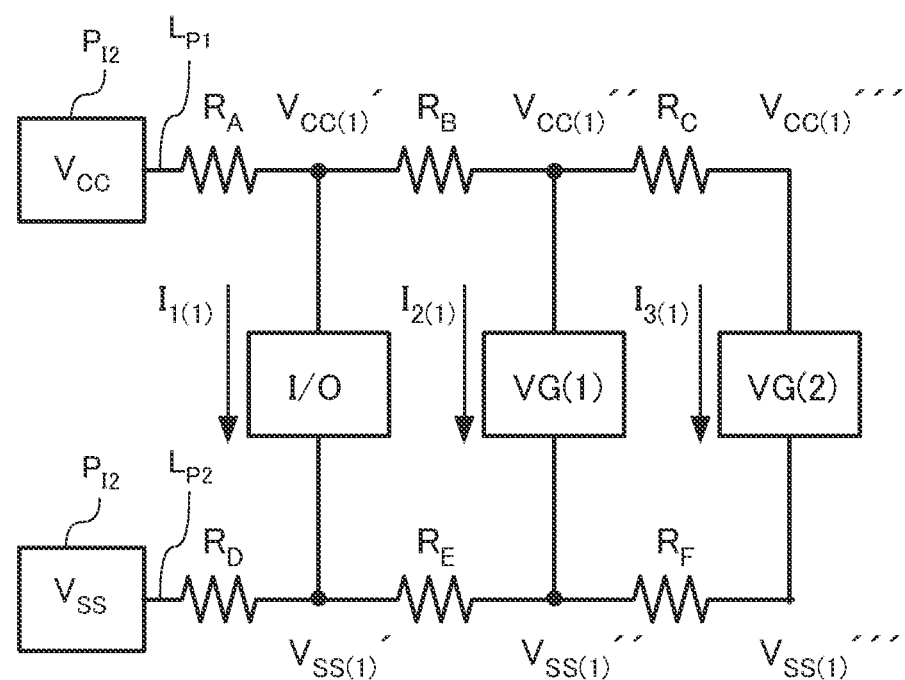
FIG. 61 is a schematic circuit diagram illustrating configurations of the bonding electrodes $P_{I2}(V_{CC})$, $P_{I2}(V_{SS})$, an input/output control circuit I/O, and the voltage generating circuits VG.

FIG. 61 is a schematic circuit diagram illustrating configurations of the bonding electrodes $P_{I2}$ ($V_{CC}$), $P_{I2}$ ($V_{SS}$), the input/output control circuit I/O, and the voltage generating circuits VG. As illustrated in FIG. 61, the input/output control circuit I/O is connected between the bonding electrodes $P_{I2}(V_{CC})$, $P_{I2}(V_{SS})$ via the voltage supply lines $L_{P1}$, $L_{P2}$. As illustrated in FIG. 57, the bonding electrodes $P_{I2}$ ($V_{CC}$), $P_{I2}$ ($V_{SS}$) connected to the input/output control circuit I/O are the bonding electrodes $P_{I2}(V_{CC})$, $P_{I2}(V_{SS})$ disposed at positions overlapping with the input/output control circuit I/O viewed from the Z-direction. That is, as illustrated in FIG. 57, the bonding electrodes $P_{I2}$ ($V_{CC}$), $P_{I2}$ ($V_{SS}$) connected to the input/output control circuit I/O are the third bonding electrodes $P_{I2}$ ($V_{CC}$), $P_{I2}$ ($V_{SS}$) counted from the X-direction negative side.

The voltage generating circuits VG(1), VG(2) are connected to be arranged in parallel with the input/output control circuit I/O between the bonding electrodes $P_{I2}(V_{CC})$, $P_{I2}(V_{SS})$ via the voltage supply lines $L_{P1}$, $L_{P2}$. A wiring resistance between the bonding electrode $P_{I2}(V_{CC})$ and the input/output control circuit I/O is $R_A$. A wiring resistance between the bonding electrode $P_{I2}(V_{CC})$ and the voltage generating circuit VG(1) is $R_A+R_B$. A wiring resistance between the bonding electrode $P_{I2}(V_{CC})$ and the voltage generating circuit VG(2) is $R_A+R_B+R_C$. A wiring resistance between the bonding electrode $P_{I2}(V_{SS})$ and the input/output control circuit I/O is $R_D$. A wiring resistance between the bonding electrode $P_{I2}(V_{SS})$ and the voltage generating circuit VG(1) is $R_D+R_E$. A wiring resistance between the bonding electrode $P_{I2}(V_{SS})$ and the voltage generating circuit VG(2) is $R_D+R_E+R_F$. Note that the wiring resistance $R_B$ corresponds to the wiring resistance $R_{CC(1)}$ in FIG. 58, the wiring resistance $R_C$ corresponds to the wiring resistance $R_{CC(2)}$ in FIG. 58, the wiring resistance $R_E$ corresponds to the wiring resistance $R_{SS(1)}$ in FIG. 58, and the wiring resistance $R_F$ corresponds to the wiring resistance $R_{SS(2)}$ in FIG. 58.

While the input/output control circuit I/O and the voltage generating circuits VG(1), VG(2) operate, the currents flowing through the input/output control circuit I/O and the voltage generating circuits VG(1), VG(2) are $I_{1(1)}$, $I_{2(1)}$, $I_{3(1)}$, respectively. At this time, voltages at the bonding electrode $P_{I2}(V_{CC})$ side and the bonding electrode $P_{I2}(V_{SS})$ side of the input/output control circuit I/O are $V_{CC(1)}'$ and $V_{SS(1)}'$, respectively. Voltages at the bonding electrode $P_{I2}(V_{CC})$ side and the bonding electrode $P_{I2}(V_{SS})$ side of the voltage generating circuit VG(1) are $V_{CC(1)}''$ and $V_{SS(1)}''$, respectively. Voltages at the bonding electrode $P_{I2}(V_{CC})$ side and the bonding electrode $P_{I2}(V_{SS})$ side of the voltage generating circuit VG(2) are $V_{CC(1)}'''$ and $V_{SS(1)}'''$, respectively.

Figure 62:
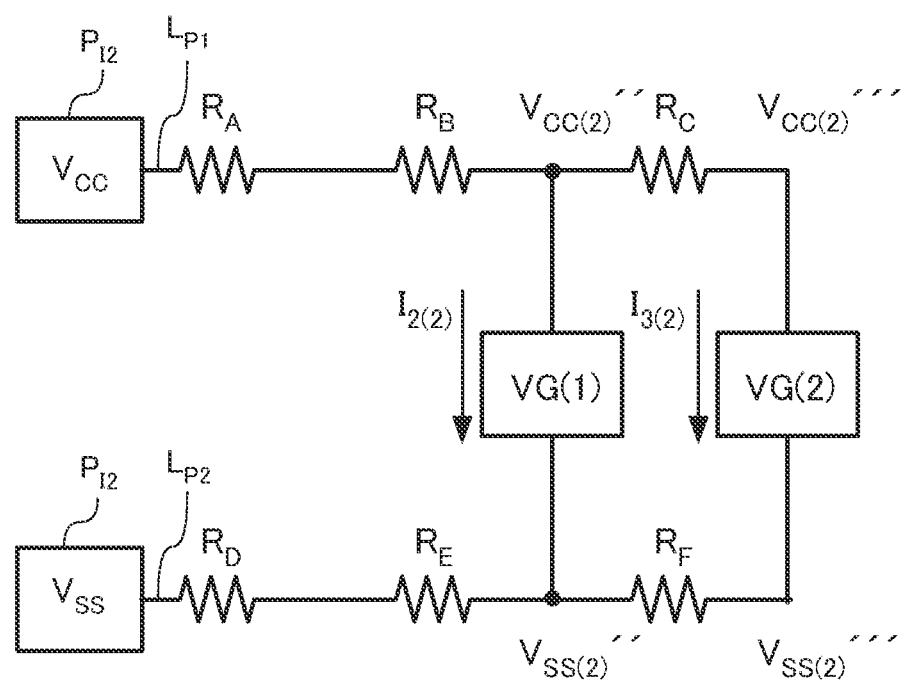
FIG. 62 is a schematic circuit diagram illustrating configurations of the bonding electrodes $P_{I2}(V_{CC})$, $P_{I2}(V_{SS})$ and the voltage generating circuits VG.

FIG. 62 is a schematic circuit diagram illustrating configurations of the bonding electrodes $P_{I2}(V_{CC})$, $P_{I2}(V_{SS})$ and the voltage generating circuits VG. As illustrated in FIG. 62, the input/output control circuit I/O is not disposed between the bonding electrodes $P_{I2}(V_{CC})$, $P_{I2}(V_{SS})$. The bonding electrodes $P_{I2}$ ($V_{CC}$), $P_{I2}$ ($V_{SS}$) in FIG. 62 are the bonding electrodes $P_{I2}$ ($V_{CC}$), $P_{I2}$ ($V_{SS}$) disposed at positions not overlapping with the input/output control circuit I/O viewed from the Z-direction as illustrated in FIG. 57. That is, the bonding electrodes $P_{I2}$ ($V_{CC}$), $P_{I2}$ ($V_{SS}$) in FIG. 62 are the first, second, or fourth bonding electrodes $P_{I2}(V_{CC})$, $P_{I2}$ ($V_{SS}$) counted from the X-direction negative side as illustrated in FIG. 57. Since the other configurations in FIG. 62 are similar to the configurations described in FIG. 61, the overlapping explanation will be omitted.

While the voltage generating circuits VG(1), VG(2) operate, the currents flowing through the voltage generating circuits VG(1), VG(2) are $I_{2(2)}$, $I_{3(2)}$, respectively. At this time, voltages at the bonding electrode $P_{I2}$ ($V_{CC}$) side and the bonding electrode $P_{I2}$ ($V_{SS}$) side of the voltage generating circuit VG(1) are $V_{CC(2)}''$ and $V_{SS(2)}''$, respectively. Voltages at the bonding electrode $P_{I2}$ ($V_{CC}$) side and the bonding electrode $P_{I2}$ ($V_{SS}$) side of the voltage generating circuit VG(2) are $V_{CC(2)}'''$ and $V_{SS(2)}'''$, respectively.

In the case of FIG. 62, since the input/output control circuit I/O is not connected to the bonding electrode $P_{I2}$ ($V_{CC}$), $P_{I2}(V_{SS})$, regardless of whether the input/output control circuit I/O operates, the currents $I_{2(2)}$, $I_{3(2)}$ flowing through the voltage generating circuits VG(1), VG(2) are constant. In contrast to this, in the case of FIG. 61, by operating the input/output control circuit I/O, the current $I_{1(1)}$ flows through the input/output control circuit I/O and the currents $I_{2(1)}$, $I_{3(1)}$ flowing through the voltage generating circuits VG(1), VG(2) decrease. Thus, in the case of FIG. 61, the voltage (the voltage difference $V_{CC(1)}''-V_{SS(1)}''$) applied to the voltage generating circuit VG(1) decreases and the voltage (the voltage difference $V_{CC(1)}'''-V_{SS(1)}'''$) applied to the voltage generating circuit VG(2) decreases. That is, the power supply voltage $V_{CC}$ applied from the bonding electrode $P_{I2}(V_{CC})$ to the voltage generating circuits VG(1), VG(2) decreases, and the ground voltage $V_{SS}$ applied from the bonding electrode $P_{I2}(V_{SS})$ to the voltage generating circuits VG(1), VG(2) increases.

[Adjustment of Operation Parameters]

As described with reference to FIG. 58 to FIG. 60, in the same memory plane MP, according to the distances of the voltage supply lines $L_P$ between the bonding electrodes $P_{I2}(V_{CC})$, $P_{I2}(V_{SS})$ and the voltage generating circuits VG or the driver circuits and the like (the CG driver circuits DRV, the source line driver circuits SDRV, and the sense amplifier modules SAM), the wiring resistances of the voltage supply lines $L_P$ change, and the voltages applied to the voltage generating circuits VG and the driver circuits and the like vary. Additionally, as described with reference to FIG. 61 and FIG. 62, since the voltage generating circuits VG and the driver circuits and the like of the memory plane MP close to the input/output control circuit I/O share the voltage supply lines $L_P$ with the input/output control circuit I/O, by performing the operation of input/output of data in the input/output control circuit I/O, the voltages applied to the voltage generating circuits VG and the driver circuits and the like vary. Note that the voltage generating circuits VG and the driver circuits and the like of the memory plane MP far from the input/output control circuit I/O do not share the voltage supply lines $L_P$ with the input/output control circuit I/O. Therefore, even when the operation of input/output of data is performed in the input/output control circuit I/O, the voltages applied to the voltage generating circuits VG and the driver circuits and the like do not vary.

Thus, the voltages applied to the different voltage generating circuits VG and driver circuits and the like in the same memory plane MP vary. Additionally, the voltages applied to the voltage generating circuits VG and the driver circuits and the like in the memory plane MP close to the input/output control circuit I/O and the memory plane MP far from the input/output control circuit I/O vary.

When the voltages applied to the voltage generating circuits VG and the driver circuits and the like vary, the voltage values of various kinds of voltages applied from the voltage generating circuits VG and the driver circuits and the like possibly vary. Therefore, according to the variation in the voltages applied to the voltage generating circuits VG and the driver circuits and the like, the operation parameters in the read operation and the write operation are adjusted.

Note that in FIG. 57, one set of the electrode $P_{I2}(V_{CC})$, $P_{I2}(V_{SS})$ are disposed in one memory plane MP. However, one set of the electrodes $P_{I2}(V_{CC})$, $P_{I2}(V_{SS})$ may be disposed been the plurality of (for example, two) memory planes MP. In this case, one set of the electrodes $P_{I2}(V_{CC})$, $P_{I2}(V_{SS})$ and the voltage generating circuits VG and the driver circuits and the like of the plurality of memory planes MP are connected with the plurality of voltage supply lines $L_P$. In this case, the distance of the voltage supply line $L_P$ changes in each of the plurality of memory planes MP, and the wiring resistance of the voltage supply line $L_P$ changes. Therefore, the voltages applied to the voltage generating circuits VG and the driver circuits and the like vary in each of the plurality of memory planes MP.

[Adjustment of Operation Parameters in Read Operation]

The operation parameters of the selected word line $WL_S$ in the read operation include the wait time Ta in FIG. 26 and the voltage Va applied to the selected word line $WL_S$ from timing t101 to timing t102 in FIG. 26. The operation parameters of the selected word line $WL_S$ in the read operation include the wait time Te in FIG. 29 and the voltage Ve applied to the selected word line $WL_S$ from timing t102 to timing t103 in FIG. 29. For example, when the power supply voltage $V_{CC}$ applied to the voltage generating circuit VG decreases, voltage values of various kinds of voltages, such as the read pass voltage $V_{READ}$ and the reading voltage applied from the voltage generating circuit VG to the CG driver circuit DRV decrease. In view of this, the wait time Ta is lengthened, the voltage Va is increased, the wait time Te is lengthened, and the voltage Ve is increased. Moreover, when the ground voltage $V_{SS}$ applied to the CG driver circuit DRV increases, the voltage effectively applied to the memory cell or the like in the memory cell array MCA decreases. In view of this, the wait time Ta is lengthened, the voltage Va is increased, the wait time Te is lengthened, and the voltage Ve is increased.

The operation parameters of the bit line BL in the read operation include the wait time Tb in FIG. 26, the voltage Vb applied to the bit line BL from timing t104 to timing t105 in FIG. 26, the wait time Tc in FIG. 26, and the wait time Td in FIG. 26. For example, when the ground voltage $V_{SS}$ (voltage $V_{SRC}$) applied to the sense amplifier module SAM increases, the wait time Tb is lengthened, the voltage Vb is increased, the wait time Tc is shortened, and the wait time Td (sense time) is lengthened.

The operation parameters of the source lines SL1, SL2 in the read operation include the wait time Ts in FIG. 26 and the voltage Vs applied to the source lines SL1, SL2 from timing t103 to timing t105 in FIG. 26. For example, when the power supply voltage $V_{CC}$ applied to the source line driver circuit SDRV decreases, the wait time Ts is lengthened and the voltage Vs is increased. When the ground voltage $V_{SS}$ applied to the source line driver circuit SDRV is increased, the wait time Ts is shortened, and the voltage Vs is decreased.

[Adjustment of Operation Parameters in Write Operation]

The operation parameters of the selected word line $WL_S$ in the write operation include the wait time Tf in FIG. 33 and the initial voltage Vf (the program voltage $V_{PGM}$ when the loop count $n_W$ is 1) of the program voltage $V_{PGM}$ in FIG. 34. The operation parameters of the selected word line $WL_S$ in the write operation include the wait time Ta' and the wait time Te' in FIG. 35. For example, when the power supply voltage $V_{CC}$ applied to the voltage generating circuit VG decreases, voltage values of various kinds of voltages, such as the program voltage $V_{PGM}$ and the write pass voltage $V_{PASS}$ applied from the voltage generating circuit VG to the CG driver circuit DRV decrease. In view of this, the wait time Tf is lengthened, the voltage Vf is increased, the wait time Ta' is lengthened, and the wait time Te' is lengthened. When the ground voltage $V_{SS}$ applied to the CG driver circuit DRV increases, the wait time Tf is lengthened, the voltage Vf is increased, the wait time Ta' is lengthened, and the wait time Te' is lengthened.

The operation parameters of the bit line BL in the write operation include the wait time Tb', the wait time Tc', and the wait time Td' in FIG. 35. For example, when the ground voltage $V_{SS}$ (the voltage $V_{SRC}$) applied to the sense amplifier module SAM increases, the wait time Tb' is lengthened, the wait time Tc' is shortened, and the wait time Td' is lengthened.

Note that in FIG. 57 to FIG. 60, each one of the bonding electrode $P_{I2}(V_{CC})$ and the bonding electrode $P_{I2}(V_{SS})$ are disposed in one memory plane MP, but two or more of the bonding electrodes $P_{I2}(V_{CC})$ and the bonding electrodes $P_{I2}(V_{SS})$ may be disposed in one memory plane MP. Further, each one of the bonding electrode $P_{I2}(V_{CC})$ and the bonding electrode $P_{I2}(V_{SS})$ may be disposed in the plurality of memory planes MP.

In FIG. 57, while the plurality of bonding electrodes $P_{I2}$ are disposed in the region (circuit region $R_C$) at the Y-direction negative side in the chip $C_P$, the plurality of bonding electrodes $P_{I2}$ may be disposed in the region at the Y-direction negative side and positive side in the chip $C_P$.

Eleventh Embodiment

Figure 63:
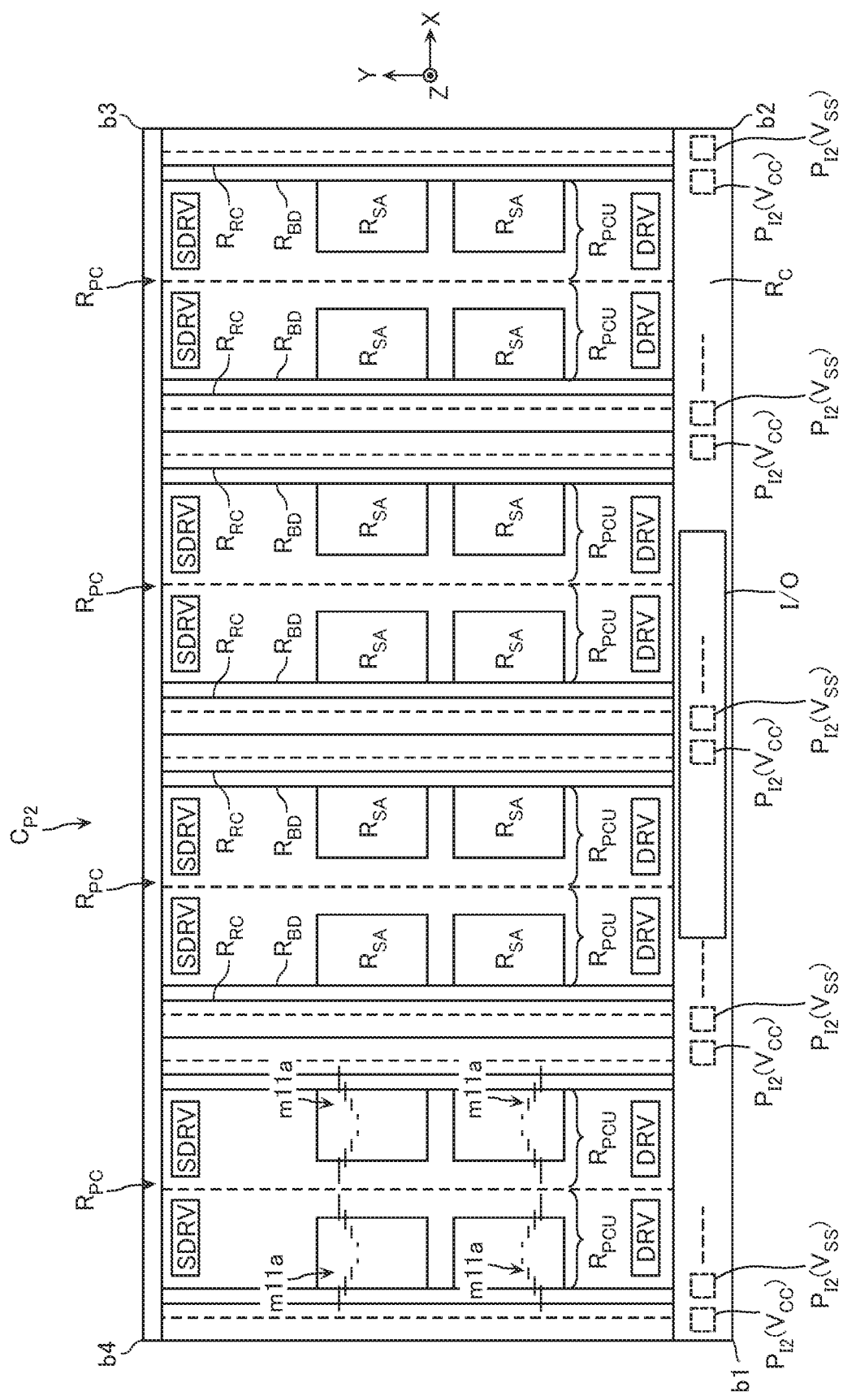
FIG. 63 is a schematic plan view illustrating an example of a configuration of a chip $C_{P2}$ according to an eleventh embodiment.

FIG. 63 is a schematic plan view illustrating an example of a configuration of a chip $C_{P2}$ according to the eleventh embodiment. In FIG. 57, four sets of the bonding electrodes $P_{T2}(V_{CC})$ and the bonding electrodes $P_{T2}(V_{SS})$ are disposed corresponding to the four peripheral circuit regions $R_{PC}$ (four memory planes MP). In contrast to this, in FIG. 63, three sets of the bonding electrodes $P_{T2}(V_{CC})$ and the bonding electrodes $P_{T2}(V_{SS})$ are disposed near boundaries of the four peripheral circuit regions $R_{PC}$ (four memory planes MP), one set of the bonding electrode $P_{T2}(V_{CC})$ and the bonding electrode $P_{T2}(V_{SS})$ are disposed on the end portion at the X-direction negative side in the first peripheral circuit region $R_{PC}$ (memory plane MP) counted from the X-direction negative side, and one set of the bonding electrode $P_{T2}(V_{CC})$ and the bonding electrode $P_{T2}(V_{SS})$ are disposed on the end portion at the X-direction positive side in the fourth peripheral circuit region $R_{PC}$ (memory plane MP) counted from the X-direction negative side.

Thus, the bonding electrodes $P_{T2}(V_{CC})$ and the bonding electrodes $P_{T2}(V_{SS})$ are disposed at both ends (the negative side and the positive side) in the X-direction of each of the memory planes MP. The bonding electrode $P_{T2}(V_{CC})$ and the bonding electrode $P_{T2}(V_{SS})$ near the boundary of the two memory planes MP are shared by the two memory planes MP. Note that the bonding electrodes $P_{T2}$ other than the bonding electrodes $P_{T2}(V_{CC})$ or the bonding electrodes $P_{T2}(V_{SS})$ are, for example, electrically connected to the external pad electrodes $P_X$ connected to, for example, the power supply voltage $V_{CCQ}$ (FIG. 2) and the data signal input/output terminals DQ0 to DQ7 (FIG. 2).

Since the other configurations in FIG. 63 are similar to the configurations described in FIG. 40 and FIG. 57, the overlapping explanation will be omitted.

Figure 64:
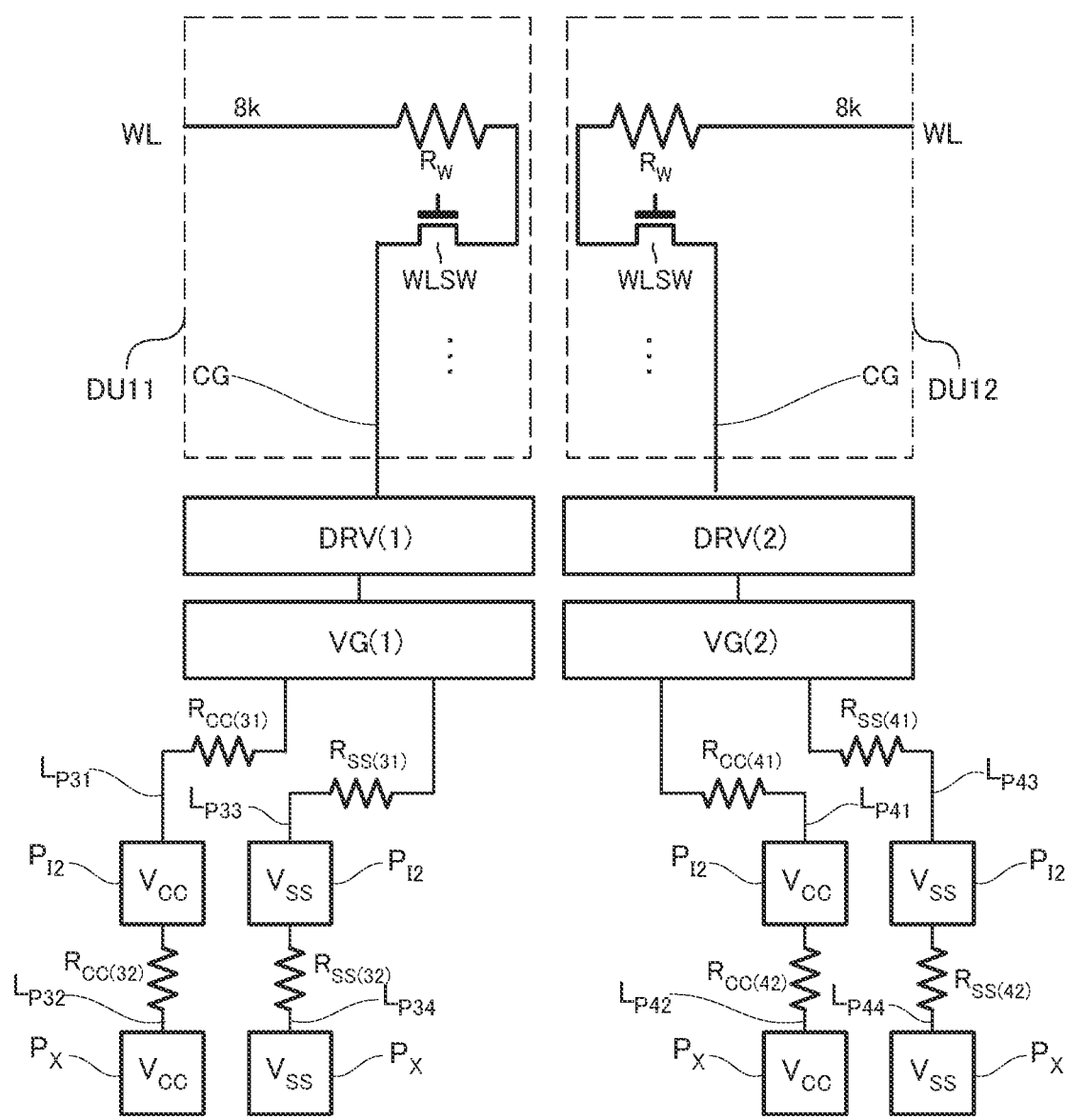
FIG. 64 is a schematic diagram illustrating a connection relation between external pad electrodes $P_X(V_{CC})$, $P_X(V_{SS})$, the bonding electrodes $P_{I2}(V_{CC})$, $P_{I2}(V_{SS})$, the voltage generating circuits VG, and the source line driver circuits SDRV.

FIG. 64 is a schematic diagram illustrating a connection relation between the external pad electrodes $P_X$ ($V_{CC}$), $P_X$ ($V_{SS}$), the bonding electrodes $P_{T2}(V_{CC})$, $P_{T2}(V_{SS})$, the voltage generating circuits VG, and source line driver circuits SDRV. FIG. 64 is a drawing corresponding to FIG. 43 and FIG. 58. Note that FIG. 64 omits the sequencer SQC.

As illustrated in FIG. 64, the bonding electrode $P_{T2}(V_{CC})$ disposed at the X-direction negative side of the memory plane MP is connected to a voltage supply line $L_{P31}$, and the voltage supply line $L_{P31}$ is connected to the voltage generating circuit VG(1). The voltage generating circuit VG(1) is connected to the CG driver circuit DRV(1). A wiring resistance of the voltage supply line $L_{P31}$ between the bonding electrode $P_{T2}(V_{CC})$ and the voltage generating circuit VG(1) (CG driver circuit DRV(1)) is $R_{CC(31)}$.

The bonding electrode $P_{T2}(V_{CC})$ disposed at the X-direction negative side of the memory plane MP is connected to a voltage supply line $L_{P32}$, and the voltage supply line $L_{P32}$ is connected to the external pad electrode $P_X(V_{CC})$. A wiring resistance of the voltage supply line $L_{P32}$ between the bonding electrode $P_{T2}(V_{CC})$ and the external pad electrode $P_X(V_{CC})$ is $R_{CC(32)}$. A wiring resistance of the voltage supply lines $L_{P31}$, $L_{P32}$ between the external pad electrodes $P_X(V_{CC})$ and the voltage generating circuit VG(1) (CG driver circuit DRV (1)) is $R_{CC(31)}+R_{CC(32)}$.

As illustrated in FIG. 56, the voltage supply line $L_{P31}$ includes the wirings d10 to d14 of the wiring layers D10 to D14, contacts that electrically connect these wirings d10 to d14, and the contacts CS. The same applies to voltage supply lines $L_{P33}$, $L_{P41}$, $L_{P43}$ (FIG. 64), voltage supply lines $L_{P51}$, $L_{P53}$, $L_{P61}$, $L_{P63}$ (FIG. 65), and voltage supply lines $L_{P71}$, $L_{P81}$ (FIG. 66) described later.

Further, as illustrated in FIG. 56, the voltage supply line $L_{P32}$ includes the bonding electrode P11, the wirings m11, m10 of the wiring layers M11, M10, the contacts CC, and the wiring ma1 of the back side wiring layer MA. The same applies to voltage supply lines $L_{P34}$, $L_{P42}$, $L_{P44}$ (FIG. 64), voltage supply lines $L_{P52}$, $L_{P54}$, $L_{P62}$, $L_{P64}$ (FIG. 65), and voltage supply lines $L_{P72}$, $L_{P82}$ (FIG. 66) described later.

As illustrated in FIG. 64, the bonding electrode $P_{T2}(V_{SS})$ disposed at the X-direction negative side of the memory plane MP is connected to the voltage supply line $L_{P33}$, and the voltage supply line $L_{P33}$ is connected to the voltage generating circuit VG(1). The voltage generating circuit VG(1) is connected to the CG driver circuit DRV(1). A wiring resistance of the voltage supply line $L_{P33}$ between the bonding electrode $P_{T2}(V_{SS})$ and the voltage generating circuit VG(1) (CG driver circuit DRV(1)) is $R_{ss(31)}$.

The bonding electrode $P_{T2}(V_{SS})$ disposed at the X-direction negative side of the memory plane MP is connected to the voltage supply line $L_{P34}$, and the voltage supply line $L_{P34}$ is connected to the external pad electrode $P_X(V_{SS})$. A wiring resistance of the voltage supply line $L_{P34}$ between the bonding electrode $P_{T2}(V_{SS})$ and the external pad electrode $P_X(V_{SS})$ is $R_{SS(32)}$. A wiring resistance of the voltage supply lines $L_{P33}$, $L_{P34}$ between the external pad electrodes $P_X(V_{SS})$ and the voltage generating circuit VG(1) (CG driver circuit DRV(1)) is $R_{ss(31)}+R_{ss(32)}$.

As illustrated in FIG. 64, the bonding electrode $P_{T2}(V_{CC})$ disposed at the X-direction positive side of the memory plane MP is connected to the voltage supply line $L_{P41}$, and the voltage supply line $L_{P41}$ is connected to the voltage generating circuit VG(2). The voltage generating circuit VG(2) is connected to the CG driver circuit DRV(2). A wiring resistance of the voltage supply line $L_{P41}$ between the bonding electrode $P_{T2}(V_{CC})$ and the voltage generating circuit VG(2) (CG driver circuit DRV(2)) is $R_{CC(41)}$.

The bonding electrode $P_{T2}(V_{CC})$ disposed at the X-direction positive side of the memory plane MP is connected to the voltage supply line $L_{P42}$, and the voltage supply line $L_{P42}$ is connected to the external pad electrode $P_X(V_{CC})$. A wiring resistance of the voltage supply line $L_{P42}$ between the bonding electrode $P_{T2}(V_{CC})$ and the external pad electrode $P_X(V_{CC})$ is $R_{CC(42)}$. A wiring resistance of the voltage supply lines $L_{P41}$, $L_{P42}$ between the external pad electrodes $P_X(V_{CC})$ and the voltage generating circuit VG(2) (CG driver circuit DRV (2)) is $R_{CC(41)}+R_{CC(42)}$.

As illustrated in FIG. 64, the bonding electrode $P_{T2}(V_{SS})$ disposed at the X-direction positive side of the memory plane MP is connected to the voltage supply line $L_{P43}$, and the voltage supply line $L_{P43}$ is connected to the voltage generating circuit VG(2). The voltage generating circuit VG(2) is connected to the CG driver circuit DRV(2). A wiring resistance of the voltage supply line $L_{P43}$ between the bonding electrode $P_{T2}(V_{SS})$ and the voltage generating circuit VG(2) (CG driver circuit DRV(2)) is $R_{ss(41)}$.

The bonding electrode $P_{T2}(V_{SS})$ disposed at the X-direction positive side of the memory plane MP is connected to the voltage supply line $L_{P44}$, and the voltage supply line $L_{P44}$ is connected to the external pad electrode $P_X(V_{SS})$. A wiring resistance of the voltage supply line $L_{P44}$ between the bonding electrode $P_{T2}(V_{SS})$ and the external pad electrode $P_X(V_{SS})$ is $R_{SS(42)}$. A wiring resistance of the voltage supply lines $L_{P43}$, $L_{P44}$ between the external pad electrodes $P_X(V_{SS})$ and the voltage generating circuit VG(2) (CG driver circuit DRV(2)) is $R_{SS(41)}+R_{SS(42)}$.

As described above, the wiring resistances increase according to the distances of the voltage supply lines $L_{P31}$, $L_{P32}$, $L_{P33}$, $L_{P34}$ between the external pad electrodes $P_X(V_{CC})$, $P_X(V_{SS})$ and the voltage generating circuit VG(1) and the CG driver circuit DRV(1). The wiring resistances increase according to the distances of the voltage supply lines $L_{P41}$, $L_{P42}$, $L_{P43}$, $L_{P44}$ between the external pad electrodes $P_X$ ($V_{CC}$), $P_X(V_{SS})$ and the voltage generating circuit VG(2) and the CG driver circuit DRV(2). Accordingly, the power supply voltage $V_{CC}$ and the ground voltage $V_{SS}$ applied from the external pad electrodes $P_X(V_{CC})$, $P_X(V_{SS})$ to the voltage generating circuit VG(1) and the CG driver circuit DRV(1) vary according to the wiring resistances. The power supply voltage $V_{CC}$ and the ground voltage $V_{SS}$ applied from the external pad electrodes $P_X(V_{CC})$, $P_X(V_{SS})$ to the voltage generating circuit VG(2) and the CG driver circuit DRV(2) also vary according to the wiring resistances. According to the variation in the voltages applied to the voltage generating circuits VG and the CG driver circuits DRV, the operation parameters in the read operation and the write operation are adjusted. The adjustment of the operation parameters is similar to that described in the tenth embodiment, and therefore the description thereof will be omitted.

Figure 65:
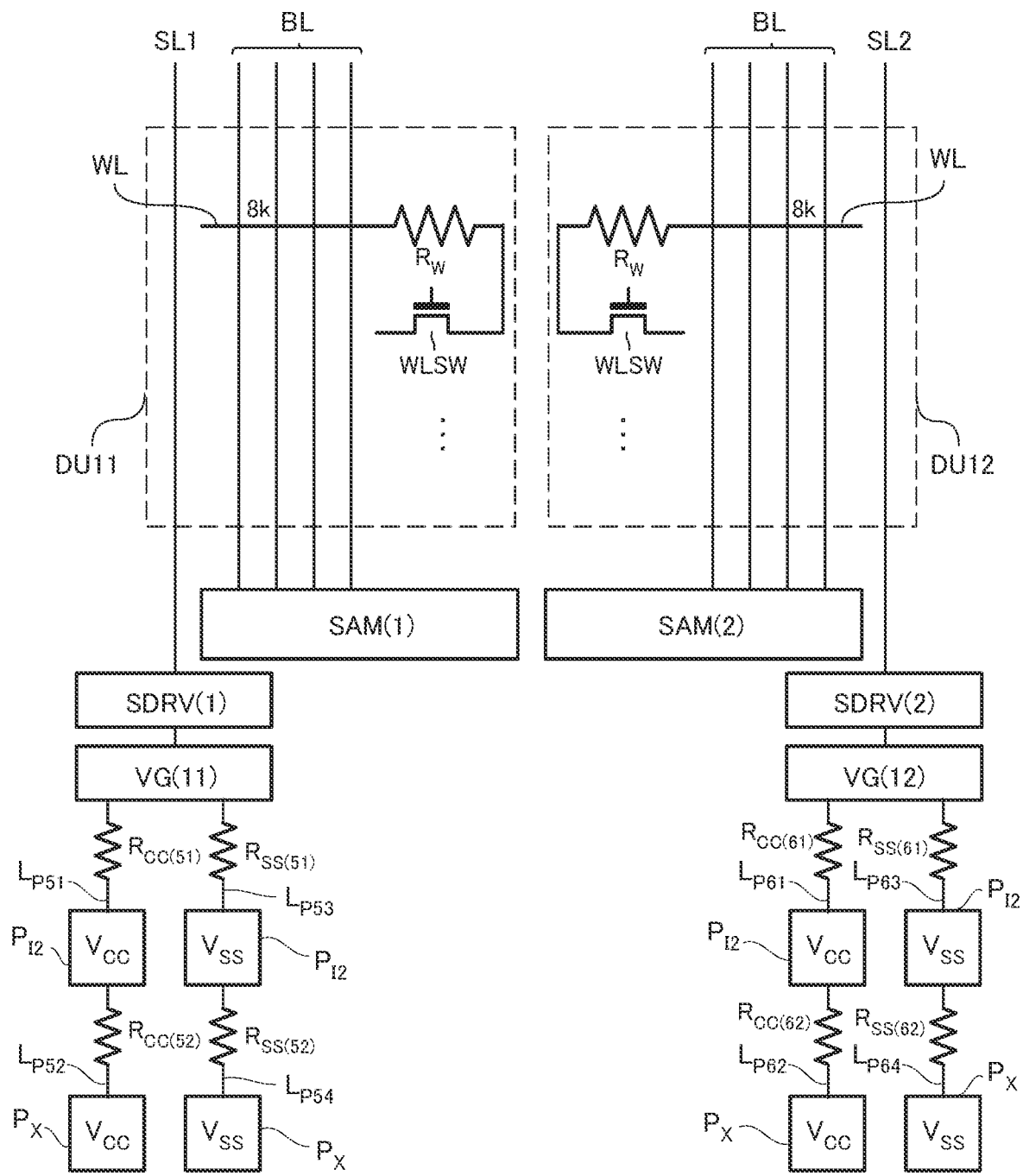
FIG. 65 is a schematic diagram illustrating a connection relation between the external pad electrodes $P_X(V_{CC})$, $P_X(V_{SS})$, the bonding electrodes $P_{I2}(V_{CC})$, $P_{I2}(V_{SS})$, the voltage generating circuits VG, and the source line driver circuits SDRV.

FIG. 65 is a schematic diagram illustrating a connection relation between the external pad electrodes $P_X(V_{CC})$, $P_X(V_{SS})$, the bonding electrodes $P_{l2}(V_{CC})$, $P_{l2}(V_{SS})$, the voltage generating circuits VG, and the source line driver circuits SDRV. FIG. 65 is a drawing corresponding to FIG. 44 and FIG. 59. Note that FIG. 65 omits the sequencer SQC.

As illustrated in FIG. 65, the bonding electrode $P_{l2}(V_{CC})$ disposed at the X-direction negative side of the memory plane MP is connected to the voltage supply line $L_{P51}$, and the voltage supply line $L_{P51}$ is connected to the voltage generating circuit VG(11). The voltage generating circuit VG(11) is connected to the source line driver circuit SDRV (1). A wiring resistance of the voltage supply line $L_{P51}$ between the bonding electrode $P_{l2}(V_{CC})$ and the voltage generating circuit VG(11) (source line driver circuit SDRV (1)) is $R_{CC(51)}$.

The bonding electrode $P_{l2}(V_{CC})$ disposed at the X-direction negative side of the memory plane MP is connected to the voltage supply line $L_{P52}$, and the voltage supply line $L_{P52}$ is connected to the external pad electrode $P_X(V_{CC})$. A wiring resistance of the voltage supply line $L_{P52}$ between the bonding electrode $P_{l2}(V_{CC})$ and the external pad electrode $P_X(V_{CC})$ is $R_{CC(52)}$. A wiring resistance of the voltage supply lines $L_{P51}$, $L_{P52}$ between the external pad electrodes $P_X(V_{CC})$ and the voltage generating circuit VG(11) (source line driver circuit SDRV(1)) is $R_{CC(51)}+R_{CC(52)}$.

As illustrated in FIG. 65, the bonding electrode $P_{l2}(V_{SS})$ disposed at the X-direction negative side of the memory plane MP is connected to the voltage supply line $L_{P53}$, and the voltage supply line $L_{P53}$ is connected to the voltage generating circuit VG(11). The voltage generating circuit VG(11) is connected to the source line driver circuit SDRV (1). A wiring resistance of the voltage supply line $L_{P53}$ between the bonding electrode $P_{l2}(V_{SS})$ and the voltage generating circuit VG(11) (source line driver circuit SDRV (1)) is $R_{ss(51)}$.

The bonding electrode $P_{l2}(V_{SS})$ disposed at the X-direction negative side of the memory plane MP is connected to the voltage supply line $L_{P54}$, and the voltage supply line $L_{P54}$ is connected to the external pad electrode $P_X(V_{SS})$. A wiring resistance of the voltage supply line $L_{P54}$ between the bonding electrode $P_{l2}(V_{SS})$ and the external pad electrode $P_X(V_{SS})$ is $R_{ss(52)}$. A wiring resistance of the voltage supply lines $L_{P53}$, $L_{P54}$ between the external pad electrodes $P_X(V_{SS})$ and the voltage generating circuit VG(11) (source line driver circuit SDRV (1)) is $R_{ss(51)}+R_{ss(52)}$.

As illustrated in FIG. 65, the bonding electrode $P_{l2}(V_{CC})$ disposed at the X-direction positive side of the memory plane MP is connected to the voltage supply line $L_{P61}$, and the voltage supply line $L_{P61}$ is connected to the voltage generating circuit VG(12). The voltage generating circuit VG(12) is connected to the source line driver circuit SDRV (2). A wiring resistance of the voltage supply line $L_{P61}$ between the bonding electrode $P_{l2}(V_{CC})$ and the voltage generating circuit VG(12) (source line driver circuit SDRV (2)) is $R_{CC(61)}$.

The bonding electrode $P_{l2}(V_{CC})$ disposed at the X-direction positive side of the memory plane MP is connected to the voltage supply line $L_{P62}$, and the voltage supply line $L_{P62}$ is connected to the external pad electrode $P_X(V_{CC})$. A wiring resistance of the voltage supply line $L_{P62}$ between the bonding electrode $P_{l2}(V_{CC})$ and the external pad electrode $P_X(V_{CC})$ is $R_{CC(62)}$. A wiring resistance of the voltage supply lines $L_{P61}$, $L_{P62}$ between the external pad electrodes $P_X(V_{CC})$ and the voltage generating circuit VG(12) (source line driver circuit SDRV (2)) is $R_{CC(61)}+R_{CC(62)}$.

As illustrated in FIG. 65, the bonding electrode $P_{l2}(V_{SS})$ disposed at the X-direction positive side of the memory plane MP is connected to the voltage supply line $L_{P63}$, and the voltage supply line $L_{P63}$ is connected to the voltage generating circuit VG(12). The voltage generating circuit VG(12) is connected to the source line driver circuit SDRV (2). A wiring resistance of the voltage supply line $L_{P63}$ between the bonding electrode $P_{l2}(V_{SS})$ and the voltage generating circuit VG(12) (source line driver circuit SDRV (2)) is $R_{ss(61)}$.

The bonding electrode $P_{l2}(V_{SS})$ disposed at the X-direction positive side of the memory plane MP is connected to the voltage supply line $L_{P64}$, and the voltage supply line $L_{P64}$ is connected to the external pad electrode $P_X(V_{SS})$. A wiring resistance of the voltage supply line $L_{P64}$ between the bonding electrode $P_{l2}(V_{SS})$ and the external pad electrode $P_X(V_{SS})$ is $R_{SS(62)}$. A wiring resistance of the voltage supply lines $L_{P63}$, $L_{P64}$ between the external pad electrodes $P_X(V_{SS})$ and the voltage generating circuit VG(12) (source line driver circuit SDRV(2)) is $R_{SS(61)}+R_{SS(62)}$.

Note that the external pad electrodes $P_X(V_{CC})$, $P_X(V_{SS})$ are connected to the wiring ma1 of the back side wiring layer MA, and the wiring ma1 extends from the end portion at the Y-direction negative side to the end portion at the Y-direction positive side of the memory plane MP. The wiring ma1 and the contacts CC are connected at the end portion at the Y-direction positive side of the memory plane MP, and the contacts CC are connected to the bonding electrode $P_{l1}$ via the wirings m10, m11 of the wiring layers M10, M11. The bonding electrode $P_{l1}$ is connected to the bonding electrodes $P_{l2}(V_{CC})$, $P_{l2}(V_{SS})$. Thus, in the example of FIG. 65, the distances of the voltage supply lines $L_{P52}$, $L_{P54}$, $L_{P62}$, $L_{P64}$ are long, and the wiring resistances $R_{CC(52)}$, $R_{SS(52)}$, $R_{CC(62)}$, $R_{SS(62)}$ are large.

As described above, the wiring resistances increase according to the distances of the voltage supply lines $L_{P51}$, $L_{P52}$, $L_{P53}$, $L_{P54}$ between the external pad electrodes $P_X(V_{CC})$, $P_X(V_{SS})$ and the voltage generating circuit VG(11) and the source line driver circuit SDRV(1). The wiring resistances increase according to the distances of the voltage supply lines $L_{P61}$, $L_{P62}$, $L_{P63}$, $L_{P64}$ between the external pad electrodes $P_X(V_{CC})$, $P_X(V_{SS})$ and the voltage generating circuit VG(12) and the source line driver circuit SDRV(2). Accordingly, the power supply voltage $V_{CC}$ and the ground voltage $V_{SS}$ applied from the external pad electrodes $P_X(V_{CC})$, $P_X(V_{SS})$ to the voltage generating circuit VG(11) and the source line driver circuit SDRV(1) vary according to the wiring resistances. The power supply voltage $V_{CC}$ and the ground voltage $V_{SS}$ applied from the external pad electrodes $P_X(V_{CC})$, $P_X(V_{SS})$ to the voltage generating circuit VG(12) and the source line driver circuit SDRV(2) also vary according to the wiring resistances. According to the variation in the voltages applied to the voltage generating circuits VG and the source line driver circuits SDRV, the operation parameters in the read operation and the write operation are adjusted. The adjustment of the operation parameters is similar to that described in the tenth embodiment, and therefore the description thereof will be omitted.

Figure 66:
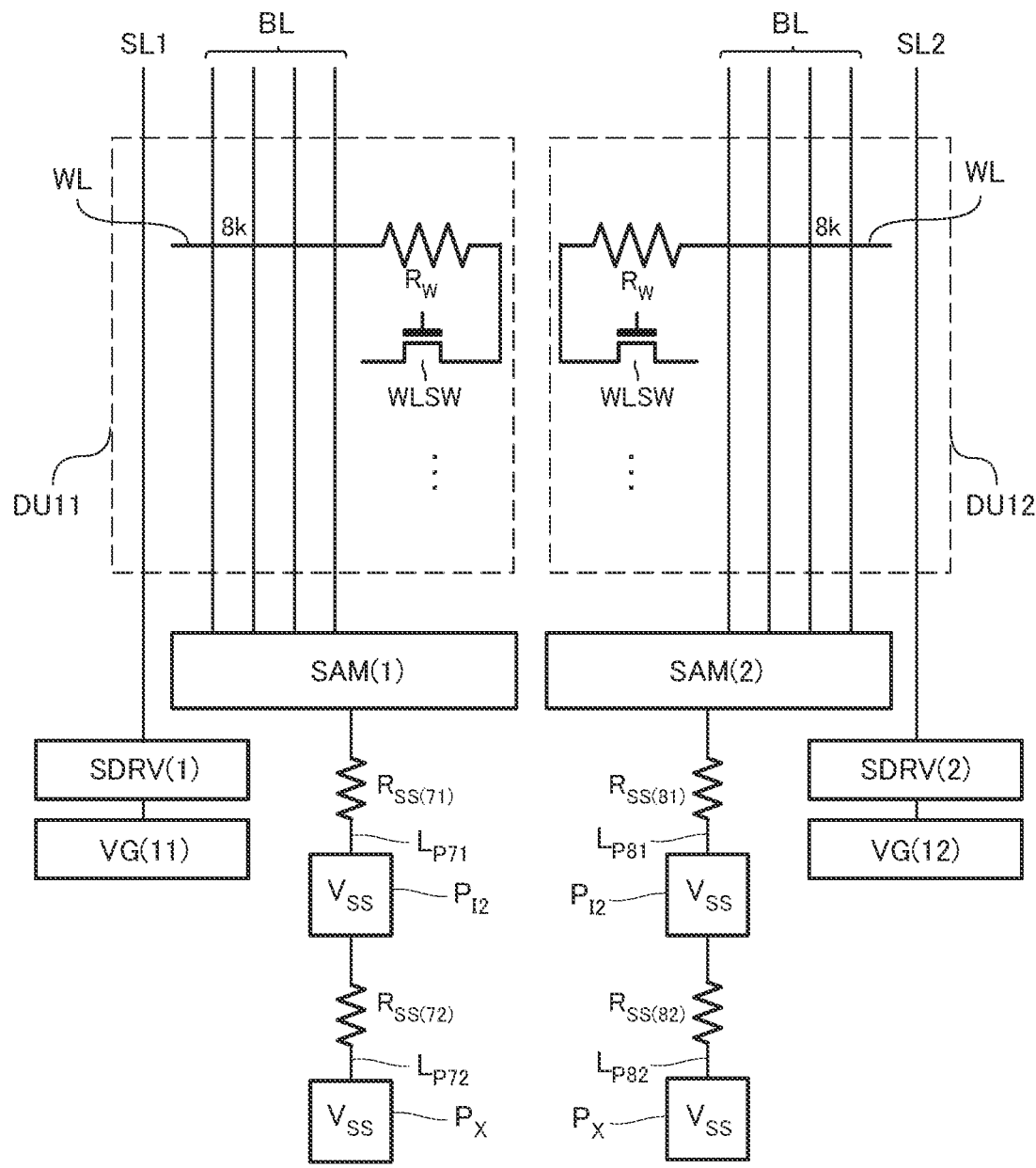
FIG. 66 is a schematic diagram illustrating a connection relation between the external pad electrodes $P_X(V_{SS})$, the bonding electrodes $P_{I2}(V_{SS})$, and the sense amplifier modules SAM.

FIG. 66 is a schematic diagram illustrating a connection relation between the external pad electrodes $P_X$ ($V_{SS}$), the bonding electrodes $P_{I2}$ ($V_{SS}$), and the sense amplifier modules SAM. FIG. 66 is a drawing corresponding to FIG. 44 and FIG. 60. Note that FIG. 66 omits the sequencer SQC.

As illustrated in FIG. 66, the bonding electrode $P_{I2}(V_{SS})$ disposed at the X-direction negative side of the memory plane MP is connected to the voltage supply line $L_{P71}$, and the voltage supply line $L_{P71}$ is connected to the sense amplifier module SAM(1). A wiring resistance of the voltage supply line $L_{P71}$ between the bonding electrode $P_{I2}(V_{SS})$ and the sense amplifier module SAM(1) is $R_{SS(71)}$. The bonding electrode $P_{I2}(V_{SS})$ disposed at the X-direction negative side of the memory plane MP is connected to the voltage supply line $L_{P72}$, and the voltage supply line $L_{P72}$ is connected to the external pad electrode $P_X(V_{SS})$. A wiring resistance of the voltage supply line $L_{P72}$ between the bonding electrode $P_{I2}(V_{SS})$ and the external pad electrode $P_X(V_{SS})$ is $R_{SS(72)}$. A wiring resistance of the voltage supply lines $L_{P71}$, $L_{P72}$ between the external pad electrodes $P_X(V_{SS})$ and the sense amplifier module SAM(1) is $R_{SS(71)}+R_{SS(72)}$.

As illustrated in FIG. 66, the bonding electrode $P_{I2}(V_{SS})$ disposed at the X-direction positive side of the memory plane MP is connected to the voltage supply line $L_{P81}$, and the voltage supply line $L_{P81}$ is connected to the sense amplifier module SAM(2). A wiring resistance of the voltage supply line $L_{P81}$ between the bonding electrode $P_{I2}(V_{SS})$ and the sense amplifier module SAM(2) is $R_{SS(81)}$. The bonding electrode $P_{I2}(V_{SS})$ disposed at the X-direction positive side of the memory plane MP is connected to the voltage supply line $L_{P82}$, and the voltage supply line $L_{P82}$ is connected to the external pad electrode $P_X(V_{SS})$. A wiring resistance of the voltage supply line $L_{P82}$ between the bonding electrode $P_{I2}(V_{SS})$ and the external pad electrode $P_X(V_{SS})$ is $R_{SS(82)}$. A wiring resistance of the voltage supply lines $L_{P81}$, $L_{P82}$ between the external pad electrodes $P_X(V_{SS})$ and the sense amplifier module SAM(2) is $R_{SS(81)}+R_{SS(82)}$.

Figure 67:
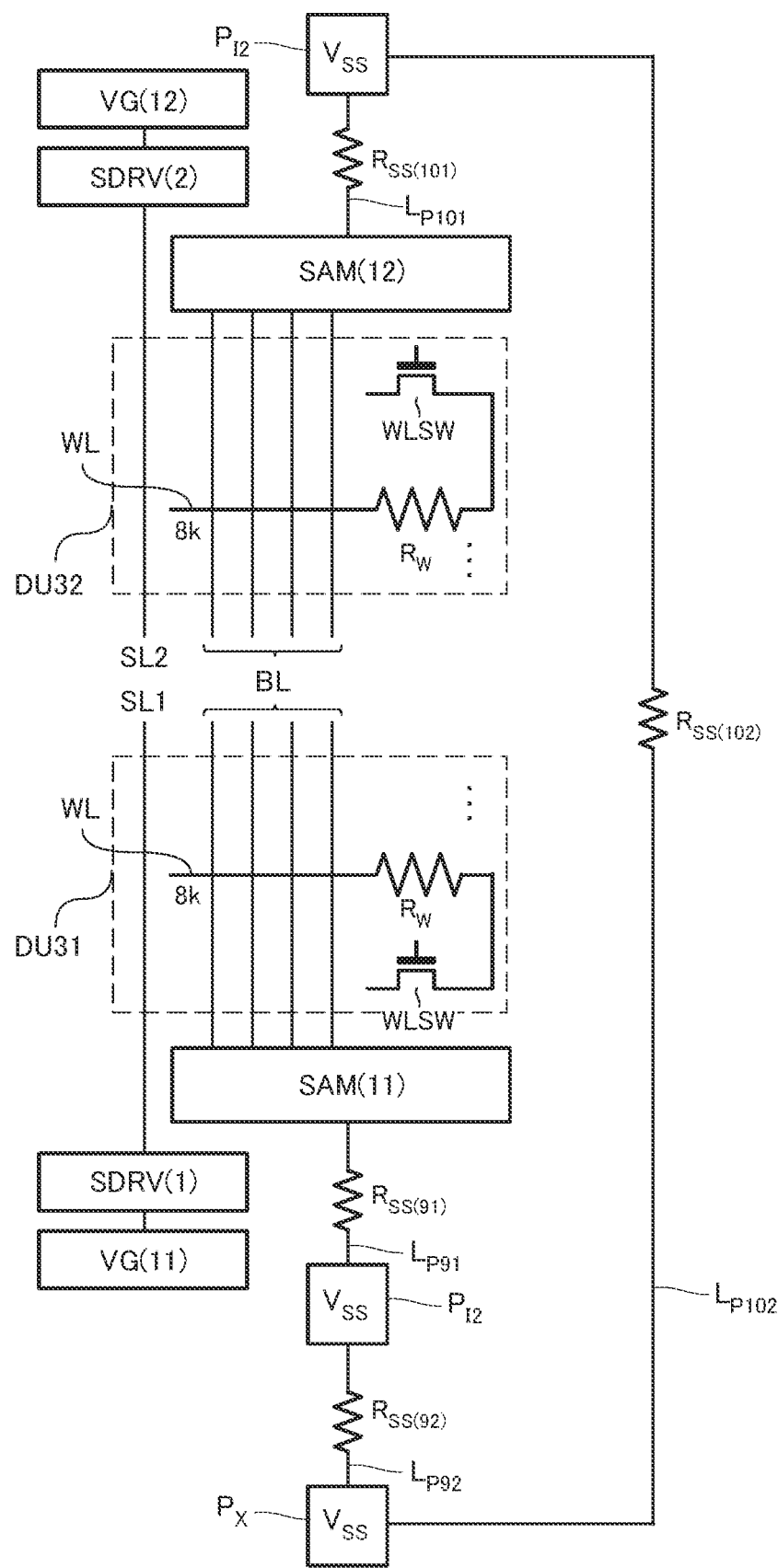
FIG. 67 is a schematic diagram illustrating a modification of a connection relation between the external pad electrode $P_X(V_{SS})$, the bonding electrodes $P_{I2}(V_{SS})$, and the sense amplifier modules SAM.

Note that in the description of the above-described embodiments, the divided ranges are configured by dividing the memory plane MP (for example, the memory hole region $R_{MH3}$) in the X-direction. For example, as described with reference to FIG. 37, the memory hole region $R_{MH3}$ is divided into the two regions $R_{MH3U}$ in the X-direction. However, like divided ranges DU31, DU32 illustrated in FIG. 67, the divided ranges may be configured by dividing the memory plane MP (for example, the memory hole region $R_{MH3}$) in the Y-direction. In FIG. 67, it is assumed that the sense amplifier module SAM(11) is disposed in the sense amplifier region $R_{SA}$ at the Y-direction negative side, and the sense amplifier module SAM(12) is disposed in the sense amplifier region $R_{SA}$ at the Y-direction positive side. In this case, the bonding electrode $P_{I2}(V_{SS})$ and the sense amplifier module SAM(11) disposed at the end portion at the Y-direction negative side are connected with a voltage supply line $L_{P91}$. A wiring resistance of the voltage supply line $L_{P91}$ is $R_{SS(91)}$. The bonding electrode $P_{I2}(V_{SS})$ and the sense amplifier module SAM(12) disposed at the end portion at the Y-direction positive side are connected with a voltage supply line $L_{P101}$. A wiring resistance of the voltage supply line $L_{P101}$ is $R_{SS(101)}$.

In this case, the external pad electrode $P_X(V_{SS})$ disposed at the end portion at the Y-direction negative side is connected to the bonding electrode $P_{I2}(V_{SS})$ disposed at the end portion at the Y-direction negative side with a voltage supply line $L_{P92}$. The voltage supply line $L_{P92}$ includes the contacts CC, the wirings m10, m11 of the wiring layers M10, M11, and the bonding electrode Pr. A wiring resistance of the voltage supply line $L_{P92}$ is $R_{SS(92)}$.

The external pad electrode $P_X(V_{SS})$ disposed at the end portion at the Y-direction negative side is connected to the bonding electrode $P_{I2}(V_{SS})$ disposed at the end portion at the Y-direction positive side with a voltage supply line $L_{P102}$. The voltage supply line $L_{P102}$ includes the wiring ma1 of the back side wiring layer MA, the contacts CC, the wirings m10, m11 of the wiring layers M10, M11, and the bonding electrode $P_{I1}$. Specifically, the external pad electrode $P_X(V_{SS})$ is connected to the wiring ma1 of the back side wiring layer MA, and the wiring ma1 extends from the end portion at the Y-direction negative side to the end portion at the Y-direction positive side of the memory plane MP. The wiring ma1 and the contacts CC are connected at the end portion at the Y-direction positive side of the memory plane MP, and the contacts CC are connected to the bonding electrode $P_{I1}$ via the wirings m10, m11 of the wiring layers M10, M11. The bonding electrode $P_{I1}$ is connected to the bonding electrode $P_{I2}(V_{SS})$. A wiring resistance of the voltage supply line $L_{P102}$ is $R_{SS(102)}$. The wiring resistance $R_{SS(102)}$ of the voltage supply line $L_{P102}$ is larger than the wiring resistance $R_{SS(92)}$ of the voltage supply line $L_{P92}$.

As described above, the wiring resistances increase according to the distances of the voltage supply lines $L_{P71}$, $L_{P72}$ between the external pad electrode $P_X(V_{SS})$ and the sense amplifier module SAM(1). The wiring resistances increase according to the distances of the voltage supply lines $L_{P81}$, $L_{P82}$ between the external pad electrodes $P_X(V_{SS})$ and the sense amplifier module SAM(2). Thus, the ground voltages $V_{SS}$ applied from the external pad electrodes $P_X(V_{SS})$ to the sense amplifier modules SAM(1), SAM(2) vary according to the wiring resistances. According to the variation in the voltages applied to the sense amplifier modules SAM(1), SAM(2), the operation parameters in the read operation and the write operation are adjusted. The adjustment of the operation parameters is similar to that described in the tenth embodiment, and therefore the description thereof will be omitted. The same applies to the configuration of FIG. 67.

Note that in FIG. 64 to FIG. 66, one external pad electrode $P_X$ and one bonding electrode $P_{I2}$ are connected with the voltage supply line $L_P$. However, the voltage supply line $L_P$ connected to one external pad electrode $P_X$ may be branched and connected to the two bonding electrodes $P_{I2}$.

Twelfth Embodiment

Figure 68:
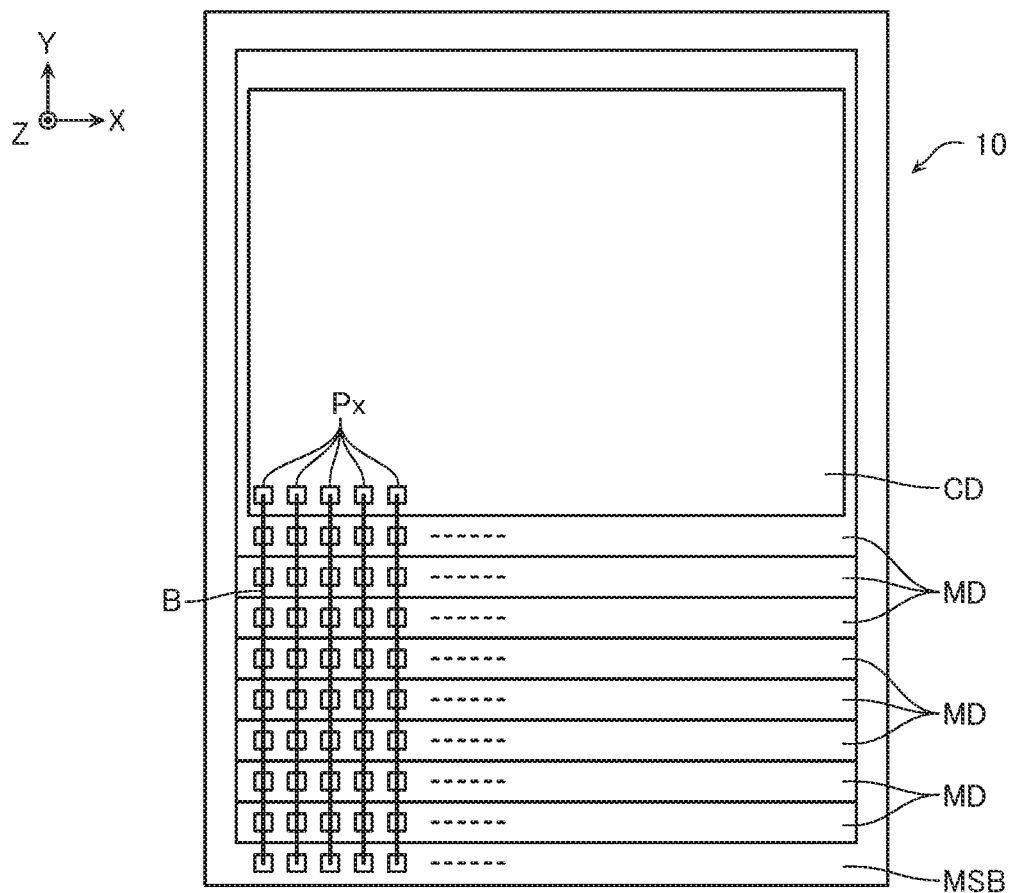
FIG. 68 is a schematic plan view illustrating an example of a configuration of the memory system 10 according to a twelfth embodiment.

FIG. 68 is a schematic plan view illustrating an example of a configuration of the memory system 10 according to the twelfth embodiment. Note that the configuration of the memory system 10 illustrated in FIG. 68 is applicable to the memory systems 10 according to the first embodiment to the eleventh embodiment.

As illustrated in FIG. 68, the memory system 10 according to this embodiment includes a mounting substrate MSB, the plurality of memory dies MD stacked on the mounting substrate MSB, and the controller die CD stacked on the memory die MD. On an upper surface of the mounting substrate MSB, the external pad electrodes $P_X$ are disposed in a region at the end portion in the Y-direction, and a part of the other region is bonded to a lower surface of the memory die MD via an adhesive and the like. On an upper surface of the memory die MD, the external pad electrodes $P_X$ are disposed in a region at the end portion in the Y-direction, and the other region is bonded to a lower surface of another memory die MD or the controller die CD via the adhesive and the like. On an upper surface of the controller die CD, the external pad electrodes $P_X$ are disposed in a region at the end portion in the Y-direction.

As illustrated in FIG. 68, the mounting substrate MSB, the plurality of memory dies MD, and the controller die CD each include a plurality of the external pad electrodes $P_X$ arranged in the X-direction. The plurality of external pad electrodes $P_X$ disposed on each of the mounting substrate MSB, the plurality of memory dies MD, and the controller die CD are mutually connected via bonding wires B.

The power supply voltage $V_{CC}$ or the ground voltage $V_{SS}$ is connected to some of the plurality of external pad electrodes $P_X$. The external pad electrode $P_X$ to which the power supply voltage $V_{CC}$ is connected is the external pad electrode $P_X(V_{CC})$, and the external pad electrode $P_X$ to which the ground voltage $V_{SS}$ is connected is the external pad electrode $P_X(V_{SS})$. Note that the pad electrode P in FIG. 5 corresponds to the external pad electrode $P_X$ in FIG. 68.

Note that the configuration illustrated in FIG. 68 is merely an example, and the specific configuration is appropriately adjustable. For example, in the example illustrated in FIG. 68, the controller die CD is stacked on the plurality of memory dies MD, and these configurations are connected with the bonding wires B. In such a configuration, the plurality of memory dies MD and the controller die CD are included in one package. However, the controller die CD may be included in a package different from the memory dies MD. Additionally, the plurality of memory dies MD and the controller die CD may be connected to one another via through electrodes or the like, not the bonding wires B.

Figure 69:
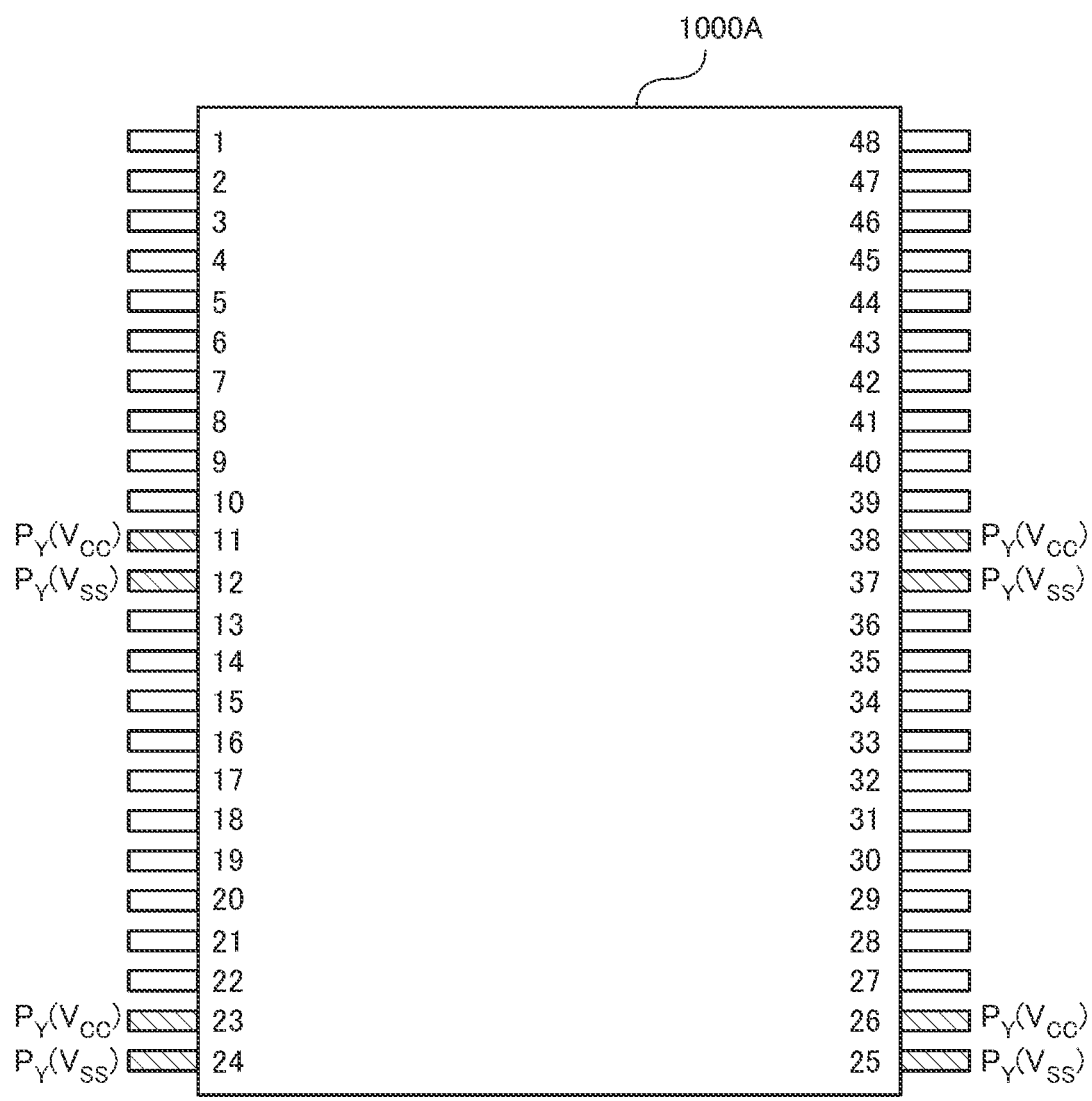
FIG. 69 is a schematic plan view illustrating an example of a configuration of a package 1000A according to the twelfth embodiment.

FIG. 69 is a schematic plan view illustrating an example of a configuration of a package 1000A according to the twelfth embodiment. The package 1000A illustrated in FIG. 69 is a Ball Grid Array (BGA) type package. On a printed circuit board of the package 1000A, the memory system 10, which has been described with reference to FIG. 1 and FIG. 68, is mounted. As illustrated in FIG. 69, a plurality of terminals (pins) are disposed at end portions at the negative side and the X-direction positive side of the package 1000A (printed circuit board). In the example of FIG. 69, 24 terminals are disposed at the end portion at the X-direction negative side of the package 1000A, and 24 terminals are disposed at the end portion at the X-direction positive side of the package 1000A.

For example, the 11-th, 23-th, 26-th, and 38-th terminals are power supply terminal $P_Y(V_{CC})$ connected to the power supply voltages $V_{CC}$. These power supply terminals $P_Y(V_{CC})$ are connected to the external pad electrodes $P_X(V_{CC})$ of the memory die MD via, for example, wirings of the printed circuit board and the bonding wires B. The 12-th, 24-th, 25-th, and 37-th terminals are power supply terminals $P_Y(V_{SS})$ connected to the ground voltages $V_{SS}$. These power supply terminals $P_Y(V_{SS})$ are connected to the external pad electrodes $P_X(V_{SS})$ of the memory die MD via, for example, the wirings of the printed circuit board and the bonding wires B.

Figure 70:
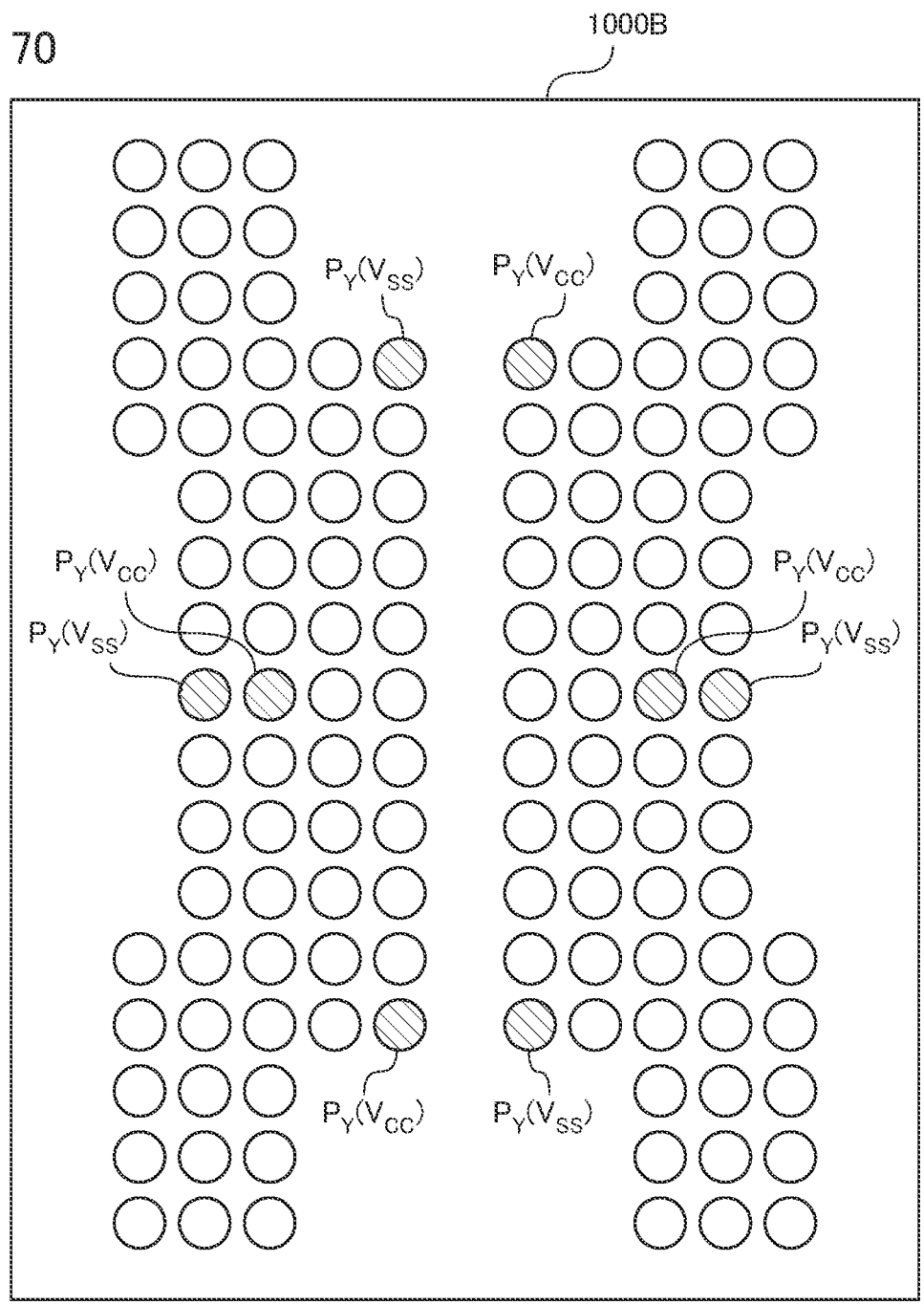
FIG. 70 is a schematic plan view illustrating an example of a configuration of a package 1000B according to the twelfth embodiment.

FIG. 70 is a schematic plan view illustrating an example of a configuration of a package 1000B according to the twelfth embodiment. The package 1000B may be used instead of the package 1000A illustrated in FIG. 69. Note that FIG. 70 illustrates the back surface of the printed circuit board of the package 1000B. While the package 1000A illustrated in FIG. 69 is the Ball Grid Array (BGA) type package, the package 1000B illustrated in FIG. 70 is a Thin Small Outline Package (TSOP) type package. On the surface of the printed circuit board of the package 1000B, the memory system 10, which has been described with reference to FIG. 1 and FIG. 68, is mounted. As illustrated in FIG. 70, a plurality of terminals (balls) are disposed on the back surface of the printed circuit board of the package 1000B.

For example, the four terminals among the plurality of terminals (balls) are the power supply terminals $P_Y(V_{CC})$ connected to the power supply voltages $V_{CC}$. These power supply terminals $P_Y(V_{CC})$ are connected to the external pad electrodes $P_X(V_{CC})$ of the memory die MD via, for example, the wirings of the printed circuit board and the bonding wires B. The four terminals among the plurality of terminals (balls) are the power supply terminals $P_Y(V_{SS})$ connected to the ground voltages $V_{SS}$. These power supply terminals $P_Y(V_{SS})$ are connected to the external pad electrodes $P_X(V_{SS})$ of the memory die MD via, for example, the wirings of the printed circuit board and the bonding wires B.

When a wiring resistance of, for example, the bonding wire B that connects the power supply terminal $P_Y(V_{CC})$ and the external pad electrode $P_X(V_{CC})$ is $R_{BCC}$ and a wiring resistance of, for example, the bonding wire B that connects the power supply terminal $P_Y(V_{SS})$ and the external pad electrode $P_X(V_{SS})$ is $R_{BSS}$ (see FIG. 71 and FIG. 72), the wiring resistance $R_{BCC}$ and the wiring resistance $R_{BSS}$ regarding the memory die MD close to the mounting substrate MSB generate differences from the wiring resistance $R_{BCC}$ and the wiring resistance $R_{BSS}$ regarding the memory die MD far from the mounting substrate MSB in some cases. In this case, the power supply voltage $V_{CC}$ and the ground voltage $V_{SS}$ applied to the voltage generating circuit VG and the driver circuit and the like (the CG driver circuit DRV, the source line driver circuit SDRV, and the sense amplifier module SAM) vary. In this case as well, according to the variation in the voltages applied to the voltage generating circuits VG and the driver circuits and the like, the operation parameters in the read operation and the write operation are adjusted. The adjustment of the operation parameters is similar to that described in the tenth embodiment, and therefore the description thereof will be omitted.

Figure 71:
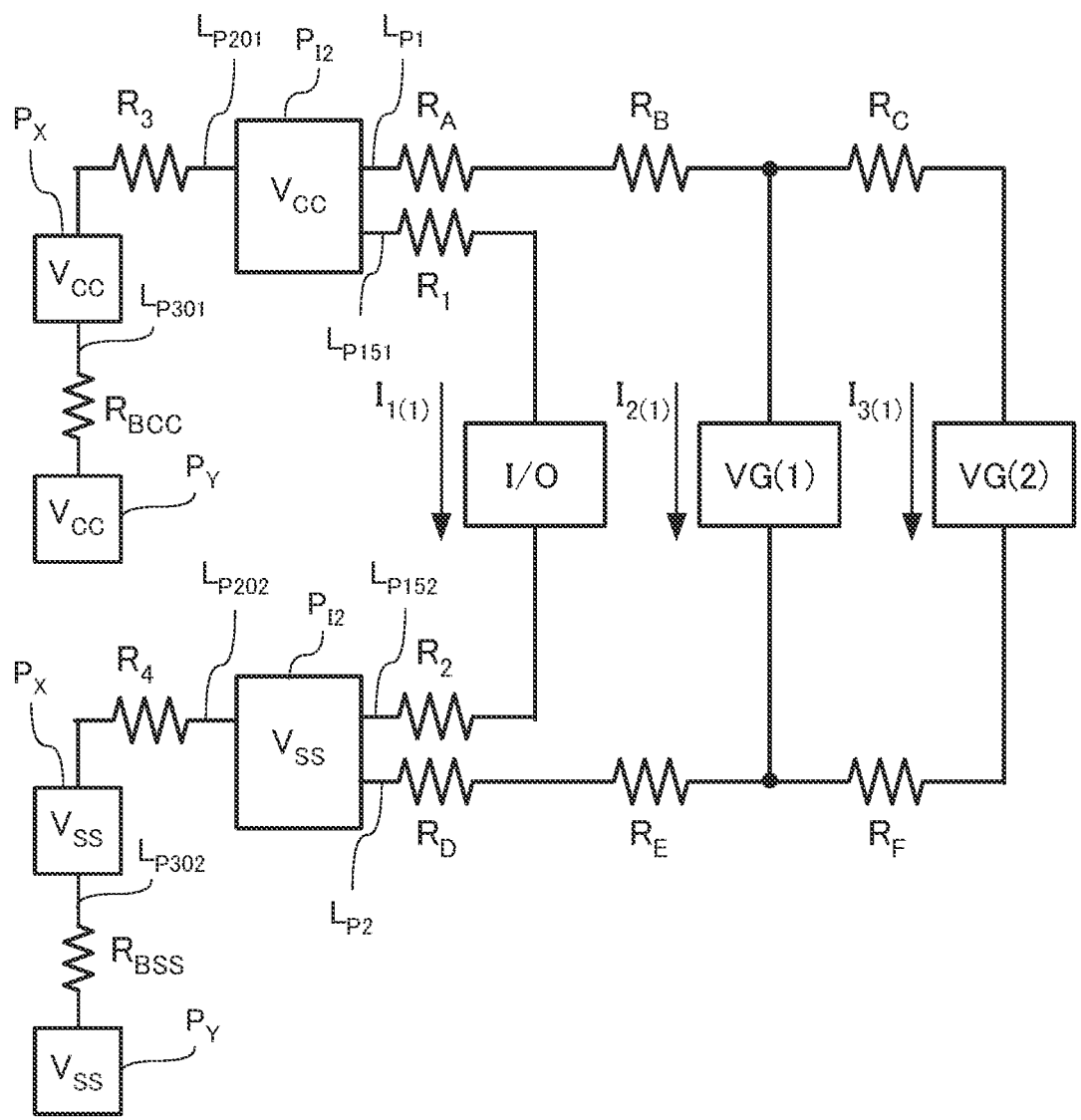
FIG. 71 is a schematic circuit diagram illustrating configurations of power supply terminals $P_Y(V_{CC})$, $P_Y(V_{SS})$, the external pad electrodes $P_X(V_{CC})$, $P_X(V_{SS})$, the bonding electrodes $P_{I2}(V_{CC})$, $P_{I2}(V_{SS})$, the input/output control circuit I/O, and the voltage generating circuits VG.

FIG. 71 is a schematic circuit diagram illustrating configurations of the power supply terminals $P_Y(V_{CC})$, $P_Y(V_{SS})$, the external pad electrodes $P_X(V_{CC})$, $P_X(V_{SS})$, the bonding electrodes $P_{I2}(V_{CC})$, $P_{I2}(V_{SS})$, the input/output control circuit I/O, and the voltage generating circuits VG. Note that FIG. 71 is a drawing corresponding to FIG. 61. In FIG. 71, the bonding electrodes $P_{I2}$ ($V_{CC}$), $P_{I2}$ ($V_{SS}$), the voltage generating circuits VG(1), VG(2), the voltage supply lines $L_{P1}$, $L_{P2}$, and the wiring resistances $R_A$, $R_B$, $R_C$, $R_D$, $R_E$, $R_F$ are similar to the configurations described with reference to FIG. 61 and FIG. 62, and therefore overlapping description will be omitted.

As illustrated in FIG. 71, the input/output control circuit I/O and the voltage generating circuits VG(1), VG(2) are connected to the bonding electrodes $P_{I2}(V_{CC})$, $P_{I2}(V_{SS})$ via different voltage supply lines $L_{P151}$, $L_{P152}$, $L_{P1}$, $L_{P2}$. That is, the input/output control circuit I/O is connected between the bonding electrodes $P_{I2}(V_{CC})$, $P_{I2}(V_{SS})$ via the voltage supply lines $L_{P151}$, $L_{P152}$. The voltage generating circuits VG(1), VG(2) are connected between the bonding electrodes $P_{I2}(V_{CC})$, $P_{I2}(V_{SS})$ via the voltage supply lines $L_{P1}$, $L_{P2}$.

A wiring resistance between the bonding electrode $P_{I2}$ ($V_{CC}$) and the input/output control circuit I/O is $R_1$. A wiring resistance between the bonding electrode $P_{I2}(V_{SS})$ and the input/output control circuit I/O is $R_2$. As illustrated in FIG.

57, the bonding electrodes $P_{I2}(V_{CC})$, $P_{I2}(V_{SS})$ connected to the input/output control circuit I/O are the bonding electrodes $P_{I2}(V_{CC})$, $P_{I2}(V_{SS})$ disposed at positions overlapping with the input/output control circuit I/O viewed from the Z-direction. That is, as illustrated in FIG. 57, the bonding electrodes $P_{I2}(V_{CC})$, $P_{I2}(V_{SS})$ connected to the input/output control circuit I/O are the third bonding electrodes $P_{I2}$ ($V_{CC}$), $P_{I2}$ ($V_{SS}$) counted from the X-direction negative side.

The bonding electrodes $P_{I2}(V_{CC})$, $P_{I2}(V_{SS})$ are connected to the external pad electrodes $P_X$ ($V_{CC}$), $P_X$ ($V_{SS}$) via voltage supply lines $L_{P201}$, $L_{P202}$, respectively. A wiring resistance between the bonding electrode $P_{I2}(V_{CC})$ and the external pad electrode $P_X(V_{CC})$ is $R_3$. A wiring resistance between the bonding electrode $P_{I2}(V_{SS})$ and the external pad electrode $P_X$ ($V_{SS}$) is $R_4$. The external pad electrodes $P_X$ ($V_{CC}$), $P_X$ ($V_{SS}$) are connected to the power supply terminals $P_Y$ ($V_{CC}$), $P_Y$ ($V_{SS}$) via voltage supply lines $L_{P301}$, $L_{P302}$, respectively. A wiring resistance between the external pad electrode $P_X(V_{CC})$ and the power supply terminal $P_Y$ ($V_{CC}$) is $R_{BCC}$. A wiring resistance between the external pad electrode $P_X(V_{SS})$ and the power supply terminal $P_Y$ ($V_{SS}$) is $R_{BSS}$.

Figure 72:
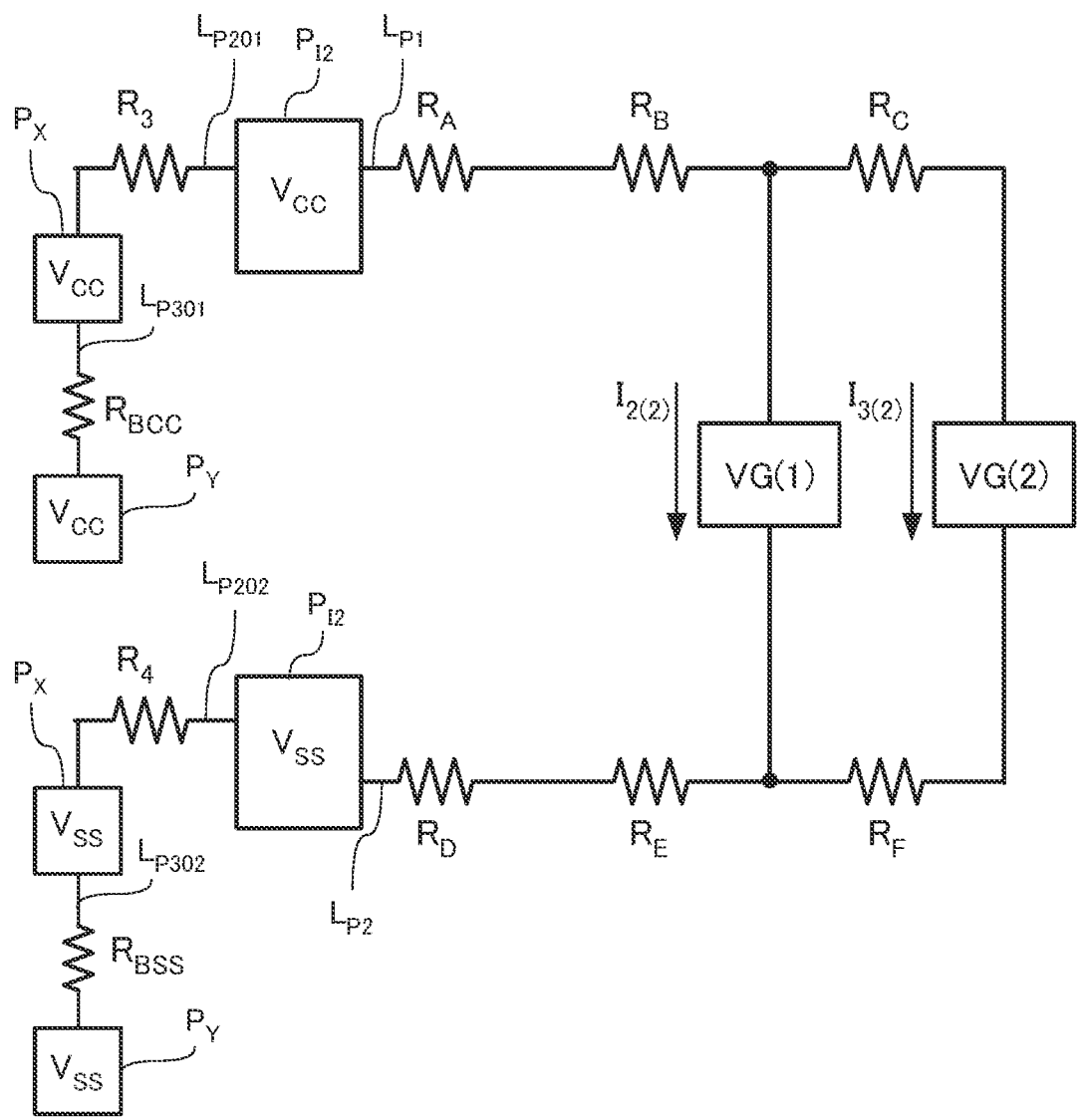
FIG. 72 is a schematic circuit diagram illustrating configurations of power supply terminals $P_Y(V_{CC})$, $P_Y(V_{SS})$, the external pad electrodes $P_X(V_{CC})$, $P_X(V_{SS})$, the bonding electrodes $P_{I2}(V_{CC})$, $P_{I2}(V_{SS})$, and the voltage generating circuits VG.

FIG. 72 is a schematic circuit diagram illustrating configurations of the power supply terminals $P_Y(V_{CC})$, $P_Y(V_{SS})$, the external pad electrodes $P_X$ ($V_{CC}$), $P_X$ ($V_{SS}$), the bonding electrodes $P_{I2}$ ($V_{CC}$), $P_{I2}$ ($V_{SS}$), and the voltage generating circuits VG. Note that FIG. 72 is a drawing corresponding to FIG. 62. As illustrated in FIG. 72, the input/output control circuit I/O is not disposed between the bonding electrodes $P_{I2}$ ($V_{CC}$), $P_{I2}$ ($V_{SS}$). The bonding electrodes $P_{I2}(V_{CC})$, $P_{I2}(V_{SS})$ in FIG. 72 are the bonding electrodes $P_{I2}(V_{CC})$, $P_{I2}(V_{SS})$ disposed at positions not overlapping with the input/output control circuit I/O viewed from the Z-direction as illustrated in FIG. 57. That is, the bonding electrodes $P_{I2}(V_{CC})$, $P_{I2}(V_{SS})$ in FIG. 72 are the first, second, or fourth bonding electrodes $P_{I2}$ ($V_{CC}$), $P_{I2}$ ($V_{SS}$) counted from the X-direction negative side as illustrated in FIG. 57. Since the other configurations in FIG. 72 are similar to the configurations described in FIG. 71, the overlapping explanation will be omitted.

As illustrated in FIG. 71, the voltage supply lines $L_{P151}$, $L_{P152}$ that connect the bonding electrodes $P_{I2}(V_{CC})$, $P_{I2}$ ($V_{SS}$) and the input/output control circuit I/O are separated from the voltage supply lines $L_{P1}$, $L_{P2}$ that connect the bonding electrodes $P_{I2}(V_{CC})$, $P_{I2}(V_{SS})$ and the voltage generating circuits VG(1), VG(2). Therefore, by operating the input/output control circuit I/O, even when the amounts of current of the voltage supply lines $L_{P151}$, $L_{P152}$ vary, the amounts of current of the voltage supply line $L_{P1}$, $L_{P2}$ are less likely to vary.

However, as illustrated in FIG. 71, the voltage supply lines $L_{P201}$, $L_{P301}$ that connect the bonding electrode $P_{I2}$ ($V_{CC}$) and the power supply terminal $P_Y$ ($V_{CC}$) are not separated from the input/output control circuit I/O and the voltage generating circuits VG(1), VG(2). Similarly, the voltage supply lines $L_{P202}$, $L_{P302}$ that connect the bonding electrode $P_{I2}(V_{SS})$ and the power supply terminal $P_Y(V_{SS})$ are not separated from the input/output control circuit I/O and the voltage generating circuits VG(1), VG(2). Therefore, by operating the input/output control circuit I/O, the amounts of current of the voltage supply lines $L_{P201}$, $L_{P301}$, $L_{P202}$, $L_{P302}$ illustrated in FIG. 71 are larger than the amounts of current of the voltage supply lines $L_{P201}$, $L_{P301}$, $L_{P202}$, $L_{P302}$ illustrated in FIG. 72. Accordingly, the voltage of the bonding electrode $P_{I2}(V_{CC})$ illustrated in FIG. 71 is lower than the voltage of the bonding electrode $P_{I2}(V_{CC})$ illustrated in FIG. 72. The voltage of the bonding electrode $P_{I2}(V_{SS})$ illustrated in FIG. 71 increases more than the voltage of the bonding electrode $P_{I2}(V_{SS})$ illustrated in FIG. 72.

Thus, by operating the input/output control circuit I/O, the voltages of the bonding electrodes $P_{I2}(V_{CC})$, $P_{I2}(V_{SS})$ to which the input/output control circuit I/O is connected vary. According to the variation in the voltage, the operation parameters in the read operation and the write operation are adjusted. The adjustment of the operation parameters is similar to that described in the tenth embodiment, and therefore the description thereof will be omitted.

Thirteenth Embodiment

Figure 73:
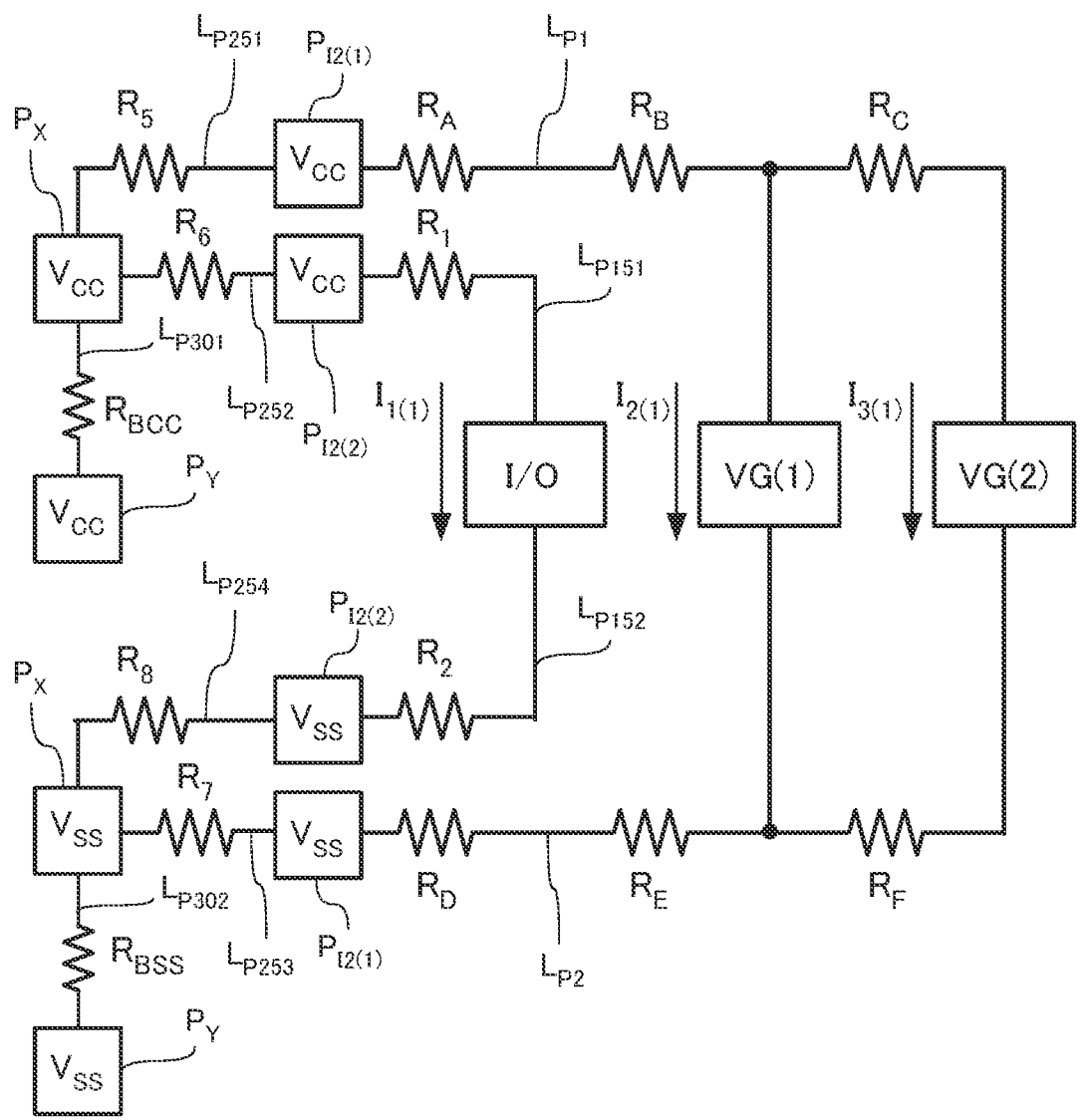
FIG. 73 is a schematic circuit diagram illustrating configurations of the power supply terminals $P_Y(V_{CC})$, $P_Y(V_{SS})$, the external pad electrodes $P_X(V_{CC})$, $P_X(V_{SS})$, the bonding electrodes $P_{I2}(V_{CC})$, $P_{I2}(V_{SS})$, the input/output control circuit I/O, and the voltage generating circuits VG.

FIG. 73 is a schematic circuit diagram illustrating configurations of the power supply terminals $P_Y(V_{CC})$, $P_Y$ ($V_{SS}$), the external pad electrodes $P_X$ ($V_{CC}$), $P_X$ ($V_{SS}$), the bonding electrodes $P_{I2}(V_{CC})$, $P_{I2}(V_{SS})$, the input/output control circuit I/O, and the voltage generating circuits VG. Note that FIG. 73 is a drawing corresponding to FIG. 61 and FIG. 71. In FIG. 73, the voltage generating circuits VG(1), VG(2), the voltage supply lines $L_{P1}$, $L_{P2}$, and the wiring resistances $R_A$, $R_B$, $R_C$, $R_D$, $R_E$, $R_F$ are similar to the configurations described with reference to FIG. 61 and FIG. 62, and therefore overlapping description will be omitted. In FIG. 73, the voltage supply lines $L_{P151}$, $L_{P152}$, the wiring resistances $R_1$, $R_2$, the external pad electrodes $P_X$ ($V_{CC}$), $P_X$ ($V_{SS}$), the power supply terminals $P_Y$ ($V_{CC}$), $P_Y$ ($V_{SS}$), the voltage supply lines $L_{P301}$, $L_{P302}$, and the wiring resistances $R_{BCC}$, $R_{BSS}$ are similar to the configurations described with reference to FIG. 71 and FIG. 72, and therefore overlapping description will be omitted.

As illustrated in FIG. 73, the input/output control circuit I/O and the voltage generating circuits VG(1), VG(2) are connected to the external pad electrodes $P_X(V_{CC})$, $P_X(V_{SS})$ via different paths. That is, the input/output control circuit I/O is connected between the bonding electrode $P_{I2(2)}$ ($V_{CC}$), $P_{I2(2)}$ ($V_{SS}$) via the voltage supply lines $L_{P151}$, $L_{P152}$. The bonding electrode $P_{I2(2)}$ ($V_{CC}$) is connected to the external pad electrode $P_X(V_{CC})$ via a voltage supply line $L_{P252}$, and the bonding electrode $P_{I2(2)}$ ($V_{SS}$) is connected to the external pad electrode $P_X(V_{SS})$ via a voltage supply line $L_{P254}$. The voltage generating circuits VG(1), VG(2) are connected between the bonding electrodes $P_{I2(1)}$ ($V_{CC}$), $P_{I2(1)}$ ($V_{SS}$) via the voltage supply lines $L_{P1}$, $L_{P2}$. The bonding electrode $P_{I2(1)}$ ($V_{CC}$) is connected to the external pad electrode $P_X(V_{CC})$ via a voltage supply line $L_{P251}$, and the bonding electrode $P_{I2(1)}$ ($V_{SS}$) is connected to the external pad electrode $P_X(V_{SS})$ via a voltage supply line $L_{P253}$.

The path (the voltage supply lines $L_{P1}$, $L_{P2}$, the bonding electrodes $P_{I2(1)}$ ($V_{CC}$), $P_{I2(1)}$ ($V_{SS}$), and the voltage supply lines $L_{P251}$, $L_{P253}$) that connects the voltage generating circuits VG(1), VG(2) and the external pad electrodes $P_X(V_{CC})$, $P_X(V_{SS})$ is referred to as a first path in some cases. A path (the voltage supply lines $L_{P151}$, $L_{P152}$, the bonding electrodes $P_{I2(2)}$ ($V_{CC}$), $P_{I2(2)}$ ($V_{SS}$), and the voltage supply lines $L_{P252}$, $L_{P254}$) that connects the input/output control circuit I/O and the external pad electrodes $P_X(V_{CC})$, $P_X(V_{SS})$ is referred to as a second path in some cases. Thus, starting from the external pad electrodes $P_X(V_{CC})$, $P_X(V_{SS})$, the first path connected to the voltage generating circuits VG(1), VG(2) and the second path connected to the input/output control circuit I/O are separated.

A wiring resistance between the bonding electrode $P_{I2(1)}$ ($V_{CC}$) and the external pad electrode $P_X(V_{CC})$ is $R_5$. A wiring resistance between the bonding electrode $P_{I2(2)}$ ($V_{CC}$) and the external pad electrode $P_X(V_{CC})$ is $R_6$. A wiring resistance between the bonding electrode $P_{I2(1)}$ ($V_{SS}$) and the external pad electrode $P_X(V_{SS})$ is $R_7$. A wiring resistance between the bonding electrode $P_{I2(2)}$ ($V_{SS}$) and the external pad electrode $P_X$ ($V_{SS}$) is $R_8$.

Note that the bonding electrodes $P_{I2(1)}$ ($V_{CC}$), $P_{I2(2)}$ ($V_{CC}$) in FIG. 73 are equivalent to the bonding electrodes formed by dividing the bonding electrode $P_{I2}(V_{CC})$ in FIG. 57 into two. The bonding electrodes $P_{I2(1)}$ ($V_{SS}$), $P_{I2(2)}$ ($V_{SS}$) in FIG. 73 are equivalent to the bonding electrodes formed by dividing the bonding electrode $P_{I2}(V_{SS})$ in FIG. 57 into two.

FIG. 74 is a schematic circuit diagram illustrating configurations of the power supply terminals $P_Y(V_{CC})$, $P_Y(V_{SS})$, the external pad electrodes $P_X$ ($V_{CC}$), $P_X$ ($V_{SS}$), the bonding electrodes $P_{I2}$ ($V_{CC}$), $P_{I2}$ ($V_{SS}$), and the voltage generating circuits VG. Note that FIG. 74 is a drawing corresponding to FIG. 62 and FIG. 72. As illustrated in FIG. 74, neither the input/output control circuit I/O nor the second path is disposed between the external pad electrodes $P_X(V_{CC})$, $P_X(V_{SS})$. Since the other configurations in FIG. 74 are similar to the configurations described in FIG. 73, the overlapping explanation will be omitted.

As illustrated in FIG. 73, the first path that connects the external pad electrodes $P_X(V_{CC})$, $P_X(V_{SS})$ and the voltage generating circuits VG(1), VG(2) is separated from the second path that connects the external pad electrodes $P_X$ ($V_{CC}$), $P_X$ ($V_{SS}$) and the input/output control circuit I/O. Therefore, by operating the input/output control circuit I/O, even when the amount of current of the second path varies, the amount of current of the first path is less likely to vary.

However, as illustrated in FIG. 73, the voltage supply line $L_{P301}$ that connects the external pad electrode $P_X$ ($V_{CC}$) and the power supply terminal $P_Y(V_{CC})$ is not separated from the input/output control circuit I/O and the voltage generating circuits VG(1), VG(2). Similarly, the voltage supply line $L_{P302}$ that connects the external pad electrode $P_X$ ($V_{SS}$) and the power supply terminal $P_Y(V_{SS})$ is not separated from the input/output control circuit I/O and the voltage generating circuits VG(1), VG(2). Therefore, by operating the input/output control circuit I/O, the amounts of current of the voltage supply lines $L_{P301}$, $L_{P302}$ illustrated in FIG. 73 are larger than the amounts of current of the voltage supply lines $L_{P301}$, $L_{P302}$ illustrated in FIG. 74. Accordingly, the voltage of the external pad electrode $P_X(V_{CC})$ illustrated in FIG. 73 is lower than the voltage of the external pad electrode $P_X(V_{CC})$ illustrated in FIG. 74. The voltage of the external pad electrode $P_X(V_{SS})$ illustrated in FIG. 73 increases more than the voltage of the external pad electrode $P_X(V_{SS})$ illustrated in FIG. 74.

Thus, by operating the input/output control circuit I/O, the voltages of the external pad electrodes $P_X(V_{CC})$, $P_X(V_{SS})$ to which the input/output control circuit I/O is connected vary. According to the variation in the voltage, the operation parameters in the read operation and the write operation are adjusted. The adjustment of the operation parameters is similar to that described in the tenth embodiment, and therefore the description thereof will be omitted.

This specification discloses the following inventions.

A semiconductor memory device comprising:
a substrate;
a conductive layer spaced from the substrate in a first direction intersecting with a surface of the substrate, extending in a second direction intersecting with the first direction, and including a first range and a second range arranged in the second direction;
a first semiconductor layer extending in the first direction and opposed to the conductive layer in the first range;
a second semiconductor layer extending in the first direction and opposed to the conductive layer in the second range;
a first electric charge accumulating portion disposed between the conductive layer and the first semiconductor layer;
a second electric charge accumulating portion disposed between the conductive layer and the second semiconductor layer;
a first bit line electrically connected to one end of the first semiconductor layer;
a second bit line electrically connected to one end of the second semiconductor layer; and a driver circuit that controls a voltage applied to the conductive layer, wherein
when:
a magnitude and a supply time of one or a plurality of voltages applied to the first bit line, a stabilization wait time until sensing start of the first bit line, and a sense time of the first bit line when a predetermined operation is performed on a first memory cell including the first electric charge accumulating portion are assumed to be first operation parameters, and
a magnitude and a supply time of one or a plurality of voltages applied to the second bit line, a stabilization wait time until sensing start of the second bit line, and a sense time of the second bit line when the predetermined operation is performed on a second memory cell including the second electric charge accumulating portion are assumed to be second operation parameters,
at least a part of the second operation parameters differs from at least a part of the first operation parameters.

The semiconductor memory device comprising:
a first wiring connecting between the first range and a first circuit; and
a second wiring connecting between the second range and a second circuit, wherein
the first wiring has a resistance larger than a resistance of the second wiring, and
at least one of the magnitude or the supply time of the one or the plurality of voltages applied to the first bit line when the predetermined operation is performed on the first memory cell is larger than at least one of the magnitude or the supply time of the one or the plurality of voltages applied to the second bit line when the predetermined operation is performed on the second memory cell.

The semiconductor memory device comprising:
a first wiring connecting between the first range and a first circuit; and
a second wiring connecting between the second range and a second circuit, wherein
the first wiring has a resistance larger than a resistance of the second wiring, and
the stabilization wait time until the sensing start of the first bit line when the predetermined operation is performed on the first memory cell is longer than the stabilization wait time until the sensing start of the second bit line when the predetermined operation is performed on the second memory cell.

The semiconductor memory device comprising:
a first wiring connecting between the first range and a first circuit; and
a second wiring connecting between the second range and a second circuit, wherein the first wiring has a resistance larger than a resistance of the second wiring, and the sense time of the first bit line when the predetermined operation is performed on the first memory cell is shorter than the sense time of the second bit line when the predetermined operation is performed on the second memory cell.

The semiconductor memory device comprising:
a first source line electrically connected to the other end of the first semiconductor layer;
a second source line electrically connected to the other end of the second semiconductor layer;
a first wiring connecting between the first range and a first circuit; and
a second wiring connecting between the second range and a second circuit, wherein
the first wiring has a resistance larger than a resistance of the second wiring, and
at least one of a magnitude or a supply time of a voltage applied to the first source line when the predetermined operation is performed on the first memory cell is larger than at least one of a magnitude or a supply time of a voltage applied to the second source line when the predetermined operation is performed on the second memory cell.

The semiconductor memory device comprising:
a contact connected to the conductive layer;
a third range disposed between the first range and the contact; and
a fourth range disposed between the second range and the contact, wherein
the third range is longer in length or shorter in width than the fourth range.

Moreover, this specification discloses the following inventions.

A semiconductor memory device comprising:
a plurality of first conductive layers arranged in a first direction and extending in a second direction intersecting with the first direction;
a plurality of second conductive layers arranged in the first direction and extending in the second direction, and the plurality of first conductive layers and the plurality of second conductive layers arranged in the second direction or a third direction intersecting with the first direction and the second direction;
a first semiconductor layer extending in the first direction and opposed to the first conductive layers;
a second semiconductor layer extending in the first direction and opposed to the second conductive layers;
a first electric charge accumulating portion disposed between the first conductive layers and the first semiconductor layer;
a second electric charge accumulating portion disposed between the second conductive layers and the second semiconductor layer;
a first bit line electrically connected to one end of the first semiconductor layer;
a second bit line electrically connected to one end of the second semiconductor layer;
a first voltage generating circuit that generates a voltage applied to the first conductive layer;
a second voltage generating circuit that generates a voltage applied to the second conductive layer;
a first driver circuit that controls the voltage applied to the first conductive layer;
a second driver circuit that controls the voltage applied to the second conductive layer;
a first electrode to which a power supply voltage is applied;
a first voltage supply line that electrically connects the first electrode and the first voltage generating circuit; and
a second voltage supply line that electrically connects the first electrode and the second voltage generating circuit, wherein
when:
a magnitude and a supply time of one or a plurality of voltages applied to the first conductive layer when a predetermined operation is performed on a first memory cell including the first electric charge accumulating portion are assumed to be first operation parameters, and
a magnitude and a supply time of one or a plurality of voltages applied to the second conductive layer when the predetermined operation is performed on a second memory cell including the second electric charge accumulating portion are assumed to be second operation parameters,
at least a part of the second operation parameters differs from at least a part of the first operation parameters.

The semiconductor memory device, wherein
the second voltage supply line has a resistance larger than a resistance of the first voltage supply line, and
at least one of the magnitude or the supply time of the one or the plurality of voltages applied to the first conductive layer when the predetermined operation is performed on the first memory cell is smaller than at least one of the magnitude or the supply time of the one or the plurality of voltages applied to the second conductive layer when the predetermined operation is performed on the second memory cell.

The semiconductor memory device, wherein
the first operation parameters include a magnitude and a supply time of one or a plurality of voltages applied to the first bit line, a stabilization wait time until sensing start of the first bit line, and a sense time of the first bit line when the predetermined operation is performed on the first memory cell, and
the second operation parameters include a magnitude and a supply time of one or a plurality of voltages applied to the second bit line, a stabilization wait time until sensing start of the second bit line, and a sense time of the second bit line when the predetermined operation is performed on the second memory cell.

The semiconductor memory device, wherein
the second voltage supply line has a resistance larger than a resistance of the first voltage supply line, and
at least one of the magnitude or the supply time of the one or the plurality of voltages applied to the first bit line when the predetermined operation is performed on the first memory cell is smaller than at least one of the magnitude or the supply time of the one or the plurality of voltages applied to the second bit line when the predetermined operation is performed on the second memory cell.

The semiconductor memory device, wherein
the second voltage supply line has a resistance larger than a resistance of the first voltage supply line, and
the stabilization wait time until the sensing start of the first bit line when the predetermined operation is performed on the first memory cell is longer than the stabilization wait time until the sensing start of the second bit line when the predetermined operation is performed on the second memory cell.

The semiconductor memory device comprising:
a second electrode to which a ground voltage is applied;
a third voltage supply line that electrically connects the second electrode and the first voltage generating circuit; and
a fourth voltage supply line that electrically connects the second electrode and the second voltage generating circuit, wherein
the fourth voltage supply line has a resistance larger than a resistance of the third voltage supply line, and
at least one of the magnitude or the supply time of the one or the plurality of the voltages applied to the first conductive layer when the predetermined operation is performed on the first memory cell is smaller than at least one of the magnitude or the supply time of the one or the plurality of voltages applied to the second conductive layer when the predetermined operation is performed on the second memory cell.

The semiconductor memory device comprising:
a first source line electrically connected to the other end of the first semiconductor layer;
a second source line electrically connected to the other end of the second semiconductor layer;
a third voltage generating circuit that generates a voltage applied to the first source line;
a fourth voltage generating circuit that generates a voltage applied to the second source line;
a first source line driver circuit that controls a voltage applied to the first source line;
a second source line driver circuit that controls a voltage applied to the second source line;
a first electrode to which the power supply voltage is applied;
a fifth voltage supply line that electrically connects the first electrode and the third voltage generating circuit; and
a sixth voltage supply line that electrically connects the first electrode and the fourth voltage generating circuit, wherein
the sixth voltage supply line has a resistance larger than a resistance of the fifth voltage supply line, and
at least one of a magnitude or a supply time of the voltage applied to the first source line when the predetermined operation is performed on the first memory cell is smaller than at least one of a magnitude or a supply time of the voltage applied to the second source line when the predetermined operation is performed on the second memory cell.

The semiconductor memory device comprising:
a seventh voltage supply line that electrically connects the second electrode and the third voltage generating circuit; and
an eighth voltage supply line that electrically connects the second electrode and the fourth voltage generating circuit, wherein
the eighth voltage supply line has a resistance larger than a resistance of the seventh voltage supply line, and at least one of the magnitude or the supply time of the voltage applied to the first source line when the predetermined operation is performed on the first memory cell is smaller than at least one of the magnitude or the supply time of the voltage applied to the second source line when the predetermined operation is performed on the second memory cell.

The semiconductor memory device comprising:
a first sense amplifier connected to the first bit line;
a second sense amplifier connected to the second bit line;
a ninth voltage supply line that electrically connects the second electrode and the first sense amplifier; and
a tenth voltage supply line that electrically connects the second electrode and the second sense amplifier, wherein
the tenth voltage supply line has a resistance larger than a resistance of the ninth voltage supply line, and
at least one of the magnitude or the supply time of the one or the plurality of voltages applied to the first bit line when the predetermined operation is performed on the first memory cell is smaller than at least one of the magnitude or the supply time of the one or the plurality of voltages applied to the second bit line when the predetermined operation is performed on the second memory cell.

The semiconductor memory device, wherein
the tenth voltage supply line has a resistance larger than a resistance of the ninth voltage supply line, and
the stabilization wait time until the sensing start of the first bit line when the predetermined operation is performed on the first memory cell is longer than the stabilization wait time until the sensing start of the second bit line when the predetermined operation is performed on the second memory cell.

Other Embodiments

The semiconductor memory devices according to the first embodiment to the ninth embodiment have been described above. However, the configurations and the operations described above are merely examples, and the specific configurations and operations are appropriately adjustable.

For example, in the first embodiment to the fifth embodiment and the seventh embodiment to ninth embodiment, the word lines WL are divided into the two divided ranges DU1, DU2, and in the sixth embodiment, the word lines WL are divided into the four divided ranges DU1 to DU4. However, the word lines WL may be divided into three divided ranges or five or more divided ranges.

For example, in the first embodiment to the ninth embodiment, the plurality of divided ranges are ranges of the same size (the number of memory cells MC). However, the plurality of divided ranges may be ranges having respective different sizes.

Additionally, in this embodiment, the resistance value of the wiring resistance $R_W$ differs by differentiating at least a part of the material of the wiring (including the contact CC), the width of the wiring, the length of the wiring, and the height of the wiring between the word line WL (divided ranges DU1, DU2) and the word line switch WLSW, a difference in the charge direction of the word line WL, the position of the plane, and the like.

Additionally, generally, the read operation and the write operation are performed with the page PG as the execution unit. In this case, for example, the page PG may be configured by the plurality of divided ranges of one word line WL, or the page PG may be configured by the divided ranges (for example, the divided range DU1 of the word line WLi and the divided range DU2 of the word line WLo) of the plurality of word lines (for example, the word lines WLi, WLo). Additionally, the page PG may be configured by the divided ranges (for example, the divided range DU1 of the word line WLi and the divided range DU2 of the word line WLo) of the word lines in different blocks (for example, the word line WLi in the block (1) and the word line WLo in the block (2)). Additionally, the page PG may be configured by the divided ranges (for example, the divided range DU1 of the word line WLi and the divided range DU2 of the word line WLo) of the word lines in the predetermined blocks of different planes (for example, the word line WLi in the block (11) of the plane (1) and the word line WLo in the block (21) of the plane (2)). The configuration also allows adjusting the operation parameters for each divided range.

For example, as described with reference to FIG. 13, the memory cell array MCA according to the first embodiment to the fourth embodiment includes the two memory cell array layers $L_{MCA1}$, $L_{MCA2}$ arranged in the Z-direction. Moreover, among the plurality of conductive layers 110 included in the memory cell array layer $L_{MCA1}$, a part of the conductive layer 200 (FIG. 15) includes the two parts 201 arranged in the X-direction and the part 202 connected to them, and sets of the pair of conductive layers 210 (FIG. 16) arranged in the X-direction are disposed above it. A part of the conductive layer 220 (FIG. 17) among the plurality of conductive layers 110 included in the memory cell array layer $L_{MCA2}$ includes the two parts 221 arranged in the X-direction and the part 222 connected to them, and sets of the pair of conductive layers 230 (FIG. 18) arranged in the X-direction are disposed above it.

However, the configuration is merely an example, and the specific configuration is appropriately adjustable.

For example, the memory cell array layer $L_{MCA2}$ may be omitted in the memory cell arrays MCA according to the first embodiment to the fourth embodiment. In the case, the memory cell array layer $L_{MCA1}$ may include the plurality of conductive layers 110 (FIG. 19) that function as, for example, the drain-side select gate lines SGD.

For example, in the memory cell array MCA according to the first embodiment to the fourth embodiment, one or more memory cell array layers may be disposed between the memory cell array layer $L_{MCA1}$ and the memory cell array layer $L_{MCA2}$. Each of the memory cell array layers may include the plurality of conductive layers 110. Additionally, parts of these plurality of conductive layers 110 may include two parts arranged in the X-direction and a part connected to them. The pair of conductive layers 110 arranged in the X-direction may be disposed above this.

For example, in the example described above, the configuration that the gate insulating film includes the insulating or conductive electric charge accumulating portion as the memory transistor has been exemplified. However, the configuration is merely an example, and the configuration of the memory transistor included in the gate insulating film is appropriately adjustable. For example, as the memory transistor, the configuration in which the gate insulating film contains ferroelectric may be employed.

For example, in the example described above, the configuration of including the plurality of memory transistors has been exemplified as the configuration of the memory cell array MCA. However, the configuration is merely an example, and the specific configuration is appropriately adjustable. For example, as the configuration of the memory cell array MCA, a configuration of including one except for the memory transistor may be employed.

For example, the memory cell array MCA may be a Static Random Access Memory (SRAM). The SRAM includes two CMOS inverters. One input terminal is connected to the other output terminal, and one output terminal is connected to the other input terminal.

Further, the memory cell array MCA may be a magnetoresistive memory, such as a Magnetoresistive Random Access Memory (MRAM) or a Spin Transfer Torque MRAM (STT-MRAM). The MRAM and the STT-MRAM include a pair of ferromagnetic films and a tunnel insulating film. The pair of ferromagnetic films are disposed to be mutually opposed. The tunnel insulating film is disposed between the pair of ferromagnetic films. The ferromagnetic film changes its magnetization direction according to the write operation.

Additionally, the memory cell array MCA may be a resistance change memory, such as a Resistive Random Access Memory (ReRAM). The ReRAM includes a pair of electrodes and metal oxide or the like. The metal oxide or the like is disposed between the pair of electrodes. In the metal oxide or the like, a filament, such as oxygen defect, is formed according to the write operation. The pair of electrodes electrically conduct or are separated via the filament, such as the oxygen defect.

The memory cell array MCA may be a phase change memory, such as a Phase Change Random Access Memory (PCRAM) or a Phase Change Memory (PCM). The phase change memory may include a chalcogenide film, such as GeSbTe. The crystalline state of the chalcogenide film may change according to the write operation.

[Others]

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a plurality of first conductive layers arranged in a first direction, extending in a second direction intersecting with the first direction, and overlapping with a sense amplifier region viewed from the first direction;
   a plurality of second conductive layers arranged in the first direction, extending in the second direction, and not overlapping with the sense amplifier region viewed from the first direction;
   a first semiconductor layer extending in the first direction and opposed to the first conductive layers;
   a second semiconductor layer extending in the first direction and opposed to the second conductive layers;
   a first electric charge accumulating portion disposed between the first conductive layers and the first semiconductor layer;
   a second electric charge accumulating portion disposed between the second conductive layers and the second semiconductor layer;
   a first bit line electrically connected to one end of the first semiconductor layer;
   a second bit line electrically connected to one end of the second semiconductor layer;
   a first driver circuit that controls a voltage applied to one of the first conductive layers; and
   a second driver circuit that controls a voltage applied to one of the second conductive layers, wherein
      at least a part of first operation parameters including magnitudes and supply times of a plurality of voltages applied to the one of the first conductive layers when a predetermined operation is performed on a first memory cell including the first electric charge accumulating portion, the at least a part of first operation parameters differing from at least a part of second operation parameters including magnitudes and supply times of a plurality of voltages applied to the one of the second conductive layers when the predetermined operation is performed on a second memory cell including the second electric charge accumulating portion.

2. The semiconductor memory device according to claim 1, comprising:

a first wiring connecting between the one of the first conductive layers and a first circuit; and a second wiring connecting between the one of the second conductive layers and a second circuit, wherein the first wiring has a resistance larger than a resistance of the second wiring, and at least one of a magnitude or a supply time of one of the plurality of voltages applied to the one of the first conductive layers when the predetermined operation is performed on the first memory cell is larger than at least one of a magnitude or a supply time of one of the plurality of voltages applied to the one of the second conductive layers when the predetermined operation is performed on the second memory cell.

3. The semiconductor memory device according to claim 1, wherein the first operation parameters include a magnitude and a supply time of a voltage applied to the first bit line, a stabilization wait time until sensing start of the first bit line, and a sense time of the first bit line when the predetermined operation is performed on the first memory cell, and the second operation parameters include a magnitude and a supply time of a voltage applied to the second bit line, a stabilization wait time until sensing start of the second bit line, and a sense time of the second bit line when the predetermined operation is performed on the second memory cell.

4. The semiconductor memory device according to claim 3, comprising:

a first wiring connecting between one of the first conductive layers and a first circuit; and a second wiring connecting between one of the second conductive layers and a second circuit, wherein the first wiring has a resistance larger than a resistance of the second wiring, and at least one of the magnitude or the supply time of the voltage applied to the first bit line when the predetermined operation is performed on the first memory cell is larger than at least one of the magnitude or the supply time of the voltage applied to the second bit line when the predetermined operation is performed on the second memory cell.

5. The semiconductor memory device according to claim 3, comprising:

a first wiring connecting between the one of the first conductive layers and a first circuit; and a second wiring connecting between the one of the second conductive layers and a second circuit, wherein the first wiring has a resistance larger than a resistance of the second wiring, and the stabilization wait time until the sensing start of the first bit line when the predetermined operation is performed on the first memory cell is longer than the stabilization wait time until the sensing start of the second bit line when the predetermined operation is performed on the second memory cell.

6. The semiconductor memory device according to claim 3, comprising:

a first wiring connecting between the one of the first conductive layers and a first circuit; and a second wiring connecting between the one of the second conductive layers and a second circuit, wherein the first wiring has a resistance larger than a resistance of the second wiring, and the sense time of the first bit line when the predetermined operation is performed on the first memory cell is shorter than the sense time of the second bit line when the predetermined operation is performed on the second memory cell.

7. The semiconductor memory device according to claim 1, comprising:

a first source line electrically connected to the other end of the first semiconductor layer;

a second source line electrically connected to the other end of the second semiconductor layer;

a first wiring connecting between the one of the first conductive layer and a first circuit; and a second wiring connecting between the one of the second conductive layer and a second circuit, wherein the first wiring has a resistance larger than a resistance of the second wiring, and at least one of a magnitude or a supply time of a voltage applied to the first source line when the predetermined operation is performed on the first memory cell is larger than at least one of a magnitude or a supply time of a voltage applied to the second source line when the predetermined operation is performed on the second memory cell.

8. The semiconductor memory device according to claim 2, wherein the first wiring has a first wiring length in a wiring layer made of copper, the second wiring has a second wiring length in a wiring layer made of copper, and the first wiring length is shorter than a second wiring length.

9. A semiconductor memory device comprising:

a plurality of first conductive layers arranged in a first direction, extending in a second direction intersecting with the first direction, and overlapping with a sense amplifier region viewed from the first direction;

a plurality of second conductive layers arranged in the first direction, extending in the second direction, and not overlapping with the sense amplifier region viewed from the first direction;

a first semiconductor layer extending in the first direction and opposed to the first conductive layers;

a second semiconductor layer extending in the first direction and opposed to the second conductive layers;

a first electric charge accumulating portion disposed between the first conductive layers and the first semiconductor layer;

a second electric charge accumulating portion disposed between the second conductive layers and the second semiconductor layer;

a first bit line electrically connected to one end of the first semiconductor layer;

a second bit line electrically connected to one end of the second semiconductor layer;

a first driver circuit that controls a voltage applied to one of the first conductive layers;
a second driver circuit that controls a voltage applied to one of the second conductive layers;
a first wiring connecting between the first conductive layer and a first circuit; and
a second wiring connecting between the second conductive layer and a second circuit, wherein
the first wiring has a resistance larger than a resistance of the second wiring, and
at least a part of first operation parameters including a magnitude and a supply time of a voltage applied to the first bit line, a stabilization wait time until sensing start of the first bit line, and a sense time of the first bit line when a predetermined operation is performed on a first memory cell including the first electric charge accumulating portion, the at least a part of the first operating parameters differing from
at least a part of second operation parameters including a magnitude and a supply time of a voltage applied to the second bit line, a stabilization wait time until sensing start of the second bit line, and a sense time of the second bit line when the predetermined operation is performed on a second memory cell including the second electric charge accumulating portion.

10. The semiconductor memory device according to claim 9, wherein
at least one of the magnitude or the supply time of the voltage applied to the first bit line when the predetermined operation is performed on the first memory cell is larger than at least one of the magnitude or the supply time of the voltage applied to the second bit line when the predetermined operation is performed on the second memory cell.

11. The semiconductor memory device according to claim 9, wherein
the stabilization wait time until the sensing start of the first bit line when the predetermined operation is performed on the first memory cell is longer than the stabilization wait time until the sensing start of the second bit line when the predetermined operation is performed on the second memory cell.

12. The semiconductor memory device according to claim 9, wherein
the sense time of the first bit line when the predetermined operation is performed on the first memory cell is shorter than the sense time of the second bit line when the predetermined operation is performed on the second memory cell.

13. The semiconductor memory device according to claim 9, comprising:
a first source line electrically connected to the other end of the first semiconductor layer; and
a second source line electrically connected to the other end of the second semiconductor layer, wherein
at least one of a magnitude or a supply time of a voltage applied to the first source line when the predetermined operation is performed on the first memory cell is larger than at least one of a magnitude or a supply time of a voltage applied to the second source line when the predetermined operation is performed on the second memory cell.

14. The semiconductor memory device according to claim 2, wherein
the first wiring and the second wiring differ in at least one of a material, a width, a height, or a length.

15. A semiconductor memory device comprising:
a plurality of first conductive layers arranged in a first direction and extending in a second direction intersecting with the first direction;
a plurality of second conductive layers arranged in the first direction and extending in the second direction, and the plurality of first conductive layers and the plurality of second conductive layers arranged in a third direction intersecting with the first direction and the second direction;
a first semiconductor layer extending in the first direction and opposed to the first conductive layers;
a second semiconductor layer extending in the first direction and opposed to the second conductive layers;
a first electric charge accumulating portion disposed between the first conductive layers and the first semiconductor layer;
a second electric charge accumulating portion disposed between the second conductive layers and the second semiconductor layer;
a first bit line electrically connected to one end of the first semiconductor layer; and
a second bit line electrically connected to one end of the second semiconductor layer, wherein
at least a part of first operation parameters including a magnitude and a supply time of a voltage applied to the first bit line, a stabilization wait time until sensing start of the first bit line, and a sense time of the first bit line when a predetermined operation is performed on a first memory cell including the first electric charge accumulating portion differs from
at least a part of second first operation parameters including a magnitude and a supply time of a voltage applied to the second bit line, a stabilization wait time until sensing start of the second bit line, and a sense time of the second bit line when the predetermined operation is performed on a second memory cell including the second electric charge accumulating portion.

16. The semiconductor memory device according to claim 15, further comprising
a source line electrically connected to other ends of the first semiconductor layer and the second semiconductor layer.

17. The semiconductor memory device according to claim 15, further comprising:
a first driver circuit that controls a voltage applied to the one of the first conductive layers;
a second driver circuit that controls a voltage applied to the one of the second conductive layers;
a first wiring connecting between the one of the first conductive layers and a first circuit; and
a second wiring connecting between the one of the second conductive layers and a second circuit, wherein
the first wiring has a resistance larger than a resistance of the second wiring.

18. The semiconductor memory device according to claim 15, wherein
at least one of the magnitude or the supply time of the voltage applied to the first bit line when the predetermined operation is performed on the first memory cell is larger than at least one of the magnitude or the supply time of the voltage applied to the second bit line when the predetermined operation is performed on the second memory cell.

19. The semiconductor memory device according to claim 15, wherein
the stabilization wait time until the sensing start of the first bit line when the predetermined operation is performed on the first memory cell is longer than the stabilization wait time until the sensing start of the second bit line when the predetermined operation is performed on the second memory cell.

20. The semiconductor memory device according to claim 15, wherein
the sense time of the first bit line when the predetermined operation is performed on the first memory cell is shorter than the sense time of the second bit line when the predetermined operation is performed on the second memory cell.

* * * * *